(12) United States Patent
Okazaki et al.

(10) Patent No.: US 10,403,760 B2
(45) Date of Patent: Sep. 3, 2019

(54) OXIDE SEMICONDUCTOR FILM, SEMICONDUCTOR DEVICE INCLUDING THE OXIDE SEMICONDUCTOR FILM, AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Kenichi Okazaki, Tochigi (JP); Junichi Koezuka, Tochigi (JP); Toshimitsu Obonai, Tochigi (JP); Satoru Saito, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 25 days.

(21) Appl. No.: 15/058,330

(22) Filed: Mar. 2, 2016

(65) Prior Publication Data

US 2016/0260836 A1    Sep. 8, 2016

(30) Foreign Application Priority Data

Mar. 3, 2015    (JP) .................................. 2015-040974

(51) Int. Cl.
*H01L 29/786* (2006.01)
*H01L 29/04* (2006.01)
(Continued)

(52) U.S. Cl.
CPC ...... *H01L 29/7869* (2013.01); *H01L 27/1225* (2013.01); *H01L 27/1248* (2013.01);
(Continued)

(58) Field of Classification Search
CPC ............ H01L 29/7869; H01L 27/1248; H01L 29/78696; H01L 29/78693;
(Continued)

(56) References Cited

U.S. PATENT DOCUMENTS 5,528,032 A    6/1996 Uchiyama
5,731,856 A    3/1998 Kim et al.
(Continued)

FOREIGN PATENT DOCUMENTS

CN    103915447 A    7/2014
EP    1737044 A    12/2006
(Continued)

OTHER PUBLICATIONS

Kawamura.Y et al., "Effect of post thermal annealing of Zno TFTs by atomic layer deposition", The 70th JSAP Autumn Meeting 2009, 2009, No. 1, p. 892, 11p-J-6.
(Continued)

*Primary Examiner* — Cuong B Nguyen
(74) *Attorney, Agent, or Firm* — Fish & Richardson P.C.

(57) ABSTRACT

A novel oxide semiconductor film. An oxide semiconductor film with a small amount of defects. An oxide semiconductor film in which a peak value of the density of shallow defect states at an interface between the oxide semiconductor film and an insulating film is small. The oxide semiconductor film includes In, M (M is Al, Ga, Y, or Sn), Zn, and a region in which a peak value of a density of shallow defect states is less than 1E13 per square cm per volt.

10 Claims, 90 Drawing Sheets

(51) Int. Cl.
  *H01L 29/24* (2006.01)
  *H01L 29/34* (2006.01)
  *H01L 29/66* (2006.01)
  *H01L 29/49* (2006.01)
  *H01L 27/12* (2006.01)

(52) U.S. Cl.
  CPC ............ *H01L 29/045* (2013.01); *H01L 29/24* (2013.01); *H01L 29/34* (2013.01); *H01L 29/4908* (2013.01); *H01L 29/66969* (2013.01); *H01L 29/78648* (2013.01); *H01L 29/78693* (2013.01); *H01L 29/78696* (2013.01)

(58) Field of Classification Search
  CPC ........... H01L 29/78648; H01L 27/1225; H01L 29/4908; H01L 29/66969; H01L 29/34; H01L 29/24; H01L 29/045
  See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 8,237,166 | B2 | 8/2012 | Kumomi et al. |
| 8,541,782 | B2 | 9/2013 | Yamazaki et al. |
| 8,547,771 | B2 | 10/2013 | Koyama |
| 8,791,516 | B2 | 7/2014 | Ohshima |
| 8,797,487 | B2 | 8/2014 | Koyama |
| 8,921,853 | B2 | 12/2014 | Yamazaki |
| 8,995,174 | B2 | 3/2015 | Koyama |
| 9,105,658 | B2 | 8/2015 | Yamazaki |
| 9,196,639 | B2 | 11/2015 | Endo |
| 9,362,415 | B2 | 6/2016 | Yamazaki |
| 9,406,760 | B2 | 8/2016 | Shimomura et al. |
| 9,490,350 | B2 | 11/2016 | Koyama |
| 9,496,408 | B2 | 11/2016 | Yamazaki et al. |
| 9,660,101 | B2 | 5/2017 | Yamazaki |
| 9,705,006 | B2 | 7/2017 | Endo |
| 9,966,474 | B2 | 5/2018 | Yamazaki |
| 10,170,500 | B2 | 1/2019 | Koyama |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0246738 | A1* | 11/2006 | Isobe ..................... H01L 27/12 438/769 |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0109351 | A1 | 5/2011 | Yamazaki et al. |
| 2011/0121284 | A1 | 5/2011 | Yamazaki et al. |
| 2011/0121288 | A1 | 5/2011 | Yamazaki et al. |
| 2011/0127522 | A1 | 6/2011 | Yamazaki |
| 2011/0127523 | A1 | 6/2011 | Yamazaki |
| 2011/0133191 | A1 | 6/2011 | Yamazaki |
| 2011/0147736 | A1 | 6/2011 | Miyanaga et al. |
| 2012/0062174 | A1 | 3/2012 | Kamata |
| 2012/0062813 | A1* | 3/2012 | Koyama ........... G02F 1/136213 349/43 |
| 2012/0153275 | A1 | 6/2012 | Endo et al. |
| 2012/0176146 | A1 | 7/2012 | Oborina et al. |
| 2012/0223305 | A1 | 9/2012 | Sato et al. |
| 2012/0225543 | A1 | 9/2012 | Ohno et al. |
| 2013/0168738 | A1 | 7/2013 | Fukuhara |
| 2013/0264563 | A1 | 10/2013 | Okazaki et al. |
| 2013/0292675 | A1 | 11/2013 | Tsubuku et al. |

(56) References Cited

U.S. PATENT DOCUMENTS

| | | |
|---|---|---|
| 2014/0027762 A1 | 1/2014 | Tsurume et al. |
| 2014/0110707 A1 | 4/2014 | Koezuka et al. |
| 2014/0138675 A1* | 5/2014 | Yamazaki ......... H01L 29/66757 257/43 |
| 2014/0145625 A1 | 5/2014 | Yamazaki et al. |
| 2014/0151687 A1 | 6/2014 | Yamazaki |
| 2014/0183523 A1* | 7/2014 | Endo .................. H01L 27/1255 257/43 |
| 2014/0183530 A1 | 7/2014 | Yamazaki et al. |
| 2014/0209896 A1 | 7/2014 | Yamazaki |
| 2014/0225105 A1 | 8/2014 | Tanaka et al. |
| 2014/0326991 A1 | 11/2014 | Matsubayashi et al. |
| 2014/0374741 A1 | 12/2014 | Kang et al. |
| 2015/0076491 A1 | 3/2015 | Yamazaki |
| 2015/0097188 A1 | 4/2015 | Yamazaki |
| 2015/0109019 A1 | 4/2015 | Matsuda et al. |
| 2015/0263177 A1 | 9/2015 | Yamazaki |
| 2016/0005871 A1 | 1/2016 | Matsuda et al. |
| 2016/0240682 A1 | 8/2016 | Shimomura et al. |
| 2016/0247907 A1 | 8/2016 | Ohashi et al. |
| 2016/0282284 A1 | 9/2016 | Hayashi et al. |
| 2019/0139988 A1 | 5/2019 | Koyama |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-097442 A | 4/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2014-131263 A | 7/2014 |
| JP | 2014-199896 A | 10/2014 |
| TW | 201227834 | 7/2012 |
| TW | 201427012 | 7/2014 |
| TW | 201430961 | 8/2014 |
| WO | WO-2004/114391 | 12/2004 |

OTHER PUBLICATIONS

Tsuji.H et al., "Development of Simulation Model for Oxide Semiconductor Thin-Film Transistors", ITE Technical Report, 2013, vol. 37, No. 2, pp. 69-72.
International Search Report (Application No. PCT/IB2016/051020) dated Jun. 28, 2016.
Written Opinion (Application No. PCT/IB2016/051020) dated Jun. 28, 2016.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using Castep", Zeitschrift fur Kristallographie, 2005, vol. 220, pp. 567-570.
Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Syposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Syposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 1919-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chinese Office Action (Application No. 201680013345.8) dated Apr. 17, 2019.

\* cited by examiner

FIG. 17A
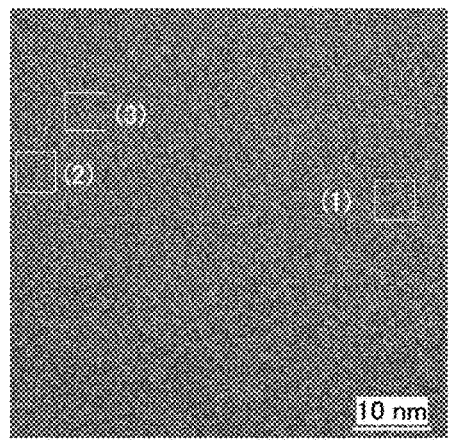
FIG. 17B    FIG. 17C    FIG. 17D
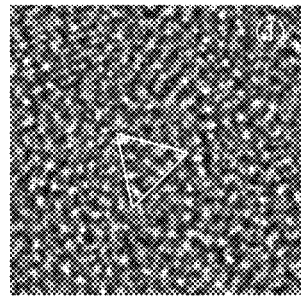 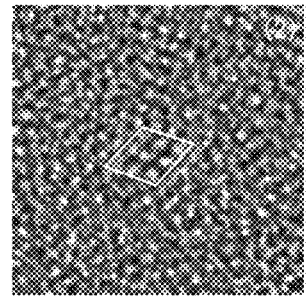 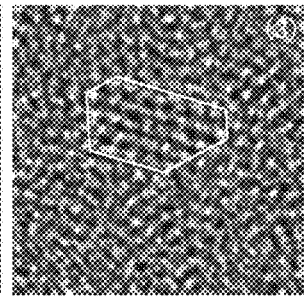

FIG. 24A
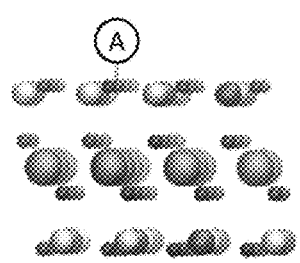
FIG. 24B
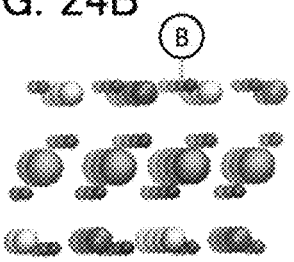
FIG. 24C
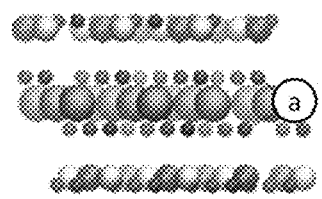
FIG. 24D
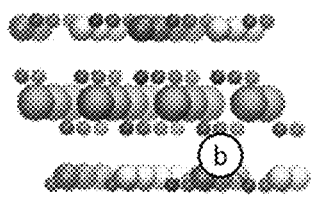
FIG. 24E
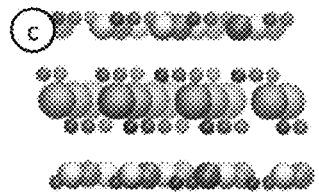
FIG. 24F
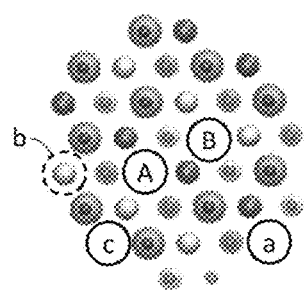
FIG. 24G
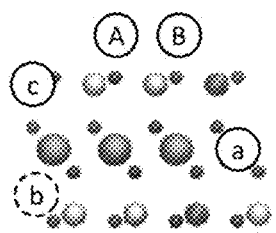
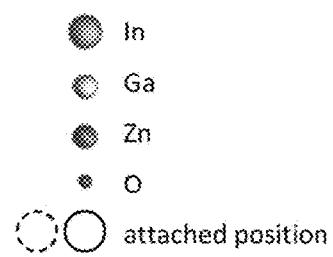

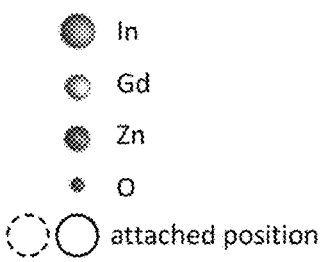

270A

270A

270B

270B

200

X1　　　　　　X2
208

200

208
Y1　　　　　　Y2

270B

X1　　　　　　X2
208b　208c
208

270B

Y1　　　　　　Y2
208b　208c
208

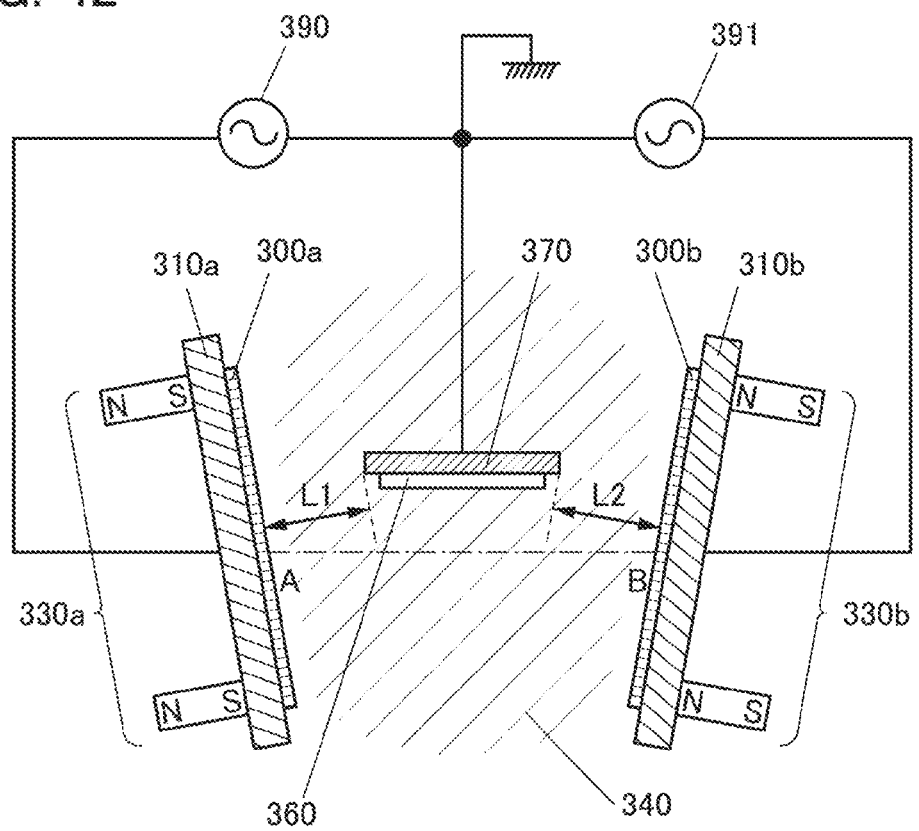

9100

9101

9102

9200

9201

9201

9201

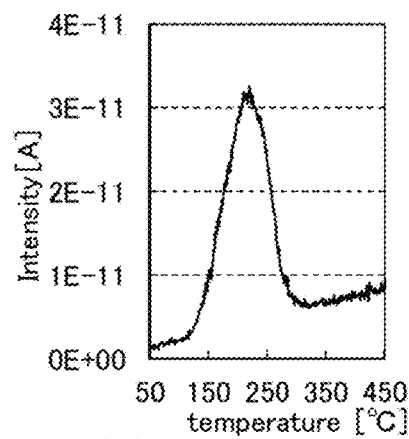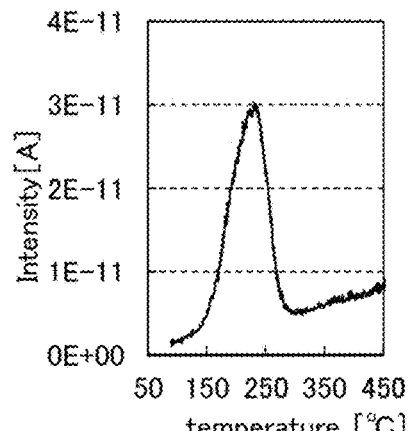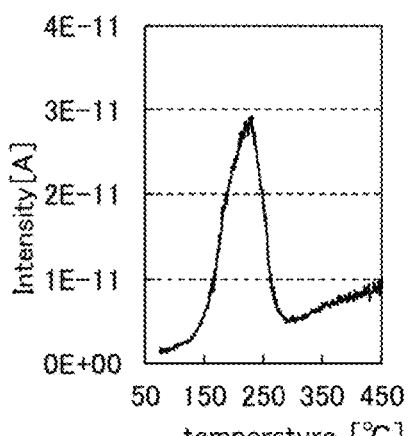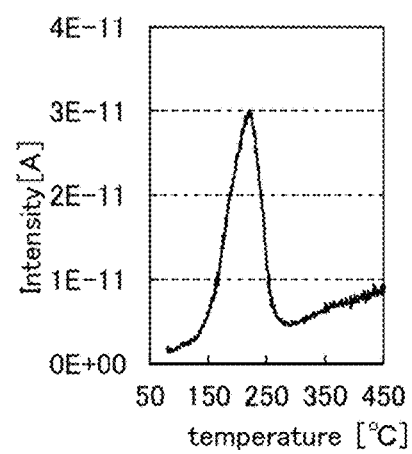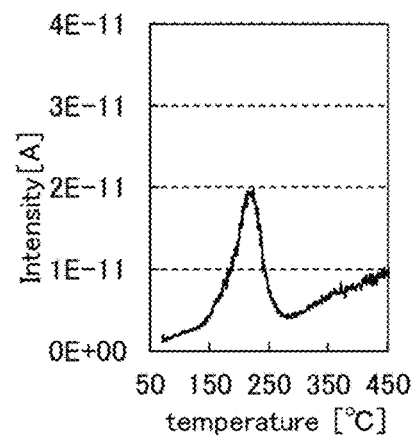

OXIDE SEMICONDUCTOR FILM, SEMICONDUCTOR DEVICE INCLUDING THE OXIDE SEMICONDUCTOR FILM, AND DISPLAY DEVICE INCLUDING THE SEMICONDUCTOR DEVICE

TECHNICAL FIELD

One embodiment of the present invention relates to an oxide semiconductor film, a semiconductor device including the oxide semiconductor film, and a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor (a thin film transistor (TFT) or a field-effect transistor (FET)) using a semiconductor thin film formed over a substrate. The transistor is applied to a wide range of electronic devices such as an integrated circuit (IC) and an image device (display device). As semiconductor thin films applicable to the transistors, silicon-based semiconductor materials have been widely used, but oxide semiconductors have been attracting attention as alternative materials.

For example, a technique in which a transistor is fabricated using an In—Ga—Zn-based oxide semiconductor is disclosed (see Patent Document 1).

REFERENCE

Patent Document

[Patent Document 1] Japanese Published Patent Application No. 2007-96055

DISCLOSURE OF INVENTION

An object of one embodiment of the present invention is to provide a novel oxide semiconductor film. Another object of one embodiment of the present invention is to provide an oxide semiconductor film with a small amount of defects. Another object of one embodiment of the present invention is to provide an oxide semiconductor film in which a peak value of the density of shallow defect states at an interface between the oxide semiconductor film and an insulating film is small. Another object of one embodiment of the present invention is to provide a semiconductor device including a transistor having excellent electrical characteristics (e.g., on-state current, field-effect mobility, or frequency characteristics). Another object of one embodiment of the present invention is to provide a semiconductor device including a transistor having excellent saturation characteristics. Another object of one embodiment of the present invention is to provide a semiconductor device including a highly reliable transistor. Another object of one embodiment of the present invention is to provide a novel semiconductor device. Another object of one embodiment of the present invention is to provide a method for manufacturing a novel semiconductor device.

Note that the description of the above objects does not disturb the existence of other objects. In one embodiment of the present invention, there is no need to achieve all the objects. Other objects will be apparent and can be derived from the description of the specification and the like.

One embodiment of the present invention is an oxide semiconductor film that includes In, M (M is Al, Ga, Y, or Sn), Zn, and a region in which a peak value of a density of shallow defect states is less than $1 \times 10^{13}$ cm$^{-2}$ eV$^{-1}$.

Another embodiment of the present invention is an oxide semiconductor film that includes In, M (M is Al, Ga, Y, or Sn), Zn, and a first region overlapping with a first conductive film with a first insulating film positioned therebetween. The first region includes a region in which a peak value of a density of shallow defect states at an interface between the oxide semiconductor film and the first insulating film is less than $1 \times 10^{13}$ cm$^{-2}$ eV$^{-1}$.

In any of the above embodiments, the peak value of the density of the shallow defect states is preferably measured by a high-frequency C-V method.

In the above embodiment, it is preferable that the peak value of the density of the shallow defect states be measured by a high-frequency C-V method and in the high-frequency C-V method, an alternating voltage at higher than or equal to 0.1 kHz and lower than or equal to 10 MHz and a direct-current voltage be applied to the first conductive film.

Another embodiment of the present invention is an oxide semiconductor film that includes In, M (M is Al, Ga, Y, or Sn), Zn, a first region overlapping with a first conductive film with a first insulating film positioned therebetween, and a second region overlapping with a second conductive film with a second insulating film positioned therebetween. The first region includes a region in which a peak value of a first density of shallow defect states at an interface between the oxide semiconductor film and the first insulating film is less than $1 \times 10^{13}$ cm$^{-2}$ eV$^{-1}$. The second region includes a region in which a peak value of a second density of shallow defect states at an interface between the oxide semiconductor film and the second insulating film is less than $1 \times 10^{13}$ cm$^{-2}$ eV$^{-1}$.

In the above embodiment, it is preferable that there be a region where the peak value of the first density of the shallow defect states is substantially equal to the peak value of the second density of the shallow defect states.

In any of the above embodiments, the peak value of the first density of the shallow defect states and the peak value of the second density of the shallow defect states are preferably measured by a high-frequency C-V method.

In the high-frequency C-V method of the above embodiment, an alternating voltage at higher than or equal to 0.1 kHz and lower than or equal to 10 MHz and a direct-current voltage are preferably applied to the first conductive film or the second conductive film.

In any of the above embodiments, the oxide semiconductor film preferably includes a region with c-axis alignment.

Another embodiment of the present invention is a semiconductor device that includes the oxide semiconductor film of any of the above embodiments, a source electrode electrically connected to the oxide semiconductor film, and a drain electrode electrically connected to the oxide semiconductor film.

Another embodiment of the present invention is a semiconductor device that includes the oxide semiconductor film of any of the above embodiments. An argon molecule at $1 \times 10^{14}$ cm$^{-2}$ or less is detected in the first insulating film by thermal desorption spectroscopy.

Another embodiment of the present invention is a semiconductor device that includes the oxide semiconductor film of any of the above embodiments. An oxygen molecule at $1 \times 10^{15}$ cm$^2$ or less is detected in the first insulating film by thermal desorption spectroscopy.

Another embodiment of the present invention is a display device that includes the semiconductor device of any of the above embodiments and a display element. Another embodiment of the present invention is a display module that includes the display device of the above embodiment and a touch sensor. Another embodiment of the present invention is an electronic device that includes the semiconductor device of any of the above embodiments, the display device of the above embodiment, or the display module of the above embodiment, and an operation key or a battery.

According to one embodiment of the present invention, a novel oxide semiconductor film can be provided. According to one embodiment of the present invention, an oxide semiconductor film with a small amount of defects can be provided. According to one embodiment of the present invention, an oxide semiconductor film in which a peak value of the density of shallow defect states at an interface between the oxide semiconductor film and an insulating film is small can be provided. According to one embodiment of the present invention, a semiconductor device including a transistor having excellent electrical characteristics (e.g., on-state current, field-effect mobility, or frequency characteristics) can be provided. According to one embodiment of the present invention, a semiconductor device including a transistor having excellent saturation characteristics can be provided. According to one embodiment of the present invention, a semiconductor device including a highly reliable transistor can be provided. According to one embodiment of the present invention, a novel semiconductor device can be provided. According to one embodiment of the present invention, a method for manufacturing a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 17A to 17D are Cs-corrected high-resolution TEM images of a plane of a CAAC-OS.

FIGS. 24A to 24G illustrate positions to which particles can be attached in a pellet.

FIG. 42 illustrates a sputtering apparatus.

FIGS. 73A to 73E are graphs showing results of TDS analysis in Example.

BEST MODE FOR CARRYING OUT THE INVENTION

Figure 1A:
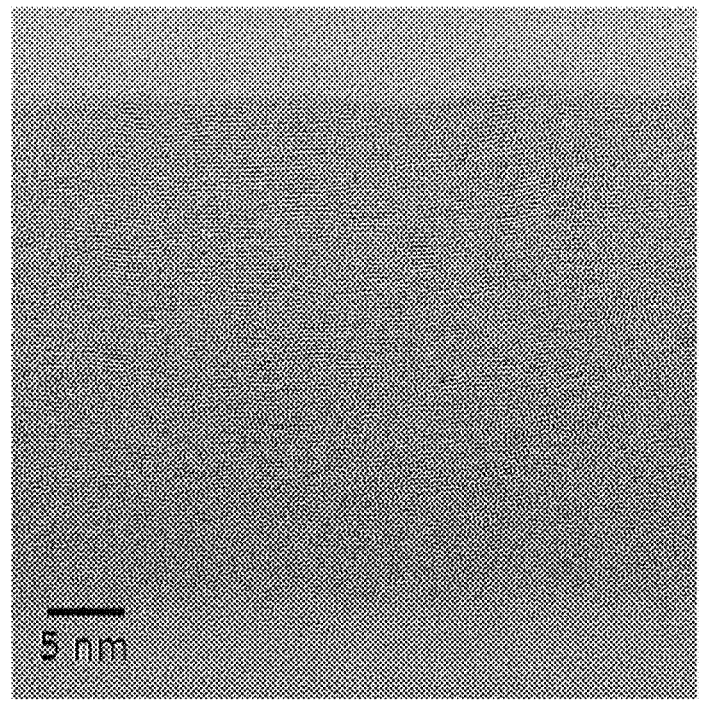
FIGS. 1A and 1B are cross-sectional TEM images of an oxide semiconductor film.

Embodiments of the present invention will be explained below with reference to the drawings. Note that the present invention is not limited to description to be given below, and modes and details thereof can be variously modified without departing from the purpose and the scope of the present invention. Thus, the present invention should not be interpreted as being limited to the description of the embodiments.

Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

Note that the ordinal numbers such as "first" and "second" in this specification and the like are used for convenience and do not denote the order of steps or the stacking order of layers in some cases. Therefore, for example, description can be made even when "first" is replaced with "second" or "third," as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In describing structures of the invention with reference to the drawings in this specification and the like, common reference numerals are used for the same portions in different drawings.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Alternatively, an "insulator" in this specification and the like can be called a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification and the like, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Thus, in this specification and the like, a channel width is any one of values, the maximum value, the minimum value, or the average value in a region where a channel is formed.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

A voltage usually refers to a potential difference between a given potential and a reference potential (e.g., a ground potential (GND) or a source potential). Accordingly, a voltage can also be called a potential.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases, and the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor includes an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Furthermore, when the semiconductor includes silicon, examples of an impurity which changes the characteristics of the semiconductor include oxygen, Group 1 elements except hydrogen, Group 2 elements, Group 13 elements, and Group 15 elements.

Embodiment 1

In this embodiment, an oxide semiconductor film of one embodiment of the present invention will be described.
<1-1. Oxide Semiconductor Film>

The oxide semiconductor film of one embodiment of the present invention includes indium (In), M (M is Al, Ga, Y, or Sn), and zinc (Zn).

An oxide semiconductor film containing In has high carrier mobility (electron mobility), for example. An oxide semiconductor film has high energy gap (Eg) by containing the element M, for example. Note that the element M is an element having high bonding energy with oxygen, which is higher than the bonding energy of In with oxygen. When containing Zn, the oxide semiconductor film is easily crystallized.

Typically, an In—Ga oxide, an In—Zn oxide, or an In-M-Zn oxide can be used for the oxide semiconductor film of one embodiment of the present invention. It is particularly preferable to use In-M-Zn oxide where M is Ga (i.e., In—Ga—Zn oxide; hereinafter sometimes referred to as IGZO) for the oxide semiconductor film.

In the case where the oxide semiconductor film is an In-M-Zn oxide, it is preferable that the atomic ratio of metal elements of a sputtering target used for forming a film of the In-M-Zn oxide satisfy In≥M and Zn≥M As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. Note that the atomic ratio of metal elements in the oxide semiconductor film varies from the atomic ratio of those in the above-described sputtering target, within a range of ±40% as an error. For example, when a sputtering target with an atomic ratio of In to Ga to Zn of 4:2:4.1 is used, the atomic ratio of In to Ga to Zn in the oxide semiconductor film may be 4:2:3 or in the neighborhood of 4:2:3.

The energy gap of the oxide semiconductor film is 2 eV or more, preferably 2.5 eV or more, further preferably 3 eV or more.

In the case where a transistor including an oxide semiconductor film in a channel region is manufactured, impurities such as hydrogen or moisture entering the oxide semiconductor film of the channel region adversely affect the transistor characteristics and therefore cause a problem. Thus, it is preferable that the amount of impurities such as hydrogen or moisture in the channel region of the oxide semiconductor film be as small as possible.

Moreover, oxygen vacancies formed in the oxide semiconductor film of the channel region adversely affect the transistor characteristics and therefore cause a problem. For example, oxygen vacancies formed in the oxide semiconductor film of the channel region are bonded to hydrogen to serve as a carrier supply source. The carrier supply source generated in the oxide semiconductor film of the channel region causes a change in the electrical characteristics, typically, a shift in the threshold voltage, of the transistor including the oxide semiconductor film. Furthermore, there is a problem in that electrical characteristics fluctuate among the transistors. Therefore, it is preferable that the amount of oxygen vacancy in the channel region of the oxide semiconductor film be as small as possible.

When defect states exist inside an oxide semiconductor film and at the interface between the oxide semiconductor film and the outside, the defect states can cause deterioration and the like of a transistor including the oxide semiconductor film. To achieve stable electrical characteristics of a transistor including an oxide semiconductor film, it is thus important to reduce defect states or the density of defect states in the oxide semiconductor film and the vicinity of its interface.

Note that defect states include shallow level defect states and deep level defect states. Note that in this specification and the like, shallow level defect states are defect states between the energy at the conduction band minimum (Ec) and the mid gap. Thus, for example, the shallow level defect states are located closer to energy at the conduction band minimum. In this specification and the like, deep level defect states are defect states between the energy at the valence band maximum (Ev) and the mid gap. Thus, for example, the deep level defect states are located closer to the mid gap than to energy at the valence band maximum.

By reducing shallow defect states or the density of shallow defect states in the oxide semiconductor film and at the interface between the oxide semiconductor film and the outside, the field-effect mobility (also simply referred as mobility or μFE) of the transistor including the oxide semiconductor film can be increased. Furthermore, a change in electrical characteristics of the transistor including the oxide semiconductor film can be reduced.

In view of the above, in one embodiment of the present invention, impurities (typically hydrogen or moisture), oxygen vacancies, and/or the density of defect states in an oxide semiconductor film are/is reduced. To reduce the impurities, the oxygen vacancies, or the density of defect states in the oxide semiconductor film, the crystallinity of the oxide semiconductor film is preferably increased.
<1-2. Structure of Oxide Semiconductor>

Here, a structure of an oxide semiconductor included in the oxide semiconductor film of one embodiment of the present invention is described.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

For the oxide semiconductor film of one embodiment of the present invention, the CAAC-OS is particularly preferred to the other oxide semiconductors described above. When the oxide semiconductor film is a CAAC-OS, the oxide semiconductor film can have higher crystallinity, and impurities, oxygen vacancies, or the density of defect states in the oxide semiconductor film can be reduced. Note that details about the above-described CAAC-OS, nc-OS, a-like OS, and the like will be described later.

Here, the crystallinity of the oxide semiconductor film of one embodiment of the present invention is described with reference to FIGS. 1A and 1B, FIGS. 2A and 2B, FIGS. 3A and 3B, FIG. 4, and FIGS. 5A and 5B.

<1-3. Crystallinity of Oxide Semiconductor Film>

The crystallinity of the oxide semiconductor film can be evaluated through analysis of a cross section of the oxide semiconductor film using a transmission electron microscope (TEM) and analysis of the oxide semiconductor film by X-ray diffraction (XRD). An oxide semiconductor film for TEM analysis and that for XRD analysis were formed and their crystallinities were evaluated.

<<Method for Forming Oxide Semiconductor Film for TEM Analysis>>

First, a method for manufacturing the oxide semiconductor film for TEM analysis is described. The oxide semiconductor film for TEM analysis was formed over a glass substrate with a size of 720 mm×600 mm to have a thickness of 35 nm. The oxide semiconductor film was formed by a sputtering method. Note that the oxide semiconductor film was formed under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

Then, the oxide semiconductor film was analyzed with a TEM.

Figure 4:
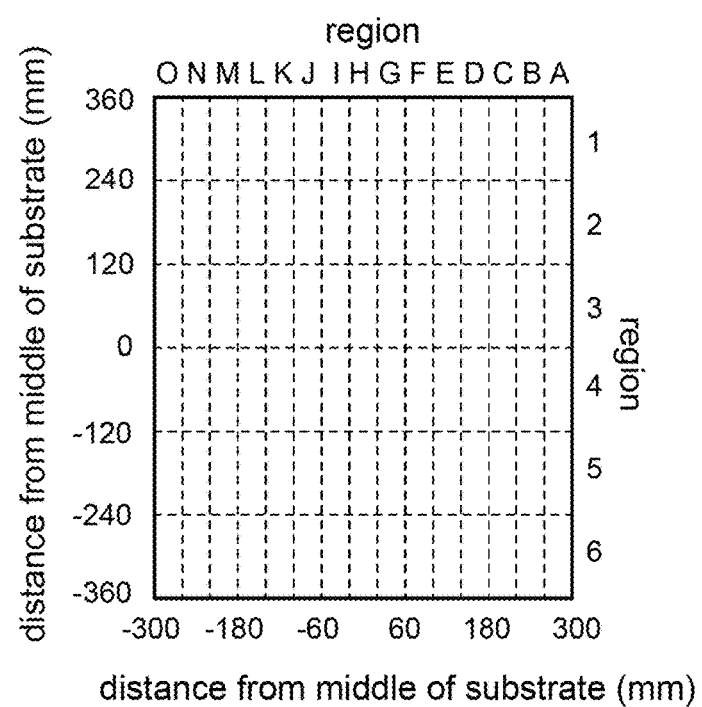
FIG. 4 shows measurement coordinates.

FIG. 4 shows the coordinates on the 720 mm×600 mm glass substrate in the TEM analysis. In FIG. 4, the 720-mm-long side of the substrate is divided into six, so that the substrate has Regions 1 to 6. The 600-mm-long side of the substrate is divided into 15, so that the substrate has Regions A to O. Hereinafter, regions on the substrate are referred to in the following manner: for example, the region near the middle of the substrate whose distance from the middle of the substrate in the 600-mm-long side direction is from −20 mm to 20 mm and whose distance from the middle of the substrate in the 720-mm-long side direction is from 0 mm to 120 mm is referred to as Region H3. The TEM analysis was performed on Region B3 and Region H3 shown in FIG. 4. Note that Region B3 and Region H3 are sometimes referred to as the outer edge of the substrate and the middle of the substrate, respectively.

<<TEM Analysis>>

The TEM analysis was performed with an atomic resolution analytical electron microscope JEM-ARM200F manufactured by JEOL Ltd. In the measurement, the acceleration voltage was 200 kV and the magnification was 4,000,000 times.

Figure 1B:
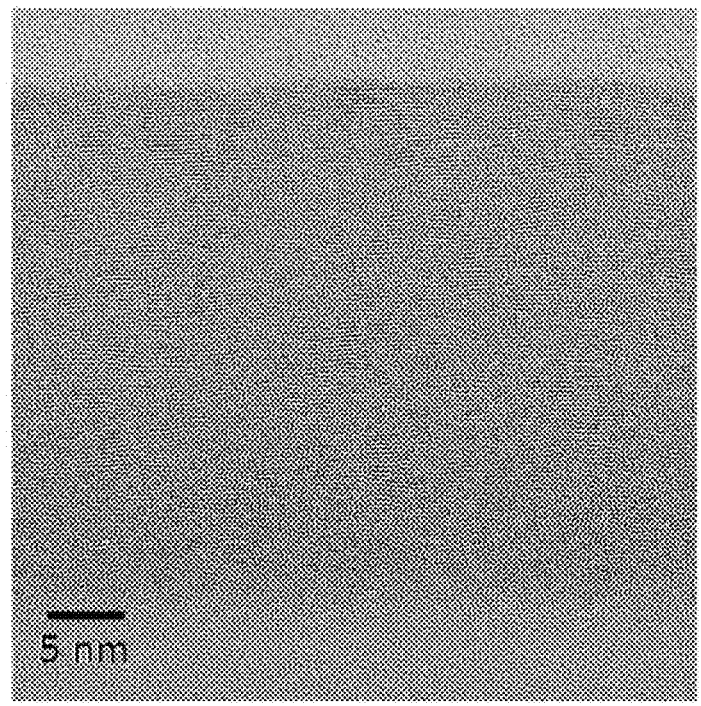

FIGS. 1A and 1B show cross-sectional TEM images of the oxide semiconductor film. Note that FIG. 1A is the cross-sectional TEM image at the middle of the substrate (Region H3) and FIG. 1B is the cross-sectional TEM image at the outer edge of the substrate (Region B3).

As shown in FIGS. 1A and 1B, when subjected to cross-sectional TEM analysis, the oxide semiconductor film of one embodiment of the present invention has a region having c-axis alignment (hereinafter also referred to as first region) in one field of the cross-sectional TEM image in which atoms can be observed.

Figure 2A:
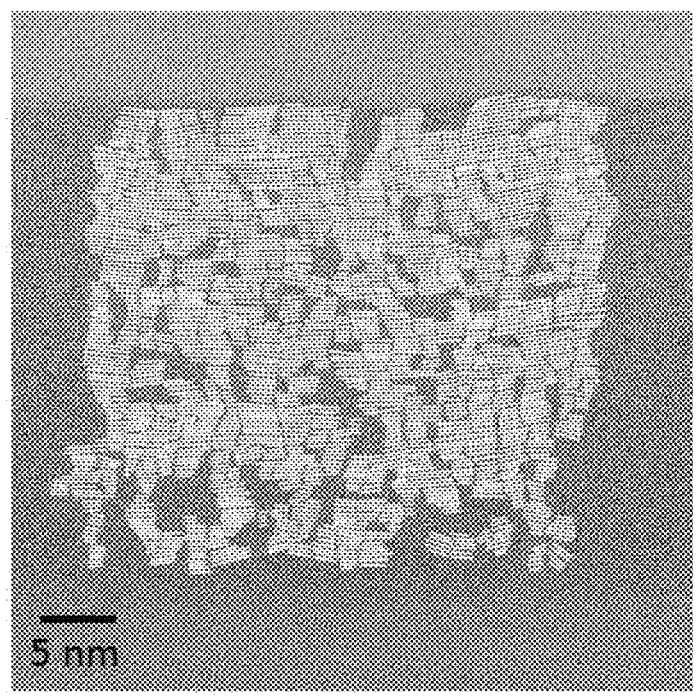
FIGS. 2A and 2B are cross-sectional TEM images of an oxide semiconductor film in which auxiliary lines are drawn.
Figure 2B:
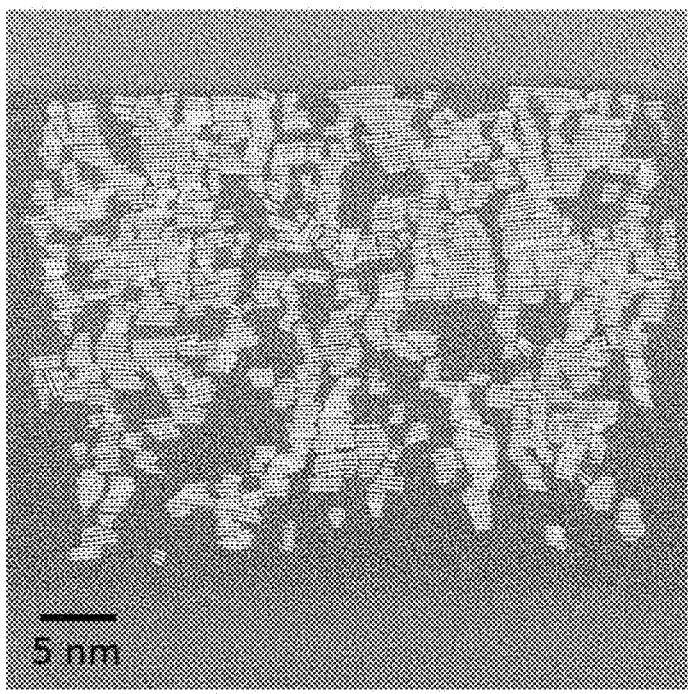

Since the region having c-axis alignment (first region) cannot be clearly observed in FIGS. 1A and 1B in some cases, the cross-sectional TEM images of FIGS. 1A and 1B in which auxiliary lines are drawn are shown in FIGS. 2A and 2B. FIG. 2A is the cross-sectional TEM image of FIG. 1A in which white lines are drawn as auxiliary lines, and FIG. 2B is the cross-sectional TEM image of FIG. 1B in which white lines are drawn as auxiliary lines. Note that in FIGS. 2A and 2B, the white auxiliary lines are drawn along the lattice fringes in the region having c-axis alignment (first region).

As shown in FIGS. 2A and 2B, when subjected to cross-sectional TEM analysis, the oxide semiconductor film of one embodiment of the present invention has a region having c-axis alignment (first region) and a region having no c-axis alignment (hereinafter also referred to as second region) in one field of the cross-sectional TEM image in which atoms can be observed. Note that the first region can also be called a region in which the c-axis is aligned in the direction parallel to the normal vector to the top surface of the film. The second region can also be called a region that does not have alignment or a region in which c-axis alignment is not easily observed. Note that the second region is referred to as an atomic void in some cases.

Comparison between the oxide semiconductor film in the middle of the substrate (Region H3) shown in FIG. 2A and the oxide semiconductor film at the outer edge of the substrate (Region B3) shown in FIG. 2B shows that the proportion of the region having c-axis alignment (first region) is higher in the oxide semiconductor film in the middle of the substrate (Region H3) shown in FIG. 2A.

Here, to calculate the areas of the region having c-axis alignment (first region) and the region having no c-axis alignment (second region) in the oxide semiconductor film in FIGS. 2A and 2B, image analysis was performed and the proportions of these regions were calculated.

Figure 3A:
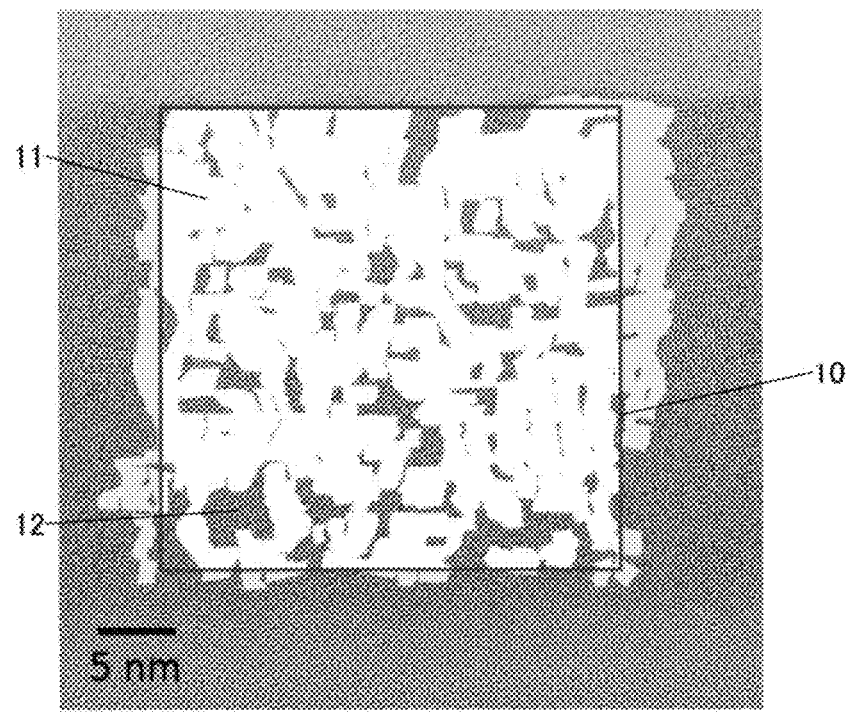
FIGS. 3A and 3B are cross-sectional TEM images of an oxide semiconductor film that are subjected to image processing.
Figure 3B:
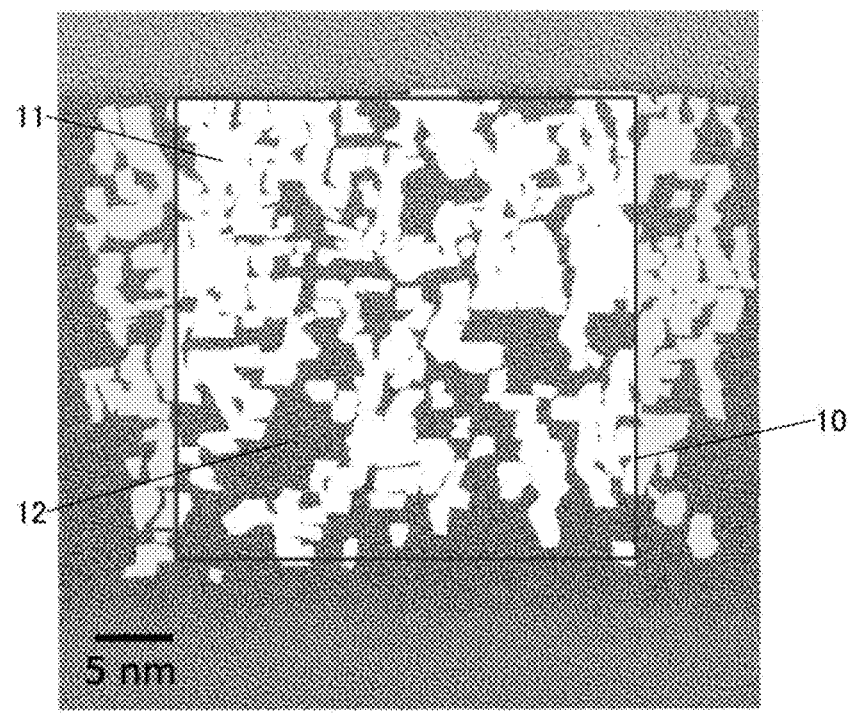

FIGS. 3A and 3B show results of the image processing of the cross-sectional TEM images of the oxide semiconductor film in FIGS. 2A and 2B. FIG. 3A shows the results of the image analysis of FIG. 2A and FIG. 3B shows the results of the image analysis of FIG. 2B. Note that quantitative determination was performed on a portion of a shown in FIGS. 3A and 3B (here, the portion with an area of 30 $nm^2$ in the cross-sectional TEM image). Note that the portion of the region 10 to be subjected to the quantitative determination is not limited to the above portion, so long as it is a portion with an area of greater than or equal to 5 $nm^2$ and less than or equal to 500 $nm^2$, preferably greater than or equal to 5 $nm^2$ and less than or equal to 100 $nm^2$, further preferably greater than or equal to 5 $nm^2$ and less than or equal to 50 $nm^2$ in the cross-sectional TEM image.

In FIGS. 3A and 3B, a region 11 filled with white is the region having c-axis alignment (first region) and a region 12 filled with gray is the region having no c-axis alignment (second region).

The results of the image analysis of the cross-sectional TEM images in FIGS. 3A and 3B show that the area of the first region in FIG. 3A occupies 76.7% and the area of the second region occupies 23.3%. The area of the first region in FIG. 3B occupies 52.8% and the area of the second region occupies 47.2%.

The oxide semiconductor film of one embodiment of the present invention can have high crystallinity when the area of the region other than the region having c-axis alignment (first region), i.e., the area of the region having no c-axis alignment (second region) occupies less than 50%, preferably less than 30%, further preferably less than 10%, including 0%.

<<Method for Forming Oxide Semiconductor Film for XRD Analysis>>

Next, a method for manufacturing the oxide semiconductor film for XRD analysis is described. The oxide semiconductor film for XRD analysis was formed over a glass substrate with a size of 720 mm×600 mm to have a thickness of 100 nm. The oxide semiconductor film was formed by a sputtering method. Note that the oxide semiconductor film was formed under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

Then, the oxide semiconductor film was analyzed by XRD.

Note that the coordinates on the glass substrate with a size of 720 mm×600 mm subjected to the XRD analysis were the same as those for the above-described TEM analysis. In other words, the XRD analysis was performed on the middle of the substrate (Region H3) and the outer edge thereof (Region B3) shown in FIG. 4.

<<XRD Analysis>>

The XRD analysis was performed using a multifunction thin film material evaluation X-ray diffractometer, D8 DISCOVER Hybrid, manufactured by Bruker AXS. An out-of-plane method was employed in the XRD analysis.

Figure 5A:
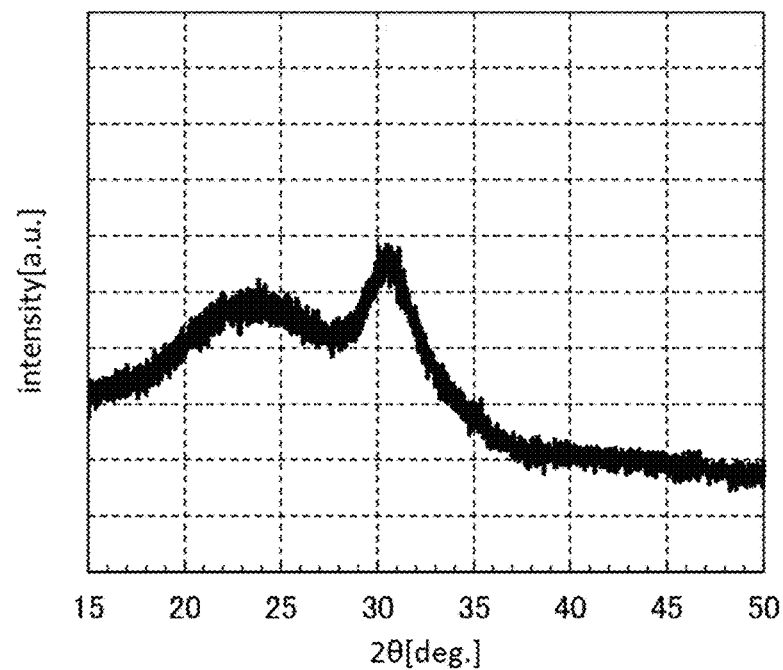
FIGS. 5A and 5B are graphs showing XRD results.
Figure 5B:
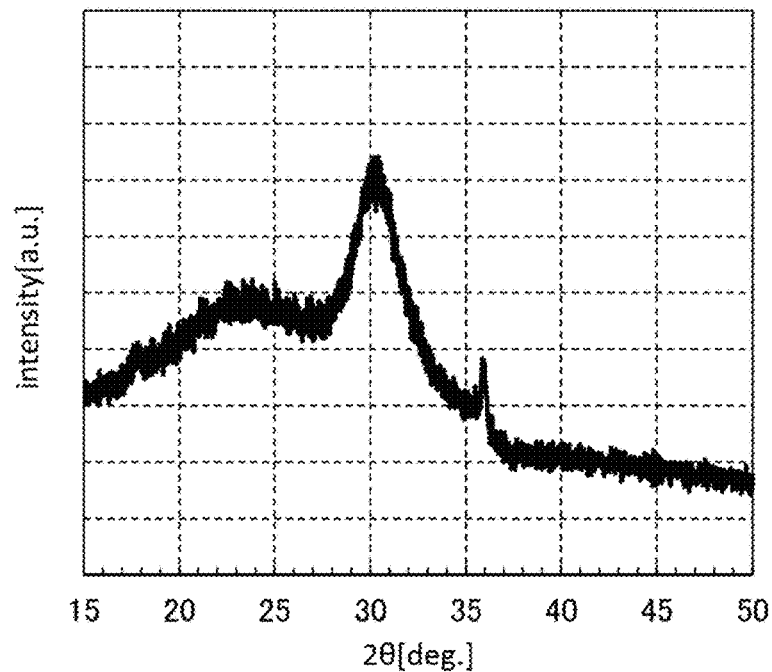

FIGS. 5A and 5B show the XRD analysis results of the oxide semiconductor film. Note that FIG. 5A shows the XRD results obtained at the middle of the substrate (Region H3) and FIG. 5B shows those obtained at the outer edge of the substrate (Region B3).

As can be seen in FIGS. 5A and 5B, the oxide semiconductor film in the middle of the substrate (Region H3) and that in the outer edge of the substrate (Region B3) each exhibit a peak at around 2θ=31°. This peak at around 2θ=31° is derived from the (009) plane of an InGaZnO$_4$ crystal, which indicates that in each of the middle and the outer edge of the substrate, crystals in the oxide semiconductor film have c-axis alignment and the c-axes are aligned in a direction substantially perpendicular to a formation surface or the top surface of the oxide semiconductor film. Note that the peak at around 2θ=24° shown in FIGS. 5A and 5B is derived from the glass substrate.

The oxide semiconductor film in the outer edge of the substrate (Region B3) shown in FIG. 5B exhibits a peak at around 2θ=36°. The peak at around 2θ=36° is probably derived from a spinel crystal structure. It can be thus presumed that crystals other than those having c-axis alignment are contained in the oxide semiconductor film in the outer edge of the substrate (Region B3).

<1-4. Method for Estimating Density of Defect State>

Next, a method for estimating the density of defect states in an oxide semiconductor film is described with reference to FIG. 6, FIGS. 7A and 7B, FIGS. 8A to 8C, and FIG. 9. The density of defect states can be estimated by comparison of measured high-frequency C-V characteristics of a transistor with calculated C-V characteristics thereof, for example.

Figure 6:
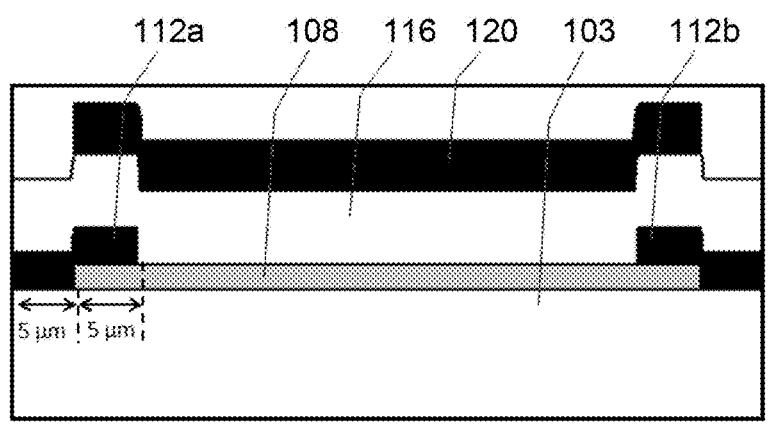
FIG. 6 is a cross-sectional view illustrating a transistor.

FIG. 6 is a schematic cross-sectional view of the transistor used for calculation. The transistor in FIG. 6 includes an insulating film 103, an oxide semiconductor film 108, conductive films 112a and 112b, an insulating film 116, and a conductive film 120. The oxide semiconductor film 108 includes a region overlapping with the conductive film 120 with the insulating film 116 provided therebetween. The conductive film 120 functions as a gate electrode. The insulating film 116 functions as a gate insulating film. The conductive films 112a and 112b are in contact with the oxide semiconductor film 108 and function as a source electrode and a drain electrode. The transistor that was actually fabricated and used for measurement also has a similar cross-sectional structure.

A device simulator "Atlas" developed by Silvaco Inc. was used for the calculation of the C-V characteristics. The table 1 lists parameters used for the calculation. Note that Eg represents an energy gap, Nc represents the effective density of states in the conduction band, and Nv represents the effective density of states in the valence band.

TABLE 1

| Structure | Channel width (μm) | 1000 |
| --- | --- | --- |
|  | Channel length (μm) | 1000 |
| Conductive film 120 | Work function (eV) | 5 |
| Insulating film 116 | Thickness (nm) | 19.5 |
|  | Dielectric constant | 4.1 |
| Conductive films 112a and 112b | Work function (eV) | 4.6 |
| Oxide semiconductor film 108 | Electron affinity (eV) | 4.6 |
|  | Eg (eV) | 3.15 |
|  | Dielectric constant | 15 |
|  | Donor density (cm$^{-3}$) | 6.6 × 10$^{-9}$ |
|  | Electron mobility (cm$^2$/Vs) | 10 |
|  | Hole mobility (cm$^2$/Vs) | 0 |
|  | Nc (cm$^{-3}$) | 5 × 10$^{18}$ |
|  | Nv (cm$^{-3}$) | 5 × 10$^{18}$ |
|  | Thickness (nm) | 30 |

The donor density of the oxide semiconductor film 108 in a region where the conductive films 112a and 112b are in contact with the oxide semiconductor film 108 was set to 1×10$^{19}$ cm$^{-3}$.

Figure 7A:
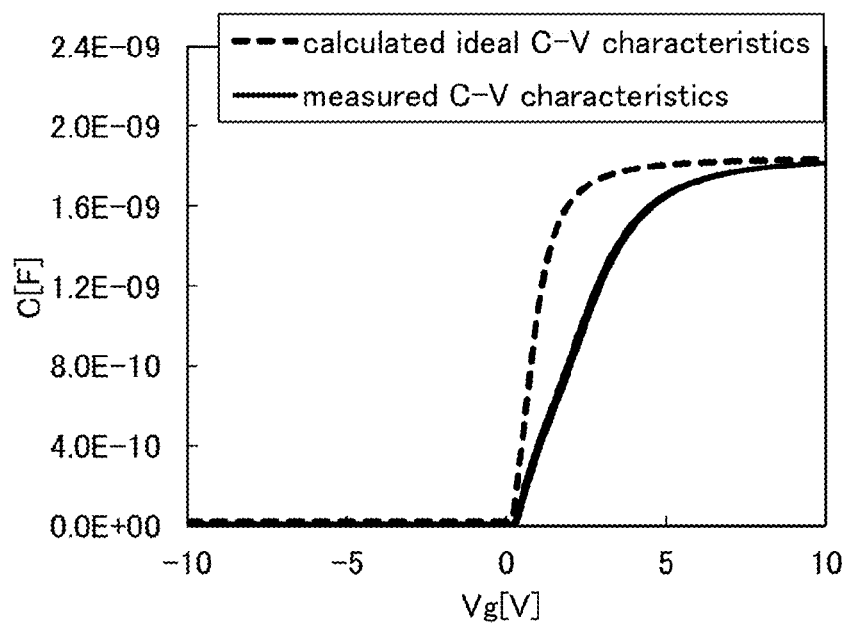
FIGS. 7A and 7B are graphs each showing C-V characteristics of a transistor.

The ideal C-V characteristics obtained by calculation and the measured C-V characteristics of the fabricated transistor are shown in FIG. 7A. In the transistor actually fabricated and subjected to the measurement includes, an In—Ga—Zn oxide that has the physical properties shown in Table 1 is used for the oxide semiconductor film 108. The measurement of the C-V characteristics was performed in such a manner that a voltage between the conductive films 112a and 112b and the conductive film 120 (gate voltage Vg) was applied from −10 V to 10 V at intervals of 0.1 V, and then applied from 10 V to −10 V at intervals of 0.1 V. An alternating voltage at 1 kHz and a direct-current voltage were applied as the gate voltage Vg.

In the case where the channel length of the transistor is large and the change in the capacitance in the measured region cannot be sufficiently reflected, an increase in the frequency of the alternating voltage sometimes reduces measured capacitance. For example, in the case where the channel length of the transistor is smaller than 1000 μm, the result can fully reflect the change in the capacitance in the measured region even with an alternating voltage at a frequency higher than 1 kHz. Thus, the frequency of the alternating voltage may be selected as appropriate in accordance with the channel length of the transistor. Note that the frequency of the alternating voltage in the case of a practical channel length of a transistor is, for example, higher than or equal to 0.1 kHz and lower than or equal to 10 MHz, higher than or equal to 0.2 kHz and lower than or equal to 1 MHz, higher than or equal to 0.3 kHz and lower than or equal to 100 kHz, or higher than or equal to 0.3 kHz and lower than or equal to 10 kHz.

As shown in FIG. 7A, a change in the capacitance with respect to the gate voltage Vg is more gradual in the actually measured C-V characteristics than in ideal C-V characteristics obtained by calculation. This is probably because an electron is trapped by a shallow defect state positioned near energy at the conduction band minimum.

Figure 8A:
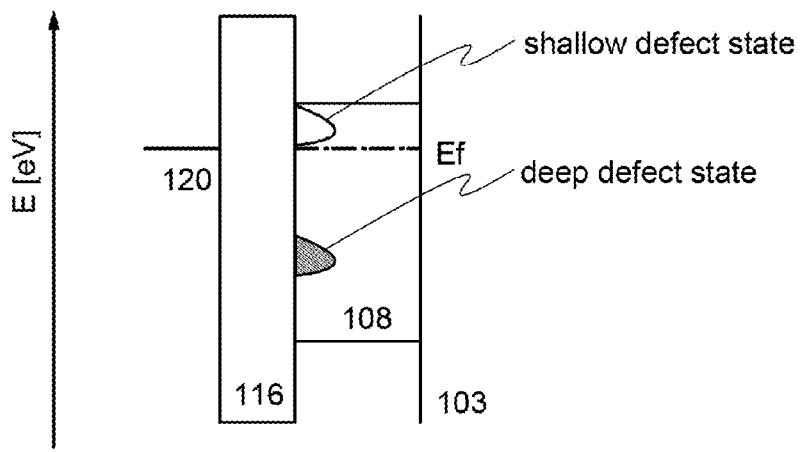
FIGS. 8A and 8B illustrate band structures of an oxide semiconductor film.
Figure 8B:
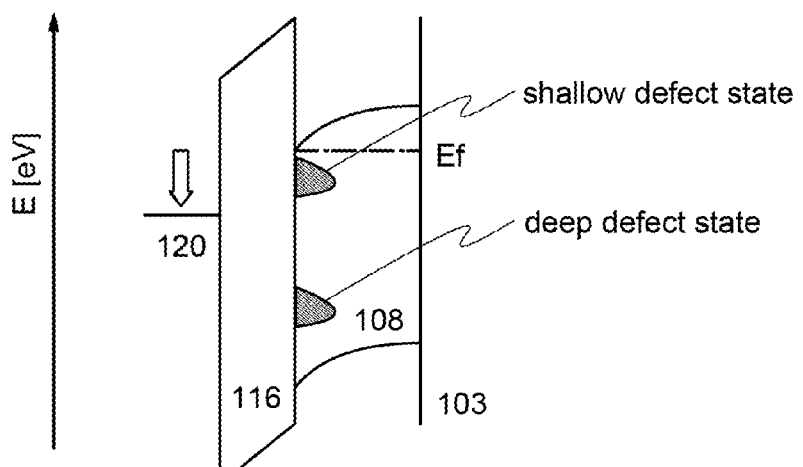

For example, in a band structure shown in FIG. 8A, an electron is not trapped by a shallow defect state in the energy gap of the oxide semiconductor film 108 but trapped by a deep defect state, at a gate voltage Vg when accumulation begins (represented as V0). Meanwhile, in a band structure shown in FIG. 8B where a positive voltage is applied as the gate voltage Vg, the band of the oxide semiconductor film 108 is curved, whereby an electron is also trapped by the shallow defect state. These phenomena can be understood by the relationship between the shallow or deep defect state and the Fermi level Ef.

Figure 8C:
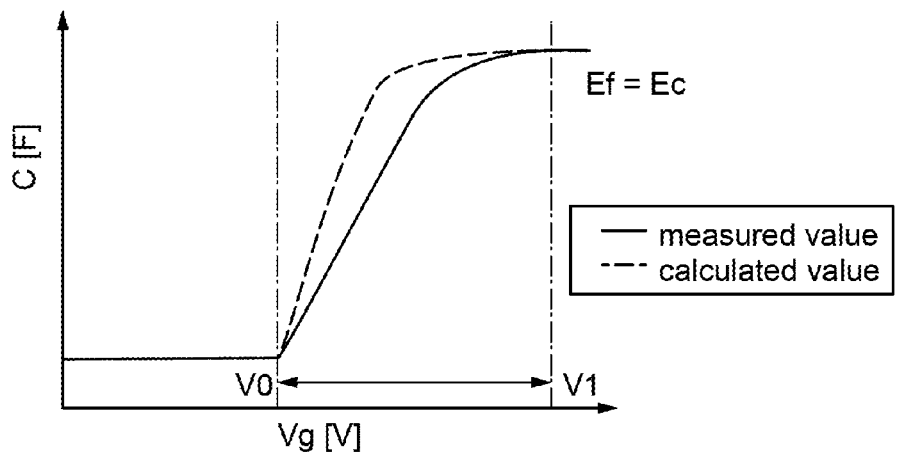
FIG. 8C is a graph showing C-V characteristics of a transistor.

Note that when the gate voltage Vg is lower than V0, trapping and detrapping of an electron in and from the shallow defect state do not occur; thus, there is no difference between the calculated value and the actually measured value. Furthermore, even when the gate voltage Vg is set higher than the gate voltage Vg (represented as V1) at which energy at the conduction band minimum corresponds to the Fermi level, trapping and detrapping of an electron in and from the shallow defect state do not occur at the interface between the oxide semiconductor film 108 and the insulating film 116; accordingly, there is no difference between the calculated value and the actually measured value. Therefore, when the gate voltage Vg is within a range from V0 to V1, the shallow defect state can be estimated as shown in FIG. 8C.

Figure 9:
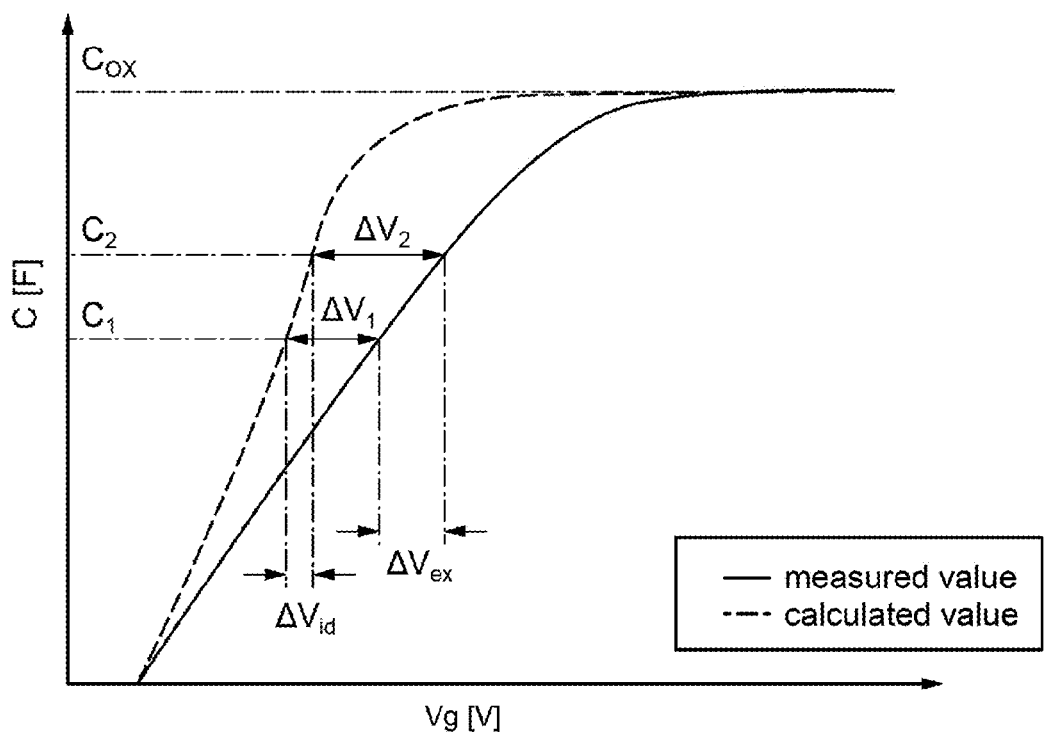
FIG. 9 is a graph showing C-V characteristics of a transistor.

A method for estimating the density of shallow defect states using, for example, typical C-V characteristics shown in FIG. 9 is described. A change in the gate voltage Vg when the capacitance changes from C1 to C2 in ideal C-V characteristics obtained by calculation is represented as $\Delta V_{id}$. A change in the gate voltage Vg when the capacitance changes from C1 to C2 in actually measured C-V characteristics is represented as $\Delta V_{ex}$. The amount of change in potential at the interface between the oxide semiconductor film 108 and the insulating film 116 when the capacitance changes from C1 to C2 is represented as $\Delta\phi$.

The C-V characteristics slope of the actually measured value is more gradual than that of the calculated value in FIG. 9, which indicates that $\Delta V_{id}$ is always smaller than $\Delta V_{ex}$. At this time, a difference between $\Delta V_{ex}$ and $\Delta V_{id}$ corresponds to a potential difference that is needed for trapping of an electron in a shallow defect state. Thus, when the amount of change in charge due to electrons trapped at the interface between the oxide semiconductor film 108 and the insulating film 116 is represented as $\Delta Q_{ss}$ and the capacitance of the insulating film 116 is represented as $C_{OX}$, $\Delta Q_{ss}$ can be expressed by Formula (1) shown below.

[Formula 1]

$$\Delta Q_{SS}=C_{OX}(\Delta V_{ex}-\Delta V_{id}) \qquad (1)$$

Furthermore, $\Delta Q_{ss}$ can be expressed by Formula (2), where $N_{ss}$ is the density of shallow defect states per unit area multiplied by energy at the interface and A is the area of the channel region of the transistor. Note that q represents elementary charge.

[Formula 2]

$$\Delta Q_{SS}=qAN_{SS}\Delta\phi \qquad (2)$$

Simultaneously solving Formulae (1) and (2) gives Formula (3).

[Formula 3]

$$qAN_{SS}\Delta\phi=C_{OX}(\Delta V_{ex}-\Delta V_{id}) \qquad (3)$$

Then, taking the limit of Formula (3) gives Formula (4).

[Formula 4]

$$N_{SS}=\lim_{\Delta\phi\to 0}\frac{C_{OX}}{qA}\left(\frac{\Delta V_{ex}-\Delta V_{id}}{\Delta\phi}\right)=\frac{C_{OX}}{qA}\left(\frac{\partial V_{ex}}{\partial\phi}-\frac{\partial V_{id}}{\partial\phi}\right) \qquad (4)$$

In other words, the density of shallow defect states ($N_{ss}$) at the interface between the oxide semiconductor film 108 and the insulating film 116 can be obtained from the C-V characteristics and Formula (4). Note that the potential at the interface between the oxide semiconductor film 108 and the insulating film 116 can be obtained by the above calculation.

In the above manner, the density of shallow defect states ($N_{ss}$) at the interface between the oxide semiconductor film 108 and the insulating film 116 in the C-V characteristics shown in FIG. 7A can be obtained. The distribution of the density of shallow defect states can correspond to a curve represented by Formula (5) that has been fitted to the Gaussian function.

[Formula 5]

$$N_{SS}=N\exp\left[-\frac{(E_C-E)^2}{W^2}\right] \qquad (5)$$

In the transistor structure in FIG. 6, fitting of the measured value and the calculated value can be performed by setting N to $2.9\times10^{13}$ cm$^{-2}$ eV$^{-1}$ and W to 0.10 eV. Thus, the peak value N of the density of shallow defect states is found to be $2.9\times10^{13}$ cm$^{-2}$ ev$^{-1}$. From the integral of the curve fitted to the Gaussian function, $5.1\times10^{12}$ cm$^{-2}$ is given as the density of shallow defect states ($N_{ss}$).

Figure 7B:
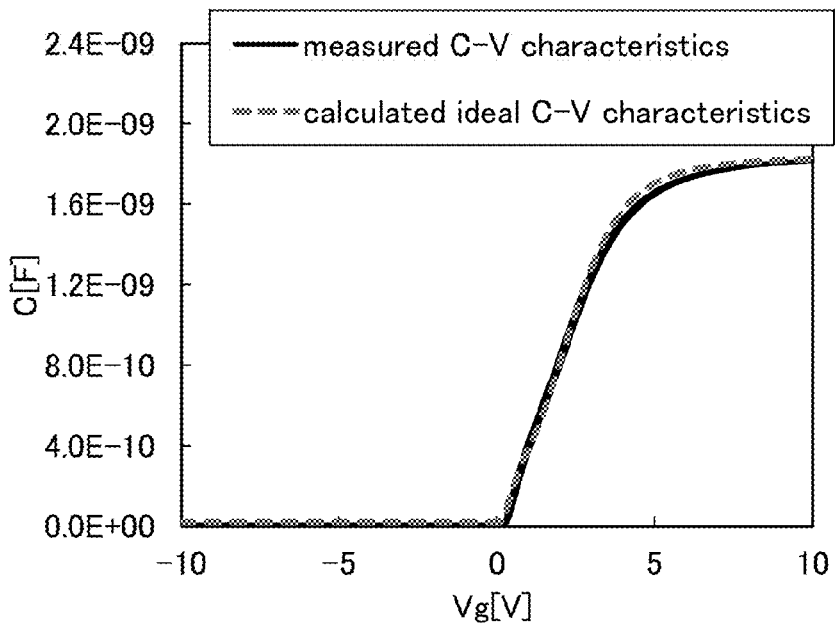

Next, comparison between C-V characteristics calculated using the Gaussian-type density of shallow defect states represented by Formula (5) and the measured C-V characteristics is shown in FIG. 7B. The results indicate that the calculated C-V characteristics and the measured C-V characteristics are highly reproducible. Accordingly, the above method is quite appropriate as a method for calculating the density of shallow defect states.

<1-5. Estimation of Density of Defect State>

Next, the density of defect states in oxide semiconductor films with different crystallinities was estimated by the estimation method described in <1-4. Method for estimating density of defect state>.

<<Transistor Structure>>

Figure 10A:
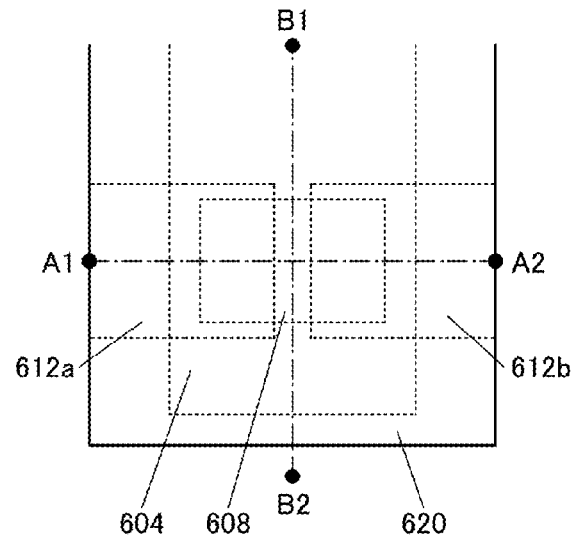
FIG. 10A is a top view of a transistor.
Figures 10B, 10C:
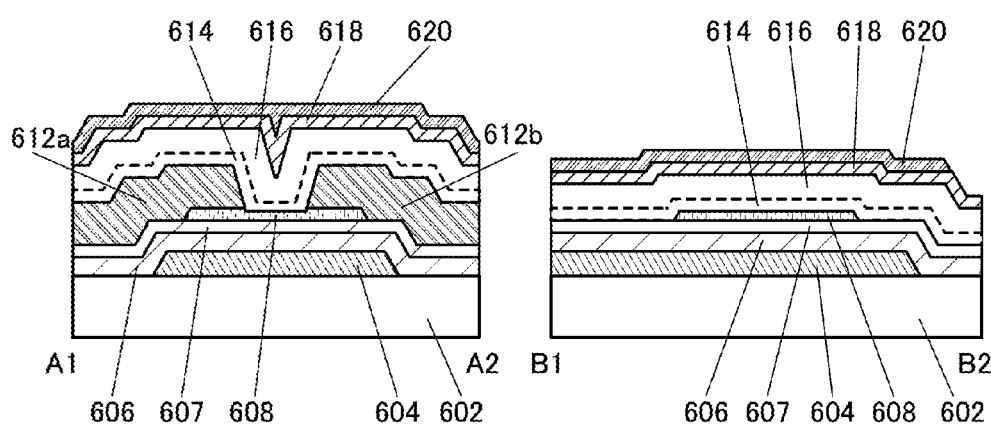
FIGS. 10B and 10C are cross-sectional views thereof.

First, the fabricated transistor structure will be described with reference to FIGS. 10A to 10C. FIG. 10A is a top view of the transistor 600. FIG. 10B is a cross-sectional view taken along the dashed-dotted line A1-A2 in FIG. 10A, and FIG. 10C is a cross-sectional view taken along the dashed-dotted line B1-B2 in FIG. 10A.

The transistor 600 includes a conductive film 604 functioning as a first gate electrode over a substrate 602, an insulating film 606 over the substrate 602 and the conductive film 604, an insulating film 607 over the insulating film 606, an oxide semiconductor film 608 over the insulating film 607, a conductive film 612a functioning as a source electrode electrically connected to the oxide semiconductor film 608, and a conductive film 612b functioning as a drain electrode electrically connected to the oxide semiconductor film 608.

Over the conductive films 612a and 612b and the oxide semiconductor film 608, insulating films 614, 616, and 618 are provided. A conductive film 620 is provided over the insulating film 618. The insulating films 606 and 607 function as first gate insulating films. The insulating films 614, 616, and 618 function as second gate insulating films. Note that the conductive film 620 functions as a second gate electrode (also referred to as a back-gate electrode) of the transistor 600.

<<Method for Manufacturing Transistor>>

Next, a method for manufacturing the transistor 600 illustrated in FIGS. 10A to 10C is described. First, the conductive film 604 was formed over the substrate 602. A glass substrate having a size of 720 mm×600 mm was used as the substrate 602. A 100-nm-thick tungsten film was formed with a sputtering apparatus and processed into a desired shape to form the conductive film 604.

Next, the insulating film 606 and the insulating film 607 were formed over the substrate 602 and the conductive film 604. As the insulating film 606, a 400-nm-thick silicon nitride film was formed with a PECVD apparatus. As the insulating film 607, a 50-nm-thick silicon oxynitride film was formed with a PECVD apparatus.

Next, the oxide semiconductor film 608 was formed over the insulating film 607.

A 35-nm-thick IGZO film was formed with a sputtering apparatus and processed into a desired shape to form the oxide semiconductor film 608. Note that the IGZO film was deposited under the conditions where the substrate temperature was 170° C., an argon gas and an oxygen gas were introduced into a chamber with the flow rate ratio of 1:1, the pressure was 0.6 Pa, and an AC power of 2500 W was applied to a metal oxide sputtering target (having an atomic ratio of In:Ga:Zn=1:1:1.2).

Then, first heat treatment was performed. As the first heat treatment, heat treatment was performed at 450° C. in a nitrogen atmosphere for 1 hour and then heat treatment was performed at 450° C. in a mixed atmosphere of nitrogen and oxygen for 1 hour.

Next, a conductive film was formed over the insulating film 607 and the oxide semiconductor film 608, a resist mask was formed over the conductive film, and a desired region was etched to form the conductive films 612a and 612b. As the conductive films 612a and 612b, a 50-nm-thick tungsten film, a 400-nm-thick aluminum film, and a 100-nm-thick titanium film were successively formed in a vacuum with a sputtering apparatus. The resist mask was removed after the formation of the conductive films 612a and 612b.

Next, a phosphoric acid solution (a solution obtained by diluting an 85% phosphoric acid solution with pure water by 100 times) was applied from above the insulating film 607, the oxide semiconductor film 608, and the conductive films 612a and 612b. Thus, part of the surface of the oxide semiconductor film 608 which is not covered with the conductive films 612a and 612b was removed.

Next, the insulating films 614 and 616 were formed over the insulating film 607, the oxide semiconductor film 608, and the conductive films 612a and 612b. As the insulating film 614, a 50-nm-thick silicon oxynitride film was formed with a PECVD apparatus. As the insulating film 616, a 400-nm-thick silicon oxynitride film was formed with a PECVD apparatus. Note that the insulating film 614 and the insulating film 616 were formed successively in a vacuum with a PECVD apparatus.

The insulating film 614 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 616 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, second heat treatment was performed. The second heat treatment was performed at 350° C. in an atmosphere containing nitrogen for 1 hour.

Next, oxygen addition treatment was performed on the insulating films 614 and 616 with an ashing apparatus under the conditions where the substrate temperature was 40° C., an oxygen gas at a flow rate of 250 sccm was introduced into a chamber, the pressure was 15 Pa, and an RF power of 4500 W was supplied between parallel-plate electrodes provided in the ashing apparatus so that a bias would be applied to the substrate side.

Next, the insulating film 618 was formed over the insulating film 616. As the insulating film 618, a 100-nm-thick silicon nitride film was formed with a PECVD apparatus. The insulating film 618 was deposited under the conditions where the substrate temperature was 350° C.; a silane gas at a flow rate of 50 sccm, a nitrogen gas at a flow rate of 5000 sccm, and an ammonia gas at a flow rate of 100 sccm were introduced into a chamber; the pressure was 100 Pa; and an RF power of 1000 W was supplied between parallel-plate electrodes provided in a PECVD apparatus.

Next, a conductive film was formed over the insulating film 618, and the conductive film was processed to form the conductive film 620. As the conductive film 620, a 100-nm-thick ITSO film was formed with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 3200 W was supplied to a metal oxide target provided in a sputtering apparatus. Note that the composition of the metal oxide target used for forming the ITSO film was $In_2O_3:SnO_2:SiO_2=85:10:5$ [wt %].

Then, third heat treatment was performed. The third heat treatment was performed at 250° C. in a nitrogen atmosphere for 1 hour.

The transistor for measurement of the C-V characteristics was formed through the above process. Note that the transistor had a channel length of 200 μm and a channel width of 50 μm.

<<Measurement of C-V Characteristics of Transistor>>

Next, C-V characteristics of the transistor fabricated as described above were measured. In "Top Gate Sweep," the conductive film 604 serving as the first gate electrode was electrically grounded and the C-V characteristics were measured between the conductive film 620 serving as the second gate electrode and the conductive films 612a and 612b serving as the source electrode and the drain electrode. In "Bottom Gate Sweep," the conductive film 620 serving as the second gate electrode was electrically grounded and the C-V characteristics were measured between the conductive film 604 serving as the first gate electrode and the conductive films 612a and 612b serving as the source electrode and the drain electrode.

Note that in the measurement of the C-V characteristics, the voltage between the conductive film 604 or the conductive film 620 and the conductive films 612a and 612b (also referred to as gate voltage Vg) was applied from −10 V to 10 V at intervals of 0.2 V. An alternating voltage at 10 kHz was applied as the gate voltage Vg.

Figure 11A:
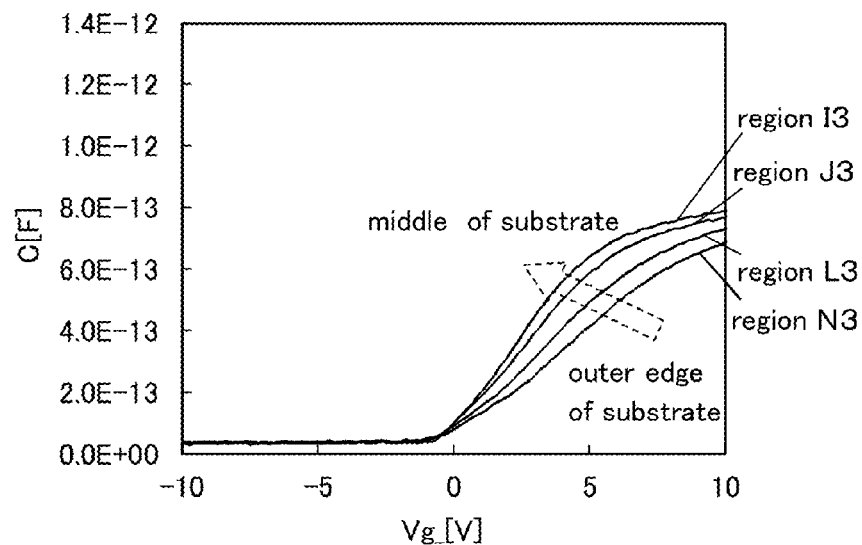
FIGS. 11A and 11B are graphs each showing C-V characteristics of a transistor.
Figure 11B:
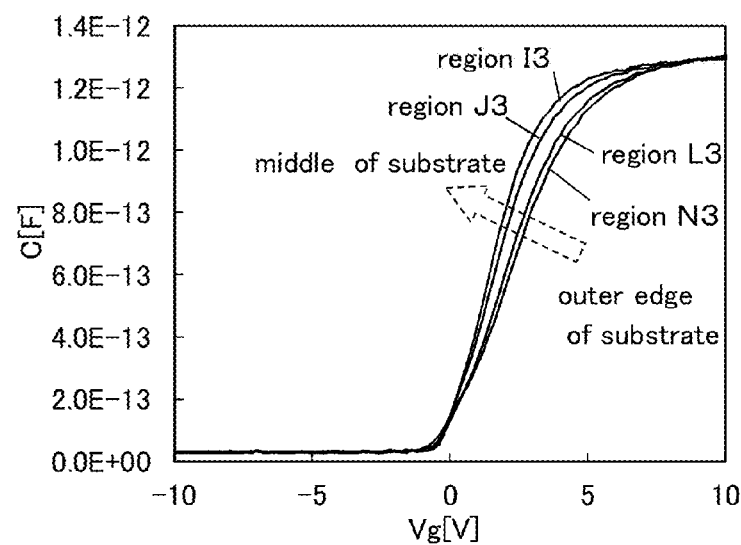

The measured C-V characteristics of the transistor fabricated in the above manner are shown in FIGS. 11A and 11B.

The C-V characteristics measurement was performed on the vicinities of the middle of the 720 mm×600 mm glass substrate of the transistor (Regions I3 and J3) and the vicinities of the outer edges of the substrate (Regions L3 and N3). Note that the coordinates on the glass substrate with a size of 720 mm×600 mm shown in FIG. 4 are used for the glass substrate here.

FIG. 11A shows the results of Top Gate Sweep and FIG. 11B shows the results of Bottom Gate Sweep. In FIGS. 11A and 11B, the vertical axis represents capacitance C and the horizontal axis represents gate voltage Vg.

As shown in FIGS. 11A and 11B, the measured capacitance was lower in Top Gate Sweep than in Bottom Gate Sweep. Furthermore, the measured change in capacitance with respect to the gate voltage Vg was smaller in the vicinity of the outer edge of the substrate than in the vicinity of the middle of the substrate.

<<Density of Defect State>>

Next, the measured C-V characteristics and calculated C-V characteristics were compared to calculate the density of defect states in the transistor. For the method for calculating the density of defect states in the transistor, <1-4. Method for estimating density of defect state> can be referred to.

Figure 12A:
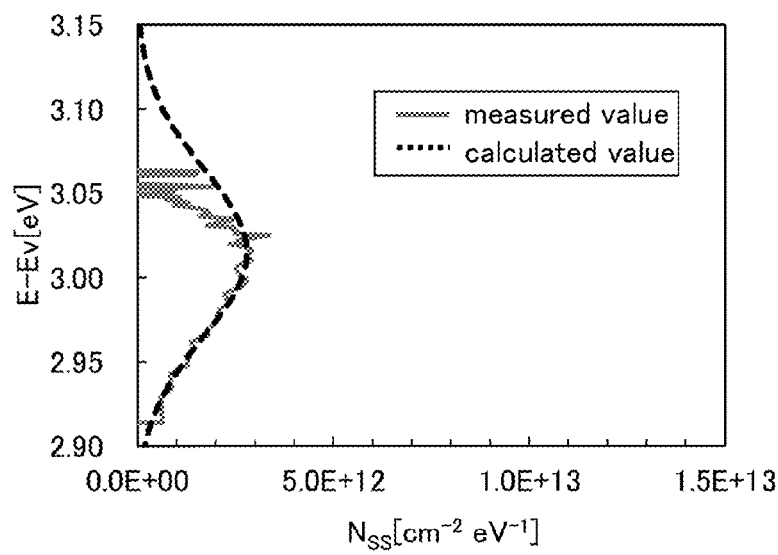
FIGS. 12A and 12B are graphs each showing C-V characteristics of a transistor.

FIG. 12A shows the results of fitting the Gaussian curve (calculated value) represented by Formula (5) shown above to the C-V characteristics measured in the vicinity of the middle of the substrate (Region I3) of the transistor by Bottom Gate Sweep. As shown in FIG. 12A, the measured C-V characteristics and the calculated C-V characteristics correspond to each other as a result of fitting, which means that the density of shallow defect states $N_{ss}$ in the oxide semiconductor film 608 can be calculated. In FIG. 12A, fitting of the measured value and the calculated value of the C-V characteristics was performed by setting N to $2.8 \times 10^{12}$ cm$^{-2}$ eV$^{-1}$ and W to 0.07 eV. Thus, the peak value N of the density of shallow defect states was found to be $2.8 \times 10^{12}$ cm$^{-2}$ eV$^{-1}$. From the integral of the curve, the density of shallow defect states ($N_{ss}$) can be given.

Figure 12B:
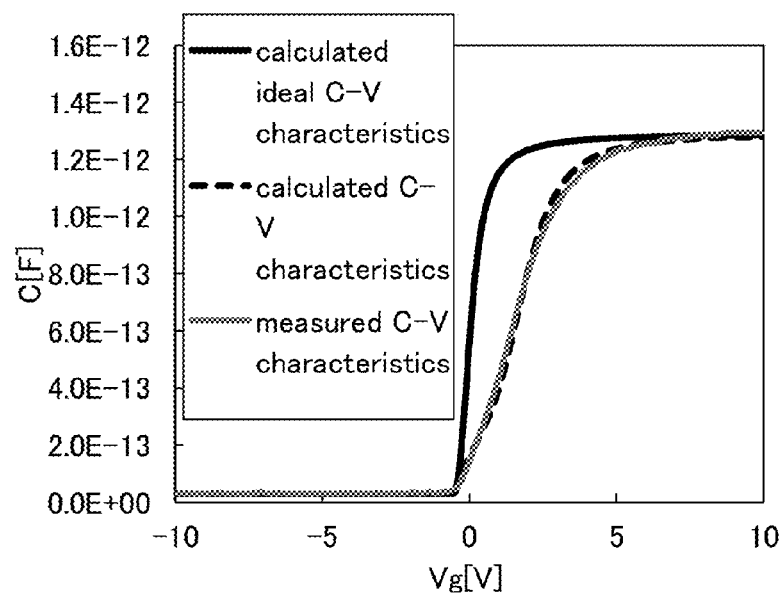

Next, C-V characteristics were calculated using the Gaussian-type density of shallow defect states represented by Formula (5) above. Comparison between the calculated C-V characteristics and the measured C-V characteristics is shown in FIG. 12B. The results indicate that the calculated C-V characteristics and the measured C-V characteristics are highly reproducible. Accordingly, the above method is quite appropriate as a method for measuring the density of shallow defect states.

<<In-Plane Distribution of Density of Defect State>>

Then, to examine the in-plane distribution of the density of defect states on the glass substrate with a size of 720 mm×600 mm, peak values of the density of shallow defect states (also referred to as a shallow level DOS or sDOS) were measured for Regions C3, D3, F3, G3, I3, J3, L3, and M3. Note that the coordinates on the glass substrate with a size of 720 mm×600 mm shown in FIG. 4 are used for the glass substrate here. The peak values of sDOS on the glass substrate with a size of 720 mm×600 mm are shown in FIG. 13.

Figure 13:
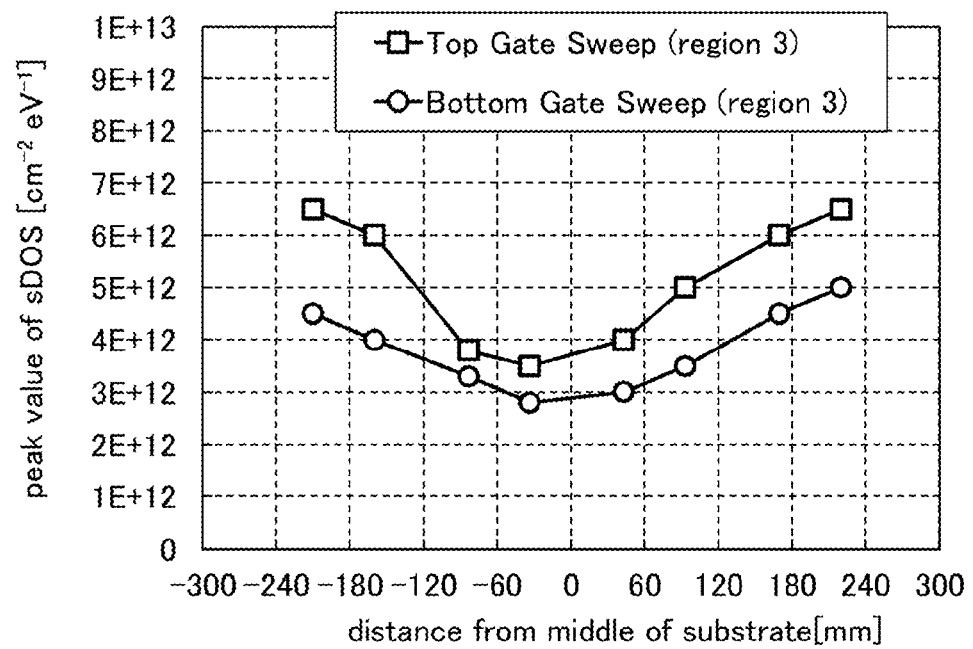
FIG. 13 is a graph showing in-plane distribution of peak values of the density of shallow defect states.

As can be seen in FIG. 13, in the transistor fabricated above, sDOS tends to increase from the vicinity of the middle of the substrate toward the outer edge of the substrate. It is suggested that this tendency is negatively correlated with the crystallinity found from the cross-sectional TEM image or the intensity of the XRD peak derived from a spinel crystal structure.

That is, sDOS is low in the vicinity of the middle of the substrate where the crystallinity is high. In other words, an oxide semiconductor film with high crystallinity has a small peak value of sDOS.

<1-6. Transistor Characteristics and sDOS>

Next, correlation between the characteristics of the transistor fabricated as described above and the calculated sDOS was examined. Note that the transistor characteristics here are field-effect mobility (μFE) obtained from Id-Vg characteristics. Measurement of the field-effect mobility (μFE) was performed on Regions C3, D3, F3, G3, I3, J3, L3, and M3 of the glass substrate. Note that the coordinates on the glass substrate with a size of 720 mm×600 mm shown in FIG. 4 are used for the glass substrate here.

Figure 14:
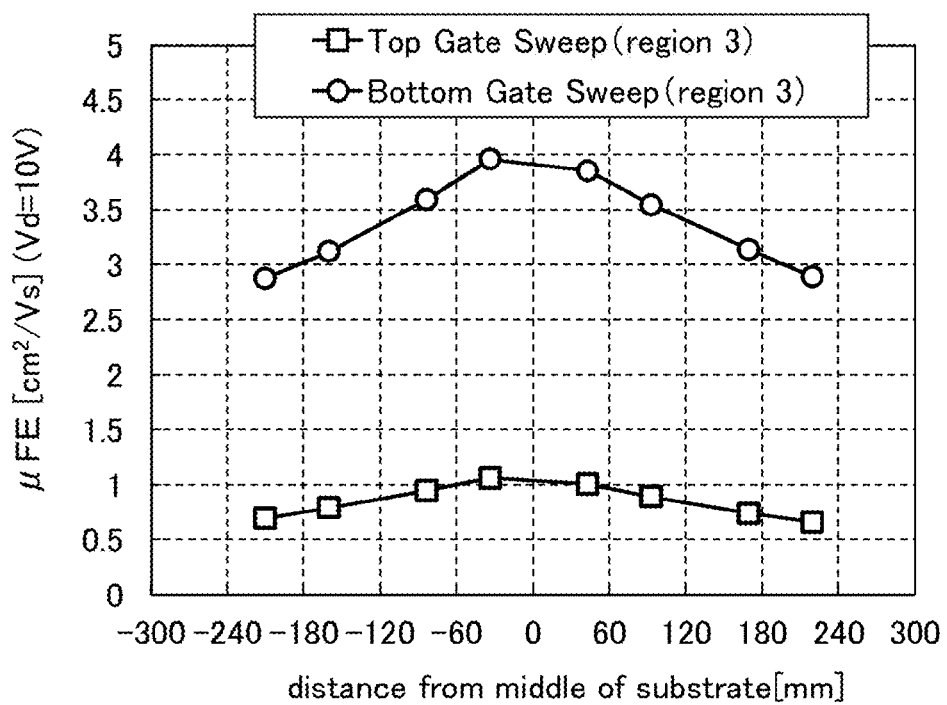
FIG. 14 is a graph showing in-plane distribution of field-effect mobilities of a transistor.

FIG. 14 shows the relationship between the field-effect mobility (μFE) obtained from the Id-Vg characteristics of the transistor and the distance from the middle of the substrate. Note that the field-effect mobility (μFE) was measured at Vd=10 V.

As can be seen in FIG. 14, in the transistor fabricated above, the field-effect mobility (μFE) tends to decrease from the vicinity of the middle of the substrate toward the outer edge of the substrate.

Figure 15:
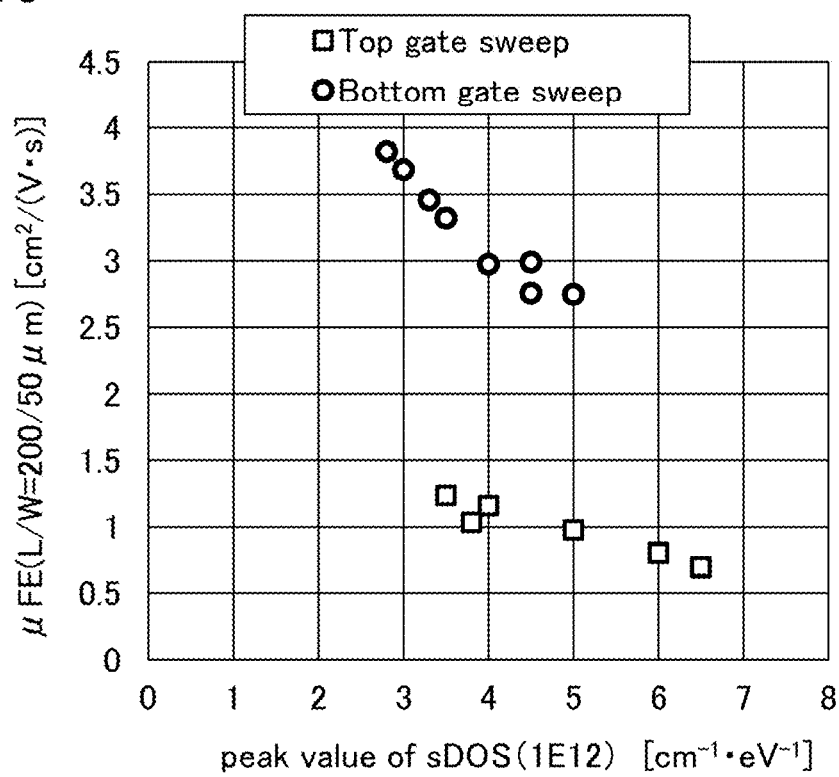
FIG. 15 is a graph showing a relationship between the density of shallow defect states and the field-effect mobility of a transistor.

Next, the correlation between the peak values of sDOS shown in FIG. 13 and the field-effect mobility shown in FIG. 14 was examined. FIG. 15 shows the correlation between the peak values of sDOS and the field-effect mobility. Note that in FIG. 15, the vertical axis represents the field-effect mobility (μFE) and the horizontal axis represents the peak values of sDOS.

As shown in FIG. 15, the field-effect mobility of the transistor tends to be high when the peak value of sDOS is small. This tendency is more notable in Bottom Gate Sweep. Therefore, a transistor can have high field-effect mobility by including an oxide semiconductor film in which the peak value of sDOS is less than $1 \times 10^{13}$ cm$^{-2}$ eV$^{-1}$, preferably less than $2 \times 10^{12}$ cm$^{-2}$ eV$^{-1}$, further preferably less than $1 \times 10^{10}$ cm$^{-2}$ eV$^{-1}$.

The structure described in this embodiment can be combined as appropriate with any of the other embodiments and the examples.

Embodiment 2

In this embodiment, details about the oxide semiconductor in Embodiment 1 are described with reference to FIGS. 16A to 16D, FIGS. 17A to 17D, FIGS. 18A to 18C, FIGS. 19A and 19B, FIG. 20, FIG. 21, FIGS. 22A to 22C, FIGS. 23A to 23F, FIGS. 24A to 24G, and FIGS. 25A to 25G.

<2-1. CAAC-OS>

First, a CAAC-OS will be described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a TEM, a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 16A:
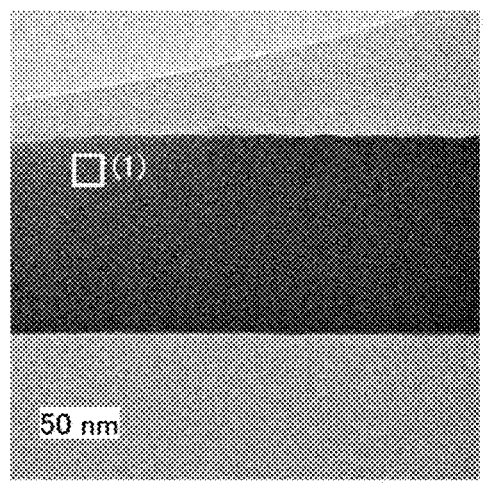
FIGS. 16A to 16D are Cs-corrected high-resolution TEM images of a cross section of a CAAC-OS and a schematic cross-sectional view of the CAAC-OS.

A CAAC-OS observed with a TEM is described below. FIG. 16A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 16B:
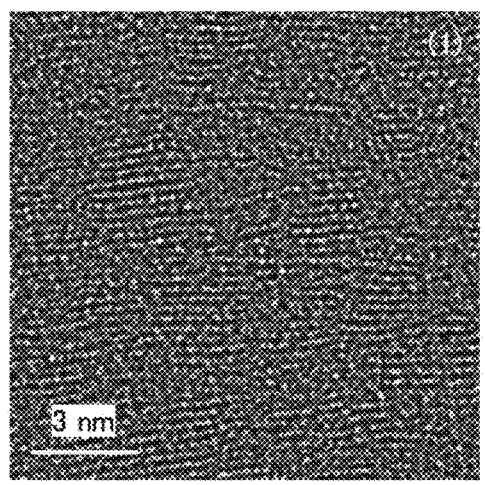

FIG. 16B is an enlarged Cs-corrected high-resolution TEM image of a region (1) in FIG. 16A. FIG. 16B shows that metal atoms are arranged in a layered manner in a pellet. Each metal atom layer has a configuration reflecting unevenness of a surface over which a CAAC-OS film is formed (hereinafter, the surface is referred to as a formation surface) or the top surface of the CAAC-OS film, and is arranged parallel to the formation surface or the top surface of the CAAC-OS film.

Figure 16C:
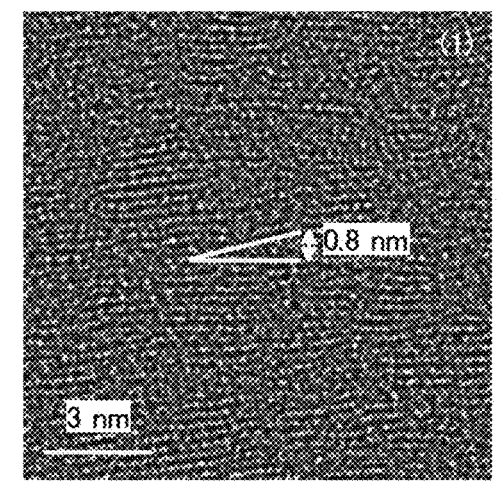

As shown in FIG. 16B, the CAAC-OS has a characteristic atomic arrangement. The characteristic atomic arrangement is denoted by an auxiliary line in FIG. 16C. FIGS. 16B and 16C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 16D:
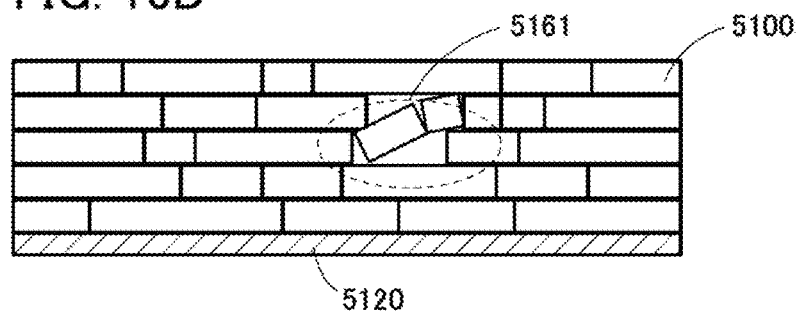

Here, according to the Cs-corrected high-resolution TEM images, the schematic arrangement of pellets 5100 of a CAAC-OS over a substrate 5120 is illustrated by such a structure in which bricks or blocks are stacked (see FIG. 16D). The part in which the pellets are tilted as observed in FIG. 16C corresponds to a region 5161 shown in FIG. 16D.

FIG. 17A shows a Cs-corrected high-resolution TEM image of a plane of the CAAC-OS observed from a direction substantially perpendicular to the sample surface. FIGS. 17B, 17C, and 17D are enlarged Cs-corrected high-resolution TEM images of regions (1), (2), and (3) in FIG. 17A, respectively. FIGS. 17B, 17C, and 17D indicate that metal atoms are arranged in a triangular, quadrangular, or hexagonal configuration in a pellet. However, there is no regularity of arrangement of metal atoms between different pellets.

Figure 18A:
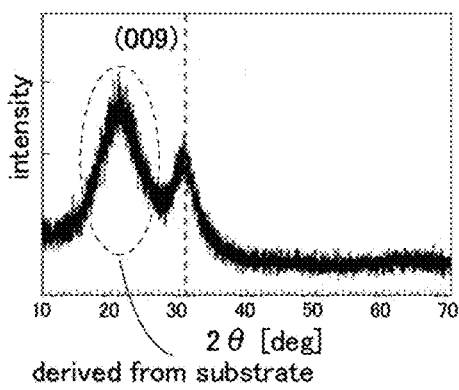
FIGS. 18A to 18C show structural analysis of a CAAC-OS and a single crystal oxide semiconductor by XRD.

Next, a CAAC-OS analyzed by XRD is described. For example, when the structure of a CAAC-OS including an InGaZnO$_4$ crystal is analyzed by an out-of-plane method, a peak appears at a diffraction angle (2θ) of around 31° as shown in FIG. 18A. This peak is assigned to the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 18B:
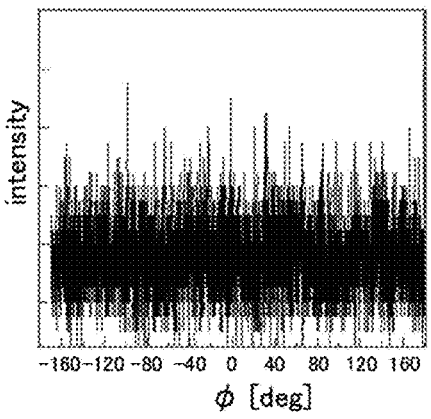
Figure 18C:
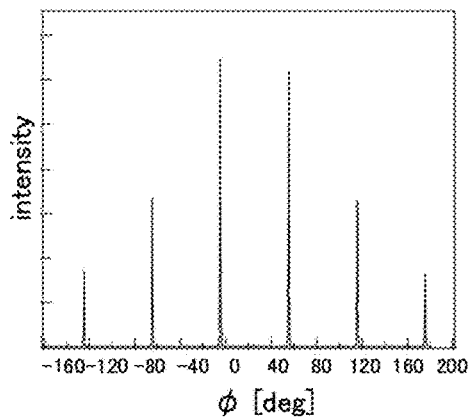

On the other hand, in structural analysis of the CAAC-OS by an in-plane method in which an X-ray beam is incident on a sample in a direction substantially perpendicular to the c-axis, a peak appears when 2θ is around 56°. This peak is assigned to the (110) plane of the InGaZnO$_4$ crystal. In the case of the CAAC-OS, when analysis (ϕ scan) is performed with 2θ fixed at around 56° and with the sample rotated using a normal vector to the sample surface as an axis (ϕ axis), as shown in FIG. 18B, a peak is not clearly observed. In contrast, in the case of a single crystal oxide semiconductor of InGaZnO$_4$, when ϕ scan is performed with 2θ fixed at around 56°, as shown in FIG. 18C, six peaks which are assigned to crystal planes equivalent to the (110) plane are observed. Accordingly, the structural analysis using XRD shows that the directions of the a-axes and b-axes are irregularly oriented in the CAAC-OS.

Figure 19A:
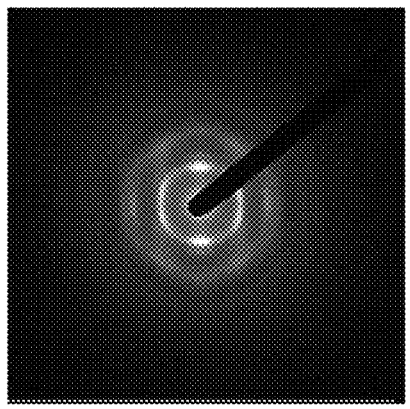
FIGS. 19A and 19B show electron diffraction patterns of a CAAC-OS.
Figure 19B:
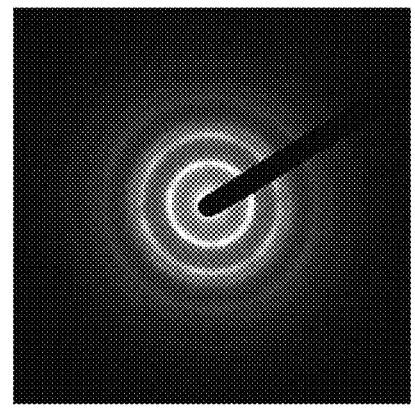

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 19A can be obtained. In this diffraction pattern, spots assigned to the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 19B shows a diffraction pattern obtained in such a manner that an electron beam with a probe diameter of 300 nm is incident on the same sample in a direction perpendicular to the sample surface. As shown in FIG. 19B, a ring-like diffraction pattern is observed. Thus, the electron diffraction also indicates that the a-axes and b-axes of the pellets included in the CAAC-OS do not have regular alignment. The first ring in FIG. 19B is considered to be assigned to the (010) plane, the (100) plane, and the like of the InGaZnO$_4$ crystal. The second ring in FIG. 19B is considered to be assigned to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/\text{cm}^3$, preferably lower than $1\times10^{11}/\text{cm}^3$, further preferably lower than $1\times10^{10}/\text{cm}^3$, and is higher than or equal to $1\times10^{-9}/\text{cm}^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<2-2. nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak indicating a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<2-3. A-Like OS>

An a-like OS has a structure between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 20:
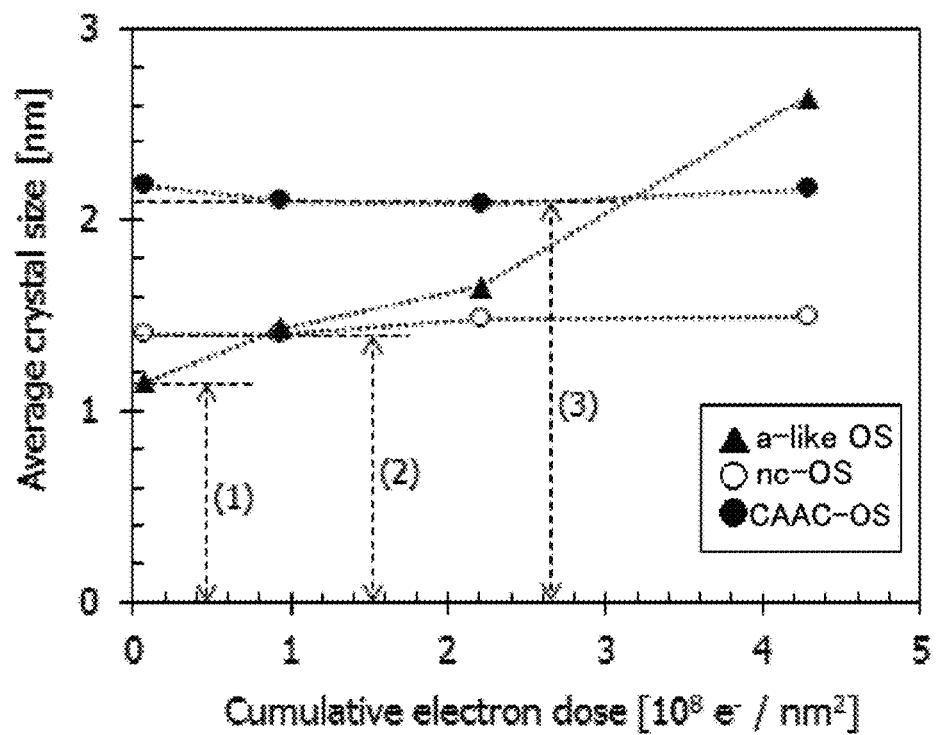
FIG. 20 shows a change in the crystal part of an In—Ga—Zn oxide induced by electron irradiation.

FIG. 20 shows change in the average size of crystal parts (at 22 points to 45 points) in each sample. Note that the crystal part size corresponds to the length of a lattice fringe. FIG. 20 indicates that the crystal part size in the a-like OS increases with an increase in the cumulative electron dose. Specifically, as shown by (1) in FIG. 20, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 20, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in an oxide semiconductor having an atomic ratio of In:Ga:Zn=1:1:1, the density of single crystal InGaZnO$_4$ with a rhombohedral crystal structure is 6.357 g/cm³. Accordingly, in the oxide semiconductor having an atomic ratio of In:Ga:Zn=1:1:1, the density of the a-like OS is higher than or equal to 5.0 g/cm³ and lower than 5.9 g/cm³. For example, in the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<2-4. Method for Forming CAAC-OS Film>

An example of a method for forming a CAAC-OS film will be described below.

Figure 21:
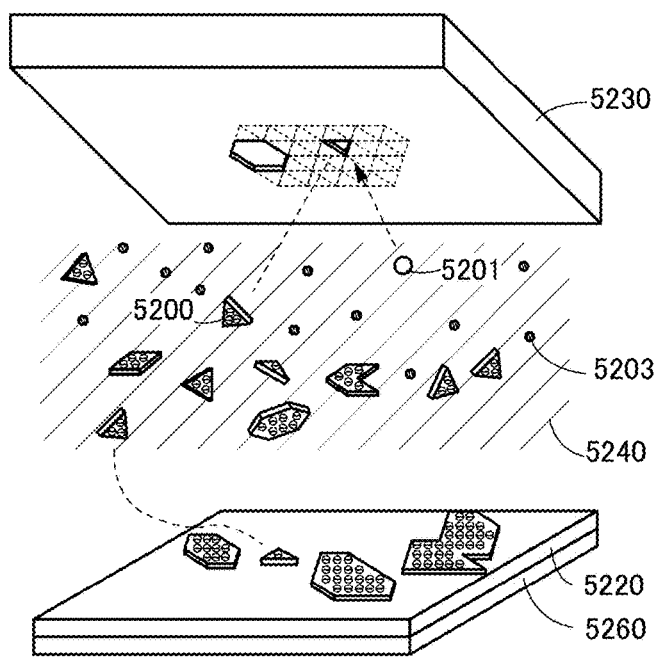
FIG. 21 illustrates a deposition method of a CAAC-OS.

FIG. 21 is a schematic view of the inside of a deposition chamber. The CAAC-OS film can be formed by a sputtering method.

As shown in FIG. 21, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets are arranged to face the target 5230 with the backing plate positioned therebetween. A sputtering method in which the deposition speed is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 volume % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 can be observed. The magnetic field forms a high-density plasma region in the vicinity of the target 5230. In the high-density plasma region, the deposition gas is ionized, so that an ion 5201 is generated. Examples of the ion 5201 include an oxygen cation ($O^+$) and an argon cation ($Ar^+$).

Figure 22A:
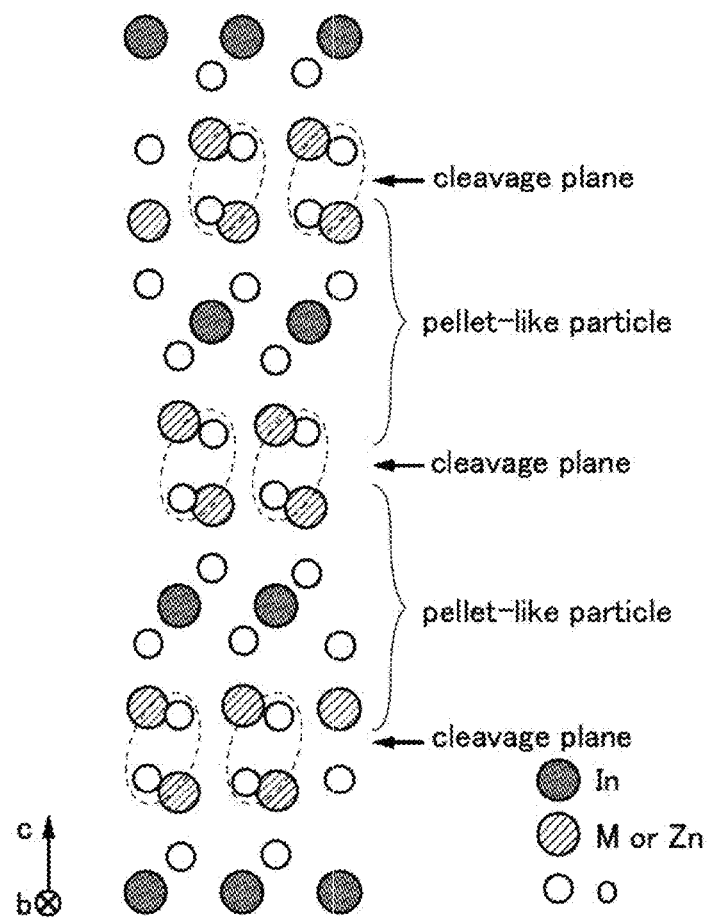
FIG. 22A to 22C illustrate a crystal of InMZnO$_4$.
Figure 22B:
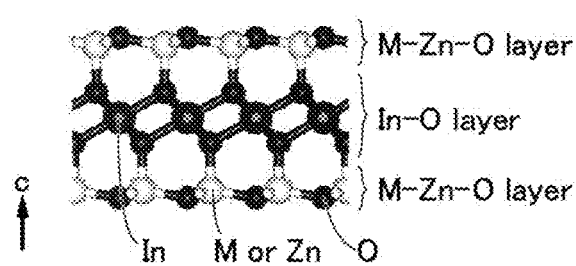
Figure 22C:
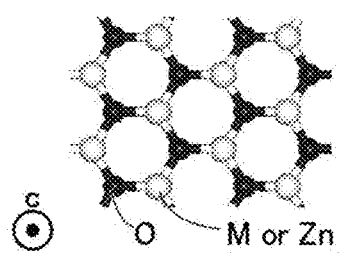

Here, the target 5230 has a polycrystalline structure which includes a plurality of crystal grains and in which a cleavage plane exists in any of the crystal grains. FIGS. 22A to 22C show a crystal structure of $InMZnO_4$ (the element M is Al, Ga, Y, or Sn, for example) included in the target 5230 as an example. Note that FIG. 22A illustrates the crystal structure of $InMZnO_4$ observed from a direction parallel to the b-axis. In the crystal of $InMZnO_4$, oxygen atoms are negatively charged, whereby repulsive force is generated between the two adjacent M-Zn—O layers. Thus, the $InMZnO_4$ crystal has a cleavage plane between the two adjacent M-Zn—O layers.

The ion 5201 generated in the high-density plasma region is accelerated toward the target 5230 side by an electric field, and then collides with the target 5230. At this time, a pellet 5200 which is a flat-plate-like or pellet-like sputtered particles is separated from the cleavage plane (FIG. 21). The pellet 5200 is between the two cleavage planes shown in FIG. 22A. Thus, when the pellet 5200 is observed, the cross-section thereof is as shown in FIG. 22B, and the top surface thereof is as shown in FIG. 22C. Note that the structure of the pellet 5200 may be distorted by an impact of collision of the ion 5201.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 100 nm, preferably greater than or equal to 2 nm and less than or equal to 50 nm, further preferably greater than or equal to 3 nm and less than or equal to 30 nm. For example, the ion 5201 collides with the target 5230 including the In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 may receive a charge when passing through the plasma 5240, so that surfaces thereof are negatively or positively charged. For example, the pellet 5200 receives a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particles 5203 that have passed through the plasma 5240 reach a surface of the substrate 5220. Note that some of the particles 5203 are discharged to the outside by a vacuum pump or the like because of their smallness in mass.

Next, deposition of the pellet 5200 and the particle 5203 over the surface of the substrate 5220 is described with reference to FIGS. 23A to 23F.

First, a first pellet 5200 is deposited over the substrate 5220. Since the pellet 5200 has a flat-plate-like shape, it is deposited so that the flat plane faces the surface of the substrate 5220. At this time, a charge on a surface of the pellet 5200 on the substrate 5220 side is lost through the substrate 5220.

Next, a second pellet 5200 reaches the substrate 5220. Since a surface of the first pellet 5200 and a surface of the second pellet 5200 are charged, they repel each other. As a result, the second pellet 5200 avoids being deposited over the first pellet 5200, and is deposited with its flat plane facing the surface of the substrate 5220 so as to be a little distance away from the first pellet 5200. With repetition of this, millions of the pellets 5200 are deposited on the surface of the substrate 5220 to have a thickness of one layer. A region where no pellet 5200 is deposited is generated between adjacent pellets 5200 (see FIG. 23A).

Then, the particles 5203 that have received energy from plasma reach the surface of the substrate 5220. The particles 5203 cannot be deposited on an active region such as the surfaces of the pellets 5200. For this reason, the particles 5203 move to regions where no pellet 5200 is deposited and are attached to side surfaces of the pellets 5200. Since available bonds of the particles 5203 are activated by energy received from plasma, the particles 5203 are chemically bonded to the pellets 5200 to form lateral growth portions 5202 (see FIG. 23B).

Figure 23A:
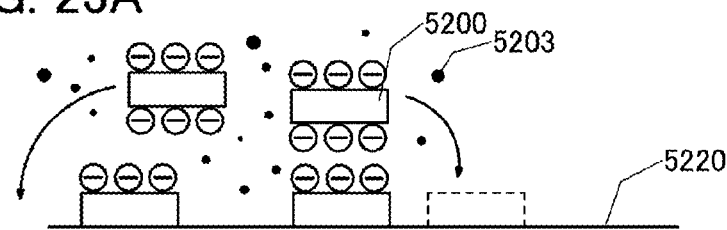
FIGS. 23A to 23F illustrate a deposition method of a CAAC-OS.
Figure 23B:
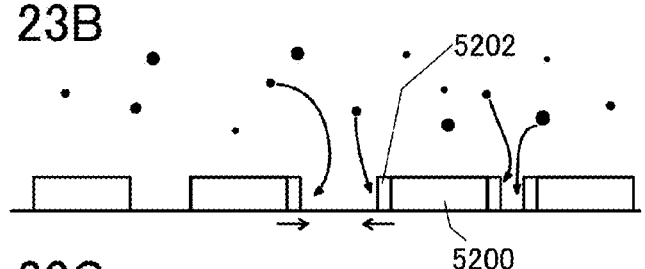
Figure 23C:
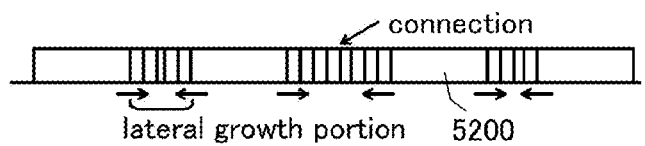

The lateral growth portions 5202 then further grow laterally so that the pellets 5200 are anchored to each other (see FIG. 23C). In this manner, the lateral growth portions 5202 are formed until they fill regions where no pellet 5200 is deposited. This mechanism is similar to a deposition mechanism for an atomic layer deposition (ALD) method.

Even when the deposited pellets 5200 are oriented in different directions, the particles 5203 cause a lateral growth to fill gaps between the pellets 5200; thus, no clear grain boundary is formed. In addition, as the particles 5203 make a smooth connection between the pellets 5200, a crystal structure different from single crystal and polycrystal structures is formed. In other words, a crystal structure including distortion between minute crystal regions (pellets 5200) is formed. Regions filling the gaps between the crystal regions are distorted crystal regions, and thus, it will be not appropriate to say that the regions have an amorphous structure.

Figure 23D:
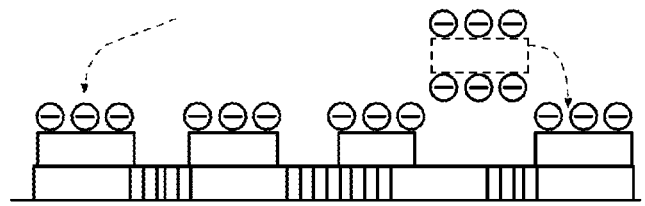
Figure 23E:
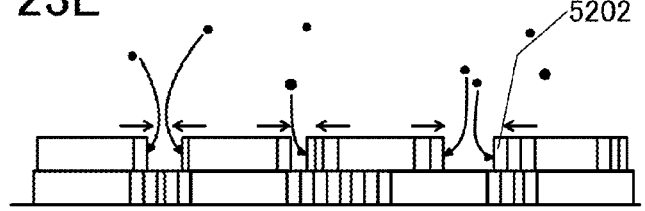
Figure 23F:
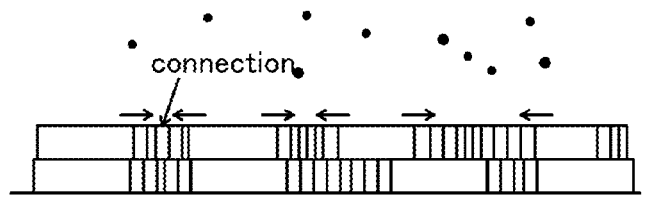

Next, new pellets 5200 are deposited with their flat planes facing the surface of the substrate 5220 (see FIG. 23D). After that, the particles 5203 are deposited so as to fill regions where no pellet 5200 is deposited, thereby forming the lateral growth portions 5202 (see FIG. 23E). In such a manner, the particles 5203 are attached to side surfaces of the pellets 5200 and the lateral growth portions 5202 cause a lateral growth so that the pellets 5200 in the second layer are anchored to each other (see FIG. 23F). Deposition continues until the m-th layer (m is an integer of two or more) is formed; as a result, a stacked-layer thin film structure is formed.

A deposition way of the pellets 5200 changes according to the surface temperature of the substrate 5220 or the like. For example, if the surface temperature of the substrate 5220 is high, migration of the pellets 5200 occurs over the surface of the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. Therefore, even when a large-sized substrate of the 8th generation or more is used as the substrate 5220, a warp or the like due to the deposition of the CAAC-OS hardly occurs.

In contrast, if the surface temperature of the substrate 5220 is low, the migration of the pellets 5200 over the substrate 5220 does not easily occur. As a result, the pellets 5200 are stacked to form an nc-OS or the like with low orientation. In the nc-OS, the pellets 5200 are possibly deposited with certain gaps because the pellets 5200 are negatively charged. Therefore, the nc-OS has low orientation but some regularity, and thus it has a denser structure than an amorphous oxide semiconductor.

When spaces between pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets are considered to be deposited on the surface of the substrate according to such a deposition model. A CAAC-OS can be deposited even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS can be formed.

In addition, even when the surface of the substrate (formation surface) has an uneven shape, the pellets are aligned along the shape.

The above-described deposition model suggests that a CAAC-OS with high crystallinity can be formed in the following manner: deposition is performed in a high vacuum to have a long mean free path, plasma energy is weakened to reduce damage around a substrate, and thermal energy is applied to a formation surface to repair damage due to plasma during deposition.

The above-described deposition model can be used not only for the case where a target has a polycrystalline structure of a composite oxide with a plurality of crystal grains, such as an In-M-Zn oxide, and any of the crystal grains have a cleavage plane; but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around a target. Because of the high electric field region of plasma, atomic particles separated from the target are anchored to each other to cause a lateral growth. For example, indium atoms, which are atomic particles, are anchored to each other and cause a lateral growth to be a nanocrystal formed of an In—O layer, and then an M-Zn—O layer is bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the targets are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

<2-5. Lateral Growth>

The following description explains that a lateral growth occurs when the particles 5203 are attached to (bonded to or adsorbed on) the pellet 5200 laterally.

FIGS. 24A to 24E illustrate a structure of the pellet 5200 and positions to which metal ions can be attached. A model assumed as the pellet 5200 is a cluster model with 84 atoms extracted from an InMZnO$_4$ crystal structure with a constant stoichiometric composition. The case where the element M is Ga is described below. FIG. 24F illustrates a structure of the pellet 5200 seen in the direction parallel to the c-axis. FIG. 24G illustrates a structure of the pellet 5200 seen in the direction parallel to the a-axis.

The positions to which metal ions can be attached are represented as a position A, a position B, a position a, a position b, and a position c. The position A is an upper part of an interstitial site surrounded by one gallium atom and two zinc atoms on the top surface of the pellet 5200. The position B is an upper part of an interstitial site surrounded by two gallium atoms and one zinc atom on the top surface of the pellet 5200. The position a is in an indium site on a side surface of the pellet 5200. The position b is in an interstitial site between an In—O layer and a Ga—Zn—O layer on a side surface of the pellet 5200. The position c is in a gallium site on a side surface of the pellet 5200.

The relative energy was estimated from first principles calculation in each case where a metal ion was located in the assumed position (the position A, the position B, the position a, the position b, or the position c). In the calculation, first principles calculation software VASP (Vienna Ab initio Simulation Package) was used. For the exchange-correlation potential, Perdew-Burke-Ernzerhof (PBE) type generalized gradient approximation (GGA) was used, and for the ion potential, a projector augmented wave (PAW) method was used. The cut-off energy was 400 eV, and Γ-only k-point sampling was used. Table 2 shows the relative energies in the case where an indium ion ($In^{3+}$), a gallium ion ($Ga^{3+}$), and a zinc ion ($Zn^{2+}$) are located at the position A, the position B, the position a, the position b, and the position c. Note that the relative energy is a relative value under the condition where the energy of the model with the lowest energy among the calculated models is set to 0 eV.

TABLE 2

| | Relative Energy [eV] | | | | |
| --- | --- | --- | --- | --- | --- |
| | Top surface of pellet | | Side surface of pellet | | |
| Ion | A | B | a | b | c |
| $In^{3+}$ | 2.1 | 1.5 | 0.0 | 1.8 | 1.9 |
| $Ga^{3+}$ | 3.7 | 3.0 | 0.6 | 0.0 | 3.5 |
| $Zn^{2+}$ | 2.3 | 1.8 | 0.0 | 0.6 | 2.9 |

It is found that any metal ion is more likely to be attached to the side surface of the pellet 5200 than to the top surface thereof. It is also found that a zinc ion as well as an indium ion is most likely to be attached to the indium site at the position a.

Figure 25A:
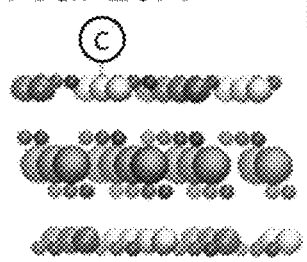
FIGS. 25A to 25G illustrate positions to which particles can be attached in a pellet.
Figure 25B:
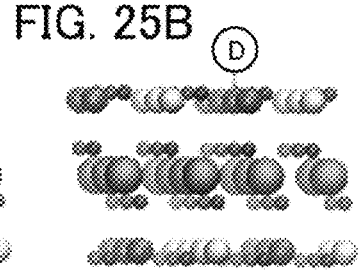
Figure 25C:
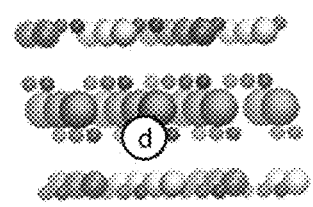
Figure 25D:
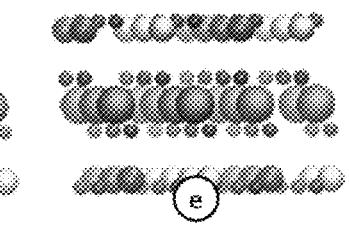
Figure 25E:
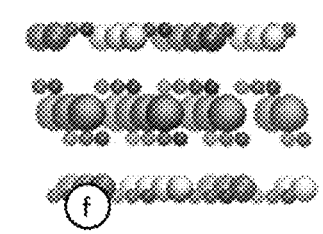
Figure 25F:
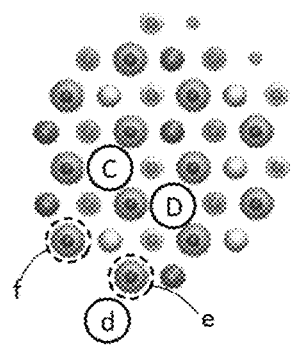
Figure 25G:
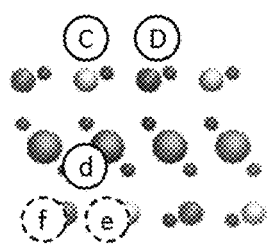

Ease of oxygen ion ($O^{2-}$) attachment to the pellet 5200 was examined. FIGS. 25A to 25E illustrate a structure of the pellet 5200 and positions to which oxygen ions can be attached. FIG. 25F illustrates a structure of the pellet 5200 seen in the direction parallel to the c-axis. FIG. 25G illustrates a structure of the pellet 5200 seen in the direction parallel to the b-axis.

The positions to which oxygen ions can be attached are represented as a position C, a position D, a position d, a position e, and a position f In the position C, an oxygen ion is bonded to gallium on the top surface of the pellet 5200. In the position D, an oxygen ion is bonded to zinc on the top surface of the pellet 5200. In the position d, an oxygen ion is bonded to indium on a side surface of the pellet 5200. In the position e, an oxygen ion is bonded to gallium on a side surface of the pellet 5200. In the position f, an oxygen ion is bonded to zinc on a side surface of the pellet 5200.

The relative energy was estimated from first principles calculation in each case where an oxygen ion was located in the assumed position (the position C, the position D, the position d, the position e, or the position f). Table 3 shows the relative energies in the case where oxygen ions ($O^{2-}$) are located at the position C, the position D, the position d, the position e, and the position f.

TABLE 3

| | Relative Energy [eV] | | | | |
| --- | --- | --- | --- | --- | --- |
| | Top surface of pellet | | Side surface of pellet | | |
| Ion | C | D | d | e | f |
| $O^{2-}$ | 3.9 | 3.6 | 0.0 | 0.5 | 1.5 |

It is found that the oxygen ion is also likely to be attached to the side surface of the pellet 5200 than to the top surface thereof.

According to the above, the particle 5203 that has approached the pellet 5200 is preferentially attached to the side surface of the pellet 5200. This suggests that the deposition model in which a lateral growth of the pellet 5200 occurs when the particles 5203 are attached to the side surface of the pellet 5200 has high validity.

Note that the structure described in this embodiment can be combined as appropriate with any of the structures described in the other embodiments and the examples.

Embodiment 3

In this embodiment, semiconductor devices including the oxide semiconductor film of one embodiment of the present invention, and manufacturing methods thereof will be described with reference to FIGS. 26A to 26C, FIGS. 27A to 27C, FIGS. 28A to 28C, FIGS. 29A to 29C, FIGS. 30A to 30D, FIGS. 31A and 31B, FIGS. 32A to 32D, FIGS. 33A to 33F, FIGS. 34A to 34F, FIGS. 35A to 35F, FIGS. 36A and 36B, FIGS. 37A to 37F, and FIGS. 38A to 38F.

<3-1. Structural Example of Semiconductor Device>

Figure 26A:
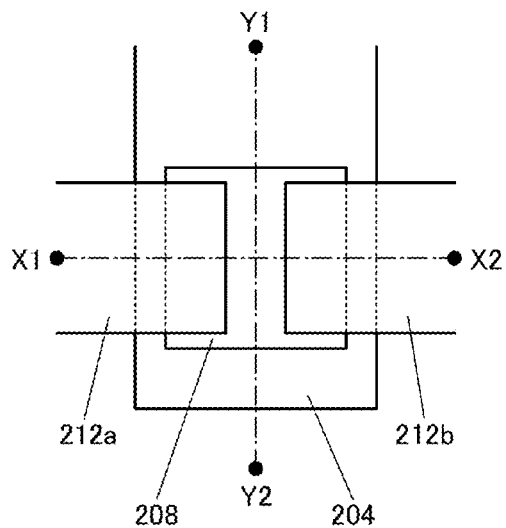
FIGS. 26A to 26C are a top view and cross-sectional views illustrating an example of a semiconductor device.
Figure 26B:
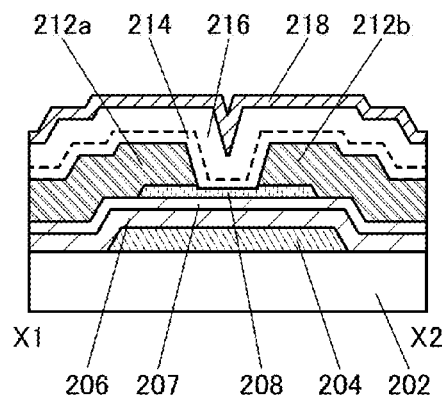
Figure 26C:
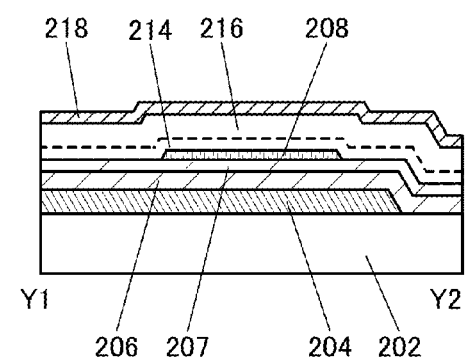

FIG. 26A is a plan view of a transistor 200 that is a semiconductor device of one embodiment of the present invention. FIG. 26B is a cross-sectional view taken along a dashed-dotted line X1-X2 in FIG. 26A, and FIG. 26C is a cross-sectional view taken along a dashed-dotted line Y1-Y2 in FIG. 26A. Note that in FIG. 26A, some components of the transistor 200 (e.g., an insulating film serving as a gate insulating film) are not illustrated to avoid complexity. Furthermore, the direction of the dashed-dotted line X1-X2 may be referred to as a channel length direction, and the direction of the dashed-dotted line Y1-Y2 may be referred to as a channel width direction. As in FIG. 26A, some components are not illustrated in some cases in top views of transistors described below.

The transistor 200 includes a conductive film 204 functioning as a gate electrode over a substrate 202, an insulating film 206 over the substrate 202 and the conductive film 204, an insulating film 207 over the insulating film 206, an oxide semiconductor film 208 over the insulating film 207, a conductive film 212a functioning as a source electrode electrically connected to the oxide semiconductor film 208, and a conductive film 212b functioning as a drain electrode electrically connected to the oxide semiconductor film 208. Over the transistor 200, specifically, over the conductive films 212a and 212b and the oxide semiconductor film 208, an insulating film 214, an insulating film 216, and an insulating film 218 are provided. The insulating films 214, 216, and 218 function as protective insulating films for the transistor 200.

Furthermore, the insulating films 206 and 207 function as gate insulating films of the transistor 200.

As the oxide semiconductor film 208, the oxide semiconductor film described in Embodiment 1 can be used. Since the oxide semiconductor film of one embodiment of the present invention has high crystallinity, the highly reliable transistor 200 can be provided.

Components of the semiconductor device of this embodiment will be described below in detail.

<<Substrate>>

There is no particular limitation on a material and the like of the substrate 202 as long as the material has heat resistance high enough to withstand at least heat treatment to be performed later. For example, a glass substrate, a ceramic substrate, a quartz substrate, a sapphire substrate, or the like may be used as the substrate 202. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 202. Further alternatively, any of these substrates provided with a semiconductor element may be used as the substrate 202. In the case where a glass substrate is used as the substrate 202, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Such a large-sized substrate is preferably used because the manufacturing cost can be reduced.

Alternatively, a flexible substrate may be used as the substrate 202, and the transistor 200 may be provided directly on the flexible substrate. Further alternatively, a separation layer may be provided between the substrate 202 and the transistor 200. The separation layer can be used when part or the whole of a semiconductor device formed over the separation layer is completed and separated from the substrate 202 and transferred to another substrate. In such a case, the transistor 200 can be transferred to a substrate having low heat resistance or a flexible substrate as well.

<<Conductive Films Functioning as Gate Electrode, Source Electrode, and Drain Electrode>>

The conductive film 204 functioning as a gate electrode, the conductive film 212a functioning as a source electrode, and the conductive film 212b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

The conductive films 204, 212a, and 212b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 204, 212a, and 212b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 204, 212a, and 212b. Use of a Cu—X alloy film enables the manufacturing cost to be reduced because wet etching process can be used in the processing.

It is especially favorable that the conductive films 204, 212a, and 212b include at least one of titanium, tungsten, tantalum, and molybdenum. When the conductive films 204, 212a, and 212b include at least one of titanium, tungsten, tantalum, and molybdenum, copper in the conductive films 204, 212a, and 212b can be prevented from being diffused to the outside, so that a function of what is called a barrier metal can be obtained.

Furthermore, the conductive films 204, 212a, and 212b preferably include a nitride containing tantalum or a nitride containing titanium. Such a nitride has conductivity and a high barrier property against copper or hydrogen. In addition, a film of such a nitride releases little hydrogen and can be favorably used as a metal in contact with the oxide semiconductor film.

<<Insulating Film Functioning as Gate Insulating Film>>

As each of the insulating films 206 and 207 functioning as gate insulating films of the transistor 200, an insulating layer including at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of the stacked-layer structure of the insulating films 206 and 207, an insulating film of a single layer formed using a material selected from the above or an insulating film of three or more layers may be used.

The insulating film 206 functions as a blocking film which inhibits penetration of oxygen. For example, in the case where excess oxygen is supplied to the insulating film 207, the insulating film 214, the insulating film 216, and/or the oxide semiconductor film 208, the insulating film 206 can inhibit penetration of oxygen.

Note that the insulating film 207 that is in contact with the oxide semiconductor film 208 functioning as a channel region of the transistor 200 is preferably an oxide insulating film and preferably includes a region including oxygen in excess of the stoichiometric composition (oxygen-excess region). In other words, the insulating film 207 is an insulating film capable of releasing oxygen. In order to provide the oxygen-excess region in the insulating film 207, the insulating film 207 is formed in an oxygen atmosphere, for example. Alternatively, the oxygen-excess region may be formed by introduction of oxygen into the insulating film 207 after the deposition. As a method for introducing oxygen, an ion implantation method, an ion doping method, a plasma immersion ion implantation method, plasma treatment, or the like may be employed.

In the case where hafnium oxide is used as the insulating film 207, the following effect is attained. Hafnium oxide has a higher dielectric constant than silicon oxide and silicon oxynitride. Therefore, by using hafnium oxide, the thickness of the insulating film 207 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 206, and a silicon oxide film is formed as the insulating film 207. The silicon nitride film has a higher dielectric constant than a silicon oxide film and needs a larger thickness for capacitance equivalent to that of the silicon oxide film. Thus, when the silicon nitride film is included as the gate insulating film of the transistor 200, the thickness of the insulating film can be physically increased. This makes it possible to reduce a decrease in withstand voltage of the transistor 200 and furthermore to increase the withstand voltage, thereby reducing electrostatic discharge damage to the transistor 200.

<<Oxide Semiconductor Film>>

As the oxide semiconductor film 208, the oxide semiconductor film of one embodiment of the present invention described in Embodiment 1 can be used.

The energy gap of the oxide semiconductor film 208 is 2 eV or more, preferably 2.5 eV or more, further preferably 3 eV or more. The use of an oxide semiconductor having such a wide energy gap can reduce off-state current of the transistor 200.

An oxide semiconductor film with low carrier density is used as the oxide semiconductor film 208. For example, an oxide semiconductor film whose carrier density is lower than $8\times10^{11}/cm^3$, preferably lower than $1\times10^{11}/cm^3$, or further preferably lower than $1\times10^{10}/cm^3$, and greater than or equal to $1\times10^{-9}/cm^3$ is used as the oxide semiconductor film 208.

Note that, without limitation to those described above, an oxide semiconductor with an appropriate composition may be used for the oxide semiconductor film 208 depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 208 be set to be appropriate.

Note that it is preferable to use, as the oxide semiconductor film 208, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, iron, nickel, silicon, and the like are given.

Hydrogen included in the oxide semiconductor film 208 reacts with oxygen bonded to a metal atom to be water, and also causes oxygen vacancies in a lattice from which oxygen is released (or a portion from which oxygen is released). Due to entry of hydrogen into the oxygen vacancies, electrons serving as carriers are generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 208. Specifically, the hydrogen concentration of the oxide semiconductor film 208, which is measured by secondary ion mass spectrometry (SIMS), is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$. In other words, the oxide semiconductor film 208 includes a region whose hydrogen concentration measured by SIMS is lower than $1\times10^{20}$ atoms/$cm^3$.

When silicon or carbon that is one of elements belonging to Group 14 is contained in the oxide semiconductor film 208, oxygen vacancies are increased in the oxide semiconductor film 208, and the oxide semiconductor film 208 becomes an n-type film. Thus, the concentration of silicon or carbon (the concentration is measured by SIMS) in the oxide semiconductor film 208 or the concentration of silicon or carbon (the concentration is measured by SIMS) in the vicinity of an interface with the oxide semiconductor film 208 is set to be lower than or equal to $2\times10^{18}$ atoms/cm$^3$, preferably lower than or equal to $2\times10^{17}$ atoms/cm$^3$.

When the oxide semiconductor film 208 contains alkali metal or alkaline earth metal, the alkali metal or the alkaline earth metal and oxygen or the like contained in the oxide semiconductor film are bonded to each other, so that carriers are generated in some cases. Thus, a transistor including an oxide semiconductor film which contains alkali metal or alkaline earth metal is likely to be normally on. Therefore, it is preferable to reduce the concentration of alkali metal or alkaline earth metal of the oxide semiconductor film 208. Specifically, the concentration of alkali metal or alkaline earth metal of the oxide semiconductor film 208, which is measured by SIMS, is lower than or equal to $1\times10^{18}$ atoms/cm$^3$, preferably lower than or equal to $2\times10^{16}$ atoms/cm$^3$.

In some cases, iron, nickel, and silicon contained in the oxide semiconductor film 208 are bonded to oxygen or the like contained in the oxide semiconductor film, so that carriers are generated. Thus, a transistor including an oxide semiconductor film which contains iron, nickel, and silicon is likely to be normally on. Therefore, it is preferable to reduce the concentrations of iron, nickel, and silicon of the oxide semiconductor film 208 are preferably reduced. For example, the total concentration of impurities, i.e., iron, nickel, and silicon in the oxide semiconductor film 208 may be lower than 0.03 atomic %.

When the oxide semiconductor film 208 contains nitrogen, the oxide semiconductor film 208 easily becomes n-type by generation of electrons serving as carriers and an increase of carrier density. A transistor including an oxide semiconductor film which contains nitrogen is likely to be normally-on. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

<<Insulating Film Functioning as Protective Insulating Film of Transistor>>

The insulating films 214 and 216 each have a function of supplying oxygen to the oxide semiconductor film 208. The insulating film 218 functions as a protective insulating film for the transistor 200. The insulating films 214 and 216 contain oxygen. Furthermore, the insulating film 214 is an insulating film which is permeable to oxygen. Note that the insulating film 214 serves also as a film which relieves damage to the oxide semiconductor film 208 at the time of forming the insulating film 216 later.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 214.

In addition, it is preferable that the number of defects in the insulating film 214 be small; as a typical example, the spin density corresponding to a signal that appears at around g=2.001 due to a dangling bond of silicon be lower than or equal to $3\times10^{17}$ spins/cm$^3$ by electron spin resonance (ESR) measurement. This is because if the density of defects in the insulating film 214 is high, oxygen is bonded to the defects and the amount of oxygen that passes through the insulating film 214 is decreased.

Note that not all oxygen entering the insulating film 214 from the outside move to the outside of the insulating film 214 and some oxygen remains in the insulating film 214. Furthermore, movement of oxygen occurs in the insulating film 214 in some cases in such a manner that oxygen enters the insulating film 214 and oxygen contained in the insulating film 214 moves to the outside of the insulating film 214. When an oxide insulating film which is permeable to oxygen is formed as the insulating film 214, oxygen released from the insulating film 216 provided over the insulating film 214 can be moved to the oxide semiconductor film 208 through the insulating film 214.

The insulating film 214 can be formed using an oxide insulating film having a low density of states due to nitrogen oxide. Note that the density of states due to nitrogen oxide can be formed between the valence band maximum ($E_{v\_os}$) and the conduction band minimum ($E_{c\_os}$) of the oxide semiconductor film. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film which releases ammonia more than nitrogen oxide in thermal desorption spectroscopy analysis; as a typical example, the amount of released ammonia molecules is greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes a temperature higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typified by NO$_2$ or NO, forms levels in the insulating film 214, for example. The level is positioned in the energy gap of the oxide semiconductor film 208. Therefore, when nitrogen oxide is diffused to the interface between the insulating film 214 and the oxide semiconductor film 208, an electron is in some cases trapped by the level on the insulating film 214 side. As a result, the trapped electron remains in the vicinity of the interface between the insulating film 214 and the oxide semiconductor film 208; thus, the threshold voltage of the transistor is shifted in the positive direction.

Nitrogen oxide reacts with ammonia and oxygen in heat treatment. Since nitrogen oxide contained in the insulating film 214 reacts with ammonia contained in the insulating film 216 in heat treatment, nitrogen oxide contained in the insulating film 214 is reduced. Therefore, an electron is hardly trapped at the interface between the insulating film 214 and the oxide semiconductor film 208.

With such an oxide insulating film, the insulating film 214 can reduce the shift in the threshold voltage of the transistor, which leads to a smaller change in the electrical characteristics of the transistor.

Note that in an ESR spectrum at 100 K or lower of the insulating film 214 subjected to heat treatment of a manufacturing process of the transistor, typically, heat treatment at a temperature lower than 400° C. or lower than 375° C. (preferably higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller the amount of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 216 is formed using an oxide insulating film that contains oxygen at a higher proportion than oxygen in the stoichiometric composition. Part of oxygen is released by heating from the oxide insulating film containing more oxygen than that in the stoichiometric composition. The oxide insulating film containing oxygen in excess of that in the stoichiometric composition is an oxide insulating film in which the amount of released oxygen converted into oxygen atoms is greater than or equal to $1.0 \times 10^{19}$ atoms/cm$^2$, preferably greater than or equal to $3.0 \times 10^{20}$ atoms/cm$^2$ in thermal desorption spectroscopy (TDS). Note that the surface temperature of the film in the TDS is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 216.

It is preferable that the amount of defects in the insulating film 216 be small; as a typical example, the spin density corresponding to a signal which appears at g=2.001 due to a dangling bond of silicon be lower than $1.5 \times 10^{18}$ spins/cm$^3$, further preferably lower than or equal to $1 \times 10^{18}$ spins/cm$^3$ by ESR measurement. Note that the insulating film 216 is provided more apart from the oxide semiconductor film 208 than the insulating film 214 is; thus, the insulating film 216 may have higher defect density than the insulating film 214.

Furthermore, the insulating films 214 and 216 can be formed using insulating films formed of the same kinds of materials; thus, a boundary between the insulating films 214 and 216 cannot be clearly observed in some cases. Thus, in this embodiment, the boundary between the insulating films 214 and 216 is shown by a dashed line. Although a two-layer structure of the insulating films 214 and 216 is described in this embodiment, the present invention is not limited to this structure. For example, a single-layer structure of either one of the insulating films 214 and 216 may be employed.

The insulating film 218 has a function of blocking oxygen, hydrogen, water, alkali metal, alkaline earth metal, or the like. It is possible to prevent outward diffusion of oxygen from the oxide semiconductor film 208, outward diffusion of oxygen included in the insulating films 214 and 216, and entry of hydrogen, water, or the like into the oxide semiconductor film 208 from the outside by providing the insulating film 218.

As the insulating film 218, a nitride insulating film can be used, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

<3-2. Structural Example of Semiconductor Device>

A structure example different from that of the transistor 200 in FIGS. 26A to 26C is described with reference to FIGS. 27A to 27C.

Figure 27A:
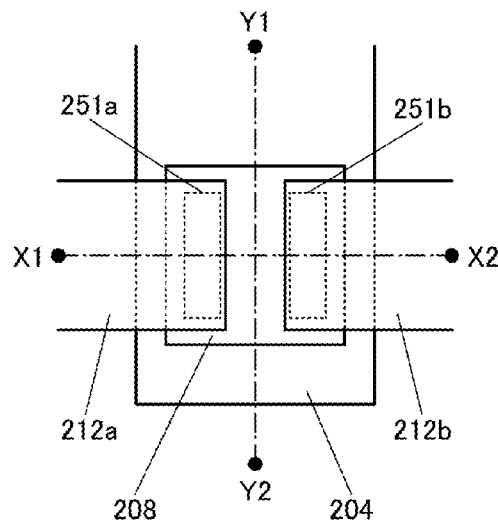
FIGS. 27A to 27C are a top view and cross-sectional views illustrating an example of a semiconductor device.

FIG. 27A is a top view of a transistor 250 that is a semiconductor device of one embodiment of the present invention. FIG. 27B is a cross-sectional view taken along dashed-dotted line X1-X2 in FIG. 27A, and FIG. 27C is a cross-sectional view taken along dashed-dotted line Y1-Y2 in FIG. 27A.

The transistor 250 includes the conductive film 204 functioning as a gate electrode over the substrate 202, the insulating film 206 over the substrate 202 and the conductive film 204, the insulating film 207 over the insulating film 206, the oxide semiconductor film 208 over the insulating film 207, the insulating films 214 and 216 over the oxide semiconductor film 208, the conductive film 212a functioning as a source electrode electrically connected to the oxide semiconductor film 208 through an opening 251a provided in the insulating films 214 and 216, and the conductive film 212b functioning as a drain electrode electrically connected to the oxide semiconductor film 208 through an opening 251b provided in the insulating films 214 and 216. Over the transistor 250, specifically over the conductive films 212a and 212b and the insulating film 216, the insulating film 218 is provided. The insulating films 214 and 216 function as protective insulating films for the oxide semiconductor film 208. The insulating film 218 functions as a protective insulating film for the transistor 250.

Figure 27B:
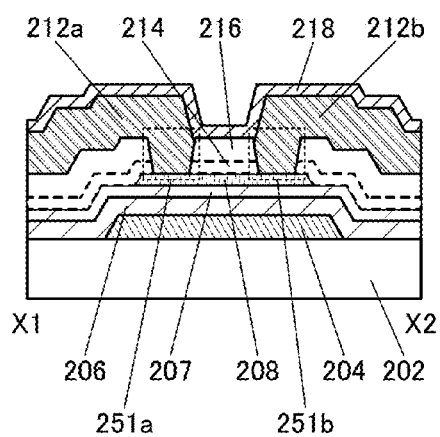
Figure 27C:
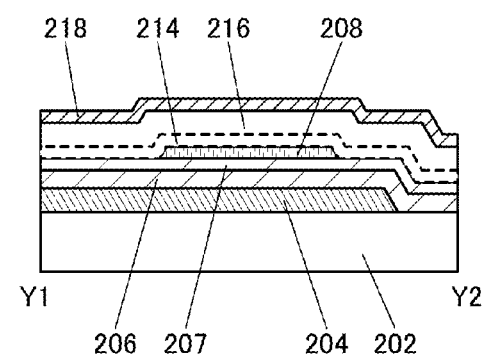

Although the transistor 200 has a channel-etched structure, the transistor 250 in FIGS. 27A to 27C has a channel-protective structure. Thus, the oxide semiconductor film of one embodiment of the present invention can be used in either the channel-etched transistor or the channel-protective transistor. The other components are the same as those of the transistor 200 and a similar effect can be obtained.

<3-3. Structural Example of Semiconductor Device>

A structure example different from that of the transistor 250 in FIGS. 27A to 27C is described with reference to FIGS. 28A to 28C.

Figure 28A:
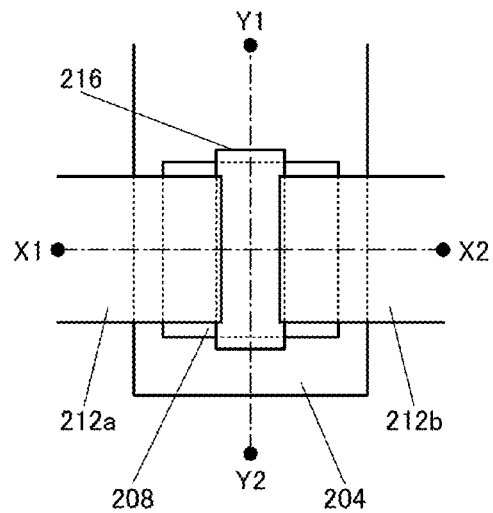
FIGS. 28A to 28C are a top view and cross-sectional views illustrating an example of a semiconductor device.

FIG. 28A is a top view of a transistor 260 that is a semiconductor device of one embodiment of the present invention. FIG. 28B is a cross-sectional view taken along dashed-dotted line X1-X2 illustrated in FIG. 28A, and FIG. 28C is a cross-sectional view taken along dashed-dotted line Y1-Y2 illustrated in FIG. 28A.

The transistor 260 includes the conductive film 204 functioning as a gate electrode over the substrate 202, the insulating film 206 over the substrate 202 and the conductive film 204, the insulating film 207 over the insulating film 206, the oxide semiconductor film 208 over the insulating film 207, the insulating films 214 and 216 over the oxide semiconductor film 208, the conductive film 212*a* functioning as a source electrode electrically connected to the oxide semiconductor film 208, and the conductive film 212*b* functioning as a drain electrode electrically connected to the oxide semiconductor film 208. Over the transistor 260, specifically over the conductive films 212*a* and 212*b* and the insulating film 216, the insulating film 218 is provided. The insulating films 214 and 216 function as protective insulating films for the oxide semiconductor film 208. The insulating film 218 functions as a protective insulating film for the transistor 260.

The transistor 260 is different from the transistor 250 illustrated in FIGS. 27A to 27C in the shape of the insulating films 214 and 216. Specifically, the insulating films 214 and 216 of the transistor 260 have an island shape over a channel region of the oxide semiconductor film 208. The other components are the same as those of the transistor 250, and a similar effect is obtained.

<3-4. Structural Example of Semiconductor Device>

A structure example different from that of the transistor 200 in FIGS. 26A to 26C is described with reference to FIGS. 29A to 29C.

Figure 29A:
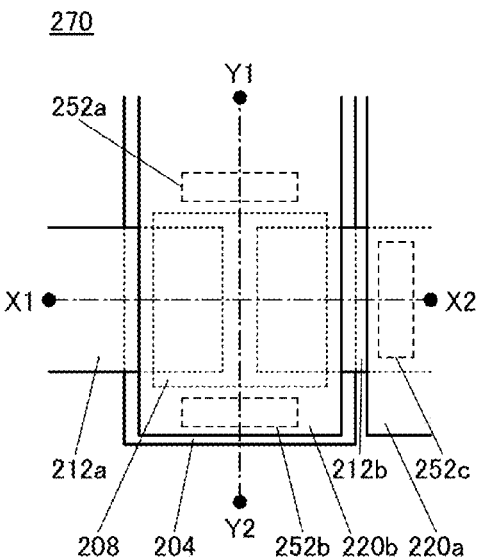
FIGS. 29A to 29C are a top view and cross-sectional views illustrating an example of a semiconductor device.

FIG. 29A is a top view of a transistor 270 that is a semiconductor device of one embodiment of the present invention. FIG. 29B is a cross-sectional view taken along dashed-dotted line X1-X2 in FIG. 29A, and FIG. 29C is a cross-sectional view taken along dashed-dotted line Y1-Y2 in FIG. 29A.

The transistor 270 includes the conductive film 204 functioning as a first gate electrode over the substrate 202, the insulating film 206 over the substrate 202 and the conductive film 204, the insulating film 207 over the insulating film 206, the oxide semiconductor film 208 over the insulating film 207, the insulating films 214 and 216 over the oxide semiconductor film 208, the conductive film 212*a* functioning as a source electrode electrically connected to the oxide semiconductor film 208, the conductive film 212*b* functioning as a drain electrode electrically connected to the oxide semiconductor film 208, the insulating film 218 over the conductive films 212*a* and 212*b* and the insulating film 216, and conductive films 220*a* and 220*b* over the insulating film 218.

In the transistor 270, the insulating films 214, 216, and 218 function as second gate insulating films of the transistor 270. Furthermore, the conductive film 220*a* in the transistor 270 functions as, for example, a pixel electrode used for a display device. The conductive film 220*a* is connected to the conductive film 212*b* through an opening 252*c* provided in the insulating films 214, 216, and 218. The conductive film 220*b* in the transistor 270 functions as a second gate electrode (also referred to as a back gate electrode).

Figure 29B:
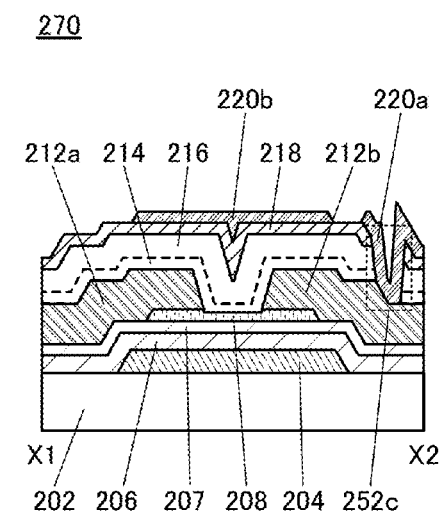
Figure 29C:
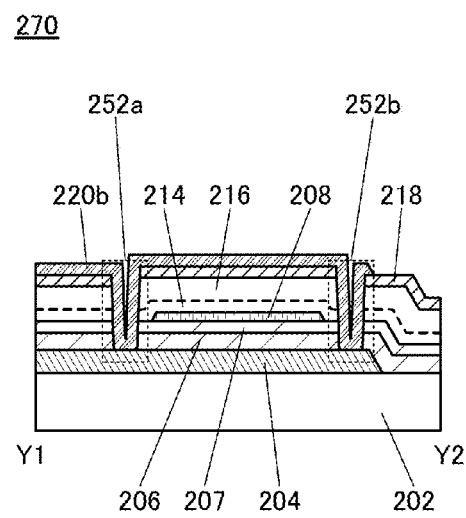

As illustrated in FIG. 29C, the conductive film 220*b* is connected to the conductive film 204 functioning as the first gate electrode through openings 252*a* and 252*b* provided in the insulating films 206, 207, 214, 216, and 218. Accordingly, the conductive film 220*b* and the conductive film 204 are supplied with the same potential.

Note that although the structure in which the openings 252*a* and 252*b* are provided so that the conductive film 220*b* and the conductive film 204 are connected to each other is described in this embodiment, one embodiment of the present invention is not limited thereto. For example, a structure in which only one of the openings 252*a* and 252*b* is provided so that the conductive film 220*b* and the conductive film 204 are connected to each other, or a structure in which the openings 252*a* and 252*b* are not provided and the conductive film 220*b* and the conductive film 204 are not connected to each other may be employed. Note that in the case where the conductive film 220*b* and the conductive film 204 are not connected to each other, it is possible to apply different potentials to the conductive film 220*b* and the conductive film 204.

As illustrated in FIG. 29B, the oxide semiconductor film 208 is positioned to face each of the conductive film 204 functioning as the first gate electrode and the conductive film 220*b* functioning as the second gate electrode, and is sandwiched between the two conductive films functioning as gate electrodes. The lengths in the channel length direction and the channel width direction of the conductive film 220*b* functioning as the second gate electrode are longer than those in the channel length direction and the channel width direction of the oxide semiconductor film 208. The whole oxide semiconductor film 208 is covered with the conductive film 220*b* with the insulating films 214, 216, and 218 positioned therebetween. Since the conductive film 220*b* functioning as the second gate electrode is connected to the conductive film 204 functioning as the first gate electrode through the openings 252*a* and 252*b* provided in the insulating films 206 and 207 and the insulating films 214, 216, and 218, a side surface of the oxide semiconductor film 208 in the channel width direction faces the conductive film 220*b* functioning as the second gate electrode with the insulating films 214, 216, and 218 positioned therebetween.

In other words, in the channel width direction of the transistor 270, the conductive film 204 functioning as the first gate electrode and the conductive film 220*b* functioning as the second gate electrode are connected to each other through the openings provided in the insulating films 206 and 207 functioning as first gate insulating films and the insulating films 214, 216, and 218 functioning as second gate insulating films; and the conductive film 204 and the conductive film 220*b* surround the oxide semiconductor film 208 with the insulating films 206 and 207 functioning as the first gate insulating films and the insulating films 214, 216, and 218 functioning as the second gate insulating films positioned therebetween.

Such a structure enables the oxide semiconductor film 208 included in the transistor 270 to be electrically surrounded by electric fields of the conductive film 204 functioning as the first gate electrode and the conductive film 220*b* functioning as the second gate electrode. A device structure of a transistor, like that of the transistor 270, in which electric fields of a first gate electrode and a second gate electrode electrically surround an oxide semiconductor film where a channel region is formed can be referred to as a surrounded channel (s-channel) structure.

Since the transistor 270 has the s-channel structure, an electric field for inducing a channel can be effectively applied to the oxide semiconductor film 208 by the conductive film 204 functioning as the first gate electrode; therefore, the current drive capability of the transistor 270 can be improved and high on-state current characteristics can be obtained. Since the on-state current can be increased, it is possible to reduce the size of the transistor 270. In addition, since the transistor 270 is surrounded by the conductive film 204 functioning as the first gate electrode and the conductive film 220*b* functioning as the second gate electrode, the mechanical strength of the transistor 270 can be increased.

<3-5. Structural Example of Semiconductor Device>

Structure examples different from that of the transistor 270 in FIGS. 29A to 29C are described with reference to FIGS. 30A to 30D.

Figure 30A:
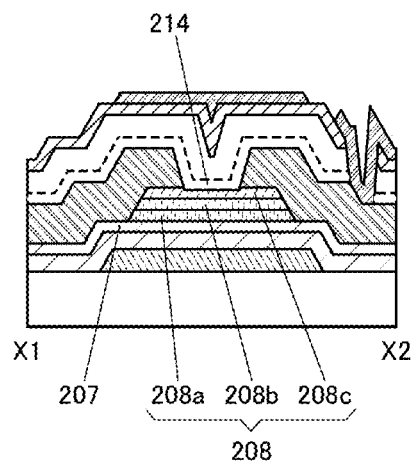
FIGS. 30A to 30D are cross-sectional views illustrating examples of a semiconductor device.
Figure 30B:
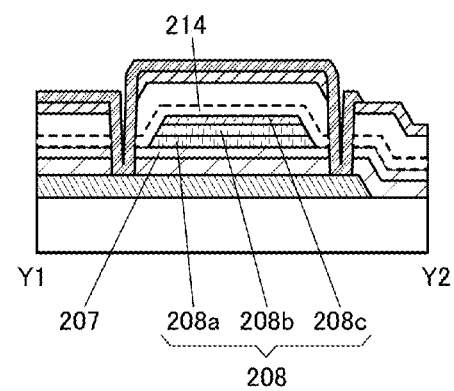
Figure 30C:
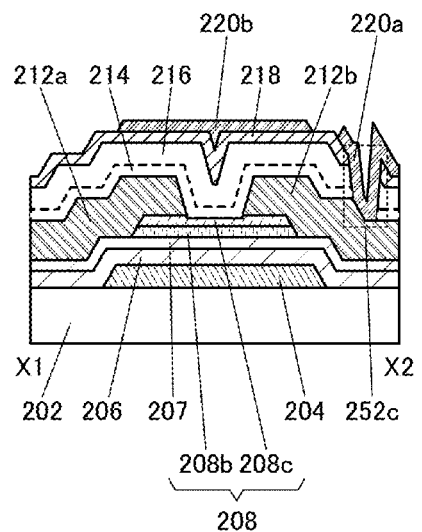
Figure 30D:
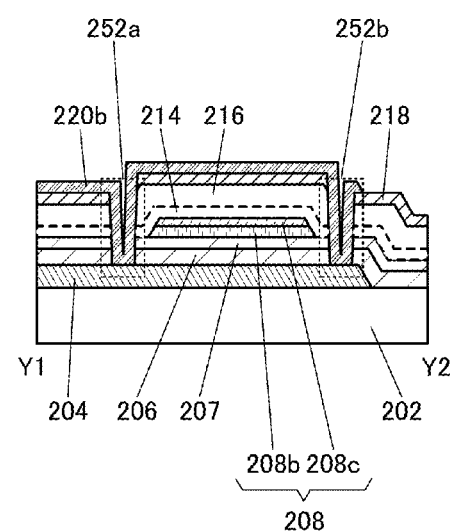

FIGS. 30A and 30B illustrate a cross-sectional view illustrating a variation of the transistor 270 in FIGS. 29B and 29C. FIGS. 30C and 30D illustrate a cross-sectional view illustrating another variation of the transistor 270 in FIGS. 29B and 29C.

A transistor 270A in FIGS. 30A and 30B has the same structure as the transistor 270 in FIGS. 29B and 29C except that the oxide semiconductor film 208 has a three-layer structure. Specifically, the oxide semiconductor film 208 of the transistor 270A includes an oxide semiconductor film 208*a*, an oxide semiconductor film 208*b*, and an oxide semiconductor film 208*c*.

A transistor 270B in FIGS. 30C and 30D has the same structure as the transistor 270 in FIGS. 29B and 29C except that the oxide semiconductor film 208 has a two-layer structure. Specifically, the oxide semiconductor film 208 of the transistor 270B includes the oxide semiconductor film 208*b* and the oxide semiconductor film 208*c*.

Here, a band structure including the oxide semiconductor films 208*a*, 208*b*, and 208*c* and insulating films in contact with the oxide semiconductor films 208*b* and 208*c* is described with reference to FIGS. 31A and 31B.

Figure 31A:
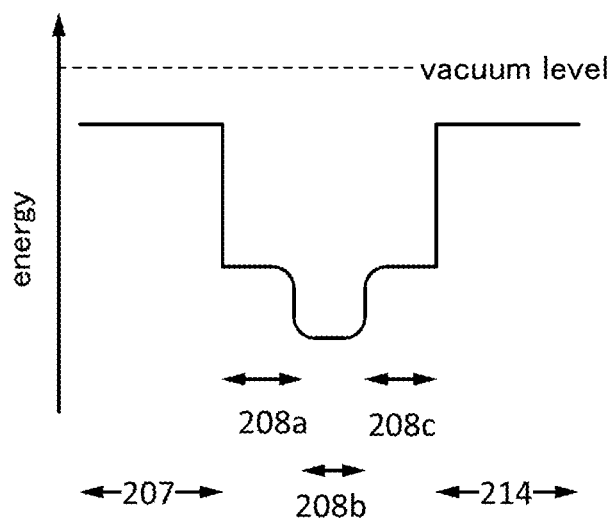
FIGS. 31A and 31B each illustrate a band structure.

FIG. 31A shows an example of a band structure in the thickness direction of a stacked-layer structure including the insulating film 207, the oxide semiconductor films 208*a*, 208*b*, and 208*c*, and the insulating film 214. FIG. 31B shows an example of a band structure in the thickness direction of a stacked-layer structure including the insulating film 207, the oxide semiconductor films 208*b* and 208*c*, and the insulating film 214. For easy understanding, energy level of the conduction band minimum (Ec) of each of the insulating film 207, the oxide semiconductor films 208*a*, 208*b*, and 208*c*, and the insulating film 214 is shown in the band structures.

In the band structure of FIG. 31A, a silicon oxide film is used as each of the insulating film 207 and the insulating film 214, an oxide semiconductor film formed using a metal oxide target having an atomic ratio of metal elements, In:Ga:Zn=1:1:1.2, is used as the oxide semiconductor film 208*a*, an oxide semiconductor film formed using a metal oxide target having an atomic ratio of metal elements, In:Ga:Zn=4:2:4.1, is used as the oxide semiconductor film 208*b*, and an oxide semiconductor film formed using a metal oxide target having an atomic ratio of metal elements, In:Ga:Zn=1:1:1.2, is used as the oxide semiconductor film 208*c*.

Figure 31B:
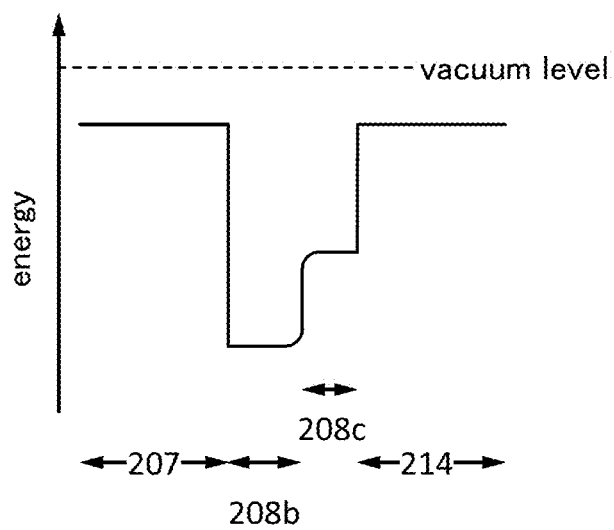

In the band structure of FIG. 31B, a silicon oxide film is used as each of the insulating film 207 and the insulating film 214, an oxide semiconductor film formed using a metal oxide target having an atomic ratio of metal elements, In:Ga:Zn=4:2:4.1, is used as the oxide semiconductor film 208*b*, and an oxide semiconductor film formed using a metal oxide target having an atomic ratio of metal elements, In:Ga:Zn=1:1:1.2, is used as the oxide semiconductor film 208*c*.

As illustrated in FIGS. 31A and 31B, the energy level of the conduction band minimum gradually changes between the oxide semiconductor film 208*a* and the oxide semiconductor film 208*b* and between the oxide semiconductor film 208*b* and the oxide semiconductor film 208*c*. In other words, the energy level of the conduction band minimum is continuously changed or continuously connected. To obtain such a band structure, there exists no impurity, which forms a defect state such as a trap center or a recombination center, at the interface between the oxide semiconductor film 208*a* and the oxide semiconductor film 208*b* or at the interface between the oxide semiconductor film 208*b* and the oxide semiconductor film 208*c*.

To form a continuous junction between the oxide semiconductor film 208*a* and the oxide semiconductor film 208*b* and between the oxide semiconductor film 208*b* and the oxide semiconductor film 208*c*, it is necessary to form the films successively without exposure to the air by using a multi-chamber deposition apparatus (sputtering apparatus) provided with a load lock chamber.

With the band structure of FIG. 31A or FIG. 31B, the oxide semiconductor film 208*b* serves as a well, and a channel region is formed in the oxide semiconductor film 208*b* in the transistor with the stacked-layer structure.

By providing the oxide semiconductor film 208*a* and the oxide semiconductor film 208*c*, the oxide semiconductor film 208*b* can be distanced away from trap states.

In addition, the trap states might be more distant from the vacuum level than the energy level of the conduction band minimum (Ec) of the oxide semiconductor film 208*b* functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 208*b*. Such a structure inhibits accumulation of electrons in the trap states. As a result, the on-state current and the field-effect mobility of the transistor can be increased.

The energy level of the conduction band minimum of each of the oxide semiconductor films 208*a* and 208*c* is closer to the vacuum level than that of the oxide semiconductor film 208*b*. Typically, a difference in energy level between the conduction band minimum of the oxide semiconductor film 208*b* and the conduction band minimum of each of the oxide semiconductor films 208*a* and 208*c* is 0.15 eV or more or 0.5 eV or more and 2 eV or less or 1 eV or less. That is, the difference between the electron affinity of each of the oxide semiconductor films 208*a* and 208*c* and the electron affinity of the oxide semiconductor film 208*b* is 0.15 eV or more or 0.5 eV or more and 2 eV or less or 1 eV or less.

In such a structure, the oxide semiconductor film 208*b* serves as a main path of current and functions as a channel region. In addition, since the oxide semiconductor films 208*a* and 208*c* each include one or more metal elements included in the oxide semiconductor film 208*b* in which a channel region is formed, interface scattering is less likely to occur at the interface between the oxide semiconductor film 208a and the oxide semiconductor film 208b or at the interface between the oxide semiconductor film 208b and the oxide semiconductor film 208c. Thus, the transistor can have high field-effect mobility because the movement of carriers is not hindered at the interface.

To prevent each of the oxide semiconductor films 208a and 208c from functioning as part of a channel region, a material having sufficiently low conductivity is preferably used for the oxide semiconductor films 208a and 208c. Thus, the oxide semiconductor films 208a and 208c can also be called oxide insulating films as determined by their physical properties and/or functions. Alternatively, a material which has a smaller electron affinity (a difference in energy level between the vacuum level and the conduction band minimum) than the oxide semiconductor film 208b and has a difference in energy level in the conduction band minimum from the oxide semiconductor film 208b (band offset) is preferably used for the oxide semiconductor films 208a and 208c. Furthermore, to inhibit generation of a difference in threshold voltage due to the value of the drain voltage, it is preferable to form the oxide semiconductor films 208a and 208c using a material whose energy level of the conduction band minimum is closer to the vacuum level than that of the oxide semiconductor film 208b. For example, the difference between the energy level of the conduction band minimum of the oxide semiconductor film 208b and that of the oxide semiconductor films 208a and 208c is preferably 0.2 eV or more, further preferably 0.5 eV or more.

It is preferable that the oxide semiconductor films 208a and 208c not have a spinel crystal structure. This is because if the oxide semiconductor films 208a and 208c have a spinel crystal structure, constituent elements of the conductive films 212a and 212b might be diffused to the oxide semiconductor film 208b at the interface between the spinel crystal structure and another region. Note that each of the oxide semiconductor film 208a and 208c is preferably a CAAC-OS, in which case a higher blocking property against constituent elements of the conductive films 212a and 212b, for example, copper elements, is obtained.

The thickness of each of the oxide semiconductor films 208a and 208c is greater than or equal to a thickness that is capable of inhibiting diffusion of the constituent elements of the conductive films 212a and 212b to the oxide semiconductor film 208b, and less than a thickness that inhibits supply of oxygen from the insulating film 214 to the oxide semiconductor film 208b. For example, when the thickness of each of the oxide semiconductor films 208a and 208c is greater than or equal to 10 nm, diffusion of the constituent elements of the conductive films 212a and 212b to the oxide semiconductor film 208b can be inhibited. When the thickness of each of the oxide semiconductor films 208a and 208c is less than or equal to 100 nm, oxygen can be effectively supplied from the insulating film 214 to the oxide semiconductor film 208b.

Although the example where an oxide semiconductor film formed using a metal oxide target having an atomic ratio of metal elements, In:Ga:Zn=1:1:1.2, is used as each of the oxide semiconductor films 208a and 208c is described in this embodiment, one embodiment of the present invention is not limited thereto. For example, an oxide semiconductor film formed using a metal oxide target having an atomic ratio of metal elements, In:Ga:Zn=1:1:1, In:Ga:Zn=1:3:2, In:Ga:Zn=1:3:4, or In:Ga:Zn=1:3:6, may be used as each of the oxide semiconductor films 208a and 208c.

When the oxide semiconductor films 208a and 208c are formed using a metal oxide target having an atomic ratio of In:Ga:Zn=1:1:1, the oxide semiconductor films 208a and 208c have an atomic ratio of In:Ga:Zn=1:$\beta$1 (0<$\beta$1≤2):$\beta$2 (0<$\beta$2≤3) in some cases. When the oxide semiconductor films 208a and 208c are formed using a metal oxide target having an atomic ratio of In:Ga:Zn=1:3:4, the oxide semiconductor films 208a and 208c have an atomic ratio of In:Ga:Zn=1:$\beta$3 (1≤$\beta$3≤5):$\beta$4 (2≤$\beta$4≤6) in some cases. When the oxide semiconductor films 208a and 208c are formed using a metal oxide target having an atomic ratio of In:Ga:Zn=1:3:6, the oxide semiconductor films 208a and 208c have an atomic ratio of In:Ga:Zn=1:$\beta$5 (1≤$\beta$5≤5):$\beta$6 (4≤$\beta$6≤8) in some cases.

Figure 32A:
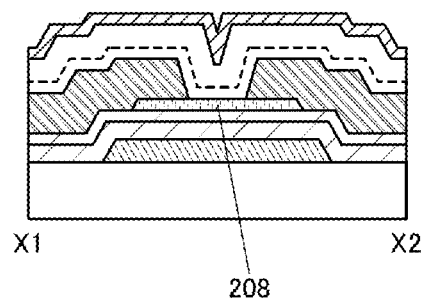
FIGS. 32A to 32D are cross-sectional views illustrating examples of a semiconductor device.
Figure 32B:
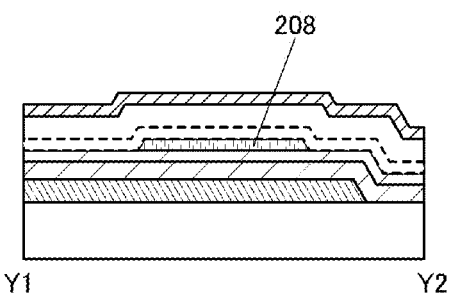
Figure 32C:
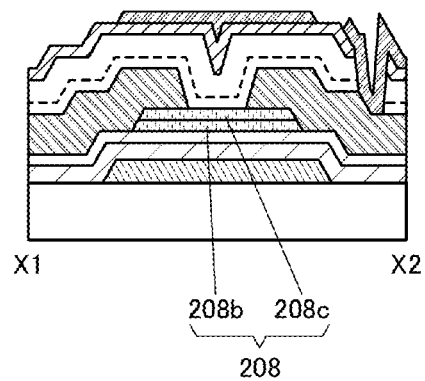
Figure 32D:
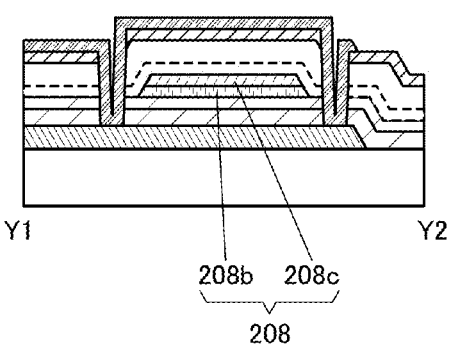

The drawings illustrate an example where the oxide semiconductor film 208 in the transistors 200 and 270 and the oxide semiconductor film 208c in the transistors 270A and 270B have a small thickness in a region which is not covered with the conductive films 212a and 212b, that is, an example where part of the oxide semiconductor film has a depressed portion. However, one embodiment of the present invention is not limited thereto, and the oxide semiconductor film does not necessarily have a depressed portion in a region which is not covered with the conductive films 212a and 212b. FIGS. 32A to 32D illustrate examples in this case. FIGS. 32A to 32D are cross-sectional views illustrating examples of the semiconductor device. FIGS. 32A and 32B illustrate a structure where the oxide semiconductor film 208 in the transistor 200 does not have a depressed portion, and FIGS. 32C and 32D illustrate a structure where the oxide semiconductor film 208 in the transistor 270B does not have a depressed portion.

The structures of the transistors of this embodiment can be freely combined with each other.

<3-6. Method for Manufacturing Semiconductor Device>

Next, a method for manufacturing the semiconductor device of one embodiment of the present invention is described with reference to drawings.

The films included in the semiconductor device of one embodiment of the present invention (i.e., the conductive film, the insulating film, the oxide semiconductor film, and the like) can be formed by a sputtering method, a chemical vapor deposition (CVD) method, a plasma-enhanced CVD (PECVD) method, a vacuum evaporation method, or a pulsed laser deposition (PLD) method. However, the present invention is not limited thereto, and the films may be formed by a coating method, a printing method, a thermal CVD method, or an atomic layer deposition (ALD) method, for example. By a thermal CVD method such as a metal organic chemical vapor deposition (MOCVD) method, the conductive film, the insulating film, the oxide semiconductor film, and the like may be formed.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time while the pressure in the chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then, the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; thus, an ALD method makes it possible to adjust the film thickness accurately and thus is suitable for manufacturing a minute FET.

The above conductive films, insulating films, oxide semiconductor films, the metal oxide films, and the like can be formed by a thermal CVD method such as an MOCVD method. To form an In—Ga—Zn—O film, for example, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed with a deposition apparatus employing ALD, two kinds of gases, i.e., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on the surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed by a deposition apparatus using an ALD method, a $WF_6$ gas and a $B_2H_6$ gas are sequentially introduced plural times to form an initial tungsten film, and then a $WF_6$ gas and an $H_2$ gas are sequentially introduced plural times to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus using an ALD method, an $In(CH_3)_3$ gas and an $O_3$ gas are sequentially introduced plural times to form an In—O layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, $Zn(CH_3)_2$ gas may be used.

<<Method 1 for Manufacturing Semiconductor Device>>

First, a method for manufacturing the transistor 270B that is a semiconductor device of one embodiment of the present invention, which is illustrated in FIGS. 30C and 30D, is described with reference to FIGS. 33A to 33F, FIGS. 34A to 34F, and FIGS. 35A to 35F. FIGS. 33A to 33F, FIGS. 34A to 34F, and FIGS. 35A to 35F are cross-sectional views illustrating a method for manufacturing a semiconductor device. FIGS. 33A, 33C, and 33E, FIGS. 34A, 34C, and 34E, and FIGS. 35A, 35C, and 35E are cross-sectional views in the channel length direction, and FIGS. 33B, 33D, and 33F, FIGS. 34B, 34D, and 34F, and FIGS. 35B, 35D, and 35F are cross-sectional views in the channel width direction.

First, a conductive film is formed over the substrate 202 and processed through a lithography process and an etching process, whereby the conductive film 204 functioning as a gate electrode is formed. Then, the insulating films 206 and 207 functioning as gate insulating films are formed over the conductive film 204 (see FIGS. 33A and 33B).

In this embodiment, a glass substrate is used as the substrate 202, and as the conductive film 204 functioning as a gate electrode, a 100-nm-thick tungsten film is formed by a sputtering method. A 400-nm-thick silicon nitride film as the insulating film 206 and a 50-nm-thick silicon oxynitride film as the insulating film 207 are formed by a PECVD method.

The insulating film 206 can have a stacked-layer structure of silicon nitride films. Specifically, the insulating film 206 can have a three-layer stacked-layer structure of a first silicon nitride film, a second silicon nitride film, and a third silicon nitride film. An example of the three-layer stacked-layer structure can be formed as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C. or lower.

When the insulating film 206 has the three-layer stacked-layer structure of silicon nitride films, for example, in the case where a conductive film containing copper (Cu) is used as the conductive film 204, the following effect can be obtained.

The first silicon nitride film can inhibit diffusion of a copper (Cu) element from the conductive film 204. The second silicon nitride film has a function of releasing hydrogen and can improve withstand voltage of the insulating film serving as a gate insulating film. The third silicon nitride film releases a small amount of hydrogen and can inhibit diffusion of hydrogen released from the second silicon nitride film.

The insulating film 207 is preferably an insulating film containing oxygen to improve characteristics of an interface with the oxide semiconductor film 208 (specifically the oxide semiconductor film 208b) formed later.

Figure 33A:
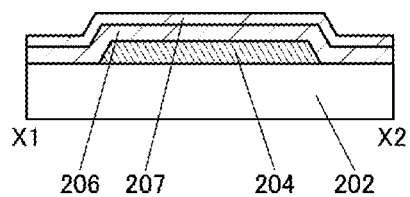
FIGS. 33A to 33F are cross-sectional views illustrating an example of a manufacturing process of a semiconductor device.
Figure 33B:
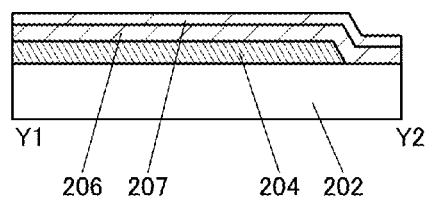
Figure 33C:
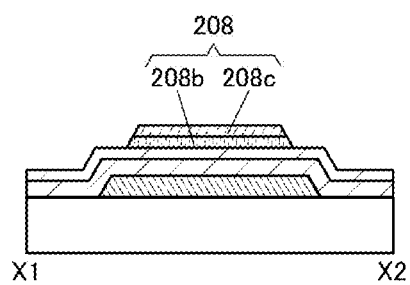
Figure 33D:
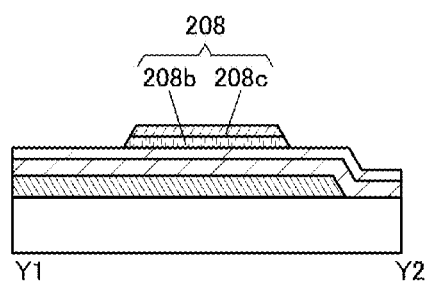

Next, a stacked-layer film of oxide semiconductor films is formed over the insulating film 207 and is processed into a desired shape, so that the island-shaped oxide semiconductor film 208 including the oxide semiconductor film 208b and the oxide semiconductor film 208c is formed (see FIGS. 33C and 33D).

The oxide semiconductor film 208 is formed at a temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide semiconductor film 208 is formed while being heated, so that the crystallinity of the oxide semiconductor film 208 can be increased. On the other hand, in the case where a large-sized glass substrate (e.g., the 6th generation to the 10th generation) is used as the substrate 202 and the oxide semiconductor film 208 is formed at a temperature higher than or equal to 150° C. and lower than 340° C., the substrate 202 might be changed in shape (distorted or warped). In the case where a large-sized glass substrate is used, the change in the shape of the glass substrate can be suppressed by forming the oxide semiconductor film 208 at a temperature higher than or equal to 100° C. and lower than 150° C.

The oxide semiconductor films 208b and 208c may be formed at the same substrate temperature or different substrate temperatures. Note that the oxide semiconductor films 208b and 208c are preferably formed at the same substrate temperature, in which case the manufacturing cost can reduced.

In this embodiment, an oxide semiconductor film to be the oxide semiconductor film 208b is deposited by a sputtering method using an In—Ga—Zn metal oxide target (having an atomic ratio of In:Ga:Zn=4:2:4.1), and an oxide semiconductor film to be the oxide semiconductor film 208c is successively deposited in a vacuum by a sputtering method using an In—Ga—Zn metal oxide target (having an atomic ratio of In:Ga:Zn=1:1:1.2). The substrate temperature during the deposition of the oxide semiconductor film to be the oxide semiconductor film 208 is 170° C. Oxygen and argon are used as deposition gases for the oxide semiconductor film to be the oxide semiconductor film 208.

In the case where the oxide semiconductor film is deposited by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, when a gas which is highly purified to have a dew point of −40° C. or lower, preferably −80° C. or lower, further preferably −100° C. or lower, still further preferably −120° C. or lower, is used as a sputtering gas, i.e., the oxygen gas or the argon gas, entry of moisture or the like into the oxide semiconductor film can be minimized.

In the case where the oxide semiconductor film is deposited by a sputtering method, the sputtering gas containing oxygen is preferably used. When the oxide semiconductor film is deposited using the sputtering gas containing oxygen, oxygen can be added to a film under the oxide semiconductor film (here, the insulating film 207) at the same time as the formation of the oxide semiconductor film. Therefore, an oxygen-excess region can be provided in the insulating film 207.

In the case where the oxide semiconductor film is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

Figure 33E:
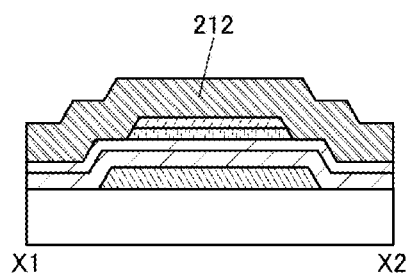
Figure 33F:
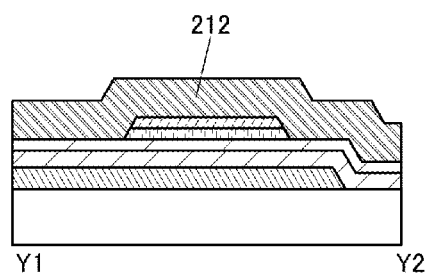

Next, the conductive film 212 to be the source electrode and the drain electrode is formed over the insulating film 207 and the oxide semiconductor film 208 by a sputtering method (see FIGS. 33E and 33F).

In this embodiment, the conductive film 212 is formed of a 400-nm-thick aluminum film is stacked over a 50-nm-thick tungsten film by a sputtering method. Although the conductive film 212 has a two-layer structure in this embodiment, one embodiment of the present invention is not limited thereto. For example, the conductive film 212 may have a three-layer structure in which a 400-nm-thick aluminum film is stacked over a 50-nm-thick tungsten film, and a 100-nm-thick titanium film is stacked over the 400-nm-thick aluminum film.

Figure 34A:
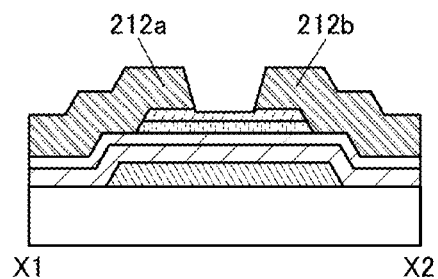
FIGS. 34A to 34F are cross-sectional views illustrating an example of a manufacturing process of a semiconductor device.
Figure 34B:
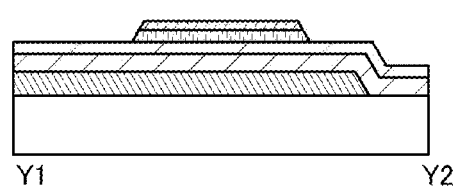

Next, the conductive film 212 is processed into desired shapes, so that the separate conductive films 212a and 212b are formed (see FIGS. 34A and 34B).

In this embodiment, the conductive film 212 is processed with a dry etching apparatus. Note that the method for processing the conductive film 212 is not limited thereto, and a wet etching apparatus may be used, for example. When the conductive film 212 is processed, a finer pattern can be formed with a dry etching apparatus than with a wet etching apparatus. On the other hand, the conductive film 212 can be processed with a wet etching apparatus at lower manufacturing cost than with a dry etching apparatus.

After the conductive films 212a and 212b are formed, a surface (on the back channel side) of the oxide semiconductor film 208 (specifically, the oxide semiconductor film 208c) may be cleaned. The cleaning may be performed, for example, using a chemical solution such as phosphoric acid. The cleaning using a chemical solution such as a phosphoric acid can remove impurities (e.g., an element included in the conductive films 212a and 212b) attached to the surface of the oxide semiconductor film 208c. Note that the cleaning is not necessarily performed, and thus the cleaning may be unnecessary.

In the step of forming the conductive films 212a and 212b and/or the cleaning step, the thickness of a region of the oxide semiconductor film 208 which is not covered by the conductive films 212a and 212b might be reduced. For example, a region where the oxide semiconductor film 208c has a smaller thickness than the oxide semiconductor film 208b is formed in some cases.

Figure 34C:
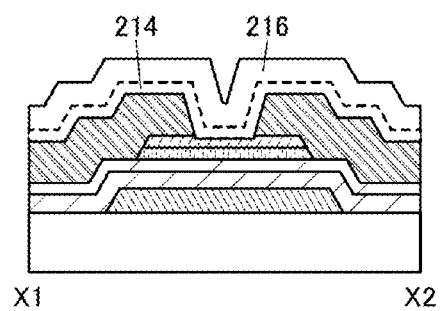
Figure 34D:
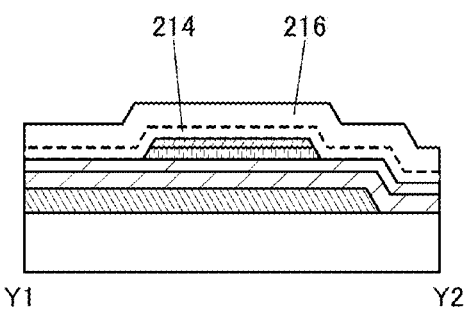

Next, the insulating films 214 and 216 are formed over the oxide semiconductor film 208 and the conductive films 212a and 212b (see FIGS. 34C and 34D).

Note that after the insulating film 214 is formed, the insulating film 216 is preferably formed in succession without exposure to the air. After the insulating film 214 is formed, the insulating film 216 is formed in succession without exposure to the air while at least one of the flow rate of a source gas, pressure, a high-frequency power, and a substrate temperature is adjusted, whereby the concentration of impurities attributed to the atmospheric component at the interface between the insulating film 214 and the insulating film 216 can be reduced and oxygen in the insulating films 214 and 216 can be moved to the oxide semiconductor film 208; accordingly, the amount of oxygen vacancies in the oxide semiconductor film 208 can be reduced.

As the insulating film 214, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 214 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating film 214 by a PECVD method under the conditions where the substrate 202 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 216, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 216, the high-frequency power having the above power density is supplied to a reaction chamber having the above pressure, whereby the decomposition efficiency of the source gas in plasma is increased, oxygen radicals are increased, and oxidation of the source gas is promoted; thus, the oxygen content in the insulating film 216 becomes higher than that in the stoichiometric composition. In addition, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating.

Note that the insulating film 214 functions as a protective film for the oxide semiconductor film 208 in the step of forming the insulating film 216. Therefore, the insulating film 216 can be formed using the high-frequency power having a high power density while damage to the oxide semiconductor film 208 is reduced.

Note that in the deposition conditions of the insulating film 216, when the flow rate of the deposition gas containing silicon with respect to the oxidizing gas is increased, the amount of defects in the insulating film 216 can be reduced. As a typical example, it is possible to form an oxide insulating layer in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

Heat treatment (hereinafter referred to as first heat treatment) is preferably performed after the insulating films 214 and 216 are formed. The first heat treatment can reduce nitrogen oxide contained in the insulating films 214 and 216. By the first heat treatment, part of oxygen contained in the insulating films 214 and 216 can be moved to the oxide semiconductor film 208, so that the amount of oxygen vacancies included in the oxide semiconductor film 208 can be reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, and the like). Note that an electric furnace, a rapid thermal anneal (RTA) apparatus, or the like can be used for the first heat treatment, in which it is preferable that hydrogen, water, and the like not be contained in the nitrogen, oxygen, ultra-dry air, or a rare gas.

Figure 34E:
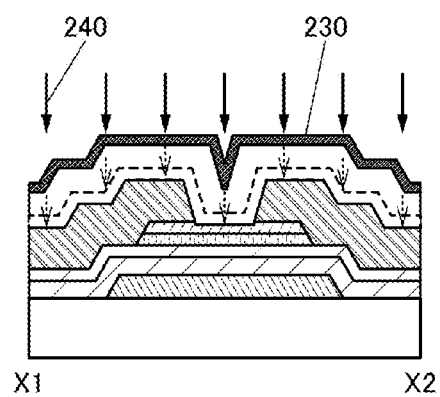
Figure 34F:
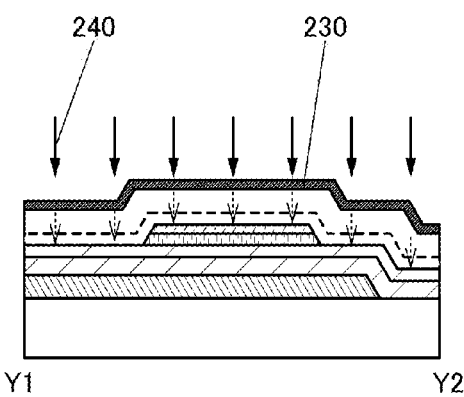

Next, a barrier film 230 is formed over the insulating film 216, and oxygen 240 is added to the insulating film 216, the insulating film 214, or the oxide semiconductor film 208 through the barrier film 230 (see FIGS. 34E and 34F).

In FIGS. 34E and 34F, oxygen added to the insulating film 214 or the insulating film 216 is schematically shown by arrows of broken lines.

The barrier film 230 is permeable to oxygen and inhibits release of oxygen. The barrier film 230 includes, for example, oxygen and metal (at least one element selected from indium, zinc, titanium, aluminum, tungsten, tantalum, molybdenum, hafnium, and yttrium). In particular, the barrier film 230 preferably includes indium tin oxide (also referred to as ITO), indium tin silicon oxide (abbreviation: ITSO), or indium oxide because an uneven surface can be favorably covered with such a material. Alternatively, as the barrier film 230, the above-described oxide semiconductor film (having an atomic ratio of In:Ga:Zn=1:1:1, In:Ga:Zn=1:3:2, In:Ga:Zn=1:3:4, In:Ga:Zn=1:3:6, In:Ga:Zn=3:1:2, or In:Ga:Zn=4:2:3, for example) may be used.

The barrier film 230 can be formed by a sputtering method. When the barrier film 230 is thin, oxygen release from the insulating film 216 to the outside is difficult to suppress in some cases. On the other hand, when the barrier film 230 is thick, oxygen cannot be favorably added to the insulating film 216 in some cases. Accordingly, the thickness of the barrier film 230 is preferably greater than or equal to 1 nm and less than or equal to 20 nm, or greater than or equal to 2 nm and less than or equal to 10 nm. In this embodiment, the barrier film 230 is a 5-nm-thick ITSO film.

As examples of the method for adding the oxygen 240 to the insulating film 216 through the barrier film 230, there are an ion doping method, an ion implantation method, and a plasma treatment method. Depending on the apparatus or conditions for adding the oxygen 240, the oxygen 240 can be added to the insulating film 214 or the oxide semiconductor film 208 under the insulating film 216 in some cases. As the oxygen 240, excess oxygen, an oxygen radical, or the like can be used. The oxygen 240 can be effectively added to the insulating film 216 while a bias is applied to the substrate side. As the bias, for example, an ashing apparatus is used, and power density of the bias applied between a pair of electrodes included in the ashing apparatus can be greater than or equal to 1 W/cm$^2$ and less than or equal to 5 W/cm$^2$. By providing the barrier film 230 over the insulating film 216 and adding the oxygen 240, the barrier film 230 functions as a protective film for inhibiting release of oxygen from the insulating film 216. Thus, a larger amount of oxygen can be added to the insulating film 216.

After the oxygen 240 is added to the insulating film 216 through the barrier film 230, heat treatment (hereinafter referred to as second heat treatment) may be performed. The second heat treatment can be performed under conditions similar to those of the first heat treatment.

Figure 35A:
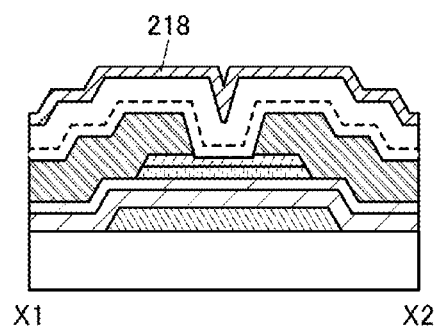
FIGS. 35A to 35F are cross-sectional views illustrating an example of a manufacturing process of a semiconductor device.
Figure 35B:
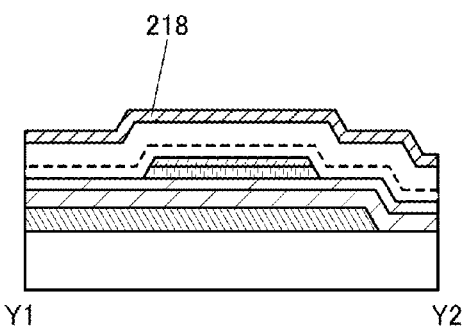
Figure 35C:
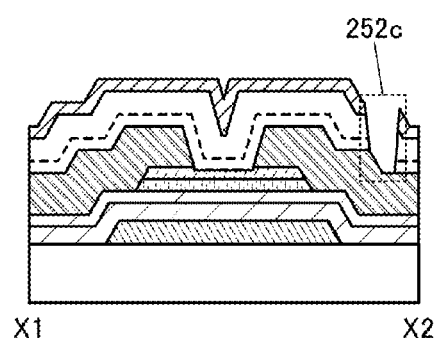
Figure 35D:
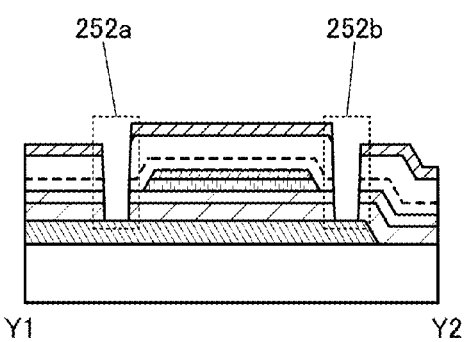

Next, the barrier film 230 is removed to expose a surface of the insulating film 216, and then, the insulating film 218 is formed over the insulating film 216 (see FIGS. 35A and 35B).

When the barrier film 230 is removed, part of the insulating film 216 is also removed in some cases. A method for removing the barrier film 230 is, for example, a dry etching method, a wet etching method, or a combination of a dry etching method and a wet etching method. In this embodiment, a wet etching method is used to remove the barrier film 230. A wet etching method is preferably used as the method for removing the barrier film 230 because of low manufacturing cost.

The insulating film 218 can be formed by a sputtering method or a PECVD method, for example. In the case where the insulating film 218 is formed by a PECVD method, for example, the substrate temperature is lower than 400° C., preferably lower than 375° C., further preferably higher than or equal to 180° C. and lower than or equal to 350° C. The substrate temperature at which the insulating film 218 is formed is preferably within the above range because a dense film can be formed. Furthermore, when the substrate temperature at which the insulating film 218 is formed is within the above range, oxygen or excess oxygen in the insulating films 214 and 216 can be moved to the oxide semiconductor film 208.

After the insulating film 218 is formed, heat treatment similar to the second heat treatment (hereinafter referred to as third heat treatment) may be performed. Through such heat treatment at lower than 400° C., preferably lower than 375° C., further preferably higher than or equal to 180° C. and lower than or equal to 350° C. after the addition of the oxygen 240 to the insulating film 216, oxygen or excess oxygen in the insulating film 216 can be moved to the oxide semiconductor film 208 (particularly, the oxide semiconductor film 208b) and compensate oxygen vacancies in the oxide semiconductor film 208.

Figure 36A:
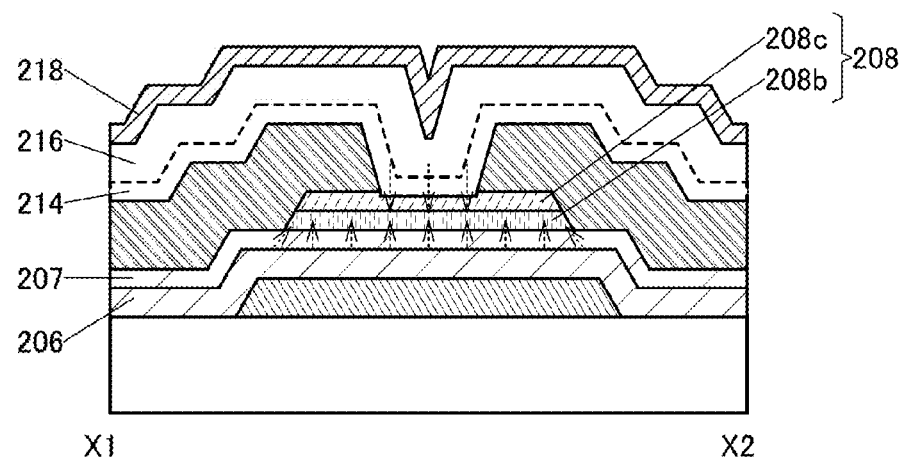
FIGS. 36A and 36B are model diagrams illustrating oxygen moving in an oxide semiconductor film.
Figure 36B:
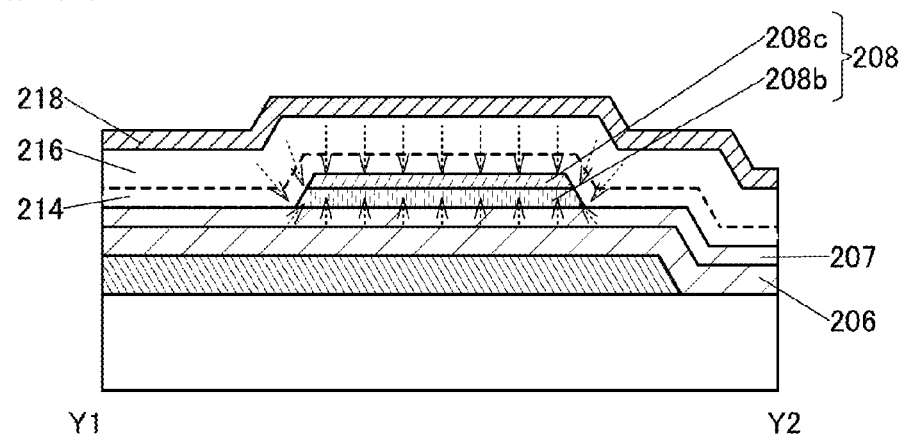

Oxygen moved to the oxide semiconductor film 208 is described with reference to FIGS. 36A and 36B. FIGS. 36A and 36B are model diagrams illustrating oxygen moved to the oxide semiconductor film 208 due to the substrate temperature at the time of forming the insulating film 218 (typically, lower than 375° C.) or the third heat treatment after the formation of the insulating film 218 (typically, lower than 375° C.). In FIGS. 36A and 36B, oxygen (oxygen radicals, oxygen atoms, or oxygen molecules) moved to the oxide semiconductor film 208 is shown by arrows of broken lines.

In the oxide semiconductor film 208 in FIGS. 36A and 36B, oxygen vacancies are compensated with oxygen moved from films in contact with the oxide semiconductor film 208 (here, the insulating film 207 and the insulating film 214). Specifically, in the semiconductor device of one embodiment of the present invention, the insulating film 207 includes an oxygen-excess region because an oxygen gas is used at the time of forming the oxide semiconductor film 208 by sputtering and oxygen is added to the insulating film 207. Since oxygen is added through the barrier film 230, the insulating films 214 and 216 also include an oxygen-excess region. In the oxide semiconductor film 208 between the insulating films including the oxygen-excess regions, oxygen vacancies can be favorably compensated.

Furthermore, the insulating film 206 is provided under the insulating film 207, and the insulating film 218 is provided over the insulating films 214 and 216. When the insulating films 206 and 218 are formed using a material having low oxygen permeability, e.g., silicon nitride, oxygen contained in the insulating films 207, 214, and 216 can be confined to the oxide semiconductor film 208 side; thus, oxygen can be favorably moved to the oxide semiconductor film 208.

In the case where a silicon nitride film is formed by a PECVD method as the insulating film 218, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in a source gas, the flow rate of the nitrogen is set to be preferably 5 times or more and 50 times or less, more preferably 10 times or more and 50 times or less the flow rate of the ammonia.

In this embodiment, with the use of a PECVD apparatus, a 50-nm-thick silicon nitride film is formed as the insulating film 218 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Next, a mask is formed over the insulating film 218 through a lithography process, and the opening 252c is formed in a desired region in the insulating films 214, 216, and 218. In addition, a mask is formed over the insulating film 218 through a lithography process, and the openings 252a and 252b are formed in desired regions in the insulating films 206, 207, 214, 216, and 218. Note that the opening 252c reaches the conductive film 212b. The openings 252a and 252b reach the conductive film 204 (see FIGS. 35C and 35D).

Note that the openings 252a and 252b and the opening 252c may be formed in the same step or may be formed by different steps. In the case where the openings 252a and 252b and the opening 252c are formed in the same step, for example, a gray-tone mask or a half-tone mask can be used. Moreover, the openings 252a and 252b may be formed in some steps. For example, openings are formed in the insulating films 206 and 207 in advance, and then, openings are formed in the insulating films 214, 216, and 218 over the openings.

Figure 35E:
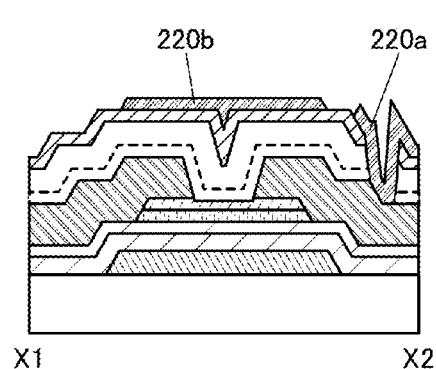
Figure 35F:
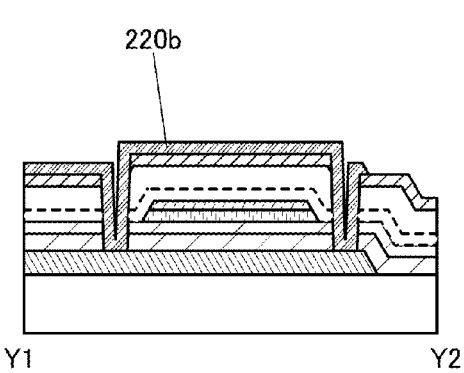

Next, a conductive film is formed over the insulating film 218 to cover the openings 252a, 252b, and 252c and processed into desired shapes, so that the conductive films 220a and 220b are formed (see FIGS. 35E and 35F).

For the conductive film to be the conductive films 220a and 220b, for example, a material including one of indium (In), zinc (Zn), and tin (Sn) can be used. In particular, for the conductive films 220a and 220b, a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin silicon oxide (ITSO) can be used. Moreover, the conductive film to be the conductive films 220a and 220b can be formed by a sputtering method, for example. In this embodiment, a 110-nm-thick ITSO film is formed by a sputtering method.

Through the above process, the transistor 270B illustrated in FIGS. 30C and 30D can be manufactured.

In the entire manufacturing process of the transistor 270B, the substrate temperature is preferably lower than 400° C., further preferably lower than 375° C., still further preferably higher than or equal to 180° C. and lower than or equal to 350° C. because the change in shape of the substrate (distortion or warp) can be reduced even when a large-sized substrate is used. In the manufacturing process of the transistor 270B, the substrate is heated at the following temperatures: the temperature in the formation of the insulating films 206 and 207 (lower than 400° C., preferably higher than or equal to 250° C. and lower than or equal to 350° C.), the temperature in the formation of the oxide semiconductor film 208 (higher than or equal to room temperature and lower than 340° C., preferably higher than or equal to 100° C. and lower than or equal to 200° C., further preferably higher than or equal to 100° C. and lower than 150° C.), the temperature in the formation of the insulating films 216 and 218 (lower than 400° C., preferably lower than 375° C., further preferably higher than or equal to 180° C. and lower than or equal to 350° C.), the temperature in the first heat treatment or the second heat treatment after the addition of the oxygen 240 (lower than 400° C., preferably lower than 375° C., further preferably higher than or equal to 180° C. and lower than or equal to 350° C.), and the like.

The structure and method described in this embodiment can be implemented by being combined as appropriate with structures and methods described in the other embodiments.

<<Method 2 for Manufacturing Semiconductor Device>>

A manufacturing method different from [Method 1 for manufacturing semiconductor device] is described below.

First, steps up to the step illustrated in FIGS. 34C and 34D are performed in a similar manner to that of [Method 1 for manufacturing semiconductor device]. Next, the barrier film 230 is formed as illustrated in FIGS. 34E and 34F, and the oxygen 240 is not added. Then, the step illustrated in FIGS. 35A and 35B is not performed, and the steps illustrated in FIGS. 35C and 35D and FIGS. 35E and 35F are performed.

In this case, for the barrier film 230, a material having a high insulating property is selected from the above materials. For the barrier film 230 used in this manufacturing method, aluminum oxide, hafnium oxide, or yttrium oxide is preferably used.

When the barrier film 230 is formed by a sputtering method using aluminum oxide, hafnium oxide, or yttrium oxide, the sputtering gas preferably contains at least oxygen. Oxygen used for the sputtering gas in the formation of the barrier film 230 becomes oxygen radicals in plasma, and the oxygen and/or the oxygen radicals are added to the insulating film 216 in some cases. Therefore, the step of adding the oxygen 240 illustrated in FIGS. 34E and 34F is not necessarily performed. In other words, oxygen adding treatment and the formation of the barrier film 230 can be performed at the same time. While the barrier film 230 has a function of adding oxygen in the formation of the barrier film 230 (particularly in an early stage of the formation), the barrier film 230 has a function of blocking oxygen after the formation of the barrier film 230 (particularly in a later stage of the formation).

In the case where the barrier film 230 is formed by a sputtering method using aluminum oxide, for example, a mixed layer might be formed in the vicinity of the interface between the insulating film 216 and the barrier film 230. For example, when the insulating film 216 is a silicon oxynitride film, an $Al_xSi_yO_z$ layer might be formed as the mixed layer. The mixed layer may include an oxygen-excess region.

When the barrier film 230 is formed using aluminum oxide, hafnium oxide, or yttrium oxide, which have a high insulating property and a high oxygen barrier property, the step of forming the insulating film 218 illustrated in FIGS. 35A and 35B is not necessarily performed. It may be possible not to remove the barrier film 230 and use it instead of the insulating film 218.

When the substrate temperature in the formation of the barrier film 230 is lower than 400° C., preferably lower than 375° C., further preferably higher than or equal to 180° C. and lower than or equal to 350° C., oxygen or excess oxygen added to the insulating film 216 can be moved to the oxide semiconductor film 208.

By using aluminum oxide, hafnium oxide, or yttrium oxide for the barrier film 230 as described above, the number of manufacturing steps of the semiconductor device can be reduced, which leads to low manufacturing cost.

<<Method 3 for Manufacturing Semiconductor Device>>

Next, a method for manufacturing the transistor 250 that is a semiconductor device of one embodiment of the present invention, which is illustrated in FIGS. 27A to 27C, is described with reference to FIGS. 37A to 37F and FIGS. 38A to 38F. FIGS. 37A to 37F and FIGS. 38A to 38F are cross-sectional views illustrating a method for manufacturing a semiconductor device. FIGS. 37A, 37C, and 37E and FIGS. 38A, 38C, and 38E are cross-sectional views in the channel length direction, and FIGS. 37B, 37D, and 37F and FIGS. 38B, 38D, and 38F are cross-sectional views in the channel width direction.

Figure 37A:
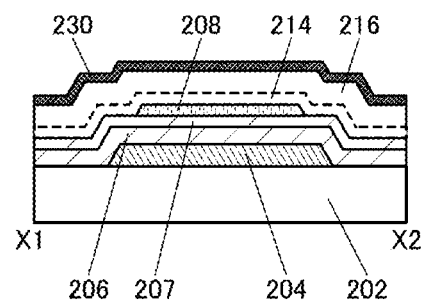
FIGS. 37A to 37F are cross-sectional views illustrating an example of a manufacturing process of a semiconductor device.
Figure 37B:
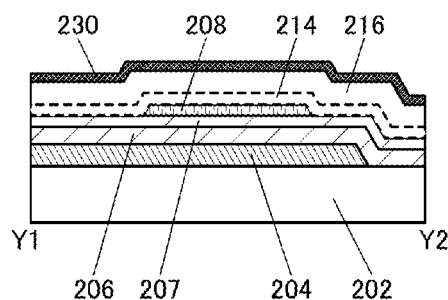

First, the conductive film 204, the insulating films 206 and 207, the oxide semiconductor film 208, the insulating films 214 and 216, and the barrier film 230 are formed over the substrate 202 (see FIGS. 37A and 37B).

The description of [Method 1 for manufacturing semiconductor device] can be referred to for the conductive film 204, the insulating films 206 and 207, the oxide semiconductor film 208, the insulating films 214 and 216, and the barrier film 230.

Figure 37C:
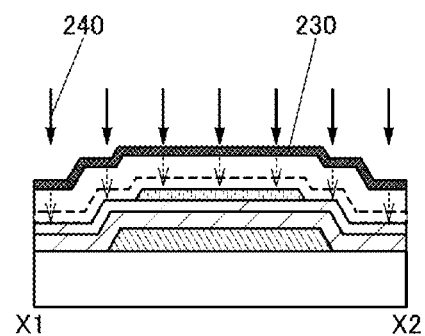
Figure 37D:
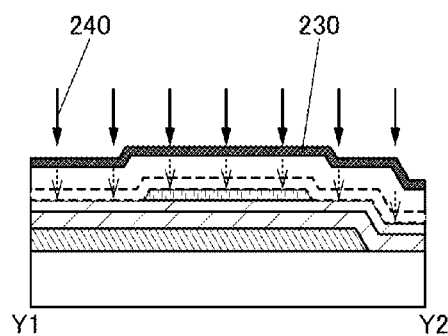
Figure 37E:
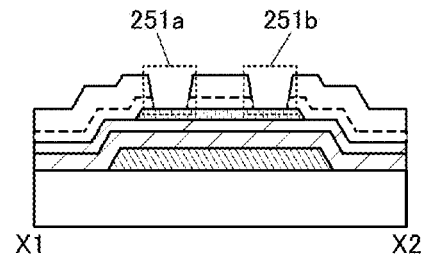
Figure 37F:
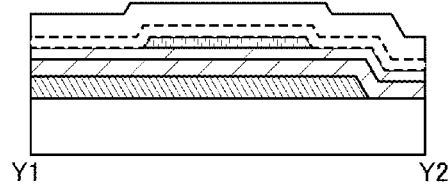

Next, the oxygen 240 is added to the insulating film 214 through the barrier film 230 (see FIGS. 37C and 37D).

Next, the barrier film 230 is removed. Then, a mask is formed over the insulating film 214 through a lithography process, and the openings 251a and 251b are formed in desired regions in the insulating films 214 and 216. Note that the openings 251a and 251b reach the oxide semiconductor film 208 (see FIGS. 37E and 37F).

Figure 38A:
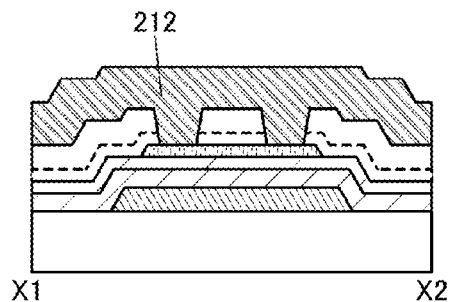
FIGS. 38A to 38F are cross-sectional views illustrating an example of a manufacturing process of a semiconductor device.
Figure 38B:
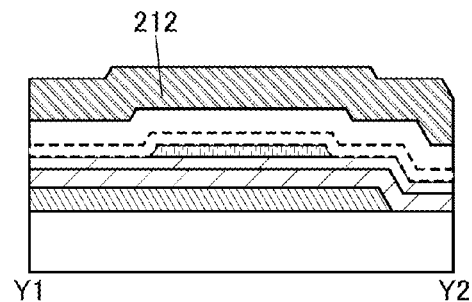

Next, the conductive film 212 is formed over the insulating film 214 to cover the openings 251a and 251b (see FIGS. 38A and 38B).

Figure 38C:
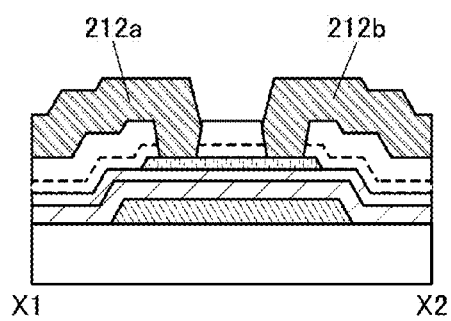
Figure 38D:
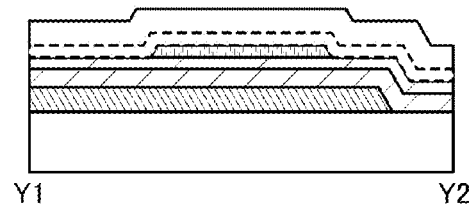

Next, a mask is formed over the conductive film 212 through a lithography process, and the conductive film is processed into desired shapes, so that the conductive films 212a and 212b are formed (see FIGS. 38C and 38D).

Figure 38E:
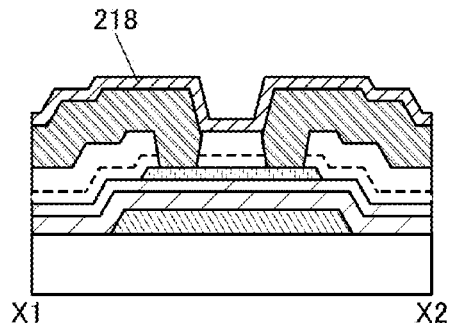
Figure 38F:
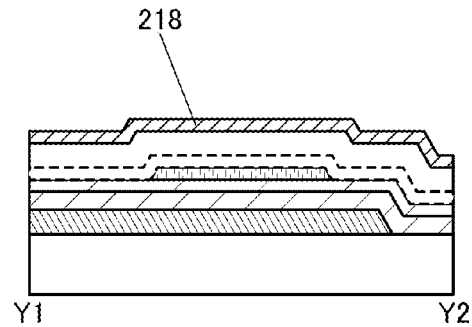

Next, the insulating film 218 is formed over the insulating film 214 and the conductive films 212a and 212b (see FIGS. 38E and 38F).

Through the above process, the transistor 250 illustrated in FIGS. 27A to 27C can be manufactured.

Figure 28B:
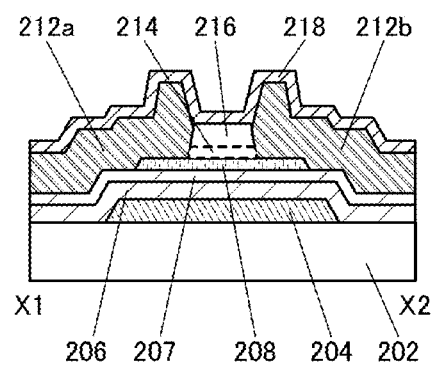
Figure 28C:
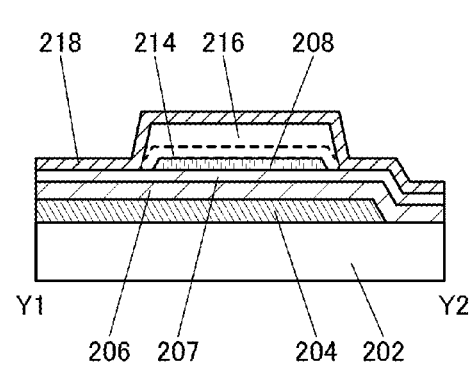

Note that the transistor 260 in FIGS. 28A to 28C can be manufactured in such a manner that the insulating films 214 and 216 are left only over a channel region of the oxide semiconductor film 208 at the step of forming the openings 251a and 251b.

The structure and method described in this embodiment can be implemented by being combined as appropriate with structures and methods described in the other embodiments and the examples.

Embodiment 4

In this embodiment, a sputtering apparatus and a deposition apparatus with which the oxide semiconductor film of one embodiment of the present invention can be formed are described with reference to FIGS. 39A and 39B, FIGS. 40A and 40B, FIGS. 41A to 41C, FIG. 42, FIG. 43, FIGS. 44A and 44B, FIG. 45, and FIGS. 46A to 46C. In the sputtering apparatus described below, a substrate, a target, and the like are provided to illustrate operation in the deposition. Note that since a substrate, a target, and the like are objects that a practitioner places as appropriate, the sputtering apparatus does not include a substrate and a target in some cases.

<4-1. Sputtering Apparatus>

Examples of a sputtering apparatus include a parallel-plate-type sputtering apparatus and a facing-targets sputtering apparatus. Deposition using the parallel-plate-type sputtering apparatus can also be referred to as parallel electrode sputtering (PESP). Deposition using the facing-targets sputtering apparatus can also be referred to as vapor deposition sputtering (VDSP).

<<Parallel-Plate-Type Sputtering Apparatus (PESP)>>

Figure 39A:
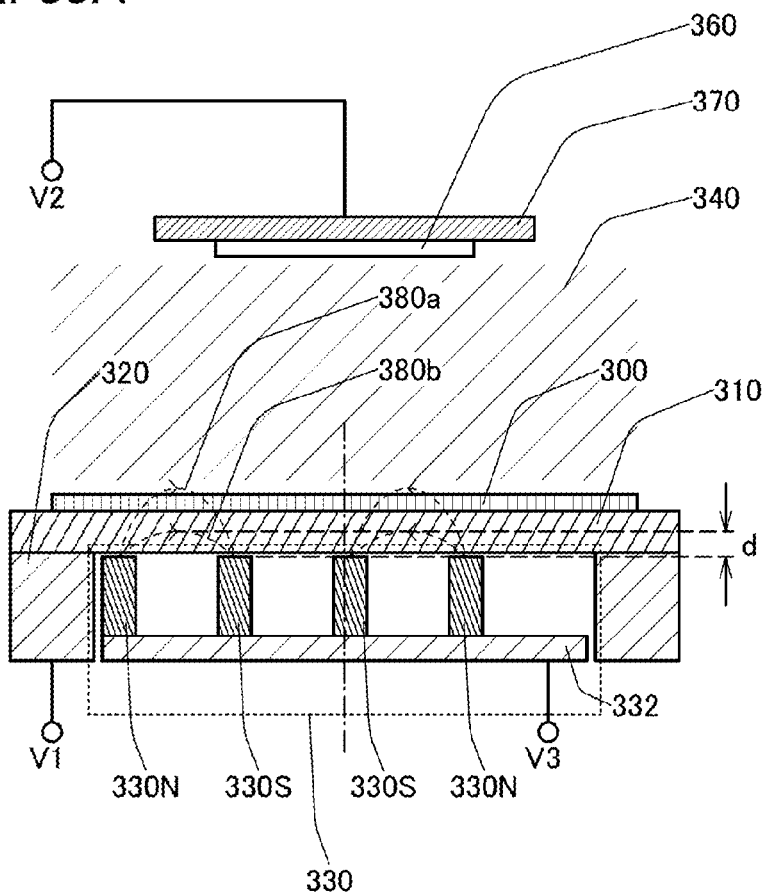
FIGS. 39A and 39B illustrate a sputtering apparatus.

First, the parallel-plate-type sputtering apparatus is described. FIG. 39A is a cross-sectional view of a deposition chamber 301 of a parallel-plate-type sputtering apparatus. The deposition chamber 301 in FIG. 39A includes a target holder 320, a backing plate 310, a target 300, a magnet unit 330, and a substrate holder 370. Note that the target 300 is placed over the backing plate 310. The backing plate 310 is placed over the target holder 320. The magnet unit 330 is placed under the target 300 with the backing plate 310 positioned therebetween. The substrate holder 370 faces the target 300. Note that in this specification, a magnet unit means a group of magnets. The magnet unit can be replaced with "cathode," "cathode magnet," "magnetic member," "magnetic part," or the like. The magnet unit 330 includes a magnet 330N, a magnet 330S, and a magnet holder 332. Note that in the magnet unit 330, the magnet 330N and the magnet 330S are placed over the magnet holder 332. The magnet 330N and the magnet 330S are spaced. When a substrate 360 is transferred into the deposition chamber 301, the substrate 360 is placed in contact with the substrate holder 370.

The target holder 320 and the backing plate 310 are fixed to each other with a bolt and have the same potential. The target holder 320 has a function of supporting the target 300 with the backing plate 310 positioned therebetween.

The target 300 is fixed to the backing plate 310. For example, the target 300 can be fixed to the backing plate 310 with a bonding member containing a low-melting-point metal such as indium.

FIG. 39A illustrates a magnetic line of force 380a and a magnetic line of force 380b formed by the magnet unit 330.

The magnetic line of force 380a is one of magnetic lines of force that form a horizontal magnetic field in the vicinity of the target 300. The vicinity of the target 300 corresponds to a region in which the vertical distance from the top surface of the target 300 is, for example, greater than or equal to 0 mm and less than or equal to 10 mm, in particular, greater than or equal to 0 mm and less than or equal to 5 mm.

The magnetic line of force 380b is one of magnetic lines of force that form a horizontal magnetic field in a plane apart from the top surface of the magnet unit 330 by a vertical distance d. The vertical distance d is, for example, greater than or equal to 0 mm and less than or equal to 20 mm or greater than or equal to 5 mm and less than or equal to 15 mm.

Here, with the use of the strong magnet 330N and the strong magnet 330S, an intense magnetic field can be generated in the vicinity of the substrate 360. Specifically, the magnetic flux density of the horizontal magnetic field in the vicinity of the substrate 360 can be greater than or equal to 10 G and less than or equal to 100 G, preferably greater than or equal to 15 G and less than or equal to 60 G, further preferably greater than or equal to 20 G and less than or equal to 40 G.

Note that the magnetic flux density of the horizontal magnetic field may be measured when the magnetic flux density of the vertical magnetic field is 0 G.

By setting the magnetic flux density of the magnetic field in the deposition chamber 301 to be in the above range, an oxide semiconductor film with high density and high crystallinity can be deposited. The deposited oxide semiconductor film hardly includes plural kinds of crystal phases and has a substantially-single crystalline phase.

Figure 39B:
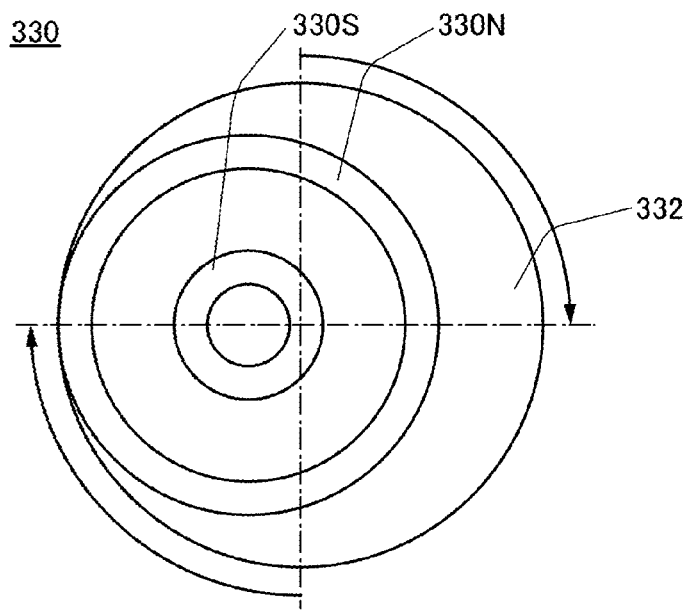

FIG. 39B is a top view of the magnet unit 330. In the magnet unit 330, the circular or substantially circular magnet 330N and the circular or substantially circular magnet 330S are fixed to the magnet holder 332. The magnet unit 330 can be rotated about a normal vector at the center of the top surface of the magnet unit 330 or a normal vector substantially at the center of the top surface of the magnet unit 330. For example, the magnet unit 330 may be rotated with a beat (also referred to as rhythm, pulse, frequency, period, cycle, or the like) of greater than or equal to 0.1 Hz and less than or equal to 1 kHz.

Thus, a region where a magnetic field on the target 300 is intense changes as the magnet unit 330 is rotated. The region with an intense magnetic field is a high-density plasma region; thus, sputtering of the target 300 easily occurs in the vicinity of the region. For example, when the region with an intense magnetic field is fixed, only a specific region of the target 300 is used. In contrast, when the magnet unit 330 is rotated as shown in FIG. 39B, the target 300 can be uniformly used. By rotating the magnet unit 330, a film with a uniform thickness and a film with uniform quality can be deposited.

By rotating the magnet unit 330, the direction of the magnetic line of force in the vicinity of the substrate 360 can also be changed.

Although the magnet unit 330 is rotated in this example, one embodiment of the present invention is not limited to this example. For example, the magnet unit 330 may be oscillated vertically or horizontally. For example, the magnet unit 330 may be oscillated with a beat of greater than or equal to 0.1 Hz and less than or equal to 1 kHz. Alternatively, the target 300 may be rotated or moved. For example, the target 300 may be rotated or moved with a beat of greater than or equal to 0.1 Hz and less than or equal to 1 kHz. Further alternatively, the direction of a magnetic line of force in the vicinity of the substrate 360 may be changed relatively by rotating the substrate 360. These methods may be combined.

The deposition chamber 301 may have a groove portion inside or under the backing plate 310. By making fluid (air, nitrogen, a rare gas, water, oil, or the like) flow through the groove portion, discharge anomaly due to an increase in the temperature of the target 300 or damage to the deposition chamber 301 due to deformation of a component can be prevented in the sputtering. In that case, the backing plate 310 and the target 300 are preferably adhered to each other with a bonding member because the cooling capability is increased.

A gasket is preferably provided between the target holder 320 and the backing plate 310, in which case an impurity is less likely to enter the deposition chamber 301 from the outside or the groove portion.

In the magnet unit 330, the magnet 330N and the magnet 330S are placed such that their surfaces on the target 300 side have opposite polarities. Here, the case where the pole of the magnet 330N on the target 300 side is the north pole and the pole of the magnet 330S on the target 300 side is the south pole is described. Note that the layout of the magnets and the poles in the magnet unit 330 are not limited to those described here or those illustrated in FIG. 39A.

In the deposition, a potential V1 applied to a terminal V1 connected to the target holder 320 is, for example, lower than a potential V2 applied to a terminal V2 connected to the substrate holder 370. The potential V2 applied to the terminal V2 connected to the substrate holder 370 is, for example, the ground potential. A potential V3 applied to a terminal V3 connected to the magnet holder 332 is, for example, the ground potential. Note that the potentials applied to the terminals V1, V2, and V3 are not limited to the above description. Not all the target holder 320, the substrate holder 370, and the magnet holder 332 are necessarily supplied with potentials. For example, the substrate holder 370 may be electrically floating. Note that although the potential V1 is applied to the terminal V1 connected to the target holder 320 (i.e., a DC sputtering method is employed) in the example illustrated in FIG. 39A, one embodiment of the present invention is not limited thereto. For example, it is possible to employ what is called an RF sputtering method, in which case a high-frequency power supply with a frequency of 13.56 MHz or 27.12 MHz, for example, is connected to the target holder 320.

FIG. 39A illustrates an example where the backing plate 310 and the target holder 320 are not electrically connected to the magnet unit 330 and the magnet holder 332, but electrical connection is not limited thereto. For example, the backing plate 310 and the target holder 320 may be electrically connected to the magnet unit 330 and the magnet holder 332, and the backing plate 310, the target holder 320, the magnet unit 330, and the magnet holder 332 may have the same potential.

To increase the crystallinity of the formed oxide semiconductor film, the temperature of the substrate 360 may be set high. By setting the temperature of the substrate 360 high, migration of sputtered particles in the vicinity of the substrate 360 can be promoted. Thus, an oxide semiconductor film with higher density and higher crystallinity can be deposited. Note that the temperature of the substrate 360 is, for example, higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C.

The vertical distance between the target 300 and the substrate 360 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 300 and the substrate 360 is small enough to suppress a decrease in the energy of the sputtered particles until the sputtered particles reach the substrate 360 in some cases. Within the above range, the vertical distance between the target 300 and the substrate 360 is large enough to make the incident direction of the sputtered particle approximately vertical to the substrate 360, so that damage to the substrate 360 caused by collision of the sputtered particles can be reduced in some cases.

Figure 40A:
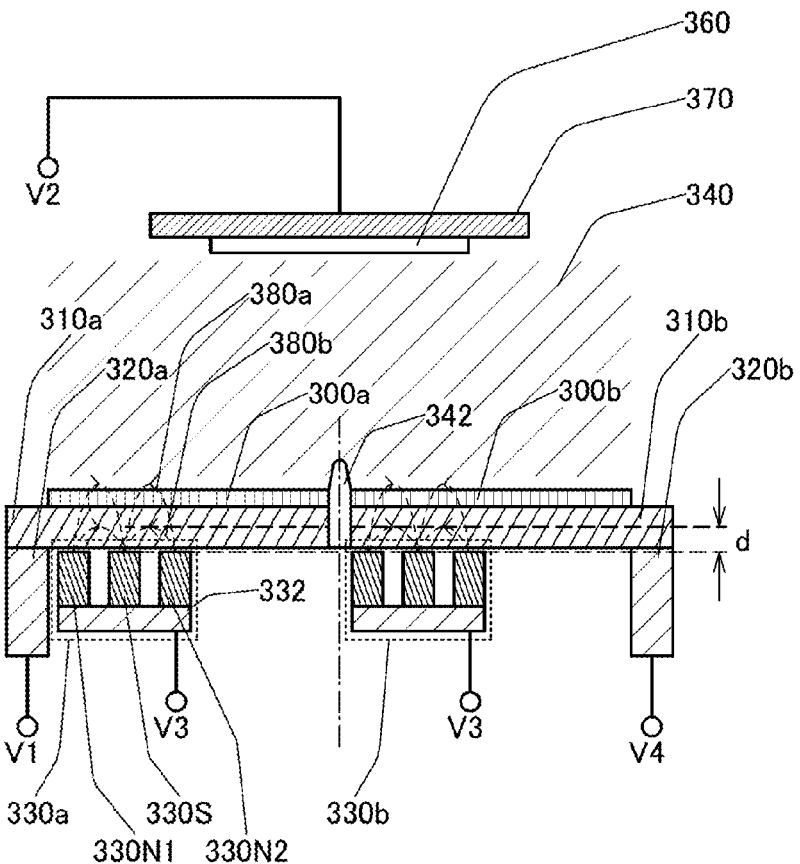
FIGS. 40A and 40B illustrate a sputtering apparatus.

FIG. 40A illustrates an example of a deposition chamber different from that in FIG. 39A.

The deposition chamber 301 in FIG. 40A includes a target holder 320a, a target holder 320b, a backing plate 310a, a backing plate 310b, a target 300a, a target 300b, a magnet unit 330a, a magnet unit 330b, a member 342, and the substrate holder 370. Note that the target 300a is placed over the backing plate 310a. The backing plate 310a is placed over the target holder 320a. The magnet unit 330a is placed under the target 300a with the backing plate 310a positioned therebetween. The target 300b is placed over the backing plate 310b. The backing plate 310b is placed over the target holder 320b. The magnet unit 330b is placed under the target 300b with the backing plate 310b positioned therebetween.

The magnet unit 330a includes a magnet 330N1, a magnet 330N2, the magnet 330S, and the magnet holder 332. Note that in the magnet unit 330a, the magnet 330N1, the magnet 330N2, and the magnet 330S are placed over the magnet holder 332. The magnet 330N1, the magnet 330N2, and the magnet 330S are spaced. Note that the magnet unit 330b has a structure similar to that of the magnet unit 330a. When the substrate 360 is transferred into the deposition chamber 301, the substrate 360 is placed in contact with the substrate holder 370.

The target 300a, the backing plate 310a, and the target holder 320a are separated from the target 300b, the backing plate 310b, and the target holder 320b by the member 342. Note that the member 342 is preferably an insulator. The member 342 may be a conductor or a semiconductor. The member 342 may be a conductor or a semiconductor whose surface is covered with an insulator.

The target holder 320a and the backing plate 310a are fixed to each other with a bolt and have the same potential. The target holder 320a has a function of supporting the target 300a with the backing plate 310a positioned therebetween. The target holder 320b and the backing plate 310b are fixed to each other with a bolt and have the same potential. The target holder 320b has a function of supporting the target 300b with the backing plate 310b positioned therebetween.

The backing plate 310a has a function of fixing the target 300a. The backing plate 310b has a function of fixing the target 300b.

FIG. 40A illustrates the magnetic line of force 380a and the magnetic line of force 380b formed by the magnet unit 330a.

The magnetic line of force 380a is one of magnetic lines of force that form a horizontal magnetic field in the vicinity of the target 300a. The vicinity of the target 300a corresponds to a region in which the vertical distance from the target 300a is, for example, greater than or equal to 0 mm and less than or equal to 10 mm, in particular, greater than or equal to 0 mm and less than or equal to 5 mm.

The magnetic line of force 380b is one of magnetic lines of force that form a horizontal magnetic field in a plane apart from the top surface of the magnet unit 330a by a vertical distance d. The vertical distance d is, for example, greater than or equal to 0 mm and less than or equal to 20 mm or greater than or equal to 5 mm and less than or equal to 15 mm.

Here, with the use of the strong magnet 330N1, the strong magnet 330N2, and the strong magnet 330S, an intense magnetic field can be generated in the vicinity of the substrate 360. Specifically, the magnetic flux density of the horizontal magnetic field in the vicinity of the substrate 360 can be greater than or equal to 10 G and less than or equal to 100 G, preferably greater than or equal to 15 G and less than or equal to 60 G, further preferably greater than or equal to 20 G and less than or equal to 40 G.

By setting the magnetic flux density of the magnetic field in the deposition chamber 301 to be in the above range, an oxide semiconductor film with high density and high crystallinity can be deposited. The deposited oxide semiconductor film hardly includes plural kinds of crystal phases and has a substantially-single crystalline phase.

Note that the magnet unit 330b forms a magnetic line of force similar to that formed by the magnet unit 330a.

Figure 40B:
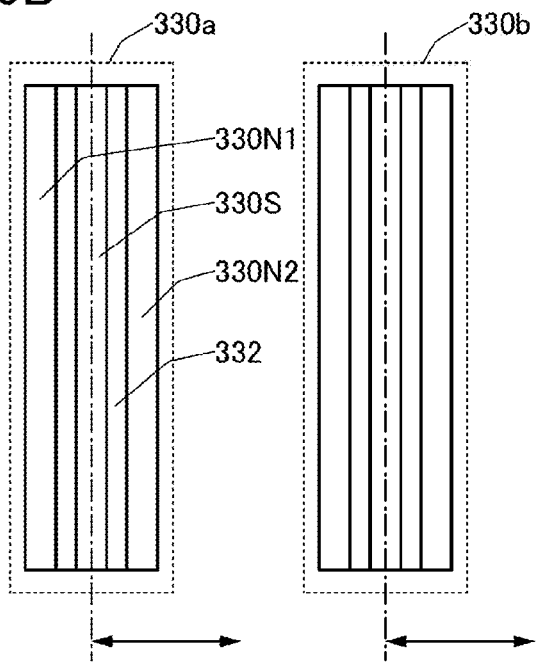

FIG. 40B is a top view of the magnet units 330a and 330b. In the magnet unit 330a, the rectangular or substantially rectangular magnet 330N1, the rectangular or substantially rectangular magnet 330N2, and the rectangular or substantially rectangular magnet 330S are fixed to the magnet holder 332. The magnet unit 330a can be oscillated horizontally as shown in FIG. 40B. For example, the magnet unit 330a may be oscillated with a beat of greater than or equal to 0.1 Hz and less than or equal to 1 kHz.

Thus, a region where a magnetic field on the target 300a is intense changes as the magnet unit 330a is oscillated. The region with an intense magnetic field is a high-density plasma region; thus, sputtering of the target 300a easily occurs in the vicinity of the region. For example, when the region with an intense magnetic field is fixed, only a specific region of the target 300a is used. In contrast, when the magnet unit 330a is oscillated as shown in FIG. 40B, the target 300a can be uniformly used. By oscillating the magnet unit 330a, a film with a uniform thickness and a film with uniform quality can be deposited.

By oscillating the magnet unit 330a, the state of the magnetic line of force in the vicinity of the substrate 360 can also be changed. The same applies to the magnet unit 330b.

Although the magnet unit 330a and the magnet unit 330b are oscillated in this example, one embodiment of the present invention is not limited to this example. For example, the magnet unit 330a and the magnet unit 330b may be rotated. For example, the magnet unit 330a and the magnet unit 330b may be rotated with a beat of greater than or equal to 0.1 Hz and less than or equal to 1 kHz. Alternatively, the target 300 may be rotated or moved. For example, the target 300 may be rotated or moved with a beat of greater than or equal to 0.1 Hz and less than or equal to 1 kHz. Further alternatively, the state of a magnetic line of force on the top surface of the substrate 360 can be changed relatively by rotating the substrate 360. These methods may be combined.

The deposition chamber 301 may have a groove portion inside or under the backing plate 310a and the backing plate 310b. By making fluid (air, nitrogen, a rare gas, water, oil, or the like) flow through the groove portion, discharge anomaly due to an increase in the temperature of the target 300a and the target 300b or damage to the deposition chamber 301 due to deformation of a component can be prevented in the sputtering. In that case, the backing plate 310a and the target 300a are preferably adhered to each other with a bonding member because the cooling capability is increased. Furthermore, the backing plate 310b and the target 300b are preferably adhered to each other with a bonding member because the cooling capability is increased.

A gasket is preferably provided between the target holder 320a and the backing plate 310a, in which case an impurity is less likely to enter the deposition chamber 301 from the outside or the groove portion. A gasket is preferably provided between the target holder 320b and the backing plate 310b, in which case an impurity is less likely to enter the deposition chamber 301 from the outside or the groove portion.

In the magnet unit 330a, the magnets 330N1 and 330N2 and the magnet 330S are placed such that their surfaces on the target 300a side have opposite polarities. Here, the case where the pole of each of the magnets 330N1 and 330N2 on the target 300a side is the north pole and the pole of the magnet 330S on the target 300a side is the south pole is described. Note that the layout of the magnets and the poles in the magnet unit 330a are not limited to those described here or those illustrated in FIG. 40A. The same applies to the magnet unit 330b.

In the deposition, a potential whose level is varied between a high level and a low level is applied to the terminal V1 connected to the target holder 320a and a terminal V4 connected to the target holder 320b. The potential V2 applied to the terminal V2 connected to the substrate holder 370 is, for example, the ground potential. A potential V3 applied to the terminal V3 connected to the magnet holder 332 is, for example, the ground potential. Note that the potentials applied to the terminals V1, V2, V3, and V4 are not limited to the above description. Not all the target holder 320a, the target holder 320b, the substrate holder 370, and the magnet holder 332 are necessarily supplied with potentials. For example, the substrate holder 370 may be electrically floating. Note that the potential whose level is varied between the high level and the low level is applied to the terminal V1 connected to the target holder 320a and the terminal V4 connected to the target holder 320b (i.e., an AC sputtering method is employed) in the example illustrated in FIG. 40A; however, one embodiment of the present invention is not limited thereto.

FIG. 40A illustrates an example where the backing plate 310a and the target holder 320a are not electrically connected to the magnet unit 330a and the magnet holder 332, but electrical connection is not limited thereto. For example, the backing plate 310a and the target holder 320a may be electrically connected to the magnet unit 330a and the magnet holder 332, and the backing plate 310a, the target holder 320a, the magnet unit 330a, and the magnet holder 332 may have the same potential. The backing plate 310b and the target holder 320b are not electrically connected to the magnet unit 330b and the magnet holder 332 in the example, but electrical connection is not limited thereto. For example, the backing plate 310a and the target holder 320b may be electrically connected to the magnet unit 330b and the magnet holder 332, and the backing plate 310a, the target holder 320b, the magnet unit 330b, and the magnet holder 332 may have the same potential.

To increase the crystallinity of the formed oxide semiconductor film, the temperature of the substrate 360 may be set high. By setting the temperature of the substrate 360 high, migration of sputtered particles in the vicinity of the substrate 360 can be promoted. Thus, an oxide semiconductor film with higher density and higher crystallinity can be deposited. Note that the temperature of the substrate 360 is, for example, higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C.

The vertical distance between the target 300a and the substrate 360 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 300a and the substrate 360 is small enough to suppress a decrease in the energy of the sputtered particles until the sputtered particles reach the substrate 360 in some cases. Within the above range, the vertical distance between the target 300a and the substrate 360 is large enough to make the incident direction of the sputtered particle approximately vertical to the substrate 360, so that damage to the substrate 360 caused by collision of the sputtered particles can be reduced in some cases.

The vertical distance between the target 300b and the substrate 360 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 300b and the substrate 360 is small enough to suppress a decrease in the energy of the sputtered particles until the sputtered particles reach the substrate 360 in some cases. Within the above range, the vertical distance between the target 300b and the substrate 360 is large enough to make the incident direction of the sputtered particle approximately vertical to the substrate 360, so that damage to the substrate 360 caused by collision of the sputtered particles can be reduced in some cases.

<<Facing-Targets Sputtering Apparatus (VDSP)>>

Figure 41A:
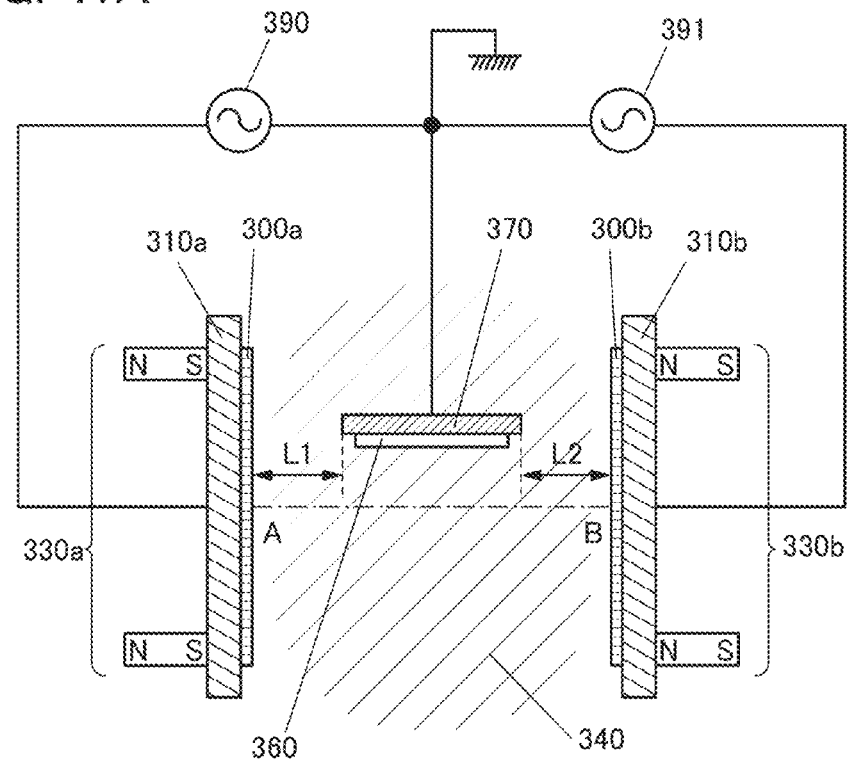
FIGS. 41A to 41C illustrate a sputtering apparatus.

Next, the facing-targets sputtering apparatus is described. FIG. 41A is a cross-sectional view of a deposition chamber of a facing-targets sputtering apparatus. The deposition chamber illustrated in FIG. 41A includes the target 300a, the target 300b, the backing plate 310a for holding the target 300a, the backing plate 310b for holding the target 300b, the magnet unit 330a placed behind the target 300a with the backing plate 310a positioned therebetween, and the magnet unit 330b placed behind the target 300b with the backing plate 310b positioned therebetween. The substrate holder 370 is placed between the target 300a and the target 300b. The substrate 360 is transferred into the deposition chamber, and then the substrate 360 is fixed to the substrate holder 370.

As illustrated in FIG. 41A, a power source 390 and a power source 391 for applying potentials are connected to the backing plates 310a and 310b. It is preferable to use AC power sources, which inversely apply alternate high and low potentials, as the power source 390 connected to the backing plate 310a and the power source 391 connected to the backing plate 310b. Although AC power sources are used as the power sources 390 and 391 illustrated in FIG. 41A, one embodiment of the present invention is not limited thereto. For example, RF power sources, DC power sources, or the like can be used as the power sources 390 and 391. Alternatively, different kinds of power sources may be used as the power sources 390 and 391.

The substrate holder 370 is preferably connected to GND. The substrate holder 370 may be in a floating state.

Figure 41B:
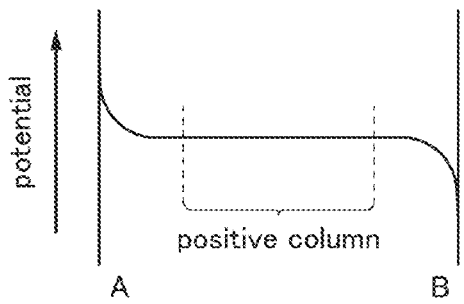
Figure 41C:
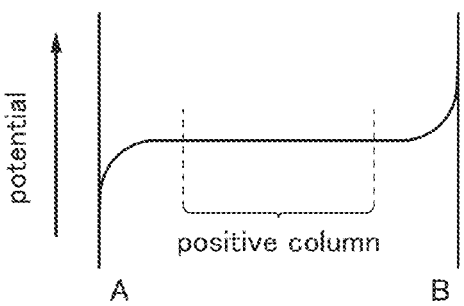

FIGS. 41B and 41C each show potential distribution of plasma 340 along dashed-dotted line A-B in FIG. 41A. FIG. 41B shows the potential distribution in the case where a high potential is applied to the backing plate 310a and a low potential is applied to the backing plate 310b. In that case, a cation is accelerated toward the target 300b. FIG. 41C shows the potential distribution in the case where a low potential is applied to the backing plate 310a and a high potential is applied to the backing plate 310b. In that case, a cation is accelerated toward the target 300a. To form the oxide semiconductor film of one embodiment of the present invention, the state in FIG. 41B and the state in FIG. 41C are alternated.

The oxide semiconductor film of one embodiment of the present invention is preferably formed while the plasma 340 completely reaches the surface of the substrate 360. For example, the substrate holder 370 and the substrate 360 are preferably placed in the plasma 340 as illustrated in FIG. 41A. It is particularly preferable that the substrate holder 370 and the substrate 360 be placed in a positive column of the plasma 340. The positive column of the plasma 340 is, in each of FIGS. 41B and 41C, a region around the midpoint of A and B where the gradient of the potential distribution is small. When the substrate 360 is placed in the positive column of the plasma 340 as illustrated in FIG. 41A, the substrate 360 is not exposed to a high electric field portion in the plasma 340; thus, damage to the substrate 360 due to the plasma 340 can be reduced and defects can be reduced.

It is preferable to place the substrate holder 370 and the substrate 360 in the plasma 340 during deposition as illustrated in FIG. 41A also because utilization efficiencies of the targets 300a and 300b are increased.

As illustrated in FIG. 41A, the horizontal distance between the substrate holder 370 and the target 300a is referred to as L1 and the horizontal distance between the substrate holder 370 and the target 300b is referred to as L2. The distance L1 and the distance L2 are each preferably as long as the length of the substrate 360 in the horizontal direction in FIG. 41A. In addition, it is preferable that the distances L1 and L2 be adjusted as appropriate so that the substrate 360 is placed in the positive column of the plasma 340 as described above. The distances L1 and L2 can each be, for example, greater than or equal to 10 mm and less than or equal to 200 mm.

In FIG. 41A, the target 300a and the target 300b are parallel to each other. Moreover, the magnet unit 330a and the magnet unit 330b are placed so that opposite poles face each other. Magnetic lines of force run from the magnet unit 330b to the magnet unit 330a. Therefore, in the deposition, the plasma 340 is confined in the magnetic field formed by the magnet units 330a and 330b. The substrate holder 370 and the substrate 360 are placed in a region where the target 300a and the target 300b face each other (also referred to as a region between targets). Note that although the substrate holder 370 and the substrate 360 are placed parallel to the direction in which the target 300a and the target 300b face each other in FIG. 41A, the substrate holder 370 and the substrate 360 may be inclined to the direction. By inclination of the substrate holder 370 and the substrate 360 at 30° or more and 60° or less (typified by 45°), for example, the proportion of sputtered particles that perpendicularly reach the substrate 360 during deposition can be increased.

The structure illustrated in FIG. 42 is different from that illustrated in FIG. 41A in that the target 300a and the target 300b that face each other are not parallel but inclined to each other (in V-shape). Thus, the description for FIG. 41A is referred to for the description except for the positions of the targets. The magnet unit 330a and the magnet unit 330b are placed so that opposite poles face each other. The substrate holder 370 and the substrate 360 are placed in the region between targets. With the targets 300a and 300b placed as illustrated in FIG. 42, the proportion of sputtered particles that reach the substrate 360 can be increased; accordingly, the deposition rate can be increased.

Figure 43:
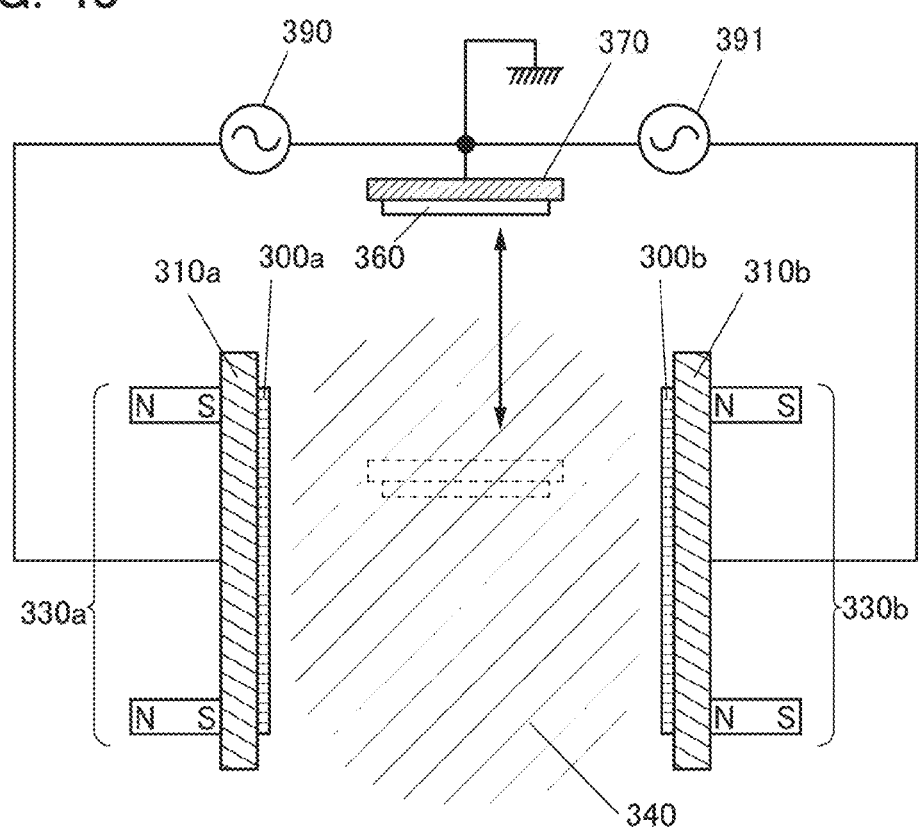
FIG. 43 illustrates a sputtering apparatus.

The positions of the substrate holder 370 and the substrate 360 are not limited to in the plasma 340 as illustrated in FIG. 41A. The substrate holder 370 and the substrate 360 may be placed outside the plasma 340 as illustrated in FIG. 43, for example. In that case, the substrate 360 is not exposed to a high electric field region of the plasma 340, leading to a reduction in damage due to the plasma 340. Note that the utilization efficiencies of the targets 300a and 300b are decreased as the distance between the plasma 340 and the substrate 360 is increased. It is preferable that the position of the substrate holder 370 be adjustable as illustrated in FIG. 43.

The substrate holder 370 may be placed either above or below the region between targets. Alternatively, the substrate holders 370 may be placed above and below the region. When the substrate holders 370 are provided above and below the region, deposition on two or more substrates can be performed at once, leading to an increase in productivity.

The facing-targets sputtering apparatus can stably generate plasma even in a high vacuum. Thus, deposition can be performed at a pressure higher than or equal to 0.005 Pa and lower than or equal to 0.09 Pa, for example. As a result, the concentration of impurities contained during deposition can be reduced.

The use of the facing-targets sputtering apparatus allows deposition in a high vacuum or deposition with less plasma damage and thus can provide a film with high crystallinity even when the temperature of the substrate 360 is low (e.g., higher than or equal to room temperature and lower than 100° C.).

Figure 44A:
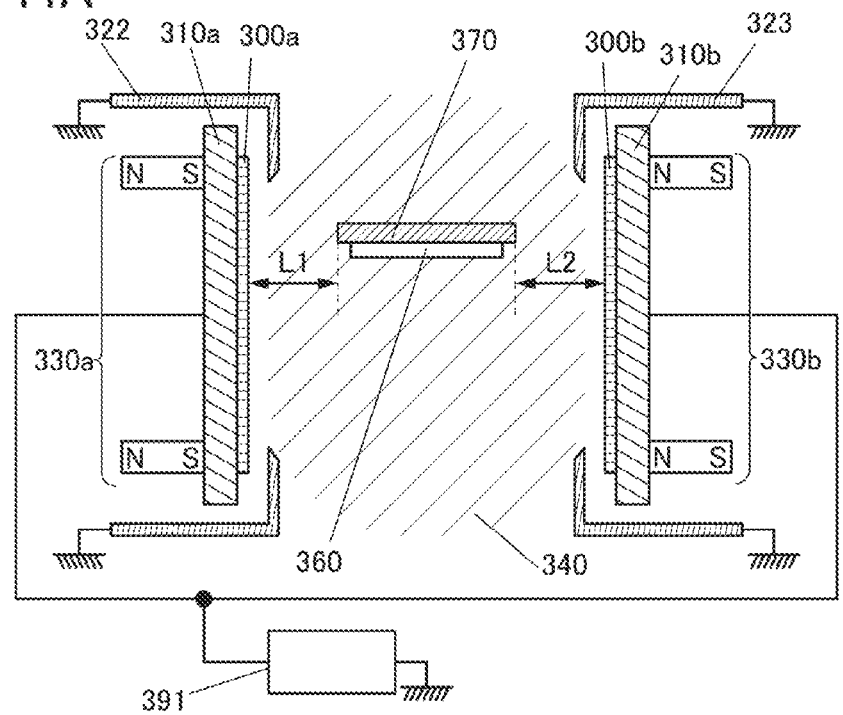
FIGS. 44A and 44B illustrate a sputtering apparatus.

FIG. 44A illustrates another example of a facing-targets sputtering apparatus.

FIG. 44A is a schematic cross-sectional view of a deposition chamber of a facing-targets sputtering apparatus. Unlike in the deposition chamber illustrated in FIG. 41A, a target shield 322 and a target shield 323 are provided. The power source 391 connected to the backing plates 310a and 310b is also provided.

The target shields 322 and 323 are connected to GND as illustrated in FIG. 44A. This means that the plasma 340 is generated by a potential difference between the backing plates 310a and 310b to which a potential of the power source 391 is applied and the target shields 322 and 323 to which GND is applied.

The oxide semiconductor film of one embodiment of the present invention is preferably formed while the plasma 340 completely reaches the surface of the substrate 360. For example, the substrate holder 370 and the substrate 360 are preferably placed in the plasma 340 as illustrated in FIG. 44A. It is particularly preferable that the substrate holder 370 and the substrate 360 be placed in a positive column of the plasma 340. The positive column of the plasma is a region where the gradient of the potential distribution is small. When the substrate 360 is placed in the positive column of the plasma 340 as illustrated in FIG. 44A, the substrate 360 is not exposed to a high electric field portion in the plasma 340; thus, damage to the substrate 360 due to the plasma 340 can be reduced and an oxide with a favorable film quality can be obtained.

It is preferable to place the substrate holder 370 and the substrate 360 in the plasma 340 during deposition as illustrated in FIG. 44A also because utilization efficiencies of the targets 300a and 300b are increased.

As illustrated in FIG. 44A, the horizontal distance between the substrate holder 370 and the target 300a is referred to as L1 and the horizontal distance between the substrate holder 370 and the target 300b is referred to as L2. The distance L1 and the distance L2 are each preferably as long as the length of the substrate 360 in the horizontal direction in FIG. 44A. In addition, it is preferable that the distances L1 and L2 be adjusted as appropriate so that the substrate 360 is placed in the positive column of the plasma 340 as described above.

Figure 44B:
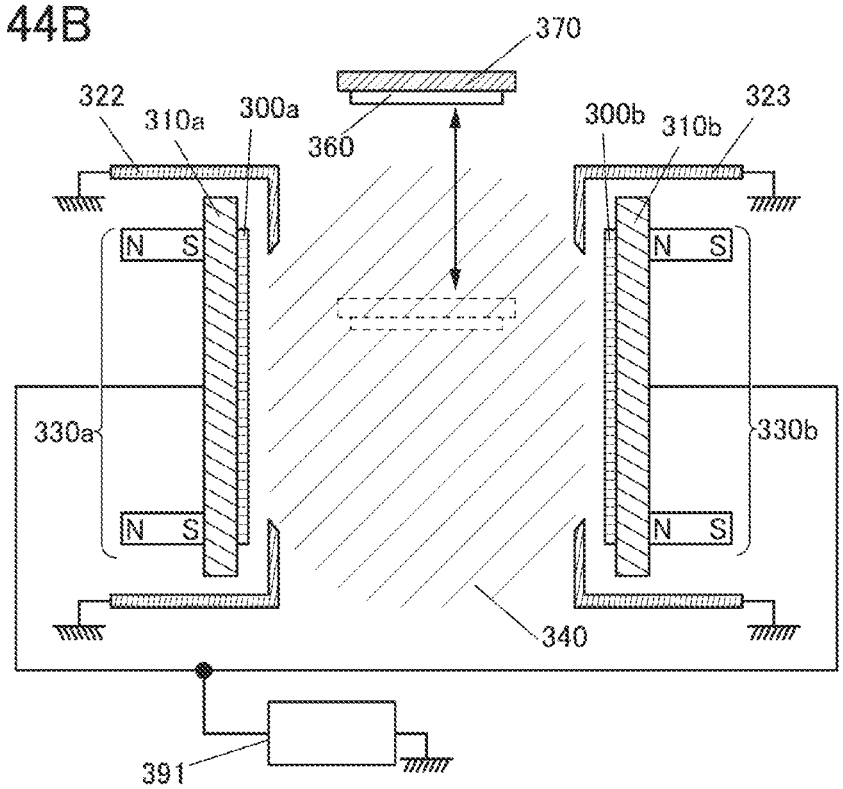

The positions of the substrate holder 370 and the substrate 360 are not limited to in the plasma 340 as illustrated in FIG. 44A. The substrate holder 370 and the substrate 360 may be placed outside the plasma 340 as illustrated in FIG. 44B, for example. In that case, the substrate 360 is not exposed to a high electric field region of the plasma 340, leading to a reduction in damage due to the plasma 340. Note that the utilization efficiencies of the targets 300a and 300b are decreased as the distance between the plasma 340 and the substrate 360 are increased. It is preferable that the position of the substrate holder 370 be adjustable as in FIG. 44B.

The substrate holder 370 may be placed above a region between targets as illustrated in FIG. 44B, or may be placed below the region. Alternatively, the substrate holders 370 may be placed above and below the region. Providing the substrate holders 370 above and below the region allows deposition on two or more substrates at once, leading to an increase in productivity.

In the above-described facing-targets sputtering apparatuses, plasma is confined by magnetic fields between targets; thus, plasma damage to a substrate can be reduced. Furthermore, a deposited film can have improved step coverage because an incident angle of a sputtered particle to a substrate can be made smaller by the inclination of the target. Moreover, deposition in a high vacuum enables the concentration of impurities contained in the film to be reduced.

Note that a parallel-plate-type sputtering apparatus or an ion beam sputtering apparatus may be provided in the deposition chamber.

<4-2. Deposition Apparatus>

A deposition apparatus including a deposition chamber with which the oxide semiconductor film of one embodiment of the present invention can be formed is described below.

First, a structure of a deposition apparatus which allows the entry of few impurities into a film at the time of the deposition or the like is described with reference to FIG. 45 and FIGS. 46A to 46C.

Figure 45:
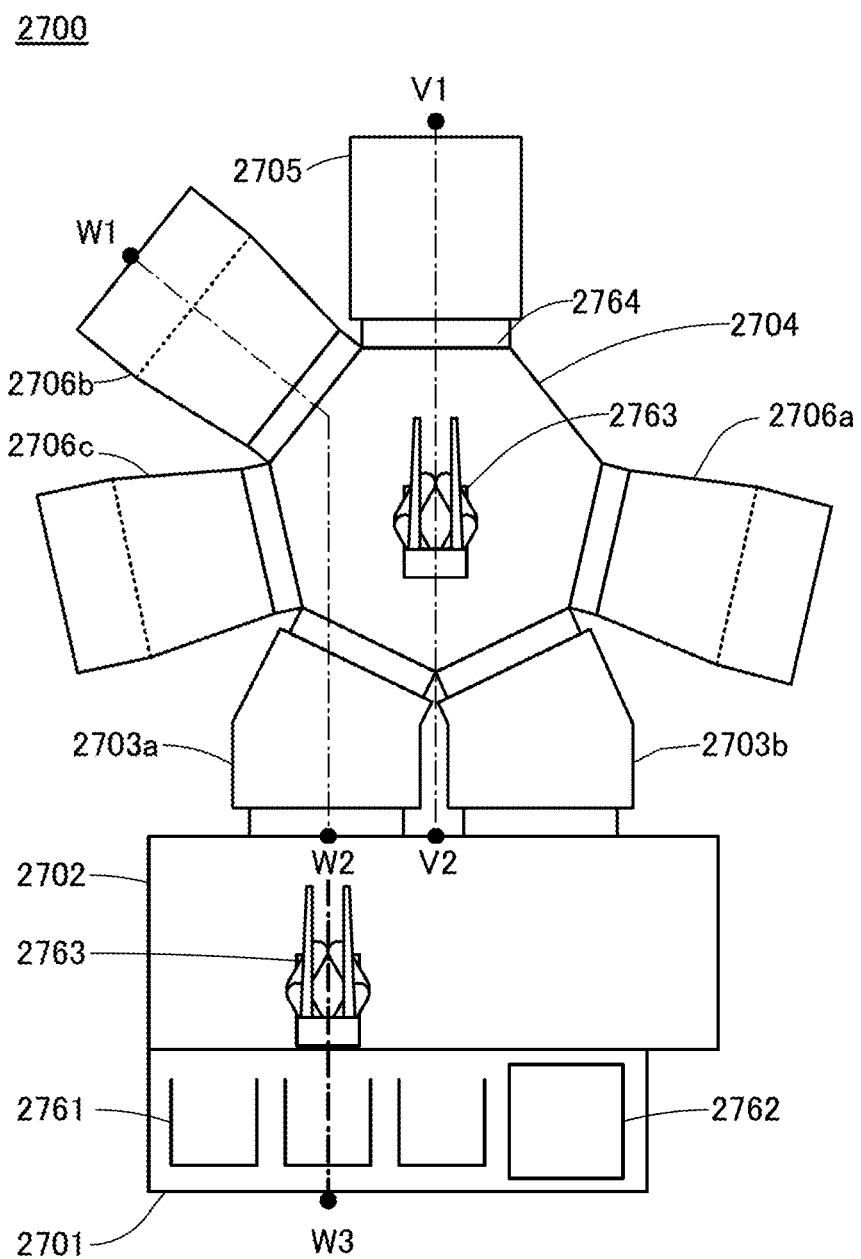
FIG. 45 is a top view illustrating an example of a deposition apparatus.

FIG. 45 is a top view schematically illustrating a single wafer multi-chamber deposition apparatus 2700. The deposition apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, a substrate heating chamber 2705 where a substrate is heated, and deposition chambers 2706a, 2706b, and 2706c in each of which a target is placed for deposition. Note that for the deposition chambers 2706a, 2706b, and 2706c, the structure of the deposition chamber described above can be referred to.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Gate valves 2764 are provided for connecting portions between chambers so that each chamber except the atmosphere-side substrate supply chamber 2701 and the atmosphere-side substrate transfer chamber 2702 can be independently kept under vacuum. Moreover, the atmosphere-side substrate transfer chamber 2702 and the transfer chamber 2704 each include a transfer robot 2763, with which a substrate can be transferred.

Furthermore, it is preferable that the substrate heating chamber 2705 also serve as a plasma treatment chamber. In the deposition apparatus 2700, it is possible to transfer a substrate without exposure to the air between treatment and treatment; therefore, adsorption of impurities on a substrate can be suppressed. In addition, the order of deposition, heat treatment, and the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement and the process conditions.

Figure 46A:
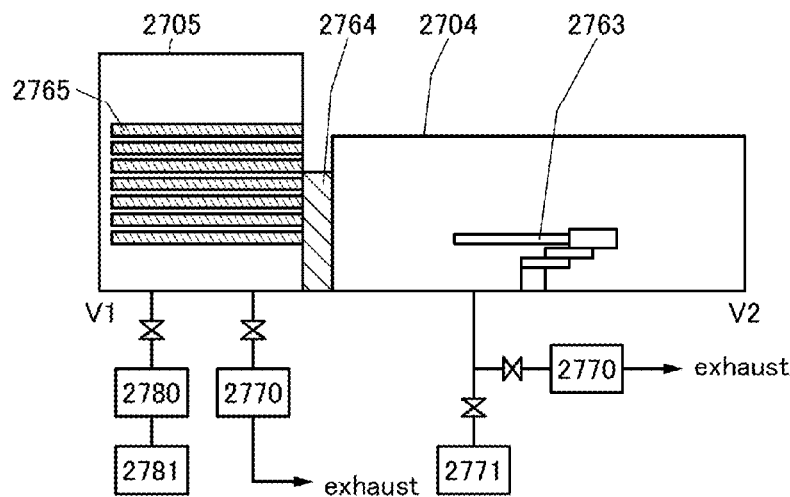
FIGS. 46A to 46C are cross-sectional views illustrating an example of a deposition apparatus.
Figure 46B:
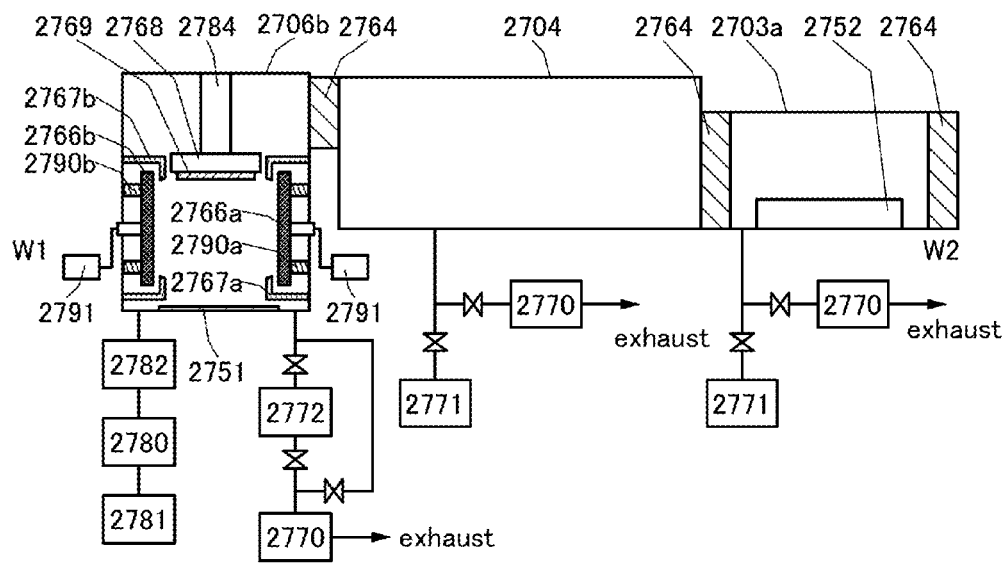
Figure 46C:
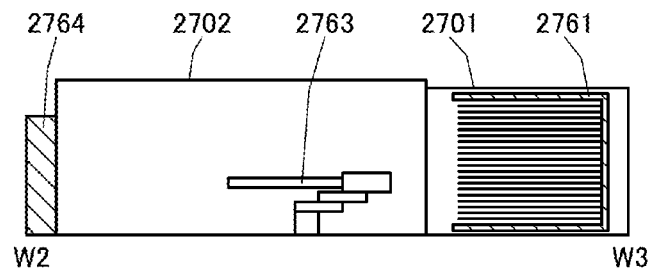

Next, FIG. 46A, FIG. 46B, and FIG. 46C are a cross-sectional view taken along dashed-dotted line V1-V2, a cross-sectional view taken along dashed-dotted line W1-W2, and a cross-sectional view taken along dashed-dotted line W2-W3, respectively, in the deposition apparatus 2700 illustrated in FIG. 45.

FIG. 46A is a cross section of the substrate heating chamber 2705 and the transfer chamber 2704, and the substrate heating chamber 2705 includes a plurality of heating stages 2765 which can hold a substrate. Furthermore, the substrate heating chamber 2705 is connected to a vacuum pump 2770 through a valve. As the vacuum pump 2770, a dry pump and a mechanical booster pump can be used, for example.

As a heating mechanism which can be used for the substrate heating chamber 2705, a resistance heater may be used for heating, for example. Alternatively, heat conduction or heat radiation from a medium such as a heated gas may be used as the heating mechanism. For example, RTA such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are provided for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. With such a structure, exhaust can be performed using the vacuum pump 2770 when the pressure inside the transfer chamber 2704 is in the range of atmospheric pressure to low or medium vacuum (about several hundred pascals to 0.1 Pa) and then, by switching the valves, exhaust can be performed using the cryopump 2771 when the pressure inside the transfer chamber 2704 is in the range of middle vacuum to high or ultra-high vacuum (approximately 0.1 Pa to $1\times10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 46B shows a cross section of the deposition chamber 2706b, the transfer chamber 2704, and the load lock chamber 2703a.

Here, the details of the deposition chamber (sputtering chamber) are described with reference to FIG. 46B. In the deposition chamber 2706b illustrated in FIG. 46B, a target 2766a, a target 2766b, a target shield 2767a, a target shield 2767b, a magnet unit 2790a, a magnet unit 2790b, a substrate holder 2768, and power sources 2791 are provided. Although not illustrated, the targets 2766a and 2766b are each fixed to a target holder with a backing plate positioned therebetween. The targets 2766a and 2766b are electrically connected to the power sources 2791. The magnet units 2790a and 2790b are placed behind the targets 2766a and 2766b, respectively. The target shields 2767a and 2767b are placed to surround end portions of the targets 2766a and 2766b, respectively. Note that here, the substrate 2769 is supported by the substrate holder 2768. The substrate holder 2768 is fixed to the deposition chamber 2706b by an movable member 2784. Owing to the movable member 2784, the substrate holder 2768 can move to a region between the targets 2766a and 2766b (region between targets). Providing the substrate holder 2768 supporting the substrate 2769 in the region between targets can reduce damage due to plasma in some cases, for example. Although not illustrated, the substrate holder 2768 may include a substrate holding mechanism which holds the substrate 2769, a rear heater which heats the substrate 2769 from the back surface, or the like.

The target shields 2767a and 2767b can suppress deposition of a particle which is sputtered from the targets 2766a and 2766b on a region where deposition is not needed. Moreover, the target shields 2767a and 2767b are preferably processed to prevent accumulated sputtered particles from being separated. For example, blasting treatment which increases surface roughness may be performed, or roughness may be formed on the surface of the target shields 2767a and 2767b.

The deposition chamber 2706b is connected to the mass flow controller 2780 through a gas heating system 2782, and the gas heating system 2782 is connected to the refiner 2781 through the mass flow controller 2780. With the gas heating system 2782, a gas which is introduced to the deposition chamber 2706b can be heated to a temperature higher than or equal to 40° C. and lower than or equal to 400° C., preferably higher than or equal to 50° C. and lower than or equal to 200° C. Note that although the gas heating system 2782, the mass flow controller 2780, and the refiner 2781 can be provided for each of a plurality of kinds of gases, only one gas heating system 2782, one mass flow controller 2780, and one refiner 2781 are provided for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like is preferably used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism which can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a refrigerator of the cryotrap 2751 is set to be lower than or equal to 100 K, preferably lower than or equal to 80 K. In the case where the cryotrap 2751 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve a higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b which are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, more preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, more preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, more preferably less than or equal to $3 \times 10^{-6}$ Pa. Furthermore, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, more preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706*b* which are described above preferably have a small amount of external leakage or internal leakage.

For example, in each of the transfer chamber 2704, the substrate heating chamber 2705, and the deposition chamber 2706*b* which are described above, the leakage rate is less than or equal to $3 \times 10^{-6}$ Pa·m$^3$/s, preferably less than or equal to $1 \times 10^{-6}$ Pa·m$^3$/s. The leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s. The leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. The leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706*b* is preferably sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen which is the main component of the oxide is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703a illustrated in FIG. 46B and the atmosphere-side substrate transfer chamber 2702 and the atmosphere-side substrate supply chamber 2701 illustrated in FIG. 46C are described. Note that FIG. 46C shows a cross section of the atmosphere-side substrate transfer chamber 2702 and the atmosphere-side substrate supply chamber 2701.

For the transfer chamber 2704 illustrated in FIG. 46B, the description of the transfer chamber 2704 illustrated in FIG. 46A can be referred to.

The load lock chamber 2703a includes a substrate delivery stage 2752. When a pressure in the load lock chamber 2703a becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703a is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 45 can have a structure similar to that in the load lock chamber 2703a.

The atmosphere-side substrate transfer chamber 2702 includes the transfer robot 2763. The transfer robot 2763 can deliver a substrate from the cassette port 2761 to the load lock chamber 2703a or deliver a substrate from the load lock chamber 2703a to the cassette port 2761.

Furthermore, a mechanism for cleaning dust or a particle, such as high efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., more preferably about room temperature (typically, 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal contained in a bonding member used for adhesion between the backing plate and a target might be sputtered and might cause an increase in impurity concentration. Thus, it is preferable that the target be cooled sufficiently.

Specifically, for the backing plate, a metal having high conductivity and a high heat dissipation property (specifically copper) is used. The target can be cooled efficiently by making a sufficient amount of cooling water flow through a groove portion which is formed in the backing plate.

With the above-described deposition apparatus, an oxide semiconductor film whose hydrogen concentration measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$ can be formed.

Furthermore, an oxide semiconductor film whose nitrogen concentration measured by SIMS is lower than or equal to $5\times10^{18}$ atoms/cm$^3$, preferably lower than or equal to $1\times10^{18}$ atoms/cm$^3$ can be formed.

Furthermore, an oxide semiconductor film whose carbon concentration measured by SIMS is lower than or equal to $2\times10^{18}$ atoms/cm$^3$, preferably lower than or equal to $2\times10^{17}$ atoms/cm$^3$ can be formed.

The oxide semiconductor film having small amounts of impurities and oxygen vacancies is an oxide semiconductor film with low carrier density (specifically, lower than $8\times10^{11}$/cm$^3$, preferably lower than $1\times10^{11}$/cm$^3$, further preferably lower than $1\times10^{10}$/cm$^3$, and is higher than or equal to $1\times10^{-9}$/cm$^3$). Such an oxide semiconductor is referred to as a highly purified intrinsic or substantially highly purified intrinsic oxide semiconductor. The oxide semiconductor film has a low impurity concentration and a low density of defect states. Thus, the oxide semiconductor film can be referred to as an oxide semiconductor film having stable characteristics.

Furthermore, an oxide semiconductor can be deposited in which the released amount of each of the following gas molecules (atoms) measured by TDS is less than or equal to $1\times10^{19}$/cm$^3$, preferably less than or equal to $1\times10^{18}$/cm$^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the use of the above deposition apparatus, the entry of impurities into the oxide semiconductor film can be suppressed. Furthermore, when a film in contact with the oxide semiconductor film is formed with the use of the above deposition apparatus, the entry of impurities into the oxide semiconductor film from the film in contact therewith can be suppressed.

Note that the structure described in this embodiment can be combined as appropriate with any of the structures described in the other embodiments and the examples.

Embodiment 5

In this embodiment, a display device that includes a semiconductor device of one embodiment of the present invention is described with reference to FIGS. 47A to 47C.

<5. Display Device>

The display device illustrated in FIG. 47A includes a region including pixels of display elements (hereinafter the region is referred to as a pixel portion 502), a circuit portion provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the image signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 47A:
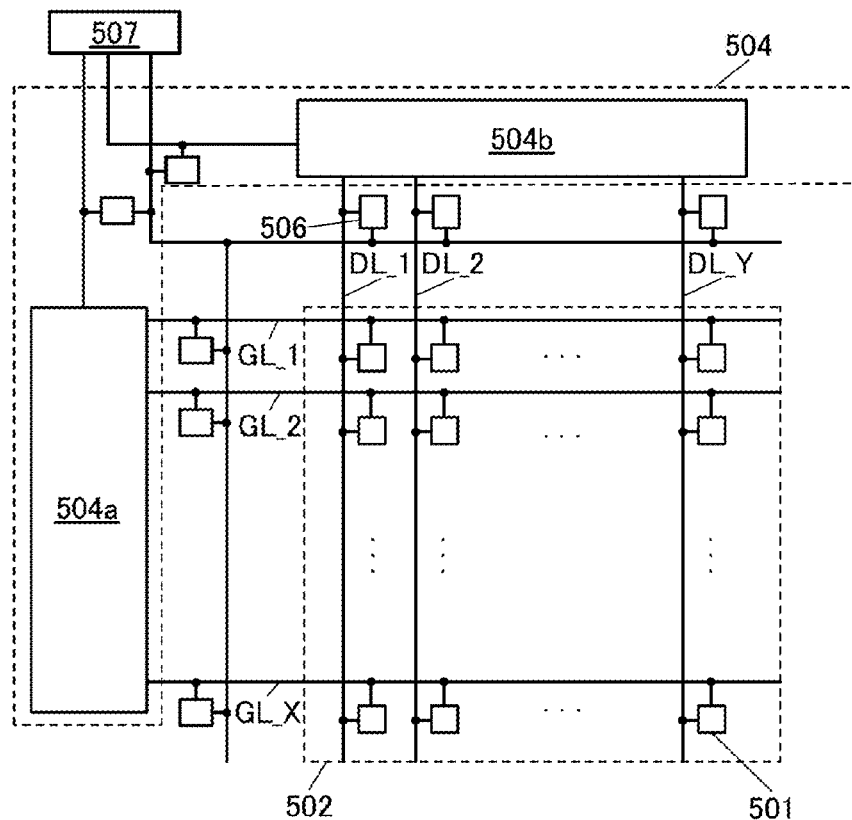
FIGS. 47A to 47C are a block diagram and circuit diagrams illustrating a display device.

The protection circuit 506 shown in FIG. 47A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 47A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 47A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 47B:
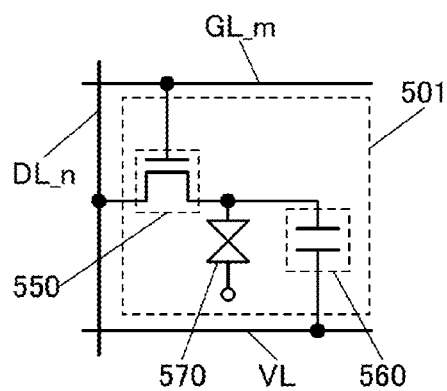

Each of the plurality of pixel circuits 501 in FIG. 47A can have the structure illustrated in FIG. 47B, for example.

The pixel circuit 501 illustrated in FIG. 47B includes a liquid crystal element 570, a transistor 550, and a capacitor 560. As the transistor 550, any of the transistors described in the above embodiments can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As a driving method of the display device including the liquid crystal element 570, any of the following modes can be used, for example: a twisted nematic (TN) mode, a super-twisted nematic (STN) mode, a vertical alignment (VA) mode, a multi-domain vertical alignment (MVA) mode, a patterned vertical alignment (PVA) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a transverse bend alignment (TBA) mode, and the like.

Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 47B, the pixel circuits 501 are sequentially selected row by row by the gate driver 504a illustrated in FIG. 47A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 47C:
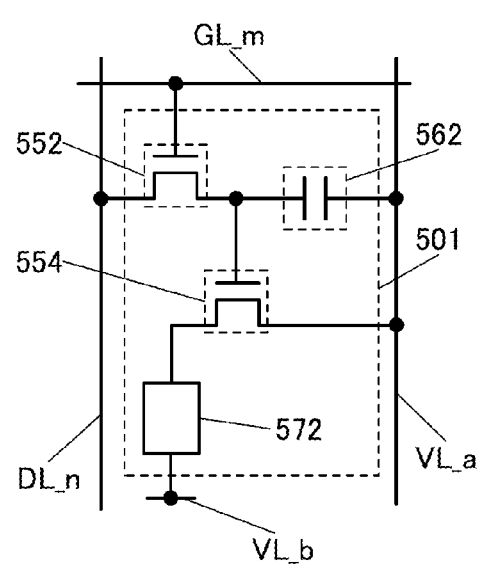

Alternatively, each of the plurality of pixel circuits 501 in FIG. 47A can have the structure illustrated in FIG. 47C, for example.

The pixel circuit 501 illustrated in FIG. 47C includes transistors 552 and 554, a capacitor 562, and a light-emitting element 572. Any of the transistors described in the above embodiments can be used as one or both of the transistors 552 and 554.

One of a source electrode and a drain electrode of the transistor 552 is electrically connected to a wiring to which a data signal is supplied (hereinafter referred to as a data line DL_n). A gate electrode of the transistor 552 is electrically connected to a wiring to which a gate signal is supplied (hereinafter referred to as a scan line GL_m).

The transistor 552 has a function of controlling whether to write a data signal.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 47C, the pixel circuits 501 are sequentially selected row by row by the gate driver 504a illustrated in FIG. 47A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although the structures including the liquid crystal element 570 or the light-emitting element 572 as a display element of the display device are described in this embodiment, one embodiment of the present invention is not limited to these structures and a variety of elements may be included in the display device.

For example, the display device includes at least one of a liquid crystal element, an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element using a carbon nanotube, and the like. Alternatively, the display device may include a display medium whose contrast, luminance, reflectivity, transmittance, or the like is changed by electrical or magnetic effect. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a directview liquid crystal display, or a projection liquid crystal display). An example of a display device including electronic ink or electrophoretic elements is electronic paper. In a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

A progressive type display, an interlace type display, or the like can be employed as the display type of the display device of this embodiment. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

The structure described in this embodiment can be combined as appropriate with any of the structures described in the other embodiments and the examples.

Embodiment 6

In this embodiment, a display device including a semiconductor device of one embodiment of the present invention and an electronic device in which the display device is provided with an input device will be described with reference to FIGS. 48A and 48B, FIGS. 49A and 49B, FIG. 50, FIGS. 51A and 51B, FIGS. 52A and 52B, and FIG. 53.
<6-1. Touch Panel>
In this embodiment, a touch panel 2000 including a display device and an input device will be described as an example of an electronic device. In addition, an example in which a touch sensor is used as an input device will be described.

Figure 48A:
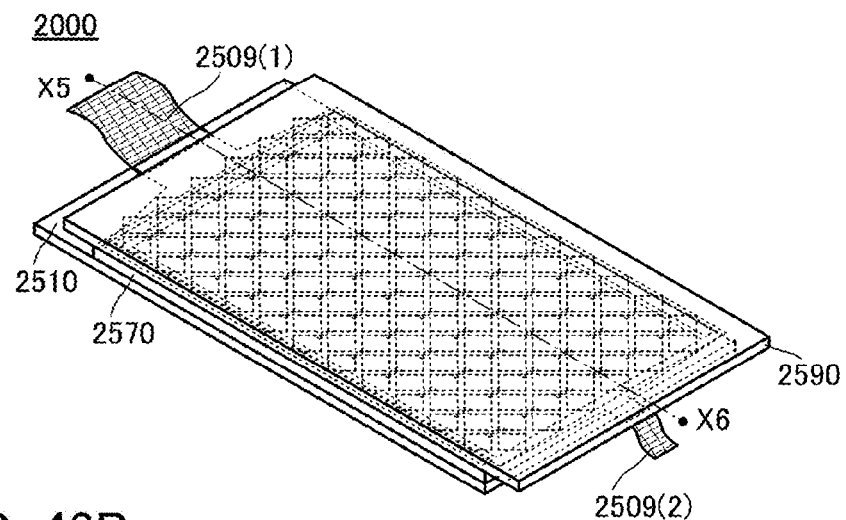
FIGS. 48A and 48B are perspective views illustrating an example of a touch panel.
Figure 48B:
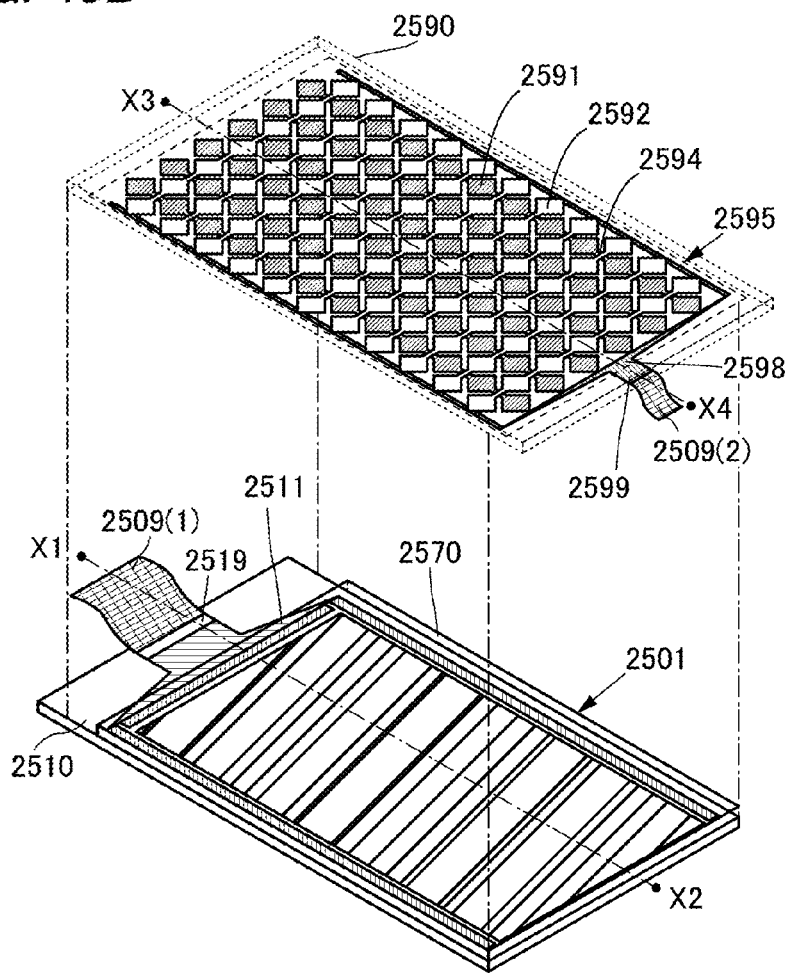

FIGS. 48A and 48B are perspective views of the touch panel 2000. Note that FIGS. 48A and 48B illustrate only main components of the touch panel 2000 for simplicity.

The touch panel 2000 includes a display device 2501 and a touch sensor 2595 (see FIG. 48B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 48B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used, for example. Examples of the capacitive touch sensor are a surface capacitive touch sensor and a projected capacitive touch sensor.

Examples of the projected capacitive touch sensor are a self-capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 48B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 48A and 48B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films used for the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case where an Ag nanowire is used as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<6-2. Display Device>

Figure 49A:
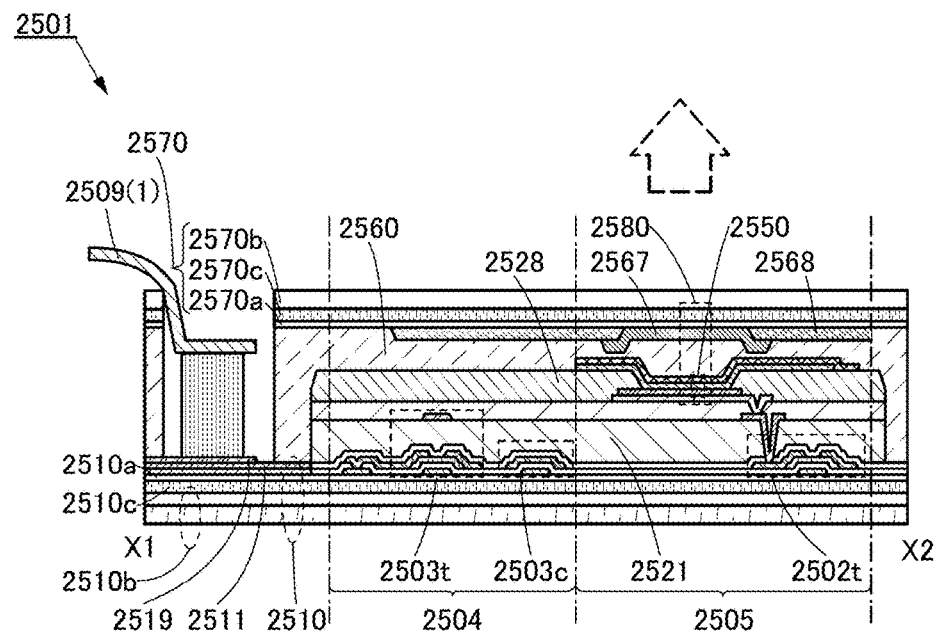
FIGS. 49A and 49B are cross-sectional views illustrating examples of a display device.
Figure 49B:
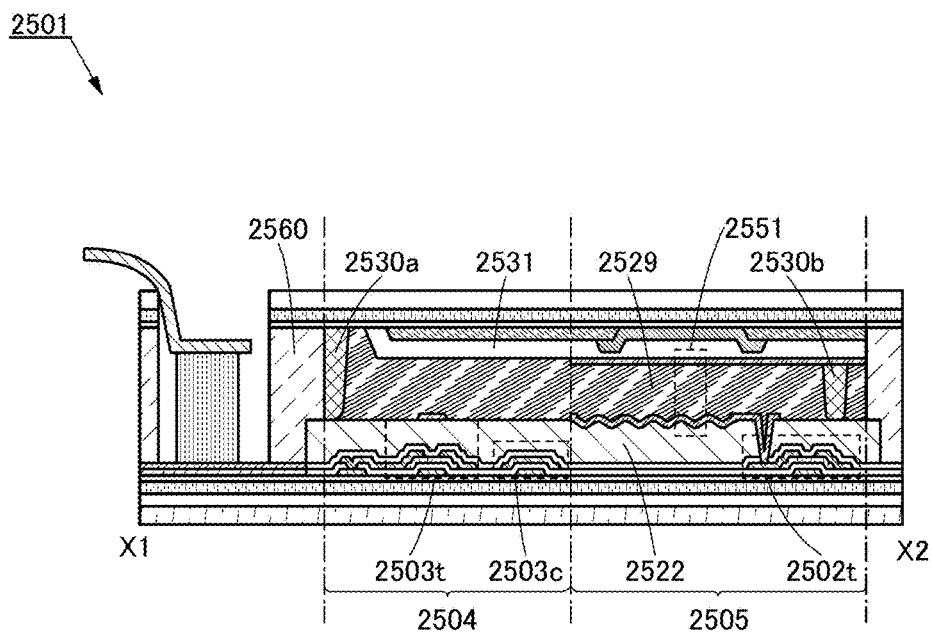

Next, the display device 2501 will be described in detail with reference to FIGS. 49A and 49B. FIGS. 49A and 49B correspond to cross-sectional views taken along dashed-dotted line X1-X2 in FIG. 48B.

The display device 2501 includes a plurality of pixels arranged in a matrix. Each of the pixels includes a display element and a pixel circuit for driving the display element.

<<Structure with EL Element as Display Element>>

First, a structure that uses an EL element as a display element will be described below with reference to FIG. 49A. In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m²·day), preferably lower than or equal to $10^{-6}$ g/(m²·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or acrylic, urethane, or epoxy can be used. Alternatively, a material that includes a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 49A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which does not transmit moisture and oxygen is preferably used.

The display device 2501 illustrated in FIG. 49A includes a pixel 2505. The pixel 2505 includes a light-emitting module 2580, the EL element 2550, and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 49A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition 2528 is provided so as to overlap with an end portion of the lower electrode of the EL element 2550.

Note that a spacer for controlling the distance between the substrate 2510 and the substrate 2570 may be formed over the partition 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and which has high crystallinity. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. Note that the details of the refresh operation will be described later.

In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

<<Structure with Liquid Crystal Element as Display Element>>

Next, a structure including a liquid crystal element as a display element is described below with reference to FIG. 49B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 49B has the same structure as the display device 2501 illustrated in FIG. 49A except the following points.

The pixel 2505 in the display device 2501 illustrated in FIG. 49B includes a liquid crystal element 2551 and the transistor 2502t that can supply electric power to the liquid crystal element 2551.

The liquid crystal element 2551 includes a lower electrode (also referred to as a pixel electrode), an upper electrode, and a liquid crystal layer 2529 between the lower electrode and the upper electrode. By the application of a voltage between the lower electrode and the upper electrode, the alignment state of the liquid crystal layer 2529 in the liquid crystal element 2551 can be changed. Furthermore, in the liquid crystal layer 2529, a spacer 2530a and a spacer 2530b are provided. Although not illustrated in FIG. 49B, an alignment film may be provided on each of the upper electrode and the lower electrode on the side in contact with the liquid crystal layer 2529.

As the liquid crystal layer 2529, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions. In the case where a horizontal electric field mode liquid crystal display device is employed, liquid crystal exhibiting a blue phase for which an alignment film is unnecessary may be used. In the case where a liquid crystal exhibiting a blue phase is used, an alignment film is not necessarily provided, so that rubbing treatment is also unnecessary. Accordingly, electrostatic discharge damage caused by the rubbing treatment can be prevented and defects and damage of the liquid crystal display device in the manufacturing process can be reduced.

The spacers 2530a and 2530b are formed by selectively etching an insulating film. The spacers 2530a and 2530b are provided in order to control the distance between the substrate 2510 and the substrate 2570 (the cell gap). Note that the spacers 2530a and 2530b may have different sizes from each other and are preferably have a columnar or spherical shape. Although the spacers 2530a and 2530b are provided on the substrate 2570 side in the non-limiting structure in FIG. 49B, they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, a resin film may be used, for example. The lower electrode of the liquid crystal element 2551 functions as a reflective electrode. The display device 2501 illustrated in FIG. 49B is of a reflective type which performs display by reflecting external light at the lower electrode and making the light pass through the coloring layer 2567. Note that in the case where a transmissive liquid crystal display device is formed, a transparent electrode is provided as the lower electrode.

The display device 2501 illustrated in FIG. 49B includes an insulating layer 2522. The insulating layer 2522 covers the transistor 2502t and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case where a transmissive liquid crystal display device is formed, a structure without such roughness may be employed.

<6-3. Touch Sensor>

Figure 50:
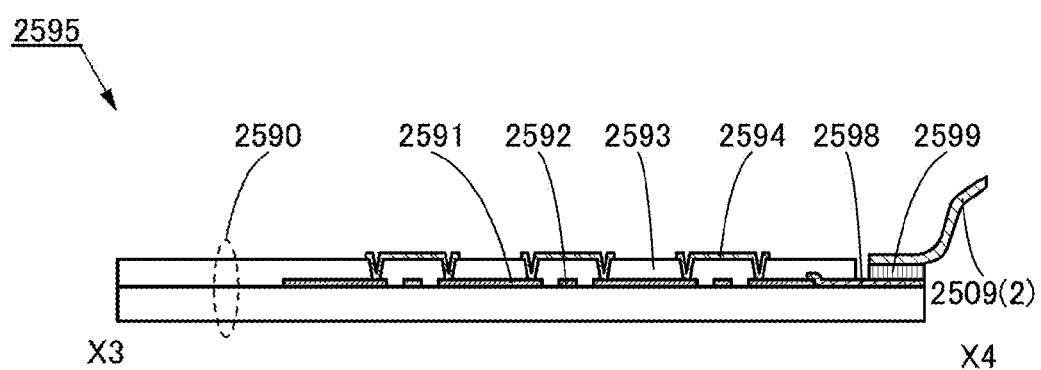
FIG. 50 is a cross-sectional view illustrating an example of a touch sensor.

Next, the touch sensor 2595 will be described in detail with reference to FIG. 50. FIG. 50 corresponds to a cross-sectional view taken along dashed-dotted line X3-X4 in FIG. 48B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<6-4. Touch Panel>

Figure 51A:
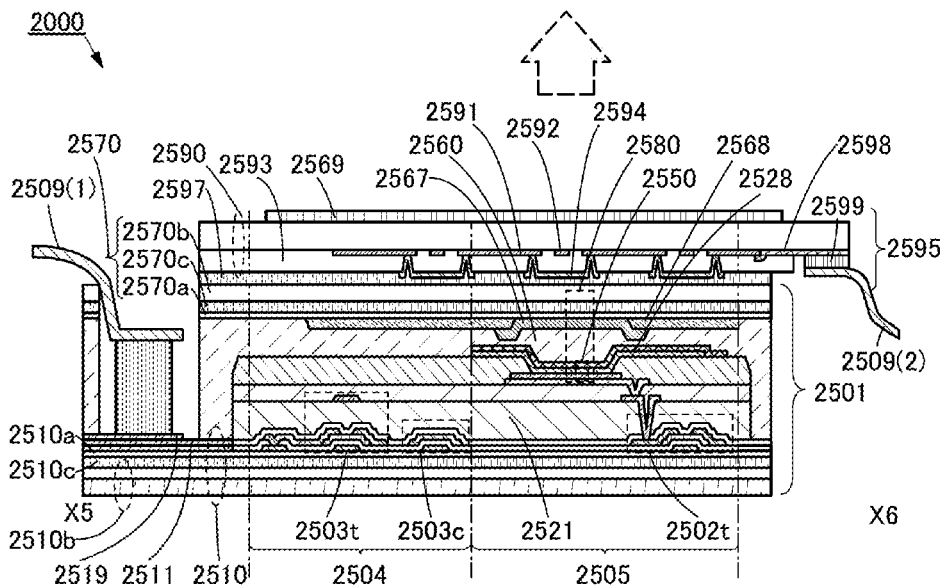
FIGS. 51A and 51B are cross-sectional views illustrating examples of a touch panel.

Next, the touch panel 2000 will be described in detail with reference to FIG. 51A. FIG. 51A corresponds to a cross-sectional view taken along dashed-dotted line X5-X6 in FIG. 48A.

In the touch panel 2000 illustrated in FIG. 51A, the display device 2501 described with reference to FIG. 48A and the touch sensor 2595 described with reference to FIG. 50 are attached to each other.

The touch panel 2000 illustrated in FIG. 51A includes an adhesive layer 2597 and an anti-reflective layer 2569 in addition to the components described with reference to FIG. 49A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 51A will be described with reference to FIG. 51B.

Figure 51B:
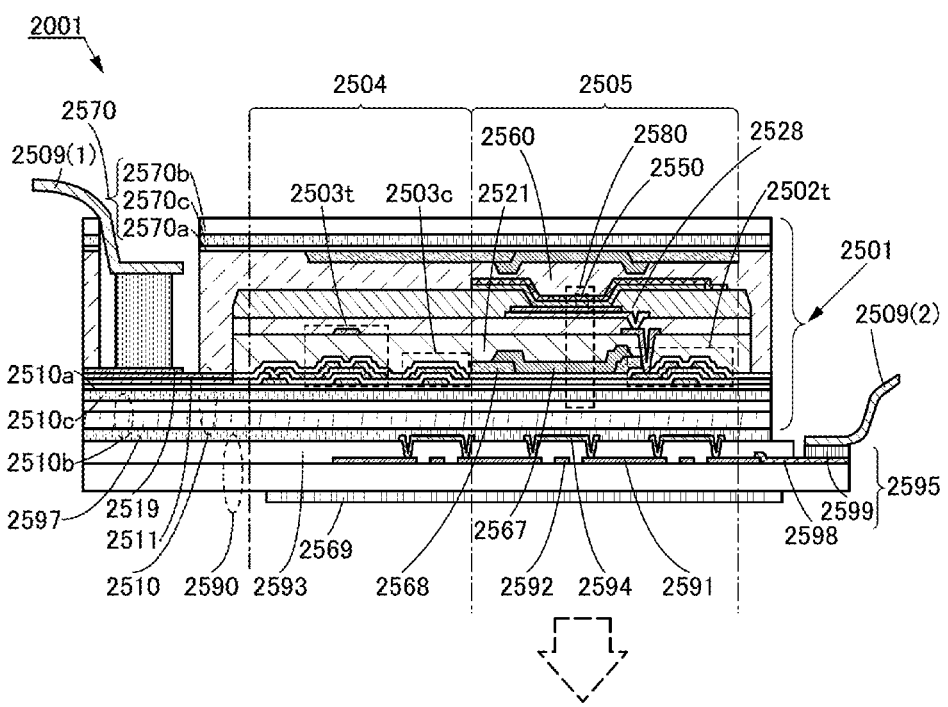

FIG. 51B is a cross-sectional view of a touch panel 2001. The touch panel 2001 illustrated in FIG. 51B differs from the touch panel 2000 illustrated in FIG. 51A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 51B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 51B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 51A or FIG. 51B, light may be emitted from the light-emitting element through either or both of the substrates 2510 and 2570.

<6-5. Method for Driving Touch Panel>

Next, an example of a method for driving a touch panel will be described with reference to FIGS. 52A and 52B.

Figure 52A:
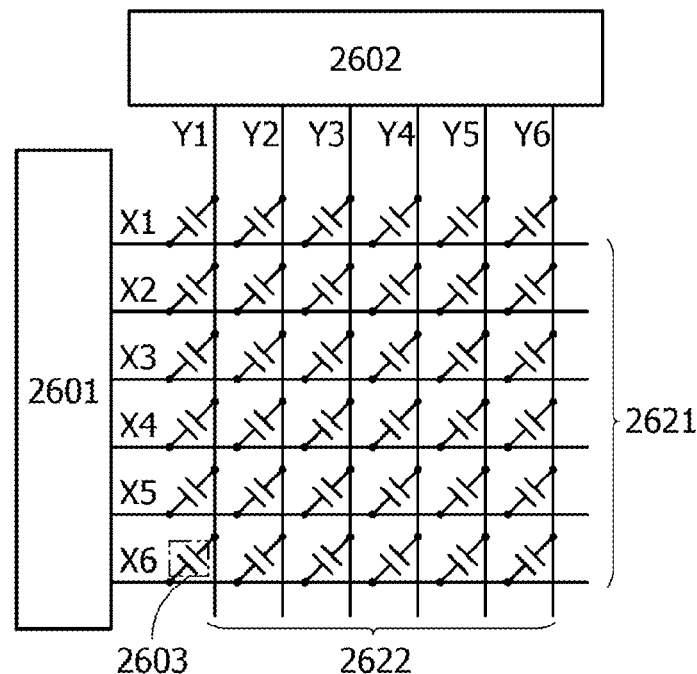
FIGS. 52A and 52B are a block diagram and a timing chart of a touch sensor.

FIG. 52A is a block diagram illustrating the structure of a mutual capacitive touch sensor. FIG. 52A illustrates a pulse voltage output circuit 2601 and a current sensing circuit 2602. Note that in FIG. 52A, six wirings X1 to X6 represent the electrodes 2621 to which a pulse voltage is applied, and six wirings Y1 to Y6 represent the electrodes 2622 that detect changes in current. FIG. 52A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 52B:
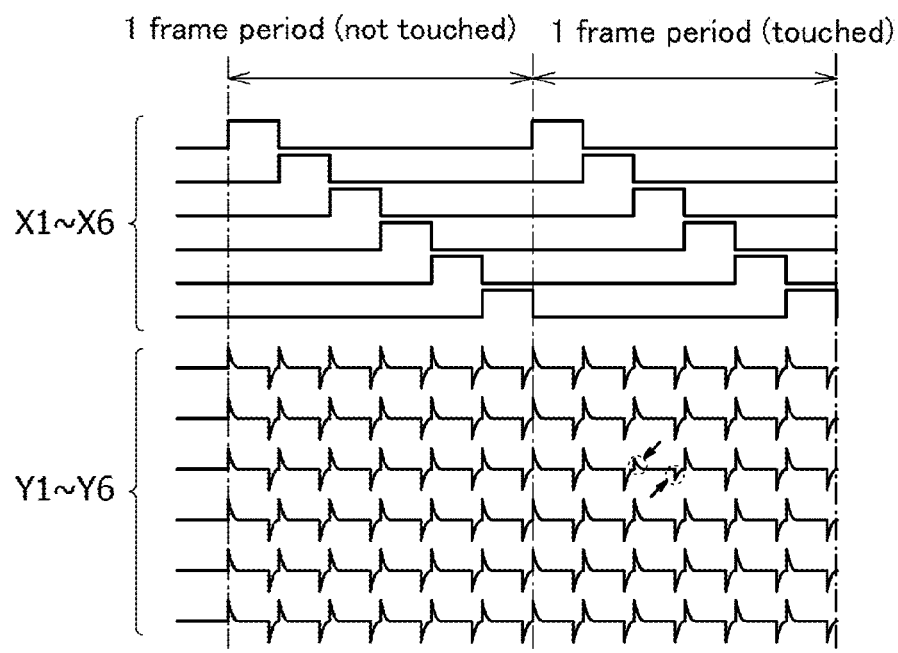

FIG. 52B is a timing chart showing input and output waveforms in the mutual capacitive touch sensor illustrated in FIG. 52A. In FIG. 52B, sensing of a sensing target is performed in all the rows and columns in one frame period. FIG. 52B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<6-6. Sensor Circuit>

Figure 53:
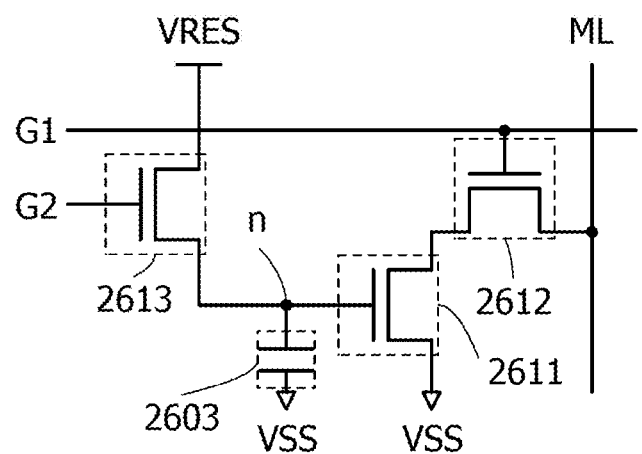
FIG. 53 is a circuit diagram of a touch sensor.

Although FIG. 52A illustrates a passive matrix type touch sensor in which only the capacitor 2603 is provided at the intersection of wirings as a touch sensor, an active matrix type touch sensor including a transistor and a capacitor may be used. FIG. 53 illustrates an example of a sensor circuit included in an active matrix type touch sensor.

The sensor circuit in FIG. 53 includes the capacitor 2603 and transistors 2611, 2612, and 2613.

A signal G2 is applied to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is applied to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 53 will be described. First, a potential for turning on the transistor 2613 is supplied to the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied to the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

The structure described in this embodiment can be combined as appropriate with any of the structures described in the other embodiments and the examples.

Embodiment 7

In this embodiment, a display device including a semiconductor device of one embodiment of the present invention and a method for driving the display device will be described with reference to FIGS. 54A and 54B, FIGS. 55A and 55B, FIGS. 56A to 56E, and FIGS. 57A to 57E.

Note that the display device of one embodiment of the present invention may include an information processing portion, an arithmetic portion, a memory portion, a display portion, an input portion, and the like.

In the display device of one embodiment of the present invention, power consumption can be reduced by reducing the number of times of writing signals for the same image (also referred to as "refresh operation") in the case where the same image (still image) is continuously displayed. Note that the frequency of refresh operations is referred to as a refresh rate (also referred to as scan frequency or vertical synchronization frequency). A display device in which the refresh rate is reduced and which causes little eye fatigue is described below.

The eye fatigue is divided into two categories: nervous fatigue and muscle fatigue. The nervous fatigue is caused by prolonged looking at light emitted from a display device or blinking images. This is because brightness stimulates and fatigues the retina and nerve of the eye and the brain. The muscle fatigue is caused by overuse of a ciliary muscle which works for adjusting the focus.

Figure 54A:
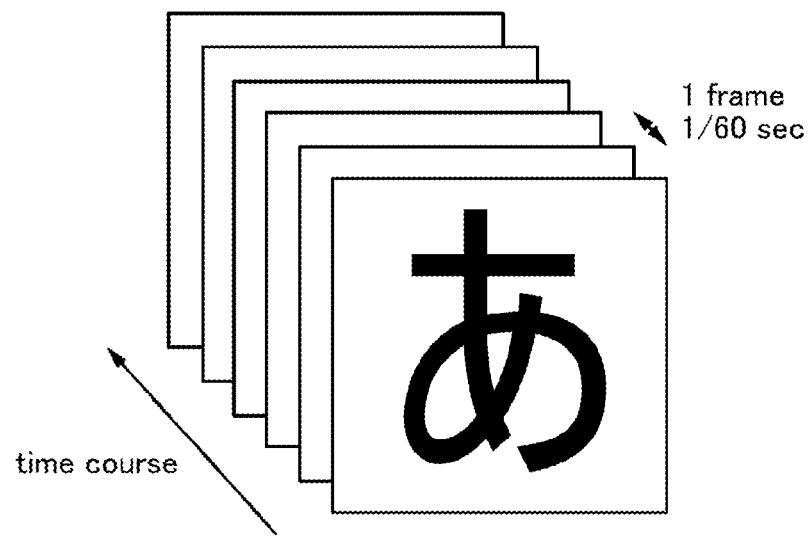
FIGS. 54A and 54B each illustrate display of a display device.

FIG. 54A is a schematic view showing display on a conventional display device. As illustrated in FIG. 54A, for the display of the conventional display device, image rewriting is performed 60 times every second. Prolonged looking at such a screen might stimulate the retina and nerve of the eye and the brain of a user and lead to eye fatigue.

In the display device of one embodiment of the present invention, a transistor including an oxide semiconductor, for example, a transistor including a CAAC-OS, is used in a pixel portion. The off-state current of the transistor is extremely low. Thus, the luminance of the display device can be maintained even when the refresh rate of the display device is lowered.

Figure 54B:
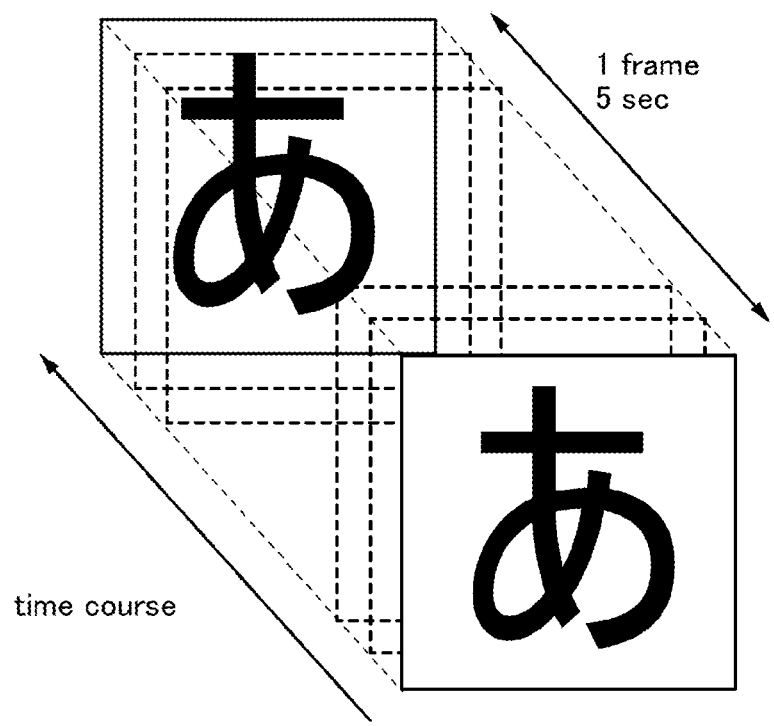

That is, as shown in FIG. 54B, an image can be rewritten as less frequently as once every five seconds, for example. This enables the user to see the same one image as long as possible, so that flicker on the screen perceived by the user is reduced. Consequently, a stimulus to the retina or the nerve of an eye or the brain of the user is relieved, resulting in less nervous fatigue.

Figure 55A:
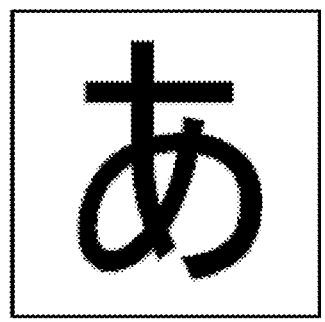
FIGS. 55A and 55B each illustrate display of a display device.

In addition, as shown in FIG. 55A, when the size of each pixel is large (for example, when the resolution is less than 150 ppi), a character displayed on the display device is blurred. When a user keeps looking at a blurred character displayed on the display device for a long time, it continues to be difficult to focus the eye on the character even though the ciliary muscle constantly moves in order to focus the eye, which might put strain on the eye.

Figure 55B:
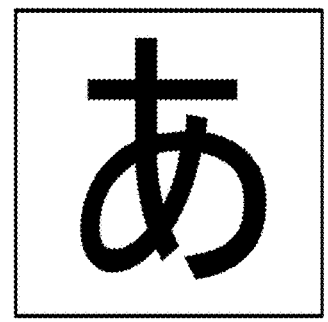

In contrast, as shown in FIG. 55B, the display device of one embodiment of the present invention is capable of high-resolution display because the size of each pixel is small; thus, precise and smooth display can be achieved. The precise and smooth display enables ciliary muscles to adjust the focus more easily, and reduces muscle fatigue of a user. When the resolution of the display device is 150 ppi or more, preferably 200 ppi or more, further preferably 300 ppi or more, the user's muscle fatigue can be effectively reduced.

Methods for quantifying eye fatigue have been studied. For example, critical flicker (fusion) frequency (CFF) is known as an indicator for evaluating nervous fatigue. Further, focus adjustment time, near point distance, and the like are known as indicators for evaluating muscle fatigue.

Other methods for evaluating eye fatigue include electroencephalography, thermography, counting the number of times of blinking, measuring the amount of tears, measuring the speed of contractile response of the pupil, and questionnaires for surveying subjective symptoms.

By any of the variety of methods above, the effect of the reduction of eye fatigue by employing the driving method of the display device of one embodiment of the present invention can be evaluated.

<7. Method for Driving Display Device>

Now, a method for driving the display device of one embodiment of the present invention is described with reference to FIGS. 56A to 56E.

<<Display Example of Image Data>>

An example of displaying two images including different image data by being transferred is described below.

Figure 56A:
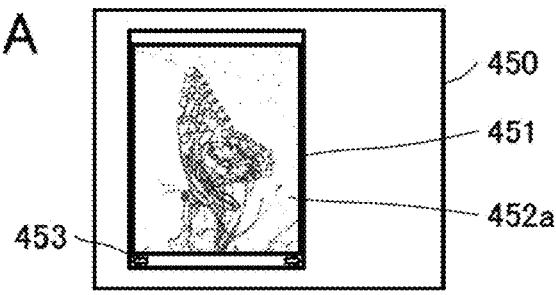
FIGS. 56A to 56E illustrate an example of a displaying method of a display device.

FIG. 56A illustrates an example in which a window 451 and a first image 452a which is a still image displayed in the window 451 are displayed on a display portion 450.

At this time, display is preferably performed at the first refresh rate. Note that the first refresh rate can be higher than or equal to $1.16 \times 10^{-5}$ Hz (about once per day) and lower than or equal to 1 Hz, higher than or equal to $2.78 \times 10^{-4}$ Hz (about once per hour) and lower than or equal to 0.5 Hz, or higher than or equal to $1.67 \times 10^{-2}$ Hz (about once per minute) and lower than or equal to 0.1 Hz.

When frequency of rewriting an image is reduced by setting the first refresh rate to an extremely small value, display substantially without flicker can be achieved, and eye fatigue of a user can be more effectively reduced.

The window 451 is displayed by, for example, executing application software for image display and includes a display region where an image is displayed.

Further, in a lower part of the window 451, a button 453 for switching a displayed image data to a different image data is displayed. When a user performs operation in which the button 453 is selected, an instruction of transferring an image can be supplied to the information processing portion of the display device.

Note that the operation method performed by the user may be set in accordance with an input unit. For example, in the case where a touch panel provided to overlap with the display portion 450 is used as the input unit, it is possible to perform operation of touching the button 453 with a finger, a stylus, or the like or input operation by a gesture where an image is made to slide. In the case where the input operation is performed with gesture or sound, the button 453 is not necessarily displayed.

Figure 56B:
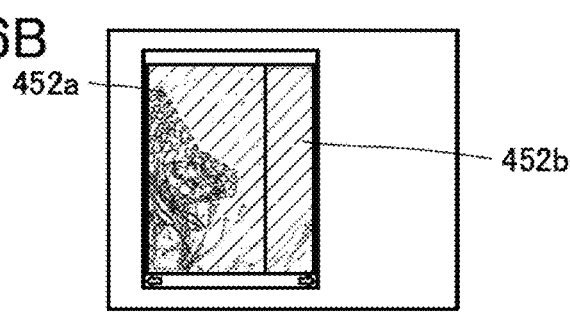

When the information processing portion of the display device receives the instruction of transferring an image, transfer of the image displayed in the window 451 starts (see FIG. 56B).

Note that in the case where display is performed at the first refresh rate in the state of FIG. 56A, the refresh rate is preferably changed to the second refresh rate before transfer of the image starts. The second refresh rate is a value necessary for displaying a moving image. For example, the second refresh rate can be higher than or equal to 30 Hz and lower than or equal to 960 Hz, preferably higher than or equal to 60 Hz and lower than or equal to 960 Hz, further preferably higher than or equal to 75 Hz and lower than or equal to 960 Hz, still further preferably higher than or equal to 120 Hz and lower than or equal to 960 Hz, yet still further preferably higher than or equal to 240 Hz and lower than or equal to 960 Hz.

When the second refresh rate is set to a value higher than that of the first refresh rate, a moving image can be displayed further smoothly and naturally. In addition, flicker which accompanies rewriting of data is less likely to be perceived by a user, whereby eye fatigue of a user can be reduced.

At this time, an image where the first image 452a and a second image 452b that is to be displayed next are combined is displayed in the window 451. The combined image is transferred unidirectionally (leftward in this case), and part of the first image 452a and part of the second image 452b are displayed in the window 451.

Further, when the combined image transfers, luminance of the image displayed in the window 451 is gradually lowered from the initial luminance at the time of the state in FIG. 56A.

Figure 56C:
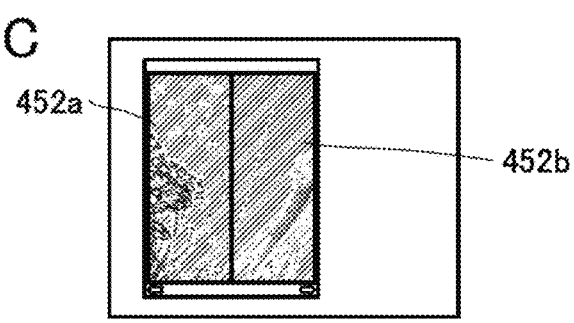

FIG. 56C illustrates a state where the image displayed in the window 451 reaches a position of the predetermined coordinates. Thus, the luminance of the image displayed in the window 451 at this time is lowest.

Note that the predetermined coordinates in FIG. 56C is set so that half of the first image 452a and half of the second image 452b are displayed; however, the coordinates are not limited to the above, and it is preferable that the coordinates be set freely by a user.

For example, the predetermined coordinates may be set so that the ratio of the distance from the initial coordinates of the image to the distance between the initial coordinates and the final coordinates is higher than 0 and lower than 1.

In addition, it is also preferable that luminance when the image reaches the position of the predetermined coordinates be set freely by a user. For example, the ratio of the luminance when the image reaches the position of the predetermined coordinates to the initial luminance may be higher than or equal to 0 and lower than 1, preferably higher than or equal to 0 and lower than or equal to 0.8, further preferably higher than or equal to 0 and lower than or equal to 0.5.

Figure 56D:
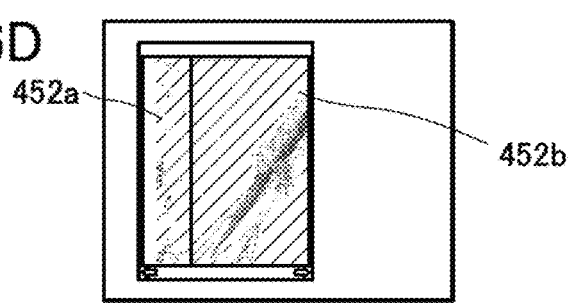

Next, in the window 451, the combined image transfers with the luminance increasing gradually (FIG. 56D).

Figure 56E:
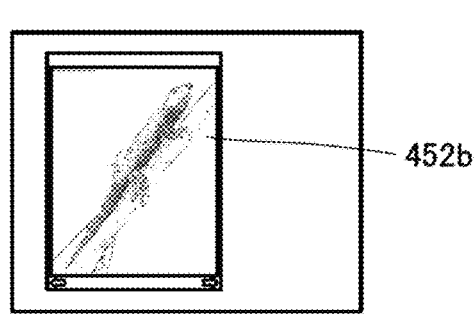

FIG. 56E illustrates a state when the combined image reaches the position of the final coordinates. In the window 451, only the second image 452b is displayed with luminance equal to the initial luminance.

Note that after the transfer of the image is completed, the refresh rate is preferably changed from the second refresh rate to the first refresh rate.

Since the luminance of the image is lowered in such a display mode, even when a user follows the motion of the image with his/her eyes, the user is less likely to suffer from eye fatigue. Thus, with such a driving method, eye-friendly display can be achieved.

<<Display Example of Document Information>>

Next, an example in which document information whose dimension is larger than a display window is displayed by scrolling is described below.

Figure 57A:
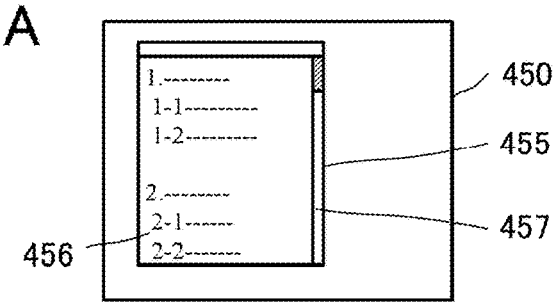
FIGS. 57A to 57E illustrate an example of a displaying method of a display device.

FIG. 57A illustrates an example in which a window 455 and part of document information 456 which is a still image displayed in the window 455 are displayed on the display portion 450.

At this time, display is preferably performed at the first refresh rate.

The window 455 is displayed by, for example, executing application software for document display, application software for document preparation, or the like and includes a display region where document information is displayed.

The dimension of an image of the document information 456 is larger than the display region of the window 455 in the longitudinal direction. That is, part of the document information 456 is displayed in the window 455. Further, as illustrated in FIG. 57A, the window 455 may be provided with a scroll bar 457 which indicates which part of the document information 456 is displayed.

Figure 57B:
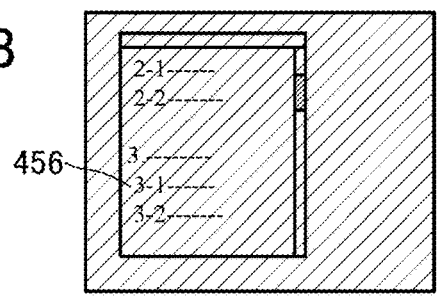

When an instruction of transferring an image (here, also referred to as scroll instruction) is supplied to the display device by the input portion, transfer of the document information 456 starts (FIG. 57B). In addition, luminance of the displayed image is gradually lowered.

Note that in the case where display is performed at the first refresh rate in the state of FIG. 57A, the refresh rate is preferably changed to the second refresh rate before transfer of the document information 456.

In this state, not only the luminance of the image displayed in the window 455 but also the luminance of the whole image displayed on the display portion 450 is lowered.

Figure 57C:
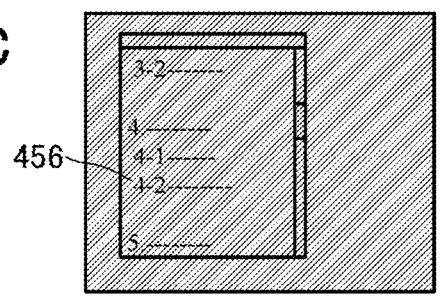

FIG. 57C illustrates a state when the document information 456 reaches a position of the predetermined coordinates. At this time, the luminance of the whole image displayed on the display portion 450 is lowest.

Figure 57D:
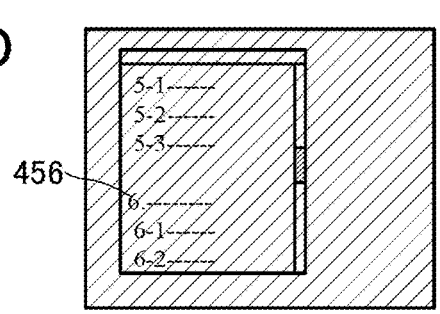

Then, the document information 456 is displayed in the window 455 while being transferred (FIG. 57D). Under this condition, the luminance of the whole image displayed on the display portion 450 is gradually increased.

Figure 57E:
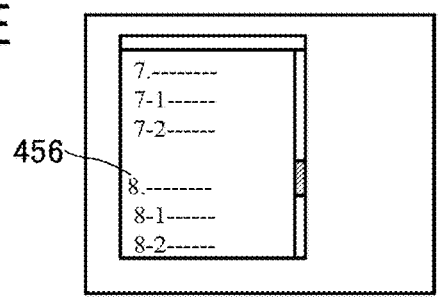

FIG. 57E illustrates a state where the document information 456 reaches a position of the final coordinates. In the window 455, a region of the document information 456, which is different from the region displayed in an initial state, is displayed with luminance equal to the initial luminance.

Note that after transfer of the document information 456 is completed, the refresh rate is preferably changed to the first refresh rate.

Since the luminance of the image is lowered in such a display mode, even when a user follows the motion of the image with his/her eyes, the user can be less likely to suffer from eye fatigue. Thus, with such a driving method, eye-friendly display can be achieved.

In particular, display of document information or the like, which has high contrast, gives a user eye fatigue significantly; thus, it is preferable to apply such a driving method to the display of document information.

This embodiment can be combined with any of the other embodiments and the examples disclosed in this specification as appropriate.

Embodiment 8

In this embodiment, a display module, electronic devices, and a display device which include a semiconductor device of one embodiment of the present invention will be described with reference to FIG. 58, FIGS. 59A to 59G, and FIGS. 60A and 60B.

<8-1. Display Module>

Figure 58:
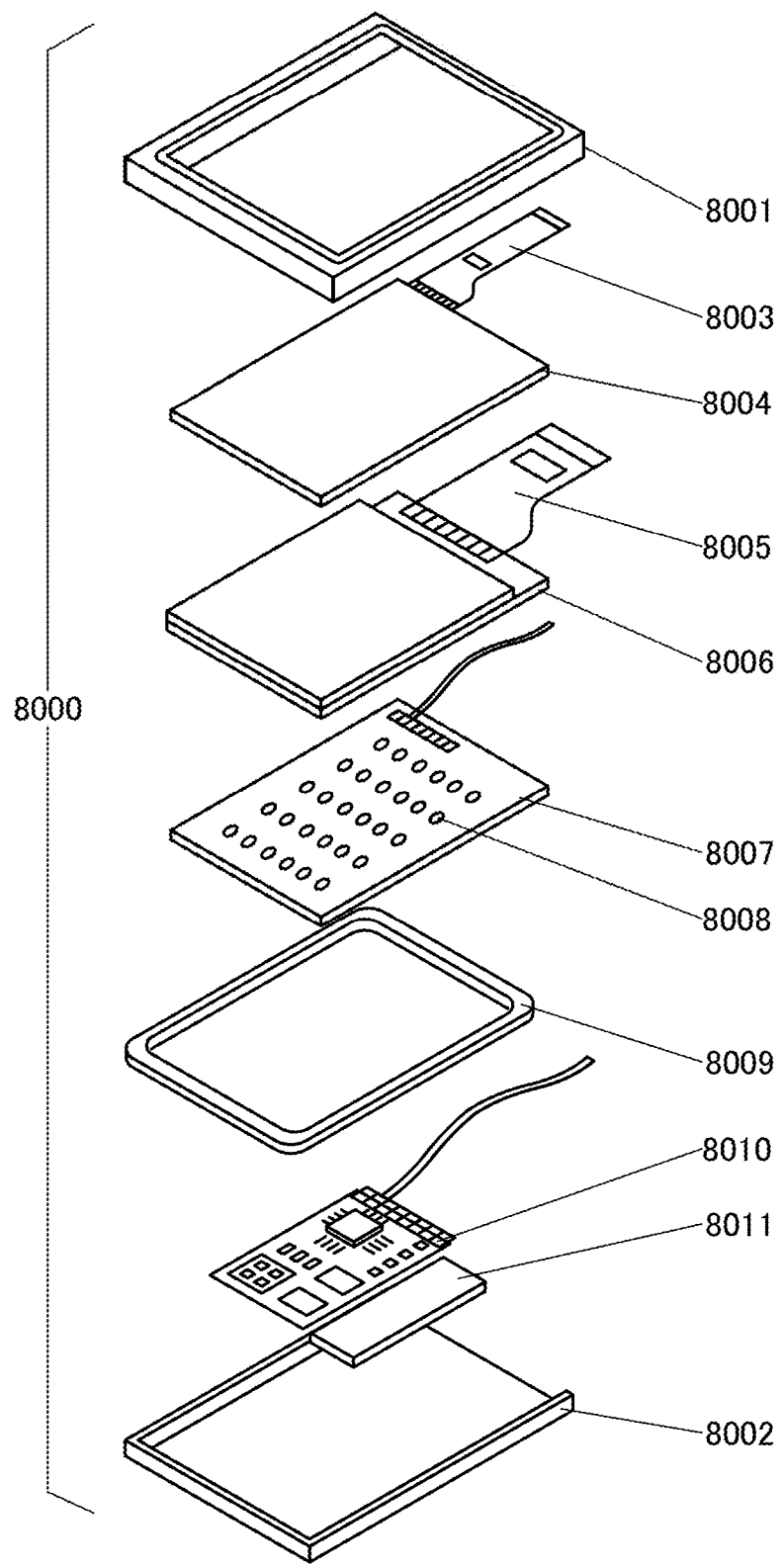
FIG. 58 illustrates a display module.

In a display module 8000 illustrated in FIG. 58, a touch sensor 8004 connected to an FPC 8003, a display panel 8006 connected to an FPC 8005, a backlight 8007, a frame 8009, a printed circuit board 8010, and a battery 8011 are provided between an upper cover 8001 and a lower cover 8002.

The oxide semiconductor film or semiconductor device of one embodiment of the present invention can be used for, for example, the display panel 8006.

The shapes or sizes of the upper cover 8001 and the lower cover 8002 can be changed as appropriate in accordance with the sizes of the touch sensor 8004 and the display panel 8006.

The touch sensor 8004 can be a resistive touch sensor or a capacitive touch sensor and can be formed to overlap with the display panel 8006. A counter substrate (sealing substrate) of the display panel 8006 can have a touch sensor function. A photosensor may be provided in each pixel of the display panel 8006 to form an optical touch sensor.

The backlight 8007 includes light sources 8008. Note that although a structure in which the light sources 8008 are provided over the backlight 8007 is illustrated in FIG. 58, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed circuit board 8010. The frame 8009 may function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case where a commercial power source is used.

The display module 8000 may be additionally provided with a member such as a polarizing plate, a retardation plate, or a prism sheet.

<8-2. Electronic Device>

FIGS. 59A to 59G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 59A to 59G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 59A to 59G are not limited thereto, and the electronic devices can have a variety of functions. Although not illustrated in FIGS. 59A to 59G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 59A to 59G will be described in detail below.

Figure 59A:
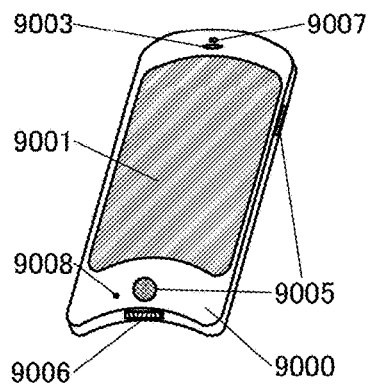
FIGS. 59A to 59G illustrate electronic devices.

FIG. 59A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 59B:
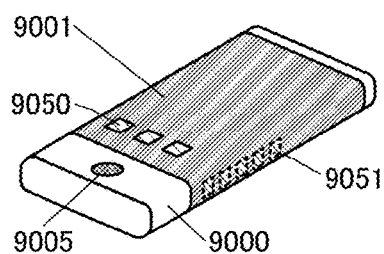

FIG. 59B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 59B, can be positioned in the portable information terminal 9101 as in the portable information terminal 9100 illustrated in FIG. 59A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming e-mail, social networking service (SNS) message, call, and the like; the title and sender of an e-mail, SNS message, and the like; the date; the time; remaining battery; the strength of an antenna; and the like. Instead of the information 9051, the operation buttons 9050 or the like may be displayed in the position where the information 9051 is displayed.

Figure 59C:
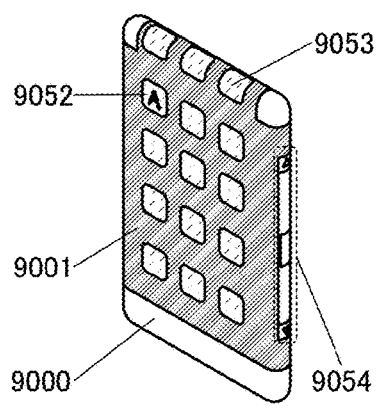

FIG. 59C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

Figure 59D:
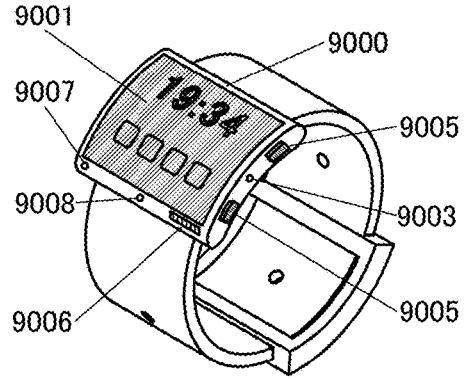

FIG. 59D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and display can be performed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 59E:
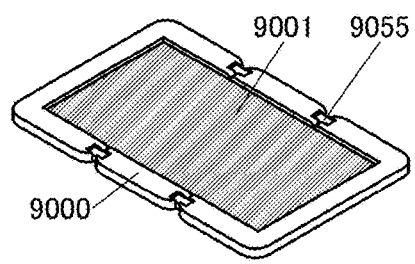
Figure 59F:
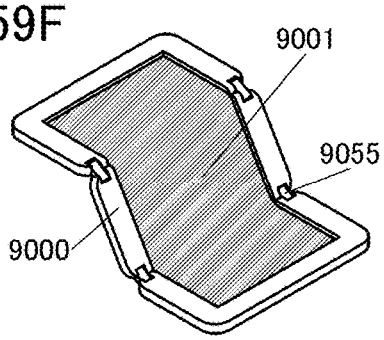
Figure 59G:
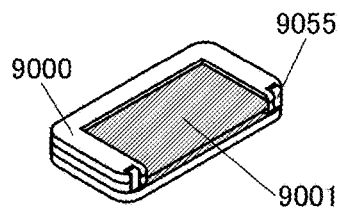

FIGS. 59E, 59F, and 59G are perspective views of a foldable portable information terminal 9201. FIG. 59E is a perspective view of the foldable portable information terminal 9201 that is opened. FIG. 59F is a perspective view of the foldable portable information terminal 9201 that is being opened or being folded. FIG. 59G is a perspective view of the foldable portable information terminal 9201 that is folded. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

Figure 60A:
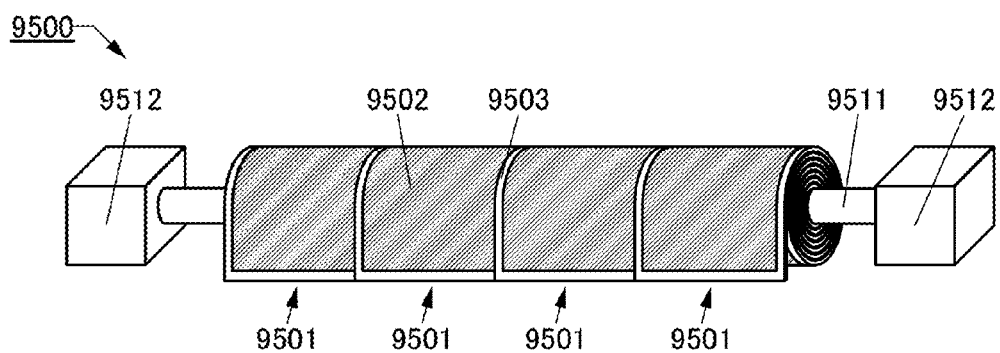
FIGS. 60A and 60B are perspective views of a display device.
Figure 60B:
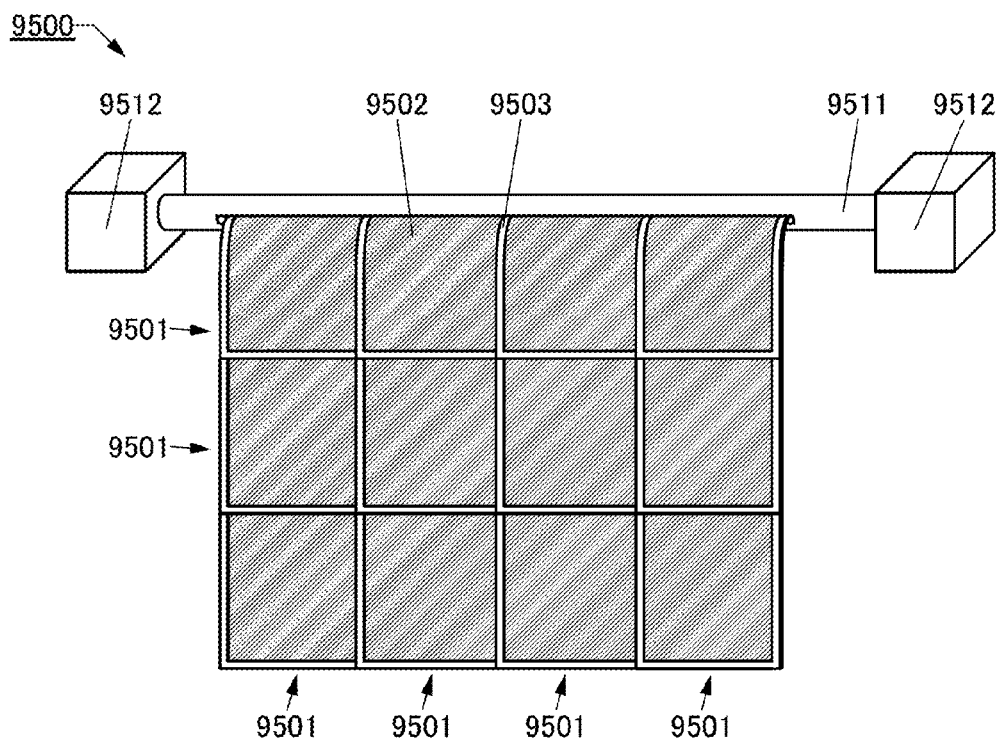

FIGS. 60A and 60B are perspective views of a display device including a plurality of display panels. Note that the plurality of display panels are wound in the perspective view in FIG. 60A, and are unwound in the perspective view in FIG. 60B.

A display device 9500 illustrated in FIGS. 60A and 60B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 60A and 60B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion. The structure in which the display portion of the electronic device described in this embodiment is flexible and display can be performed on the curved display surface or the structure in which the display portion of the electronic device is foldable is described as an example; however, the structure is not limited thereto, and a structure in which the display portion of the electronic device is not flexible and display is performed on a plane portion may be employed.

The structure described in this embodiment can be combined as appropriate with any of the structures described in the other embodiments and the examples.

Embodiment 9

In this embodiment, a deposition apparatus which can be used for manufacturing the display module of one embodiment of the present invention will be described with reference to FIG. 61.

Figure 61:
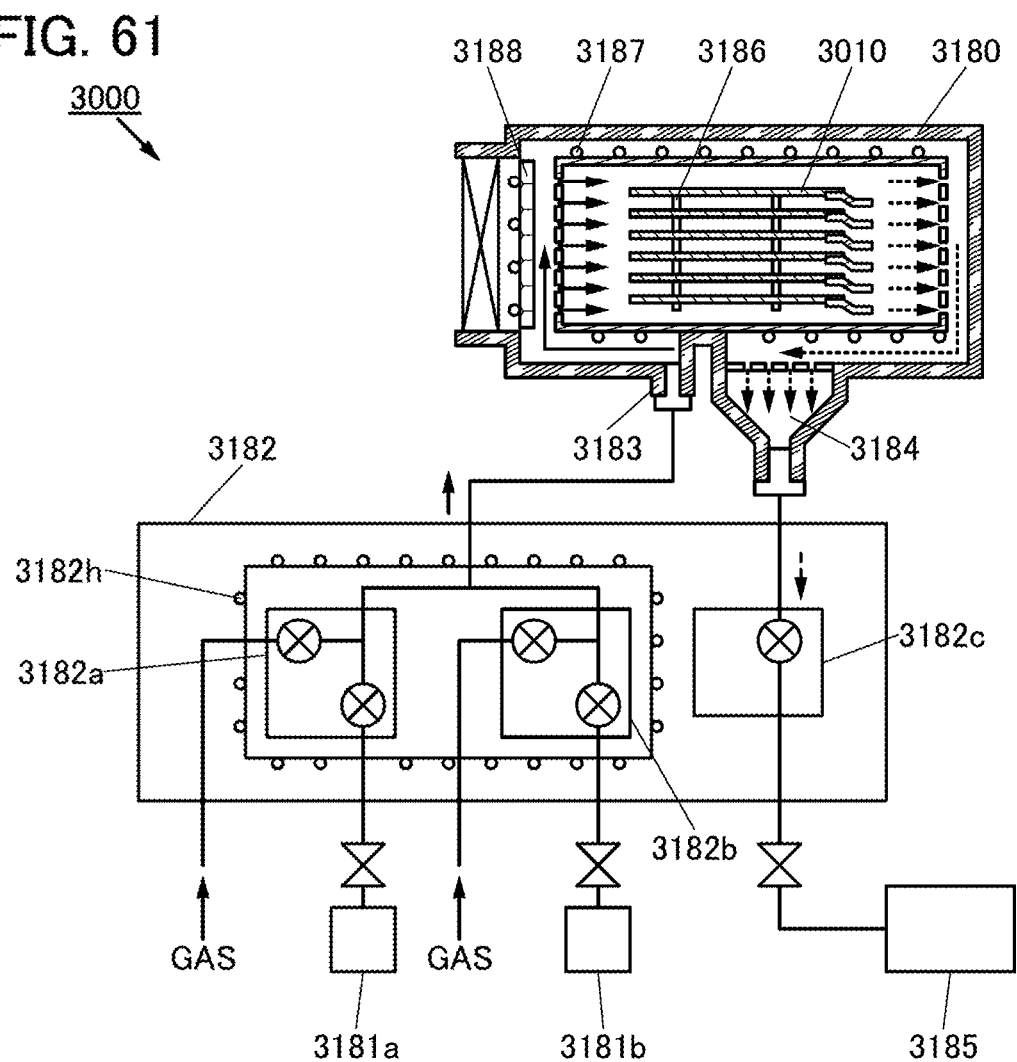
FIG. 61 illustrates a structure of a deposition apparatus.

FIG. 61 illustrates a deposition apparatus 3000 which can be used for manufacturing the display module of one embodiment of the present invention. Note that the deposition apparatus 3000 is an example of a batch-type ALD apparatus.

<9-1. Structural Example of Deposition Apparatus>

The deposition apparatus 3000 described in this embodiment includes a deposition chamber 3180 and a control portion 3182 connected to the deposition chamber 3180 (see FIG. 61).

The control portion 3182 includes a control unit (not illustrated) which supplies control signals and flow rate controllers 3182a, 3182b, and 3182c to which the control signals are supplied. For example, high-speed valves can be used as the flow rate controllers. Specifically, flow rates can be precisely controlled by using ALD valves or the like. The control portion 3182 also includes a heating mechanism 3182h which controls the temperatures of the flow rate controllers and pipes.

The flow rate controller 3182a is supplied with a control signal, a first source material, and an inert gas and has a function of supplying the first source material or the inert gas in accordance with the control signal.

The flow rate controller 3182b is supplied with a control signal, a second source material, and an inert gas and has a function of supplying the second source material or the inert gas in accordance with the control signal.

The flow rate controller 3182c is supplied with a control signal and has a function of connecting to an evacuation unit 3185 in accordance with the control signal.

<<Source Material Supply Portion>>

A source material supply portion 3181a has a function of supplying the first source material and is connected to the flow rate controller 3182a.

A source material supply portion 3181b has a function of supplying the second source material and is connected to the flow rate controller 3182b.

A vaporizer, a heating unit, or the like can be used as each of the source material supply portions. Thus, a gaseous source material can be generated from a solid or liquid source material.

Note that the number of source material supply portions is not limited to two and may be three or more.

<<Source Material>>

Any of a variety of substances can be used as the first source material. For example, a volatile organometallic compound, a metal alkoxide, or the like can be used as the first source material. Any of a variety of substances which react with the first source material can be used as the second source material. For example, a substance which contributes to an oxidation reaction, a substance which contributes to a reduction reaction, a substance which contributes to an addition reaction, a substance which contributes to a decomposition reaction, a substance which contributes to a hydrolysis reaction, or the like can be used as the second source material.

Furthermore, a radical or the like can be used. For example, plasma obtained by supplying a source material to a plasma source, or the like can be used. Specifically, an oxygen radical, a nitrogen radical, or the like can be used.

The second source material combined with the first source material is preferably a source material which reacts at a temperature close to room temperature. For example, a source material which reacts at a temperature higher than or equal to room temperature and lower than or equal to 200° C., preferably higher than or equal to 50° C. and lower than or equal to 150° C., is preferable.

<<Evacuation Unit>>

The evacuation unit 3185 has an evacuating function and is connected to the flow rate controller 3182c. Note that a trap for capturing the source material to be evacuated may be provided between an outlet port 3184 and the flow rate controller 3182c. The evacuated gas or the like is removed by using a removal unit.

<<Control Portion>>

The control portion 3182 supplies the control signals which control the flow rate controllers, a control signal which controls the heating mechanism, or the like. For example, in a first step, the first source material is supplied to a surface of a process member. Then, in a second step, the second source material which reacts with the first source material is supplied. Accordingly, a reaction product of the first source material and the second source material can be deposited onto a surface of a process member 3010.

Note that the amount of the reaction product to be deposited onto the surface of the process member 3010 can be controlled by repetition of the first step and the second step.

Note that the amount of the first source material to be supplied to the process member 3010 is limited by the maximum possible amount of adsorption on the surface of the process member 3010. For example, conditions are selected so that a monomolecular layer of the first source material is formed on the surface of the process member 3010, and the formed monomolecular layer of the first source material is reacted with the second source material, whereby a significantly uniform layer containing the reaction product of the first source material and the second source material can be formed.

Accordingly, a variety of materials can be deposited on a surface of the process member 3010 even when the surface has a complicated structure. For example, a film having a thickness greater than or equal to 3 nm and less than or equal to 200 nm can be formed on the process member 3010.

In the case where, for example, a small hole called a pinhole or the like is formed in the surface of the process member 3010, the pinhole can be filled by depositing a material into the pinhole.

The remainder of the first source material or the second source material is evacuated from the deposition chamber 3180 with use of the evacuation unit 3185. For example, the evacuation may be performed while an inert gas such as argon or nitrogen is introduced.

<<Deposition Chamber>>

The deposition chamber 3180 includes an inlet port 3183 from which the first source material, the second source material, and the inert gas are supplied and the outlet port 3184 from which the first source material, the second source material, and the inert gas are evacuated.

The deposition chamber 3180 includes a support portion 3186 which has a function of supporting one or a plurality of process members 3010, a heating mechanism 3187 which has a function of heating the one or plurality of process members 3010, and a door 3188 which has a function of opening or closing to load and unload the one or plurality of process members 3010.

For example, a resistive heater, an infrared lamp, or the like can be used as the heating mechanism 3187. The heating mechanism 3187 has a function of heating up, for example, to 80° C. or higher, 100° C. or higher, or 150° C. or higher. The heating mechanism 3187 heats the one or plurality of process members 3010 to a temperature higher than or equal to room temperature and lower than or equal to 200° C., preferably higher than or equal to 50° C. and lower than or equal to 150° C.

The deposition chamber 3180 may also include a pressure regulator and a pressure detector.

<<Support Portion>>

The support portion 3186 supports the one or plurality of process members 3010. Accordingly, an insulating film, for example, can be formed over the one or plurality of process members 3010 in each treatment.

<9-2. Example of Film>

An example of a film which can be formed with the deposition apparatus 3000 described in this embodiment will be described.

For example, a film including an oxide, a nitride, a fluoride, a sulfide, a ternary compound, a metal, or a polymer can be formed.

For example, the film can be formed with a material including aluminum oxide, hafnium oxide, aluminum silicate, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like.

For example, the film can be formed with a material including aluminum nitride, hafnium nitride, silicon nitride, tantalum nitride, titanium nitride, niobium nitride, molybdenum nitride, zirconium nitride, gallium nitride, or the like.

For example, the film can be formed with a material including copper, platinum, ruthenium, tungsten, iridium, palladium, iron, cobalt, nickel, or the like.

For example, the film can be formed with a material including zinc sulfide, strontium sulfide, calcium sulfide, lead sulfide, calcium fluoride, strontium fluoride, zinc fluoride, or the like.

For example, the film can be formed with a material which includes a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

This embodiment can be combined with any of the other embodiments and the examples in this specification as appropriate.

Example 1

In this example, the crystallinity of oxide semiconductor films was evaluated using XRD analysis.

<1-1. Evaluation by XRD>

Sample A1, Sample A2, and Sample A3 were formed and evaluated by XRD. Note that Samples A1 and A2 are comparative oxide semiconductor films and Sample A3 is the oxide semiconductor film of one embodiment of the present invention.

In Sample A1, a 100-nm-thick IGZO film was formed over a glass substrate with a size of 720 mm×600 mm with a sputtering apparatus. Note that the IGZO film was deposited under the conditions where the substrate temperature was 170° C., an argon gas and an oxygen gas were introduced into a chamber with the flow rate ratio of 1:1, the pressure was 0.6 Pa, and an AC power of 2500 W was applied to a metal oxide sputtering target (having an atomic ratio of In:Ga:Zn=1:1:1.2).

In Sample A2, a 100-nm-thick IGZO film was formed over a glass substrate with a size of 720 mm×600 mm with a sputtering apparatus. Note that the IGZO film was deposited under the conditions where the substrate temperature was 170° C., an argon gas and an oxygen gas were introduced into a chamber with the flow rate ratio of 1:1, the pressure was 0.2 Pa, and an AC power of 500 W was applied to a metal oxide sputtering target (having an atomic ratio of In:Ga:Zn=1:1:1.2).

In Sample A3, a 100-nm-thick IGZO film was formed over a glass substrate with a size of 720 mm×600 mm with a sputtering apparatus. Note that the IGZO film was deposited under the conditions where the substrate temperature was 170° C., an argon gas and an oxygen gas were introduced into a chamber with the flow rate ratio of 7:3, the pressure was 0.6 Pa, and an AC power of 2500 W was applied to a metal oxide sputtering target (having an atomic ratio of In:Ga:Zn=4:2:4.1).

Through the above steps, Samples A1, A2, and A3 were formed.

The XRD analysis was performed on Samples A1, A2, and A3 using a multifunction thin film material evaluation X-ray diffractometer, D8 DISCOVER Hybrid, manufactured by Bruker AXS. An out-of-plane method was employed in the XRD analysis.

Figure 62A:
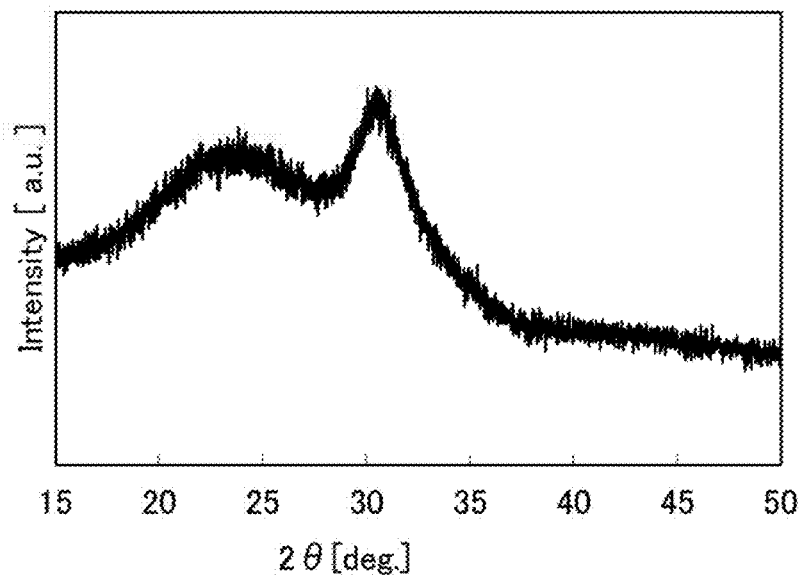
FIGS. 62A and 62B are graphs showing XRD spectra in Example.
Figure 62B:
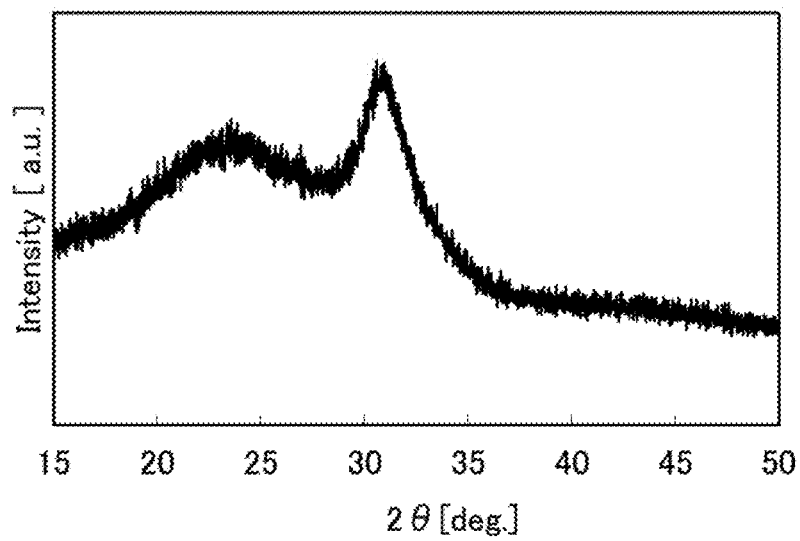

FIGS. 62A and 62B show XRD profiles of Samples A1 and A3. The results of Sample A1 are shown in FIG. 62A, and the results of Sample A3 are shown in FIG. 62B. Note that the XRD analysis was performed on the middle of the glass substrate with a size of 720 mm×600 mm, which corresponds to Region $H_3$ described in Embodiment 1 with reference to FIG. 4.

As shown in FIGS. 62A and 62B, a peak was observed at around $2\theta=31°$ in each of Samples A1 and A3. This peak is derived from the (009) plane of an $InGaZnO_4$ crystal, which indicates that crystals in the oxide semiconductor film in each of Sample A1 and Sample A3 have c-axis alignment, and that the c-axes are aligned in a direction substantially perpendicular to a formation surface or the top surface of the oxide semiconductor film. When the peaks at around $2\theta=31°$ are compared with each other, the peak in Sample A3 is narrower and sharper than the peak in Sample A1. Therefore, the crystallinity of Sample A3 is higher than that of Sample A1.

Figure 63:
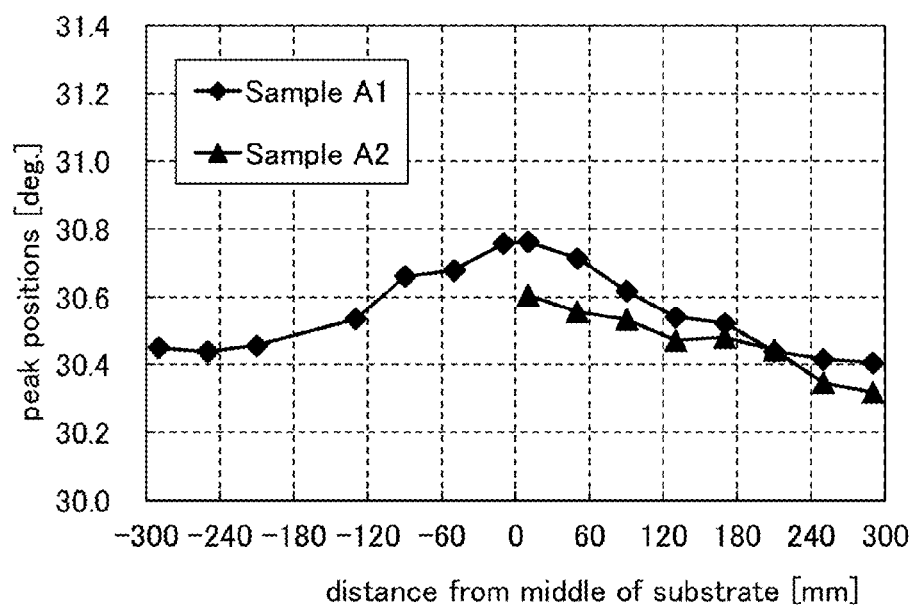
FIG. 63 is a graph showing in-plane distribution of peak positions of XRD spectra in Example.
Figure 64:
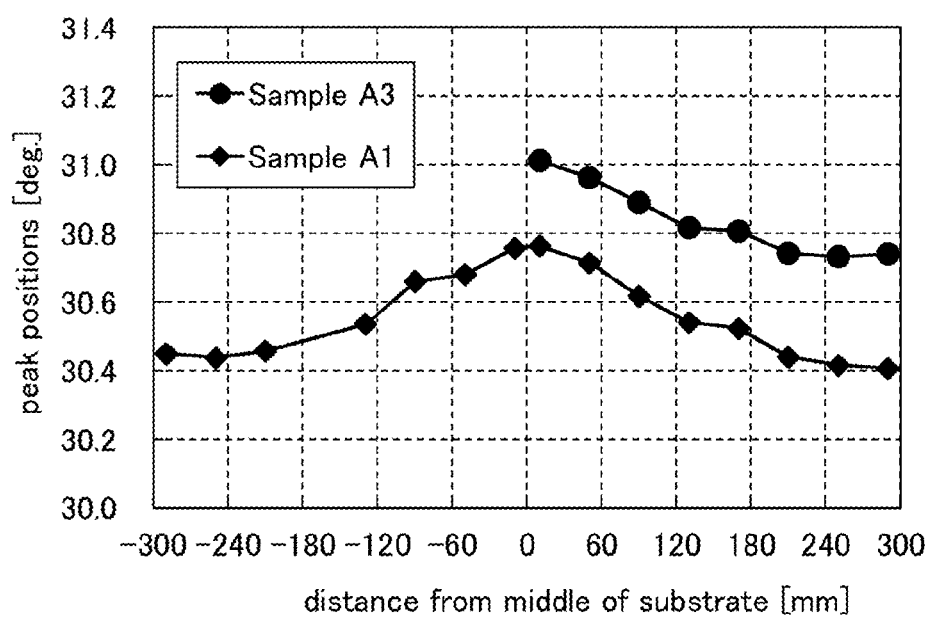
FIG. 64 is a graph showing in-plane distribution of peak positions of XRD spectra in Example.

Next, to examine the in-plane distribution of crystallinity on the glass substrate with a size of 720 mm×600 mm, the peak angles obtained in XRD profiles were plotted with respect to the distance from the middle of the substrate, and the results are shown in FIG. 63 and FIG. 64. In each of FIG. 63 and FIG. 64, the horizontal axis represents the distance from the middle of the substrate and the vertical axis represents the angle of the peak 2θ derived from the (009) plane of an InGaZnO$_4$ crystal.

Note that the peak at around 2θ=31° indicates the interatomic distance on the (009) plane of an InGaZnO$_4$ crystal, a larger angle of 2θ means a smaller interatomic distance on the (009) plane, and a smaller angle of 2θ means a larger interatomic distance on the (009) plane.

For Sample A1, the measurement was performed on Regions A3, B3, C3, D3, E3, F3, G3, H3, I3, J3, K3, M3, N3, and O3 on the substrate. For Samples A2 and A3, the measurement was performed on Regions A3, B3, C3, D3, E3, F3, G3, and H3.

As shown in FIG. 63 and FIG. 64, in each of Samples A1, A2, and A3, the peak angles are larger in the vicinity of the middle of the substrate and smaller in regions farther from the middle of the substrate. The results suggest that in the middle of the substrate, the interatomic distance on the (009) plane is small, i.e., has high density, and thus, the crystallinity is high.

The peak angle of Sample A3 is larger than that of Sample A1 or Sample A2. That is, in Sample A3, the interatomic distance on the (009) plane is smaller, i.e., has higher density, than in Samples A1 and A2, and thus, the crystallinity of Sample A3 is high.

The structure described in this example can be combined as appropriate with any of the embodiments and the other examples.

Example 2

In this example, a transistor of one embodiment of the present invention was formed and subjected to C-V characteristics measurement. The formed transistor corresponds to the transistor 600 described in Embodiment 1 with reference to FIGS. 10A to 10C.

<2-1. Transistor Structure>

For the evaluation in this example, Sample C1, Sample C2, and Sample C3 were formed as transistors each corresponding to the transistor 600. In each of Samples C1 to C3, the channel length was 200 μm and the channel width was 50 μm. The structure of the oxide semiconductor film 608 is different between Samples C1 to C3, and other components in Samples C1 to C3 are the same. Formation conditions of the oxide semiconductor film 608 will be described in detail in Method for manufacturing transistor. Note that Samples C1 and C2 are transistors for comparison, and Sample C3 is the transistor of one embodiment of the present invention.

<2-2. Method for Manufacturing Transistor>

First, the conductive film 604 was formed over the substrate 602. A glass substrate with a size of 720 mm×600 mm was used as the substrate 602. As the conductive film 604, a 100-nm-thick tungsten film was formed with a sputtering apparatus.

Next, the insulating film 606 and the insulating film 607 were formed over the substrate 602 and the conductive film 604. As the insulating film 606, a 400-nm-thick silicon nitride film was formed with a PECVD apparatus. As the insulating film 607, a 50-nm-thick silicon oxynitride film was formed with a PECVD apparatus.

Next, the oxide semiconductor film 608 was formed over the insulating film 607.

As the oxide semiconductor film 608 of Sample C1, a 35-nm-thick IGZO film was formed with a sputtering apparatus. Note that the IGZO film was deposited under the conditions where the substrate temperature was 170° C., an argon gas and an oxygen gas were introduced into a chamber with the flow rate ratio of 1:1, the pressure was 0.6 Pa, and an AC power of 2500 W was applied to a metal oxide sputtering target (having an atomic ratio of In:Ga:Zn=1:1:1.2).

As the oxide semiconductor film 608 of Sample C2, a 35-nm-thick IGZO film was formed with a sputtering apparatus. Note that the IGZO film was deposited under the conditions where the substrate temperature was 170° C., an argon gas and an oxygen gas were introduced into a chamber with the flow rate ratio of 1:1, the pressure was 0.2 Pa, and an AC power of 500 W was applied to a metal oxide sputtering target (having an atomic ratio of In:Ga:Zn=1:1:1.2).

As the oxide semiconductor film 608 of Sample C3, a 25-nm-thick IGZO film was formed with a sputtering apparatus. The IGZO film was deposited under the conditions where the substrate temperature was 170° C., an argon gas and an oxygen gas were introduced into a chamber with the flow rate ratio of 7:3, the pressure was 0.6 Pa, and an AC power of 2500 W was applied to a metal oxide sputtering target (having an atomic ratio of In:Ga:Zn=4:2:4.1).

Then, first heat treatment was performed. As the first heat treatment, heat treatment was performed at 450° C. in a nitrogen atmosphere for 1 hour and then heat treatment was performed at 450° C. in a mixed atmosphere of nitrogen and oxygen for 1 hour.

Next, a conductive film was formed over the insulating film 607 and the oxide semiconductor film 608, a resist mask was formed over the conductive film, and a desired region was etched to form the conductive films 612a and 612b. As the conductive films 612a and 612b, a 50-nm-thick tungsten film, a 400-nm-thick aluminum film, and a 100-nm-thick titanium film were successively formed in a vacuum with a sputtering apparatus. The resist mask was removed after the formation of the conductive films 612a and 612b.

Next, a phosphoric acid solution (a solution obtained by diluting an 85% phosphoric acid solution with pure water by 100 times) was applied from above the insulating film 607, the oxide semiconductor film 608, and the conductive films 612a and 612b. Thus, part of the surface of the oxide semiconductor film 608 which is not covered with the conductive films 612a and 612b was removed.

Next, the insulating films 614 and 616 were formed over the insulating film 607, the oxide semiconductor film 608, and the conductive films 612a and 612b. As the insulating film 614, a 50-nm-thick silicon oxynitride film was formed with a PECVD apparatus. As the insulating film 616, a 400-nm-thick silicon oxynitride film was formed with a PECVD apparatus. Note that the insulating film 614 and the insulating film 616 were formed successively in a vacuum with a PECVD apparatus.

The insulating film 614 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 616 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, second heat treatment was performed. The second heat treatment was performed at 350° C. in an atmosphere containing nitrogen for 1 hour.

Next, oxygen addition treatment was performed on the insulating films 614 and 616 with an ashing apparatus under the conditions where the substrate temperature was 40° C., an oxygen gas at a flow rate of 250 sccm was introduced into a chamber, the pressure was 15 Pa, and an RF power of 4500 W was supplied between parallel-plate electrodes provided in the ashing apparatus so that a bias would be applied to the substrate side.

Next, the insulating film 618 was formed over the insulating film 616. As the insulating film 618, a 100-nm-thick silicon nitride film was formed with a PECVD apparatus. The insulating film 618 was deposited under the conditions where the substrate temperature was 350° C.; a silane gas at a flow rate of 50 sccm, a nitrogen gas at a flow rate of 5000 sccm, and an ammonia gas at a flow rate of 100 sccm were introduced into a chamber; the pressure was 100 Pa; and an RF power of 1000 W was supplied between parallel-plate electrodes provided in a PECVD apparatus.

Next, a conductive film was formed over the insulating film 618, and the conductive film was processed to form the conductive film 620. As the conductive film 620, a 100-nm-thick ITSO film was formed with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 3200 W was supplied to a metal oxide target provided in a sputtering apparatus. Note that the composition of the metal oxide target used for forming the ITSO film was $In_2O_3:SnO_2:SiO_2=85:10:5$ [wt %].

Then, third heat treatment was performed. The third heat treatment was performed at 250° C. in a nitrogen atmosphere for 1 hour.

Through the above steps, Samples C1, C2, and C3 were formed.

<2-3. Measurement of C-V Characteristics of Transistor>

Next, C-V characteristics of Samples C1, C2, and C3 fabricated as described above were measured. In Top Gate Sweep, the conductive film 604 serving as the first gate electrode was electrically grounded and the C-V characteristics were measured between the conductive film 620 serving as the second gate electrode and the conductive films 612a and 612b serving as the source electrode and the drain electrode. In Bottom Gate Sweep, the conductive film 620 serving as the second gate electrode was electrically grounded and the C-V characteristics were measured between the conductive film 604 serving as the first gate electrode and the conductive films 612a and 612b serving as the source electrode and the drain electrode.

Note that in the measurement of the C-V characteristics, the voltage between the conductive film 604 or the conductive film 620 and the conductive films 612a and 612b (also referred to as gate voltage Vg) was applied from −10 V to 10 V at intervals of 0.01 V. An alternating voltage at 10 kHz was applied as the gate voltage Vg. The measured C-V characteristics were fitted with the Gaussian curve represented by Formula (5) in Embodiment 1, whereby the peak value N of the density of shallow defect states $N_{ss}$ was obtained.

To examine the in-plane distribution of the density of defect states on the glass substrate with a size of 720 mm×600 mm, the peak values of the density of shallow defect states (sDOS) on the substrate were calculated. Note that FIG. 4 can be referred to for the coordinates on the 720 mm×600 mm glass substrate of the transistor subjected to the C-V characteristics measurement. In Sample C1, Regions C6, D6, F6, G6, I6, J6, L6, and M6 were subjected to the measurement. In Samples C2 and C3, Regions C3, D3, F3, G3, I3, J3, L3, and M3 were subjected to the measurement.

Figure 65:
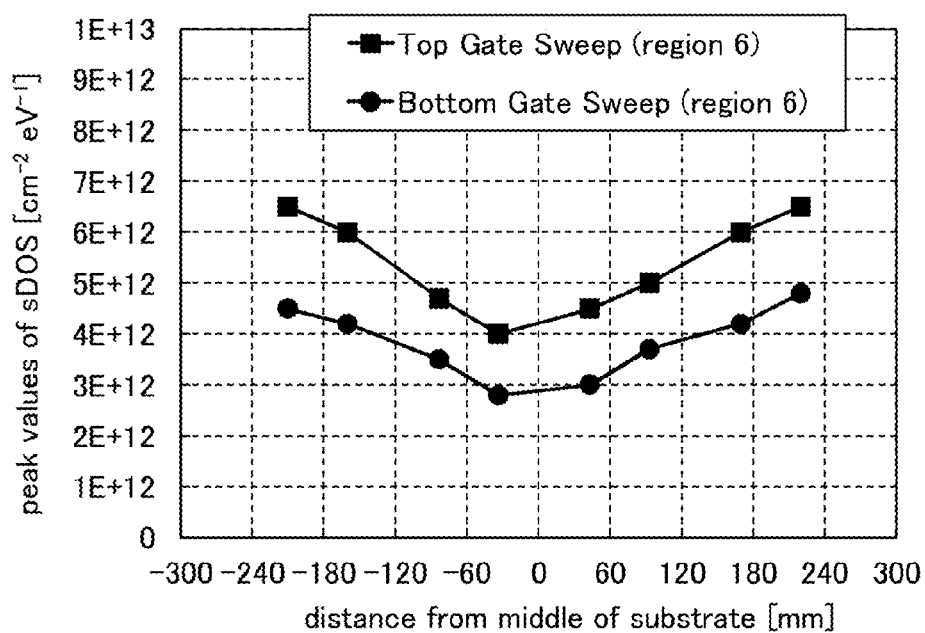
FIG. 65 is a graph showing in-plane distribution of peak values of the density of shallow defect states in Example.
Figure 66:
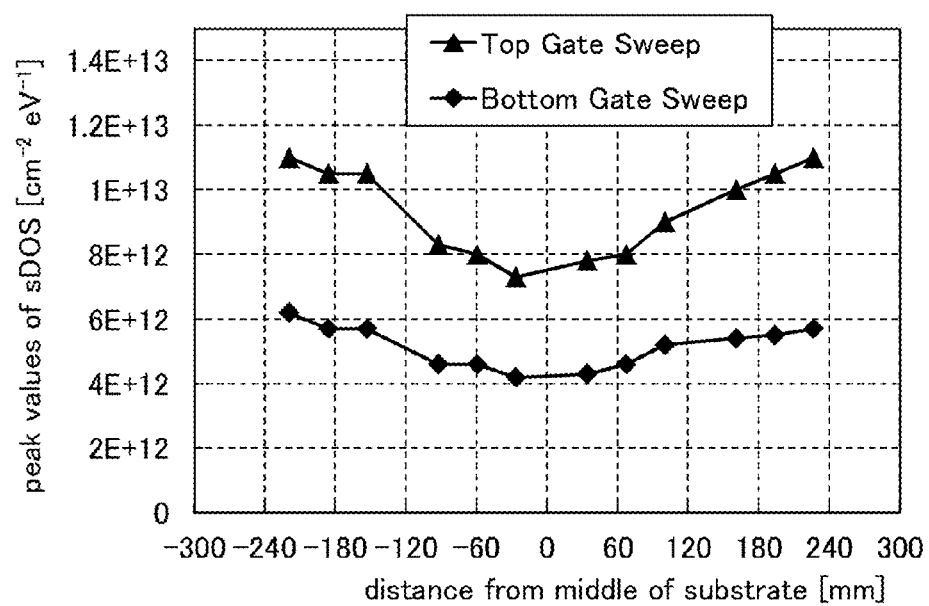
FIG. 66 is a graph showing in-plane distribution of peak values of the density of shallow defect states in Example.
Figure 67:
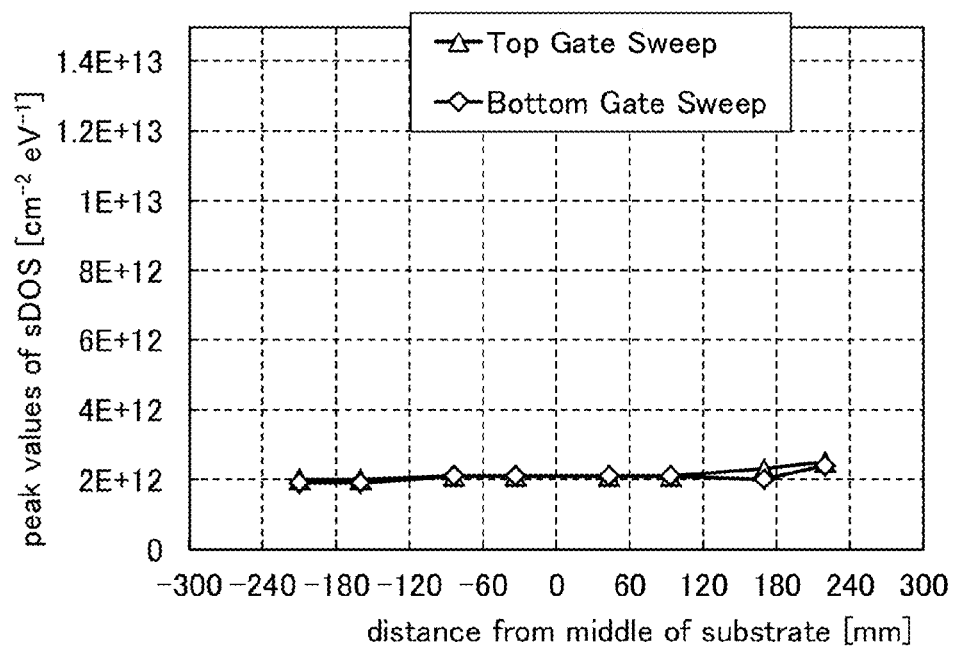
FIG. 67 is a graph showing in-plane distribution of peak values of the density of shallow defect states in Example.

FIGS. 65, 66, and 67 show the peak values of the density of shallow defect states (sDOS) that were obtained in the above manner. Note that FIGS. 65, 66, and 67 show the results of Samples C1, C2, and C3, respectively.

As can be seen in FIG. 65 and FIG. 66, in Samples C1 and C2, sDOS tends to increase from the vicinity of the middle of the substrate toward the outer edge of the substrate. The results are negatively correlated with the crystallinity obtained by XRD in Example 1. That is, sDOS is low in the vicinity of the middle of the substrate where the crystallinity is high.

As shown in FIG. 67, in Sample C3, the peak values of sDOS were small on the entire substrate. There was little difference between the results of Top Gate Sweep and those of Bottom Gate Sweep. As described in Example 1, the oxide semiconductor film of Sample A3, which was formed in a manner similar to that of the oxide semiconductor film used in Sample C3, had high crystallinity; thus, a peak value of sDOS of an oxide semiconductor film with high crystallinity was found to be small. A peak value of sDOS of an oxide semiconductor film is preferably less than $1\times10^{13}$ $cm^{-2}$ $eV^{-1}$, further preferably less than $2\times10^{12}$ $cm^{-2}$ $eV^{-1}$, still further preferably less than $1\times10^{10}$ $cm^{-2}$ $eV^{-1}$.

The structure described in this example can be combined as appropriate with any of the embodiments and the other examples.

Example 3

In this example, damage caused to an insulating film in deposition of an oxide semiconductor film was examined.

<3-1. TDS Analysis>

To examine damage caused to an insulating film in deposition of an oxide semiconductor film, the insulating film was subjected to measurement by thermal desorption spectroscopy (TDS). In the TDS analysis performed on the insulating film, the released amount of argon and oxygen molecules that were used for deposition of the oxide semiconductor film was measured and evaluated. Sample D1, Sample D2, and Sample D3 were formed and analyzed by TDS. Note that Samples D1 and D2 are samples in which comparative oxide semiconductor films were formed and Sample D3 is a sample in which the oxide semiconductor film of one embodiment of the present invention was formed.

In each of Samples D1, D2, and D3, the oxide semiconductor film was formed over the insulating film and then was removed. Samples D1, D2, and D3 were formed under the same conditions except for the formation conditions of the oxide semiconductor film. Details about the formation conditions of the oxide semiconductor film are described below.

First, a 400-nm-thick silicon nitride film was formed over a glass substrate having a size of 720 mm×600 mm with a PECVD apparatus. After the formation of the silicon nitride film, heat treatment was performed at 450° C. in a nitrogen atmosphere for 1 hour to form an insulating film. Over the insulating film, an IGZO film was formed as an oxide semiconductor film to a thickness of 35 nm with a sputtering apparatus.

The oxide semiconductor film of Sample D1 was deposited under the conditions where the substrate temperature was 170° C., an argon gas and an oxygen gas were introduced into a chamber with the flow rate ratio of 1:1, the pressure was 0.6 Pa, and an AC power of 2500 W was applied to a metal oxide sputtering target (having an atomic ratio of In:Ga:Zn=1:1:1.2).

The oxide semiconductor film of Sample D2 was deposited under the conditions where the substrate temperature was 170° C., an argon gas and an oxygen gas were introduced into a chamber with the flow rate ratio of 1:1, the pressure was 0.2 Pa, and an AC power of 500 W was applied to a metal oxide sputtering target (having an atomic ratio of In:Ga:Zn=1:1:1.2).

The oxide semiconductor film of Sample D3 was deposited under the conditions where the substrate temperature was 170° C., an argon gas and an oxygen gas were introduced into a chamber with the flow rate ratio of 7:3, the pressure was 0.6 Pa, and an AC power of 2500 W was applied to a metal oxide sputtering target (having an atomic ratio of In:Ga:Zn=4:2:4.1).

After the deposition of the oxide semiconductor film, the oxide semiconductor film was removed by a wet etching process to expose the insulating film. Through the above steps, Samples D1, D2, and D3 were formed.

To examine the in-plane distribution of damage caused to the insulating film on the glass substrate with a size of 720 mm×600 mm, Regions A3 to O3 were subjected to TDS analysis. FIG. 4 can be referred to for the coordinates on the substrate subjected to the TDS analysis.

Figure 68A:
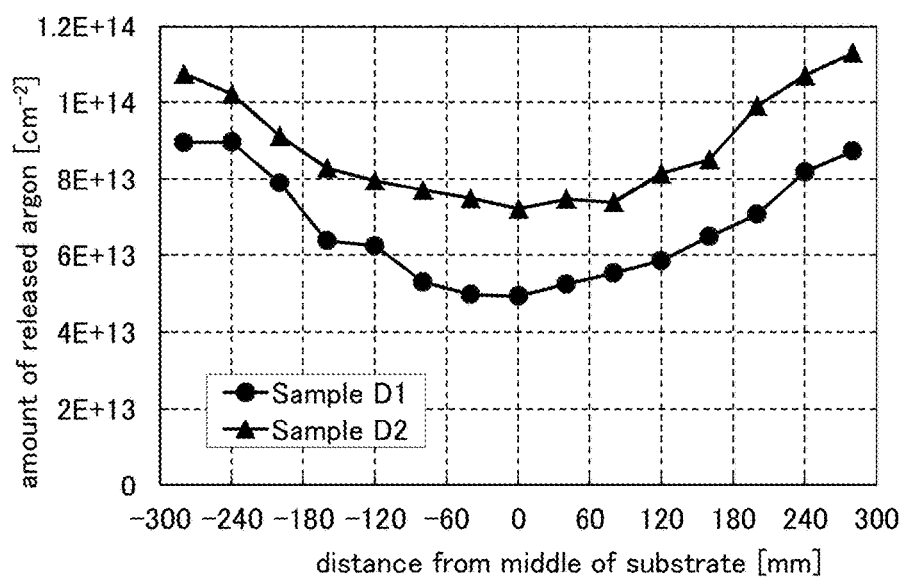
FIGS. 68A and 68B are graphs showing results of TDS analysis in Example.
Figure 68B:
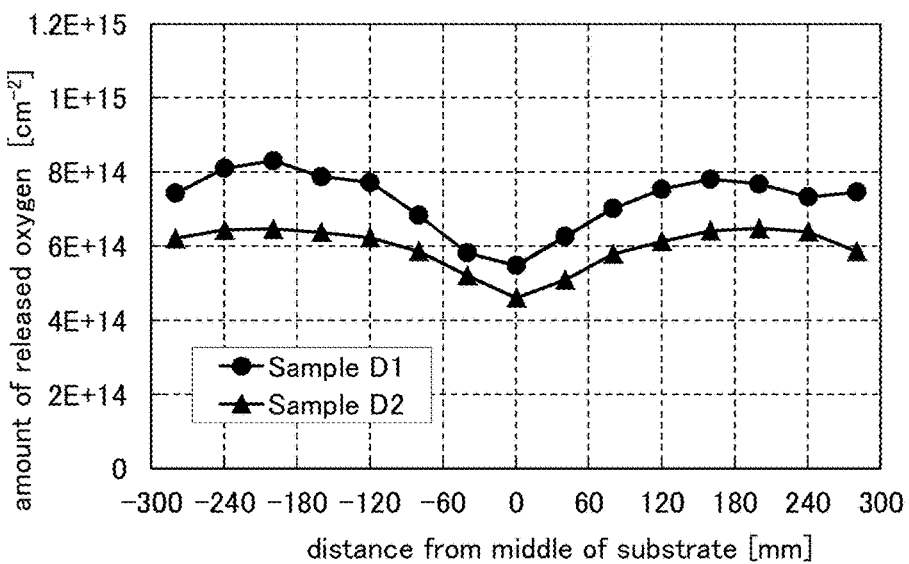
Figure 69A:
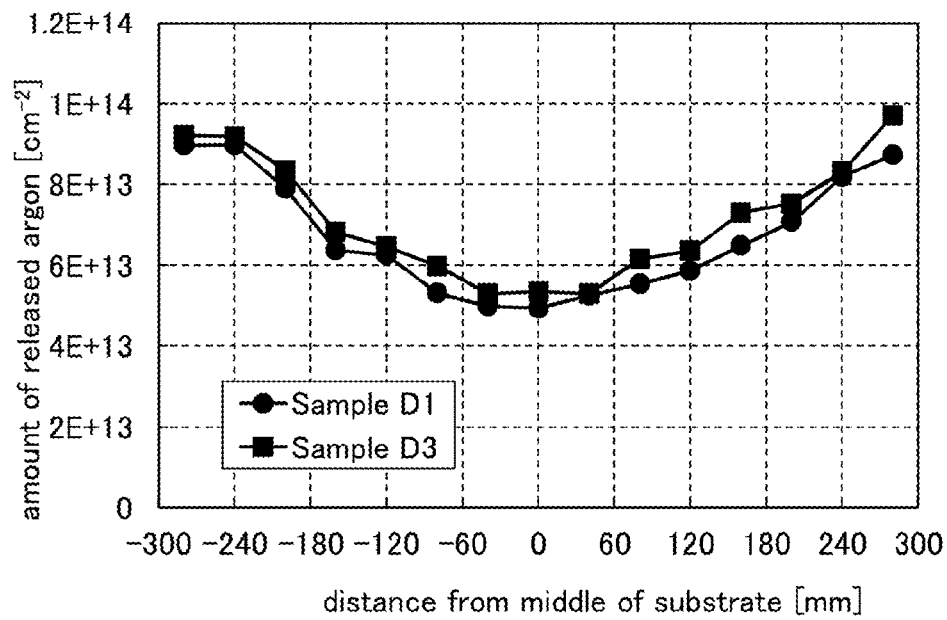
FIGS. 69A and 69B are graphs showing results of TDS analysis in Example.
Figure 69B:
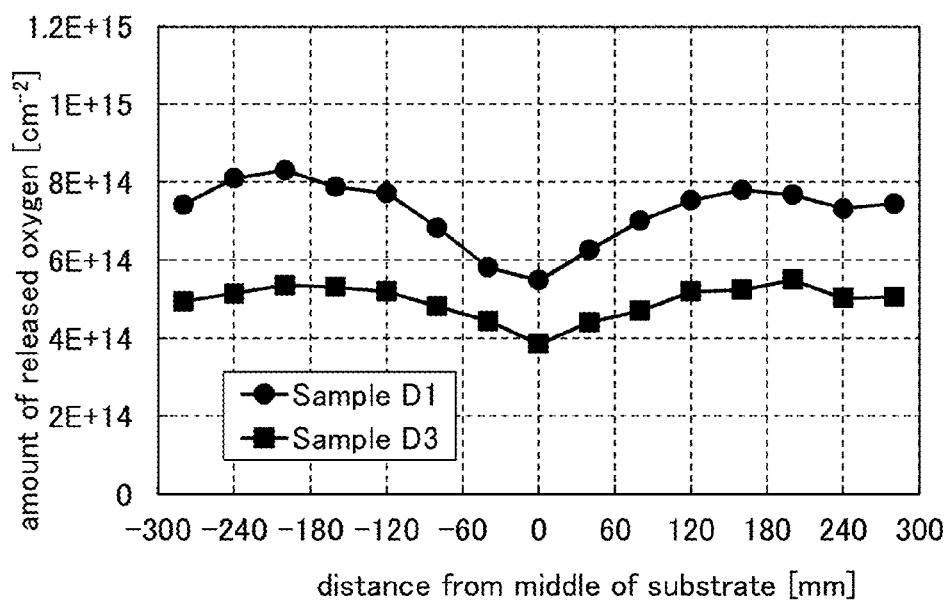
Figure 70A:
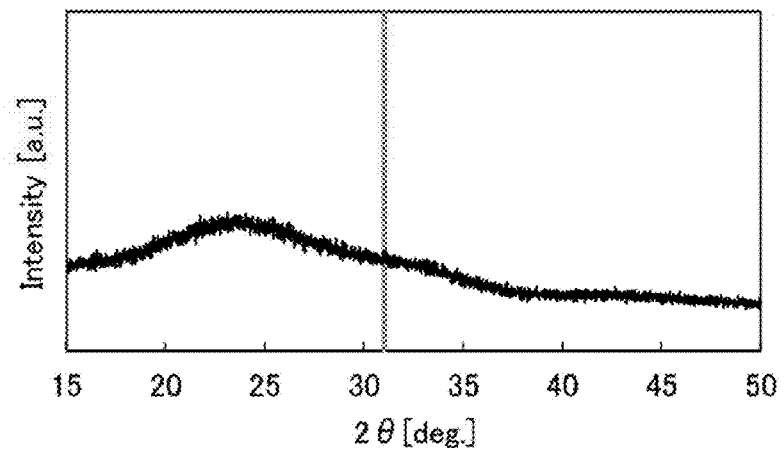
FIGS. 70A to 70C show XRD spectra in Example.
Figure 70B:
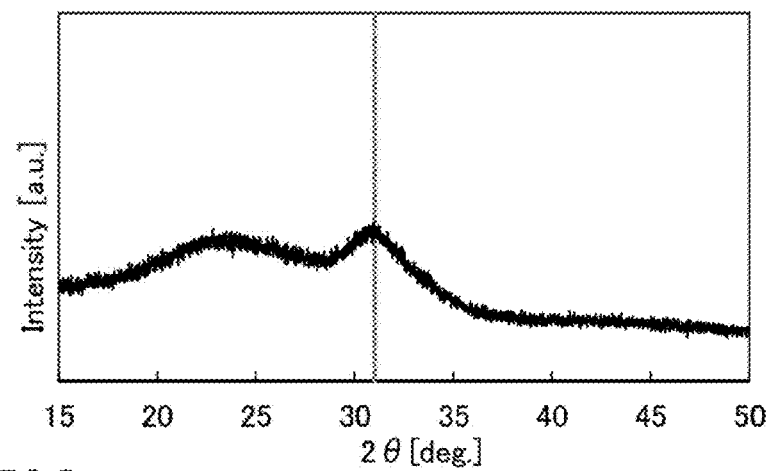
Figure 70C:
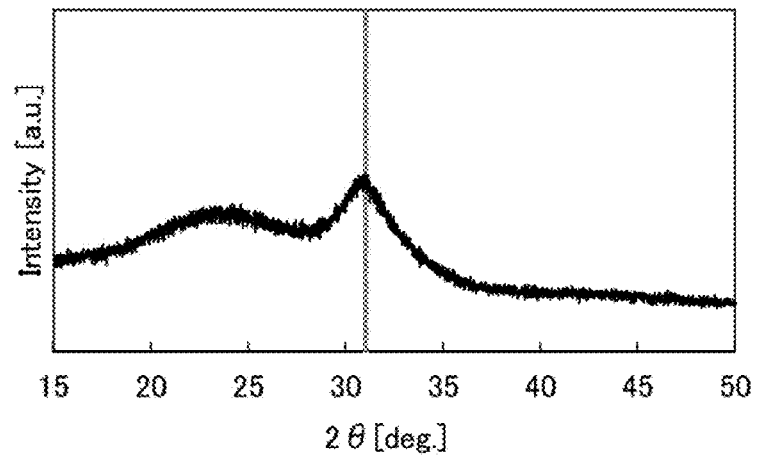
Figure 71A:
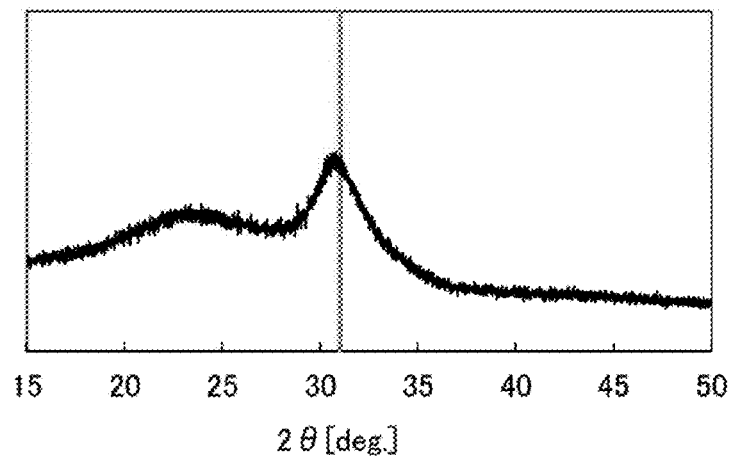
FIGS. 71A to 71C show XRD spectra in Example.
Figure 71B:
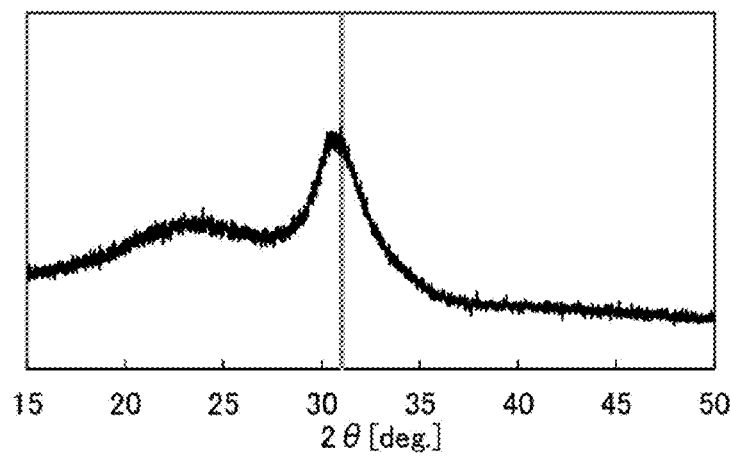
Figure 71C:
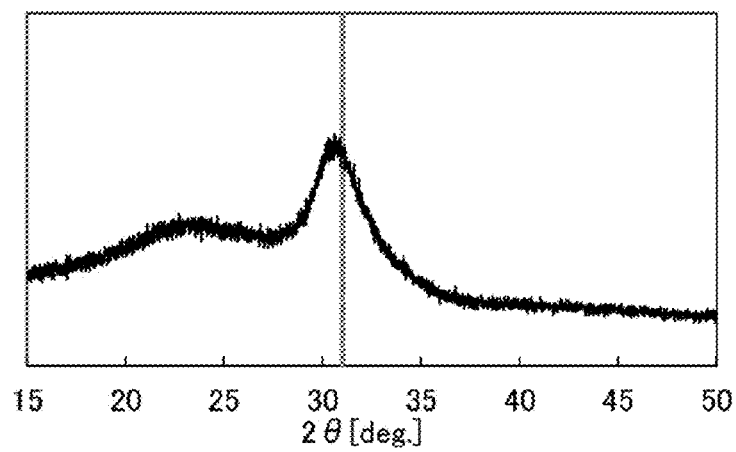
Figure 72A:
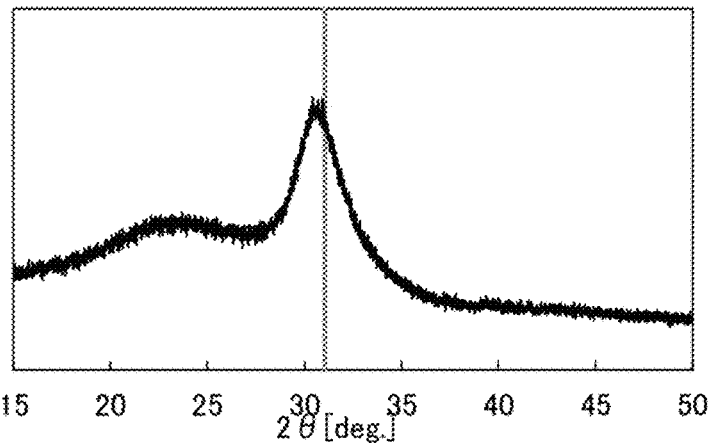
FIGS. 72A to 72C show XRD spectra in Example.
Figure 72B:
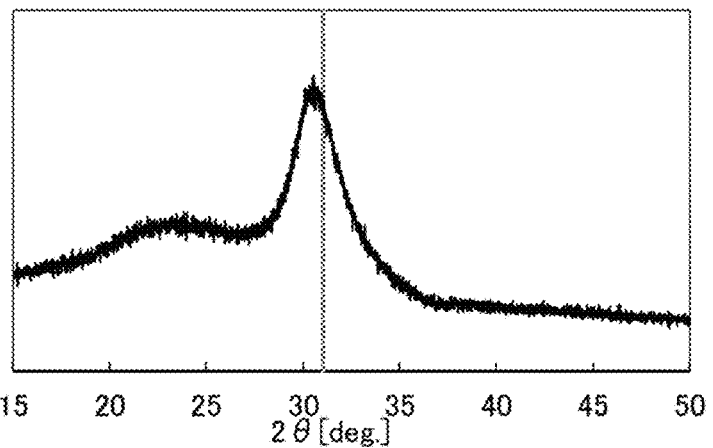
Figure 72C:
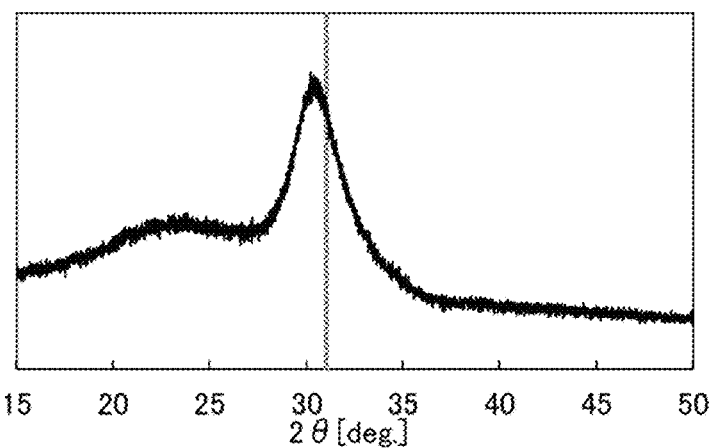

FIG. 68A and FIG. 69A show the amount of argon released from Samples D1, D2, and D3 measured by the TDS analysis. FIG. 68B and FIG. 69B show the amount of released oxygen molecules. Note that FIGS. 68A and 68B show the results of Samples D1 and D2, and FIGS. 69A and 69B show the results of Samples D1 and D3.

From the TDS analysis results shown in FIGS. 68A and 68B and FIGS. 69A and 69B, the amounts of argon and oxygen introduced into the insulating film at the time of deposition of the oxide semiconductor film can be estimated. In other words, smaller amounts of argon and oxygen released from the insulating film mean that smaller amounts of argon and oxygen were introduced into the insulating film at the time of the deposition of the oxide semiconductor film and less damage was caused to the insulating film in the deposition of the oxide semiconductor film.

The amount of released oxygen molecules was smaller in Sample D2 than in Sample D1, but the amount of released argon was larger in Sample D2. Thus, damage to the insulating film in Sample D2 is not minor.

The amount of released argon was not different between Samples D1 and D3, but the amount of released oxygen was smaller in Sample D3. The results showed that less damage was caused to the insulating film in Sample D3. This is probably because the oxide semiconductor film of Sample D3 has high crystallinity and is dense.

The structure described in this example can be combined as appropriate with any of the embodiments and the other examples.

Example 4

In this example, change in the crystallinity of an oxide semiconductor film as a function of the flow rate ratio between an argon gas and an oxygen gas at the time of deposition of the oxide semiconductor film was examined by XRD analysis.

Samples E1 to E9 for the XRD analysis were formed. Samples E1 to E9 were formed under the same conditions except for the flow rate ratio between an argon gas and an oxygen gas at the time of deposition.

In Sample E1, a 100-nm-thick IGZO film was formed over a glass substrate with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 0%, the pressure was 0.6 Pa, and an AC power of 2500 W was applied to a metal oxide sputtering target (having an atomic ratio of In:Ga:Zn=4:2:4.1).

The flow rate ratios of the oxygen gas to the (argon gas+oxygen gas) in Samples E2 to E9 were 5%, 10%, 20%, 30%, 40%, 50%, 70%, and 100%, respectively.

The XRD analysis was performed on Samples E1 to E9 using a multifunction thin film material evaluation X-ray diffractometer, D8 DISCOVER Hybrid, manufactured by Bruker AXS. An out-of-plane method was employed in the XRD analysis.

FIGS. 70A to 70C, FIGS. 71A to 71C, and FIGS. 72A to 72C show XRD profiles of Samples E1 to E9. FIG. 70A, FIG. 70B, FIG. 70C, FIG. 71A, FIG. 71B, FIG. 71C, FIG. 72A, FIG. 72B, and FIG. 72C show the results of Sample E1, Sample E2, Sample E3, Sample E4, Sample E5, Sample E6, Sample E7, Sample E8, and Sample E9, respectively.

As shown in FIGS. 70A to 70C, FIGS. 71A to 71C, and FIGS. 72A to 72C, a peak was observed at around $2\theta=31°$ in each of Samples E2 to E9. This peak is derived from the (009) plane of an $InGaZnO_4$ crystal, which indicates that crystals in the oxide semiconductor film in each of Sample E2 to E9 have c-axis alignment, and that the c-axes are aligned in a direction substantially perpendicular to a formation surface or the top surface of the oxide semiconductor film.

Furthermore, the higher the proportion of the oxygen gas at the time of formation of the IGZO film is, the higher the intensity of the peak at around $2\theta=31°$ is. That is, the higher proportion of oxygen at the time of the formation leads to higher crystallinity. Accordingly, the proportion of an oxygen gas at the time of the formation of an oxide semiconductor film is preferably 10% or more.

The structure described in this example can be combined as appropriate with any of the embodiments and the other examples.

Example 5

In this example, the oxygen permeability of an oxide semiconductor film was examined.

The oxygen permeability of an oxide semiconductor film was measured by thermal desorption spectroscopy (TDS). In the TDS analysis, the released amount of oxygen that was added to an insulating film under the oxide semiconductor film was measured. Samples F1 to F6 for the TDS analysis were fabricated.

Samples F1 to F5 were formed by adding oxygen to the insulating film and forming the oxide semiconductor film over the insulating film. Samples F1 to F5 were formed under the same conditions except for the flow rate ratio between an argon gas and an oxygen gas at the time of formation of the oxide semiconductor film.

For Sample F1, a 400-nm-thick silicon oxynitride film was formed over a glass substrate with a PECVD apparatus. After the formation of the silicon oxynitride film, heat treatment was performed at 350° C. in a nitrogen atmosphere for 1 hour to form an insulating film.

Next, a conductive film was formed over the insulating film. As the conductive film, a 5-nm-thick ITSO film was formed with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target provided in a sputtering apparatus. Note that the composition of the metal oxide target used for forming the ITSO film was $In_2O_3:SnO_2:SiO_2=85:10:5$ [wt %].

Next, oxygen was added to the insulating film through the conductive film with an ashing apparatus under the conditions where the substrate temperature was 40° C., an oxygen gas at a flow rate of 250 sccm was introduced into a chamber, the pressure was 15 Pa, and an RF power of 4500 W was supplied between parallel-plate electrodes provided in the ashing apparatus so that a bias would be applied to the substrate side. After oxygen was added to the insulating film, the ITSO film was removed by a wet etching process.

Over the insulating film, an IGZO film was formed as an oxide semiconductor film to a thickness of 10 nm with a sputtering apparatus.

Note that the oxide semiconductor film of Sample F1 was deposited under the conditions where the substrate temperature was 170° C., the argon gas and the oxygen gas were introduced into a chamber such that the flow rate ratio of the oxygen gas to the (argon gas+oxygen gas) was 10%, the pressure was 0.6 Pa, and an AC power of 2500 W was applied to a metal oxide sputtering target (having an atomic ratio of In:Ga:Zn=4:2:4.1).

Through the foregoing steps, Sample F1 was fabricated.

The flow rate ratios of the oxygen gas to the (argon gas+oxygen gas) in Samples F2 to F5 were 20%, 30%, 40%, and 50%, respectively.

Samples F1 to F5 that were fabricated as described above were subjected to TDS analysis. The amounts of released oxygen measured by the TDS analysis are shown in FIGS. 73A to 73E. Note that FIG. 73A, FIG. 73B, FIG. 73C, FIG. 73D, and FIG. 73E show the results of Sample F1, Sample F2, Sample F3, Sample F4, and Sample F5, respectively.

From the TDS analysis results, the amount of oxygen introduced into the insulating film and released through the oxide semiconductor film can be estimated. In other words, a smaller amount of released oxygen means lower oxygen permeability of the oxide semiconductor film. The TDS analysis results in FIGS. 73A to 73E show that a lower flow rate ratio of the oxygen gas at the time of formation of the oxide semiconductor film leads to higher oxygen permeability of the oxide semiconductor film. It was thus found that to introduce oxygen into an oxide semiconductor film, the flow rate ratio of oxygen at the time of formation of the oxide semiconductor film is preferably low, or specifically, 40% or lower.

The structure described in this example can be combined as appropriate with any of the embodiments and the other examples.

Example 6

In this example, the density of defect states at deep levels in the energy gap of an oxide semiconductor film was measured.

<Method for Fabricating Sample>

Figure 74:
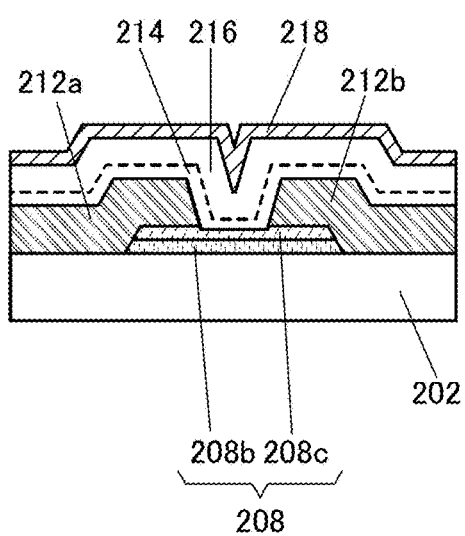
FIG. 74 is a schematic cross-sectional view of a structure of a sample in Example.

In this example, Samples G1 to G8 each having the structure illustrated in FIG. 74 were fabricated for evaluation. Note that the oxide semiconductor film 208 in each of Samples G1 to G8 includes the oxide semiconductor film 208b and the oxide semiconductor film 208c. Samples G1 to G8 were formed under the same conditions except for the flow rate ratio between an argon gas and an oxygen gas at the time of formation of the oxide semiconductor film 208b.

First, the oxide semiconductor film 208 was formed over the substrate 202.

In Sample G1, a 10-nm-thick IGZO film was formed as the oxide semiconductor film 208b of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 0%, the pressure was 0.6 Pa, and an AC power of 2500 W was applied to a metal oxide sputtering target (having an atomic ratio of In:Ga:Zn=4:2:4.1). Then, a 15-nm-thick IGZO film was formed as the oxide semiconductor film 208c with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

The flow rate ratios of the oxygen gas to the (argon gas+oxygen gas) for formation of the oxide semiconductor film 208b in Samples G2 to G8 were 5%, 10%, 20%, 30%, 40%, 50%, and 70%, respectively.

Next, a conductive film was formed over the oxide semiconductor film 208, a resist mask was formed over the conductive film, and a desired region was etched to form the conductive films 212a and 212b. As the conductive films 212a and 212b, a 50-nm-thick tungsten film, a 400-nm-thick aluminum film, and a 100-nm-thick titanium film were successively formed in a vacuum with a sputtering apparatus. The resist mask was removed after the formation of the conductive films 212a and 212b.

Next, the insulating films 214 and 216 were formed over the oxide semiconductor film 208 and the conductive films 212a and 212b. As the insulating film 214, a 50-nm-thick silicon oxynitride film was formed with a PECVD apparatus. As the insulating film 216, a 400-nm-thick silicon oxynitride film was formed with a PECVD apparatus. Note that the insulating film 214 and the insulating film 216 were formed successively in a vacuum with a PECVD apparatus.

The insulating film 214 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 216 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Next, heat treatment was performed at 350° C. under an atmosphere containing nitrogen for 1 hour.

Then, as a conductive film, a 5-nm-thick ITSO film was formed over the insulating films 214 and 216 with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target provided in a sputtering apparatus. Note that the composition of the metal oxide target used for forming the ITSO film was $In_2O_3$:$SnO_2$:$SiO_2$=85:10:5 [wt %].

Next, oxygen was added to the insulating films 214 and 216 through the conductive film with an ashing apparatus under the conditions where the substrate temperature was 40° C., an oxygen gas at a flow rate of 250 sccm was introduced into a chamber, the pressure was 15 Pa, and an RF power of 4500 W was supplied between parallel-plate electrodes provided in the ashing apparatus so that a bias would be applied to the substrate side. After oxygen was added to the insulating film, the ITSO film was removed by a wet etching process.

Then, the insulating film 218 was formed over the insulating film 216. As the insulating film 218, a 100-nm-thick silicon nitride film was formed with a PECVD apparatus. The insulating film 218 was deposited under the conditions where the substrate temperature was 350° C., a silane gas at a flow rate of 50 sccm, a nitrogen gas at a flow rate of 5000 sccm, and an ammonia gas at a flow rate of 100 sccm were introduced into a chamber, the pressure was 100 Pa, and an RF power of 1000 W was supplied between parallel-plate electrodes provided in a PECVD apparatus.

Through the above steps, Samples G1 to G8 were formed.
<Measurement of Density of Deep Defect States>

Deep defect states of the oxide semiconductor films in Samples G1 to G8 fabricated as described above were evaluated. In this example, the defect states of the oxide semiconductor were evaluated by a constant photocurrent method (CPM).

In CPM measurement, the amount of light with which a surface of a sample between terminals is irradiated is adjusted in the state where voltage is applied between two electrodes included in the sample so that a photocurrent value is kept constant, and then an absorption coefficient is derived from the amount of the irradiation light in each wavelength. In the CPM measurement, when the sample has a defect, the absorption coefficient due to the energy which corresponds to the level at which the defect exists (calculated from the wavelength) is increased. The increase in the absorption coefficient is multiplied by a constant, whereby the density of deep defect states (also referred to as dDOS) of the sample can be obtained.

A part of the absorption coefficient which is called an urbach tail due to the band tail is removed from a curve of the absorption coefficient obtained by the CPM measurement, whereby the absorption coefficient due to the defect levels can be calculated from the following formula. Here, α(E) indicates the absorption coefficient at each energy level and au indicates the absorption coefficient due to the urbach tail.

[Formula 6]

$$\int \frac{\alpha(E) - \alpha_u}{E} dE \quad (6)$$

Figure 75A:
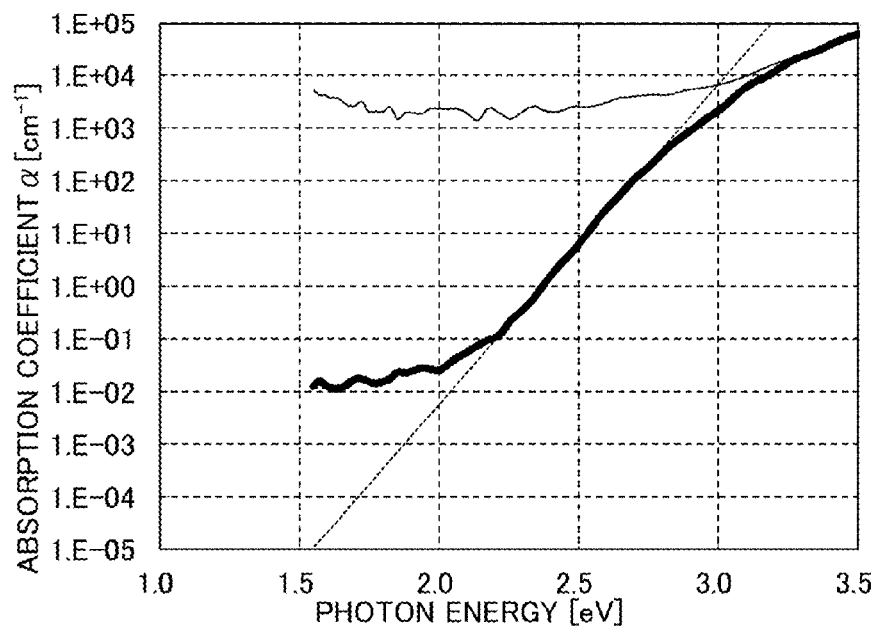
FIGS. 75A and 75B are graphs showing results of CPM measurement in Example.
Figure 75B:
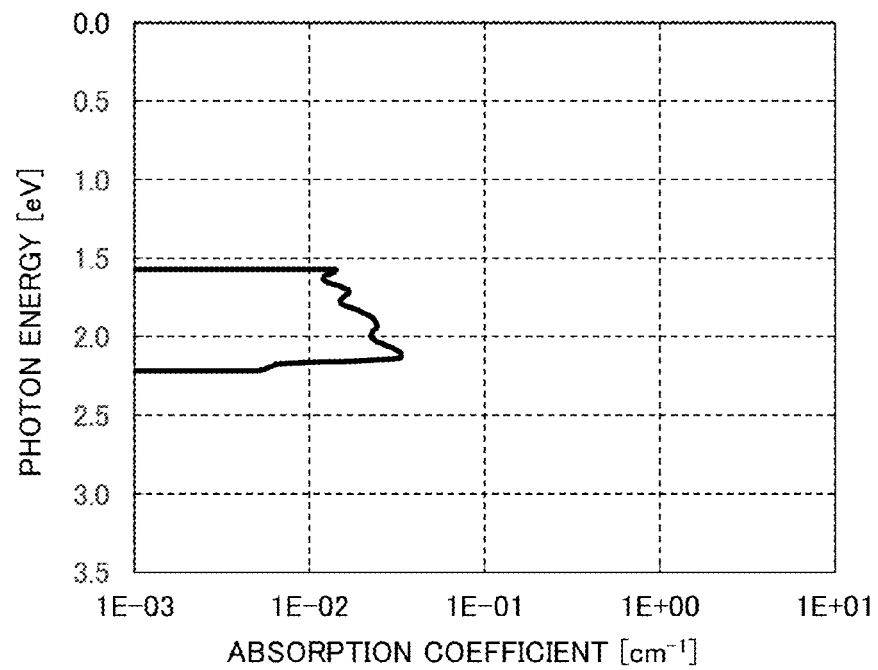

FIGS. 75A and 75B show the results of the CPM measurement of Sample G5. FIG. 75A shows the curve of the absorption coefficient of Sample G5. In FIG. 75A, the horizontal axis represents the photon energy, and the vertical axis represents the absorption coefficient. The thick line in FIG. 75A is the curve of the absorption coefficient of Sample G5, and the dotted line indicates a tangent line, and a thin line indicates an absorption coefficient optically measured.

FIG. 75B shows the absorption coefficient obtained by removing the absorption coefficient due to the band tail from the curve of the absorption coefficient, that is, the absorption coefficient due to defect states. In FIG. 75B, the horizontal axis represents the absorption coefficient, and the vertical axis represents the photon energy. The conduction band minimum energy and the valence band maximum energy of the oxide semiconductor film are set to 0 eV and 3.15 eV, respectively, on the vertical axis in FIG. 75B. Further, in FIG. 75B, the curve indicated by a solid line corresponds to absorption due to the defect states of Sample G5, and absorption due to the defect states is seen in an energy range of 1.5 eV to 2.3 eV. When the values at each energy level are integrated, it is found that the absorption coefficient due to the defect states of Sample G5 is $1.39 \times 10^{-2}$ $cm^{-1}$.

Figure 76:
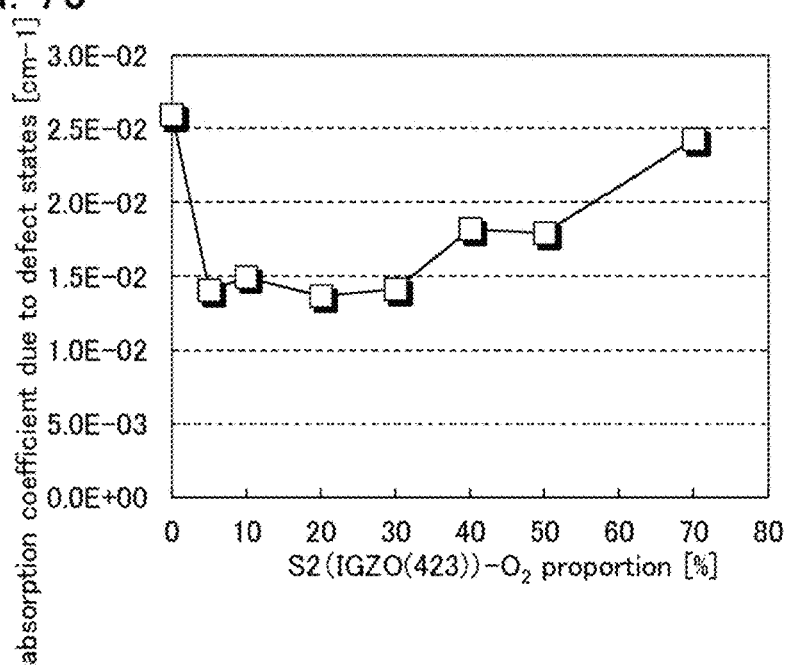
FIG. 76 is a graph showing results of CPM measurement in Example.

The absorption coefficient due to the defect states in Samples G1 to G8 calculated by the above method is shown in FIG. 76. As shown in FIG. 76, the absorption coefficient due to the defect states depends on the proportion of the oxygen gas in formation of the oxide semiconductor film 208b. In the range of the proportion of oxygen from 10% to 70%, the absorption coefficient due to the defect states is smaller when the proportion of oxygen is lower. This suggests that when oxygen added to the insulating film over the oxide semiconductor film 208 is sufficiently diffused to the oxide semiconductor film 208, the defect states in the oxide semiconductor film can be reduced. In contrast, when the proportion of the oxygen gas is lower than or equal to 5%, the absorption coefficient due to defect states tends to increase; thus, the proportion of the oxygen gas in formation of the oxide semiconductor film 208b is preferably higher than or equal to 10% and lower than or equal to 50%.

The structure described in this example can be combined as appropriate with any of the embodiments and the other examples.

Example 7

In this example, a transistor of one embodiment of the present invention was formed and subjected to electrical characteristics measurement.

Figure 77A:
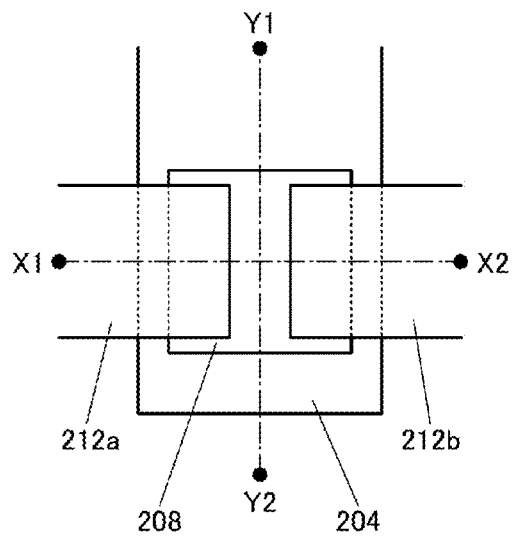
FIG. 77A is a schematic top view of a structure of transistors in Example.
Figure 77B:
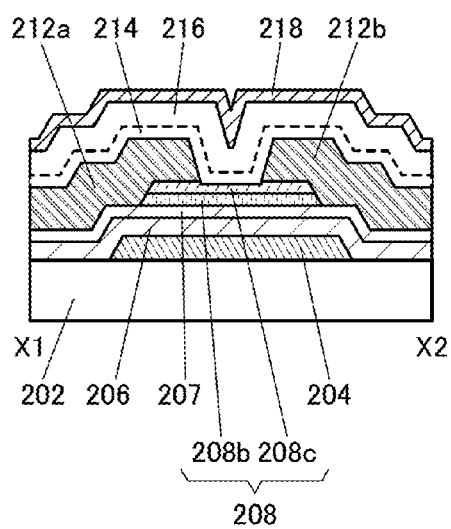
FIGS. 77B and 77C are schematic cross-sectional views thereof.
Figure 77C:
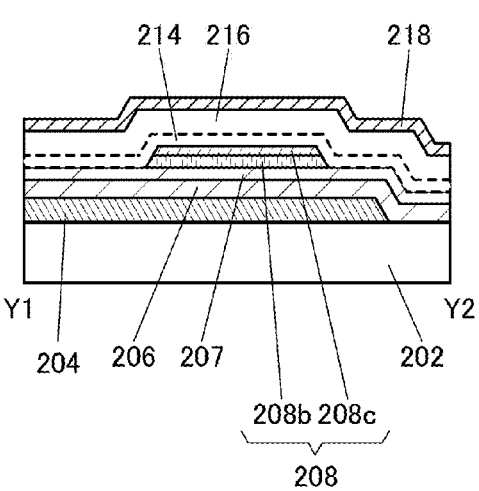
Figure 78A:
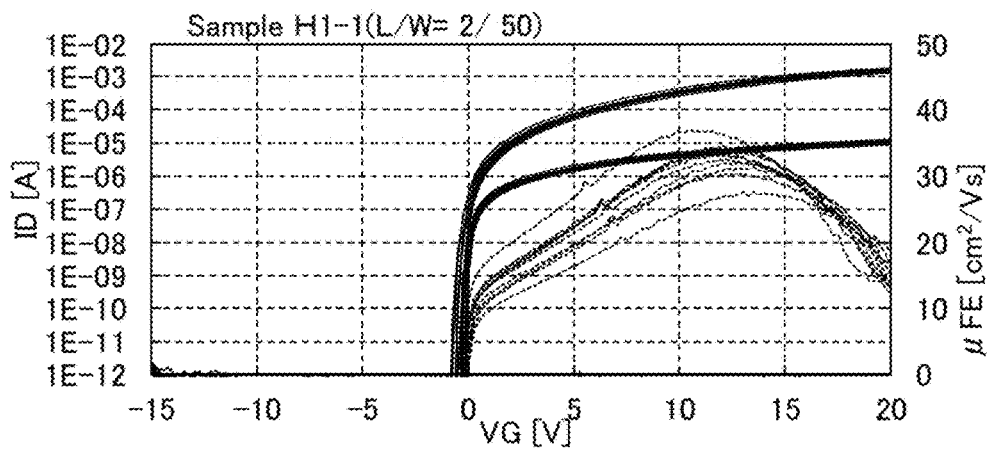
FIGS. 78A to 78C each show Id-Vg characteristics of a transistor in Example.
Figure 78B:
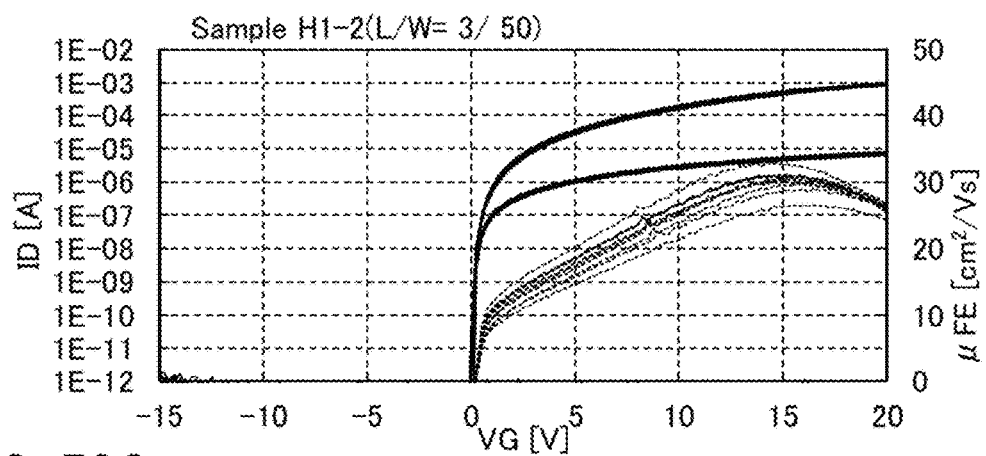
Figure 78C:
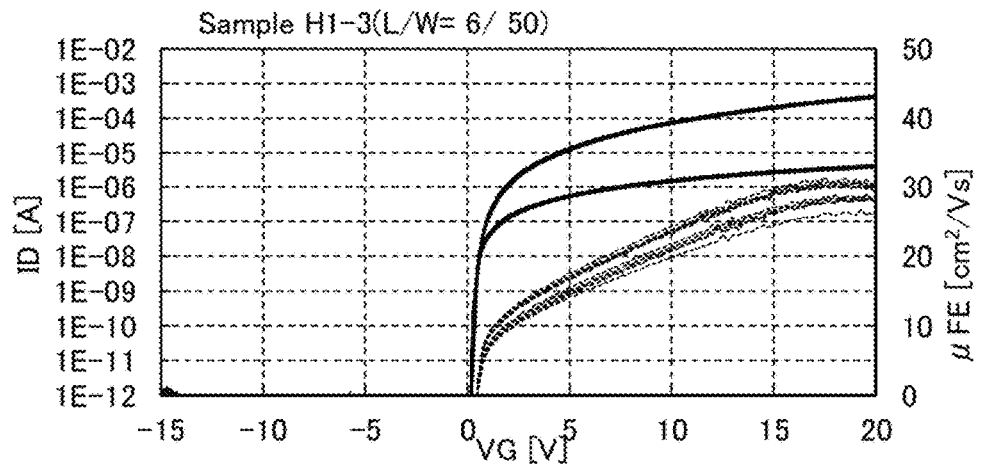
Figure 79A:
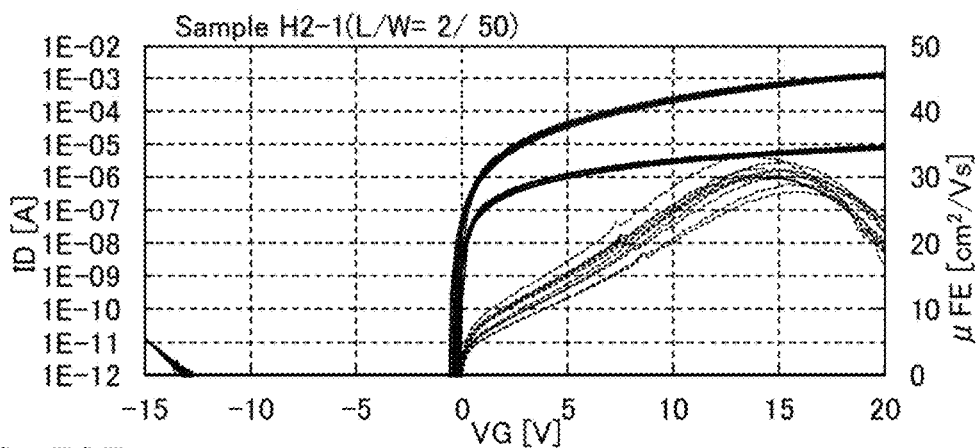
FIGS. 79A to 79C each show Id-Vg characteristics of a transistor in Example.
Figure 79B:
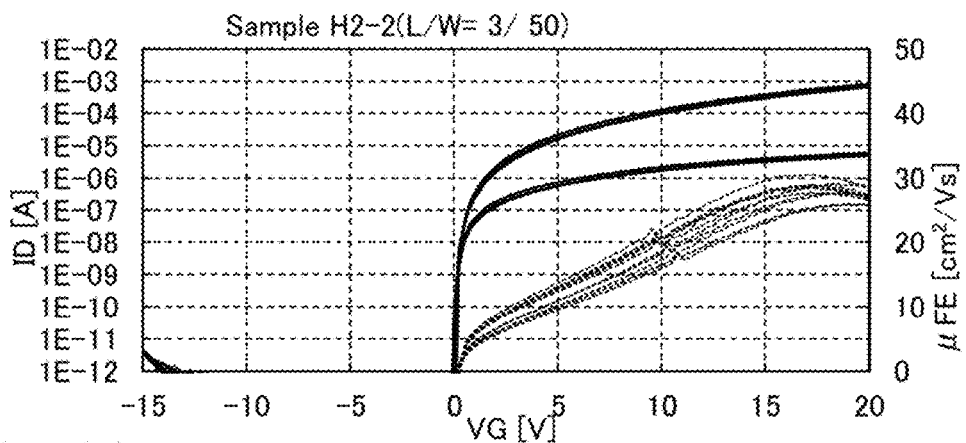
Figure 79C:
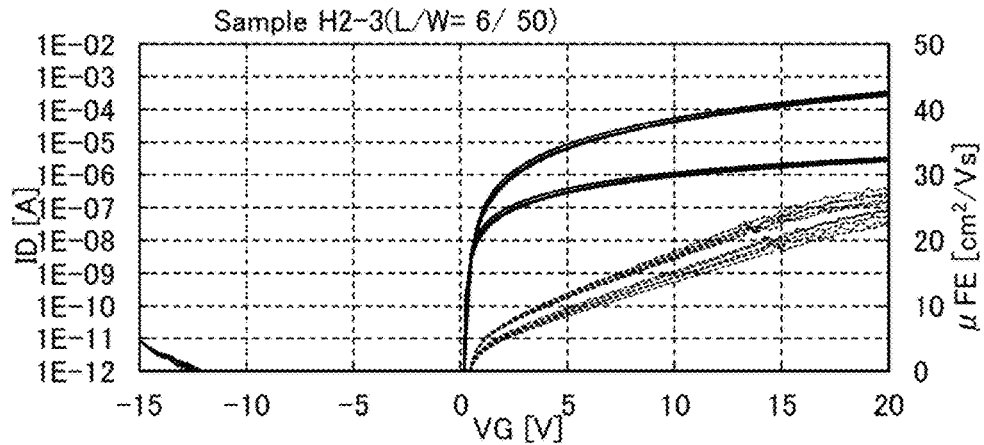
Figure 80A:
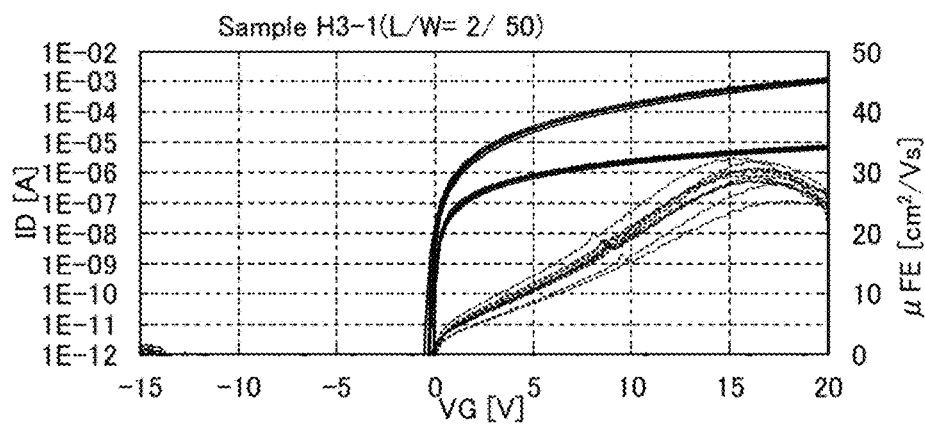
FIGS. 80A to 80C each show Id-Vg characteristics of a transistor in Example.
Figure 80B:
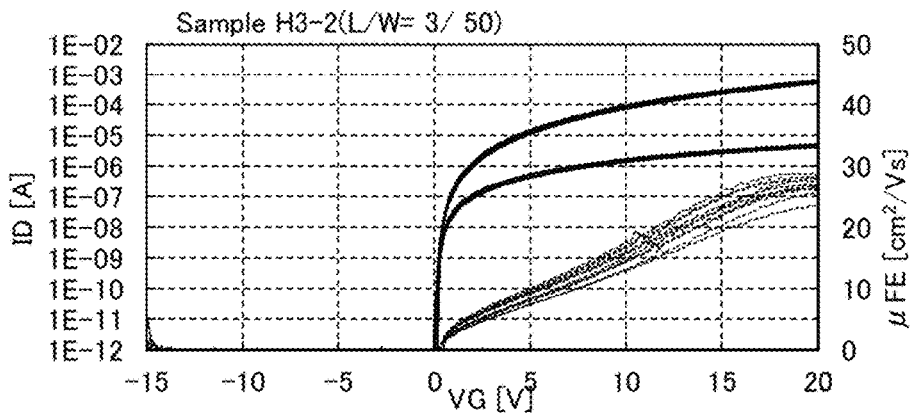
Figure 80C:
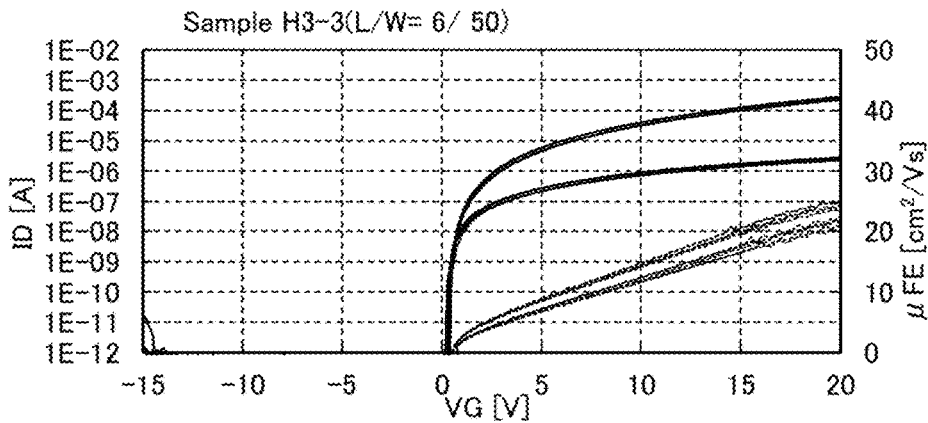
Figure 81A:
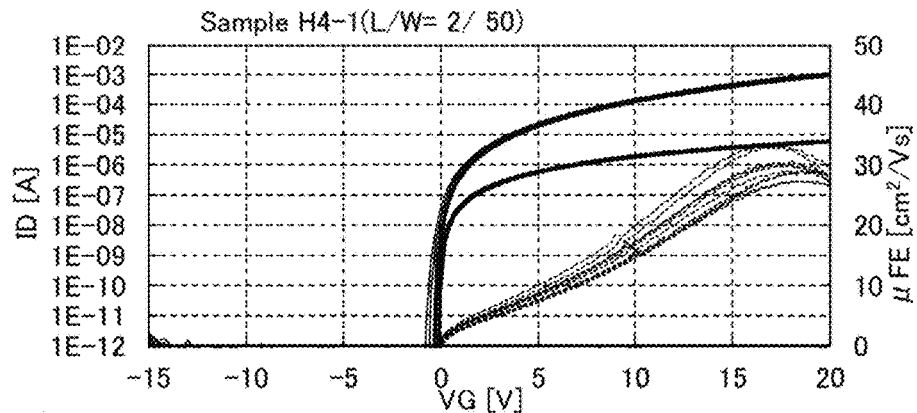
FIGS. 81A to 81C each show Id-Vg characteristics of a transistor in Example.
Figure 81B:
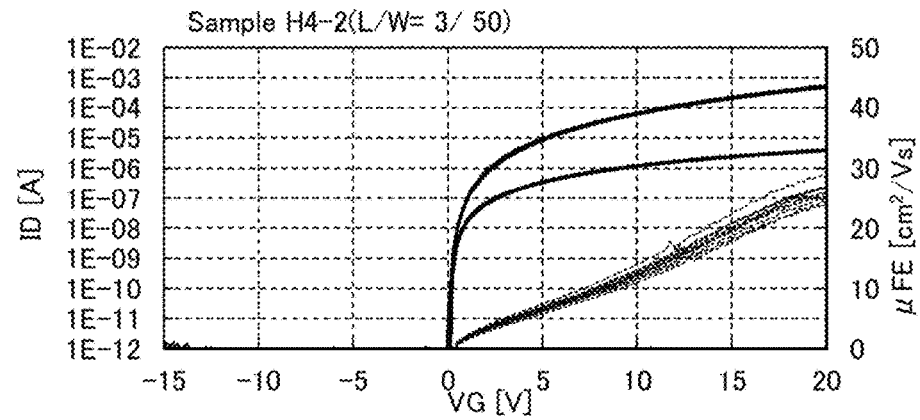
Figure 81C:
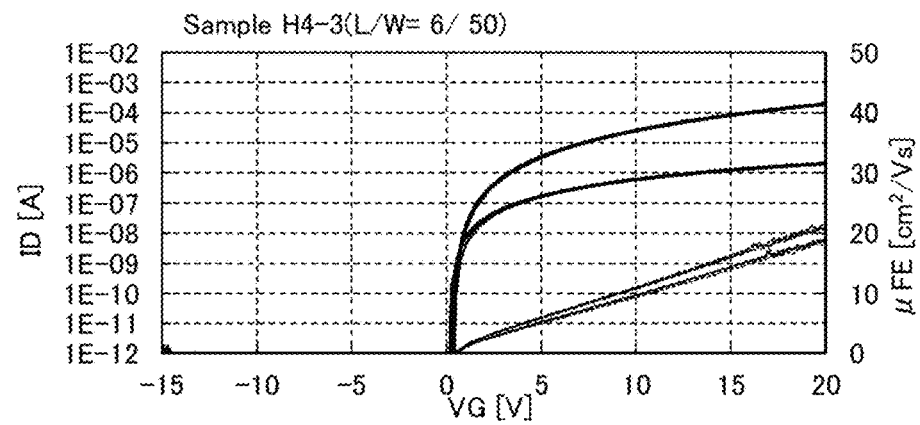
Figure 82A:
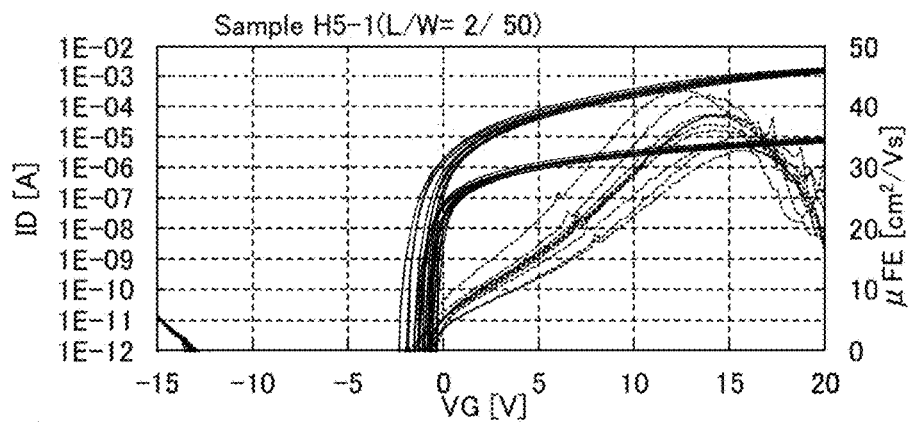
FIGS. 82A to 82C each show Id-Vg characteristics of a transistor in Example.
Figure 82B:
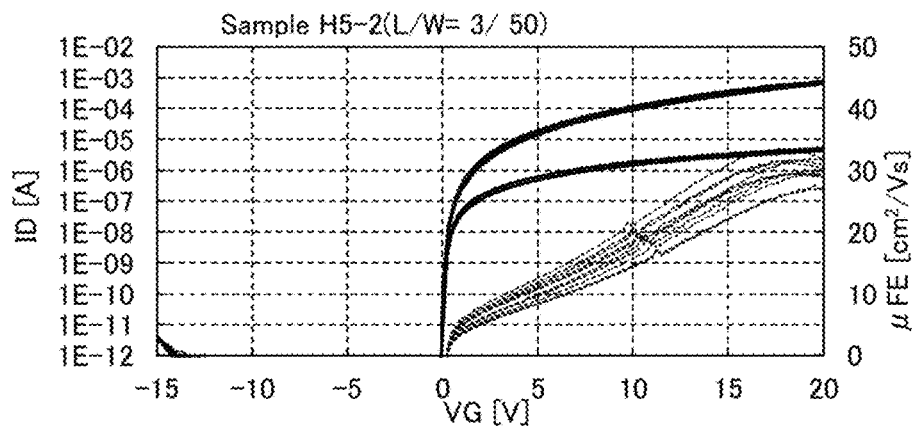
Figure 82C:
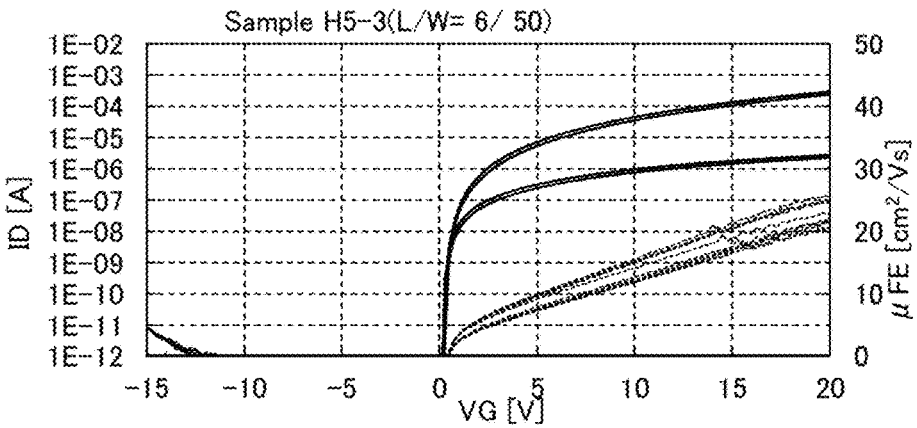
Figure 83A:
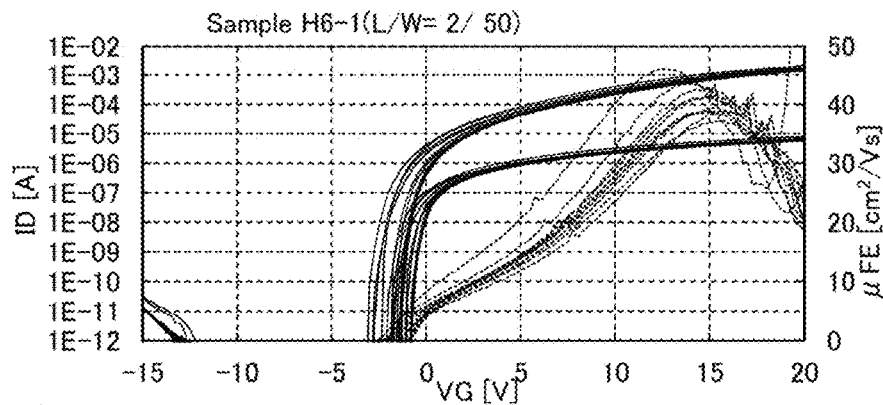
FIGS. 83A to 83C each show Id-Vg characteristics of a transistor in Example.
Figure 83B:
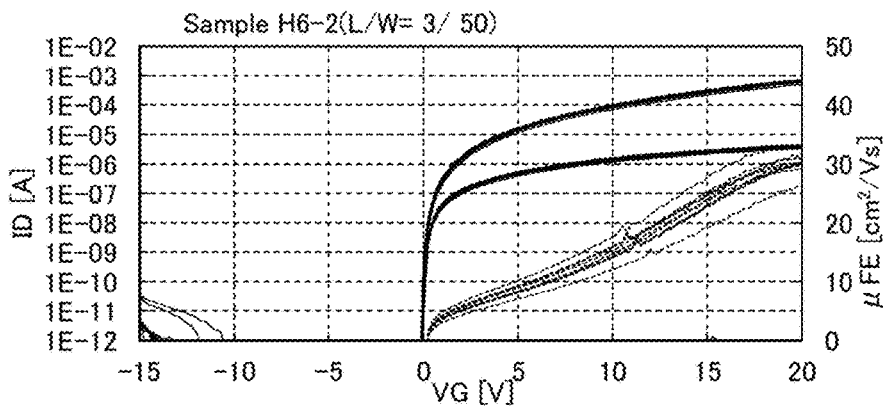
Figure 83C:
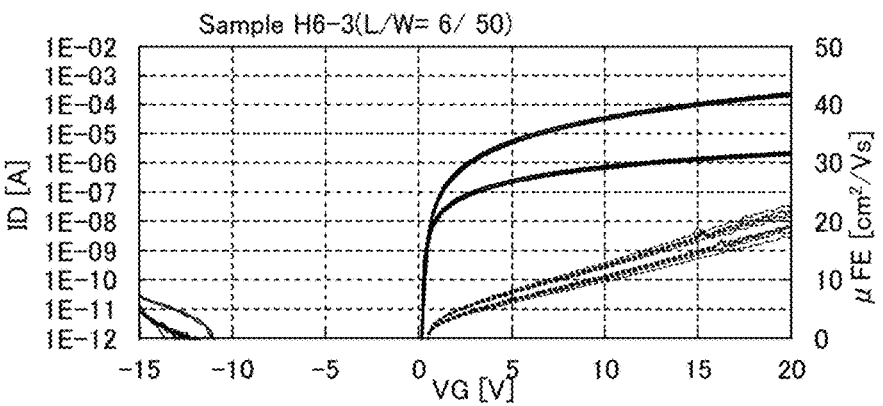
Figure 84A:
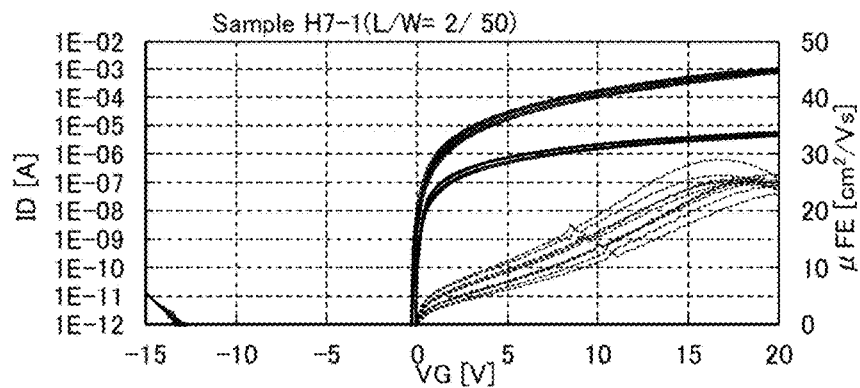
FIGS. 84A to 84C each show Id-Vg characteristics of a transistor in Example.
Figure 84B:
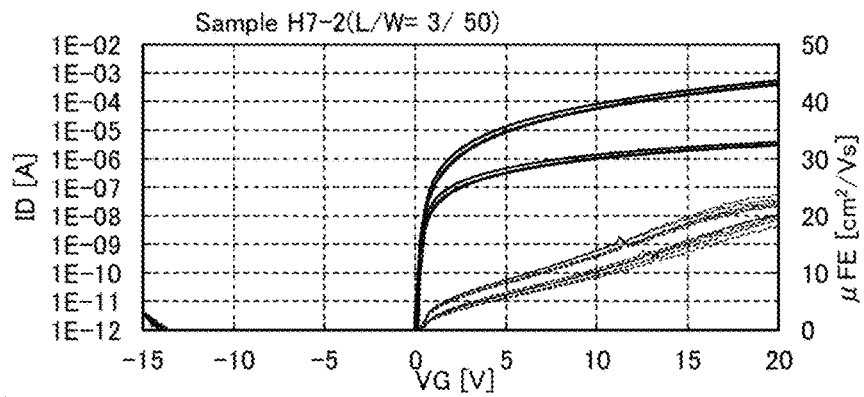
Figure 84C:
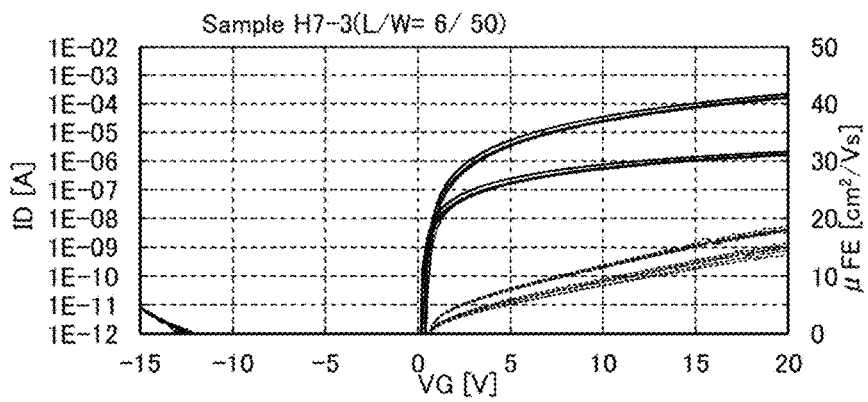

As the transistors subjected to the electrical characteristics measurement, Samples H1 to H7 each corresponding to a transistor 280 illustrated in FIGS. 77A to 77C were fabricated. FIG. 77A is a top view of the transistor 280. FIG. 77B is a cross-sectional view taken along the dashed-dotted line X1-X2 in FIG. 77A, and FIG. 77C is a cross-sectional view taken along the dashed-dotted line Y1-Y2 in FIG. 77A.

The transistor 280 includes the conductive film 204 functioning as a gate electrode over the substrate 202, the insulating film 206 over the substrate 202 and the conductive film 204, the insulating film 207 over the insulating film 206, the oxide semiconductor film 208 over the insulating film 207, the conductive film 212a functioning as a source electrode electrically connected to the oxide semiconductor film 208, and the conductive film 212b functioning as a drain electrode electrically connected to the oxide semiconductor film 208. Furthermore, the oxide semiconductor film 208 includes the oxide semiconductor films 208b and 208c.

Over the transistor 280, specifically over the conductive films 212a and 212b and the oxide semiconductor film 208, the insulating films 214, 216, and 218 are provided. The insulating films 206 and 207 function as gate insulating films.

The structure of the oxide semiconductor film 208 is different between Samples H1 to H7, and other components in Samples H1 to H7 are the same. Formation conditions of the oxide semiconductor film 208 will be described in detail in Method for manufacturing transistor below.

<Method for Manufacturing Transistor>

Next, a method for manufacturing the transistor 280 illustrated in FIGS. 77A to 77C is described. First, the conductive film 204 was formed over the substrate 202. A glass substrate was used as the substrate 202. A 100-nm-thick tungsten film was formed with a sputtering apparatus to form the conductive film 204.

Next, the insulating film 206 and the insulating film 207 were formed over the substrate 202 and the conductive film 204. As the insulating film 206, a 400-nm-thick silicon nitride film was formed with a PECVD apparatus. As the insulating film 207, a 50-nm-thick silicon oxynitride film was formed with a PECVD apparatus.

Next, the oxide semiconductor film 208 was formed over the insulating film 207.

In Sample H1, a 10-nm-thick IGZO film was formed as the oxide semiconductor film 208*b* of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 10%, the pressure was 0.6 Pa, and an AC power of 2500 W was applied to a metal oxide sputtering target (having an atomic ratio of In:Ga:Zn=4:2:4.1). Then, a 15-nm-thick IGZO film was formed as the oxide semiconductor film 208*c* with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

In Sample H2, a 10-nm-thick IGZO film was formed as the oxide semiconductor film 208*b* of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 30%, the pressure was 0.6 Pa, and an AC power of 2500 W was applied to a metal oxide sputtering target (having an atomic ratio of In:Ga:Zn=4:2:4.1). Then, a 15-nm-thick IGZO film was formed as the oxide semiconductor film 208*c* with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

In Sample H3, a 10-nm-thick IGZO film was formed as the oxide semiconductor film 208*b* of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=4:2:4.1). Then, a 15-nm-thick IGZO film was formed as the oxide semiconductor film 208*c* with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

In Sample H4, a 10-nm-thick IGZO film was formed as the oxide semiconductor film 208*b* of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 100%, the pressure was 0.6 Pa, and an AC power of 2500 W was applied to a metal oxide sputtering target (having an atomic ratio of In:Ga:Zn=4:2:4.1). Then, a 15-nm-thick IGZO film was formed as the oxide semiconductor film 208*c* with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

In Sample H5, a 15-nm-thick IGZO film was formed as the oxide semiconductor film 208*b* of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 30%, the pressure was 0.6 Pa, and an AC power of 2500 W was applied to a metal oxide sputtering target (having an atomic ratio of In:Ga:Zn=4:2:4.1). Then, a 15-nm-thick IGZO film was formed as the oxide semiconductor film 208*c* with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

In Sample H6, a 20-nm-thick IGZO film was formed as the oxide semiconductor film 208*b* of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 30%, the pressure was 0.6 Pa, and an AC power of 2500 W was applied to a metal oxide sputtering target (having an atomic ratio of In:Ga:Zn=4:2:4.1). Then, a 15-nm-thick IGZO film was formed as the oxide semiconductor film 208*c* with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

In Sample H7, a 10-nm-thick IGZO film was formed as the oxide semiconductor film 208*b* of the oxide semiconductor film 208 with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 30%, the pressure was 0.6 Pa, and an AC power of 2500 W was applied to a metal oxide sputtering target (having an atomic ratio of In:Ga:Zn=4:2:4.1). Then, a 30-nm-thick IGZO film was formed as the oxide semiconductor film 208c with a sputtering apparatus. Note that the IGZO film was deposited under the conditions where the substrate temperature was 170° C., the argon gas and the oxygen gas were introduced into a chamber such that the flow rate ratio of the oxygen gas to the (argon gas+oxygen gas) was 50%, the pressure was 0.6 Pa, and an AC power of 2500 W was applied to a metal oxide sputtering target (having an atomic ratio of In:Ga:Zn=1:1:1.2).

Next, a conductive film was formed over the insulating film 207 and the oxide semiconductor film 208, a resist mask was formed over the conductive film, and a desired region was etched to form the conductive films 212a and 212b. As the conductive films 212a and 212b, a 50-nm-thick tungsten film, a 400-nm-thick aluminum film, and a 100-nm-thick titanium film were successively formed in a vacuum with a sputtering apparatus. The resist mask was removed after the formation of the conductive films 212a and 212b.

Next, a phosphoric acid solution (a solution obtained by diluting an 85% phosphoric acid solution with pure water by 100 times) was applied from above the insulating film 207, the oxide semiconductor film 208, and the conductive films 212a and 212b. Thus, part of the surface of the oxide semiconductor film 208 which is not covered with the conductive films 212a and 212b was removed.

Next, the insulating films 214 and 216 were formed over the insulating film 207, the oxide semiconductor film 208, and the conductive films 212a and 212b. As the insulating film 214, a 40-nm-thick silicon oxynitride film was formed with a PECVD apparatus. As the insulating film 216, a 400-nm-thick silicon oxynitride film was formed with a PECVD apparatus. Note that the insulating film 214 and the insulating film 216 were formed successively in a vacuum with a PECVD apparatus.

The insulating film 214 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 216 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Next, heat treatment was performed at 350° C. under an atmosphere containing nitrogen for 1 hour.

Then, as a conductive film, a 5-nm-thick ITSO film was formed over the insulating films 214 and 216 with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target provided in a sputtering apparatus. Note that the composition of the metal oxide target used for forming the ITSO film was $In_2O_3$:$SnO_2$:$SiO_2$=85:10:5 [wt %].

Next, oxygen was added to the insulating films 214 and 216 through the conductive film with an ashing apparatus under the conditions where the substrate temperature was 40° C., an oxygen gas at a flow rate of 250 sccm was introduced into a chamber, the pressure was 15 Pa, and an RF power of 4500 W was supplied between parallel-plate electrodes provided in the ashing apparatus so that a bias would be applied to the substrate side. After oxygen was added to the insulating film, the ITSO film was removed by a wet etching process.

Then, the insulating film 218 was formed over the insulating film 216. As the insulating film 218, a 100-nm-thick silicon nitride film was formed with a PECVD apparatus. The insulating film 218 was deposited under the conditions where the substrate temperature was 350° C., a silane gas at a flow rate of 50 sccm, a nitrogen gas at a flow rate of 5000 sccm, and an ammonia gas at a flow rate of 100 sccm were introduced into a chamber, the pressure was 100 Pa, and an RF power of 1000 W was supplied between parallel-plate electrodes provided in a PECVD apparatus.

In the above processes, the transistors corresponding to Samples H1 to H7 were fabricated. Note that the sizes of the transistors are of the following three kinds: channel length=2 μm and channel width=50 μm, channel length=3 μm and channel width=50 μm, and channel length=6 μm and channel width=50 μm. In the following description, Sample H1 with a channel length of 2 μm is referred to as Sample H1-1, Sample H1 with a channel length of 3 μm is referred to as Sample H1-2, and Sample H1 with a channel length of 6 μm is referred to as Sample H1-3 in some cases. The same applies to Samples H2 to H7.

<Evaluation of Electrical Characteristics of Transistor>

The electrical characteristics of the transistors corresponding to Samples H1 to H7 were evaluated. As the electrical characteristics of the transistors, drain current-gate voltage (Id-Vg) characteristics and field-effect mobility (μFE) obtained from the Id-Vg characteristics were measured. The electrical characteristics of the transistors corresponding to Samples H1 to H7 are shown in FIGS. 78A to 78C, FIGS. 79A to 79C, FIGS. 80A to 80C, FIGS. 81A to 81C, FIGS. 82A to 82C, FIGS. 83A to 83C, and FIGS. 84A to 84C. FIG. 78A, FIG. 79A, FIG. 80A, FIG. 81A, FIG. 82A, FIG. 83A, and FIG. 84A each show the characteristics of the transistor with a channel length of 2 μm and a channel width of 50 μm, FIG. 78B, FIG. 79B, FIG. 80B, FIG. 81B, FIG. 82B, FIG. 83B, and FIG. 84B each show the characteristics of the transistor with a channel length of 3 μm and a channel width of 50 μm, and FIG. 78C, FIG. 79C, FIG. 80C, FIG. 81C, FIG. 82C, FIG. 83C, and FIG. 84C each show the characteristics of the transistor with a channel length of 6 μm and a channel width of 50 μm.

In FIGS. 78A to 78C, FIGS. 79A to 79C, FIGS. 80A to 80C, FIGS. 81A to 81C, FIGS. 82A to 82C, FIGS. 83A to 83C, and FIGS. 84A to 84C, the voltage (Vd) between the source electrode and the drain electrode was set at 0.1 V and 20 V, and Vg was applied from −15 V to 20 V at intervals of 0.25 V. Furthermore, in FIGS. 78A to 78C, FIGS. 79A to 79C, FIGS. 80A to 80C, FIGS. 81A to 81C, FIGS. 82A to 82C, FIGS. 83A to 83C, and FIGS. 84A to 84C, the first vertical axis represents the drain current (Id), the second vertical axis represents the field-effect mobility (μFE) when Vd is 20 V, and the horizontal axis represents the gate voltage (Vg). Data of ten transistors are superimposed on each other. All the transistors exhibit little variation and normally-off characteristics.

FIGS. 78A to 78C, FIGS. 79A to 79C, FIGS. 80A to 80C, and FIGS. 81A to 81C show the electrical characteristics of the transistors of Samples H1, Samples H2, Samples H3, and Samples H4, i.e., the transistors including the oxide semiconductor films 208b formed at a flow rate ratio of the oxygen gas of 10%, 30%, 50%, and 100%, respectively. From the measured electrical characteristics shown in FIGS. 78A to 78C, FIGS. 79A to 79C, FIGS. 80A to 80C, and FIGS. 81A to 81C, it is found that a smaller flow rate ratio of the oxygen gas in formation of the oxide semiconductor film 208b leads to higher field-effect mobility (μFE) of the transistor.

Comparison of the characteristics of the transistors having a channel length of 2 μm shows that Samples H1, in each of which the flow rate ratio of the oxygen gas in formation of the oxide semiconductor film 208b is 10%, have a little larger variation in characteristics. Accordingly, the flow rate ratio of the oxygen gas in formation of the oxide semiconductor film 208b is preferably higher than or equal to 10% and lower than or equal to 50%, further preferably higher than or equal to 30% and lower than or equal to 50%.

FIGS. 79A to 79C, FIGS. 82A to 82C, FIGS. 83A to 83C, and FIGS. 84A to 84C respectively show the electrical characteristics of the transistors of Samples H2, Samples H5, Samples H6, and Samples H7. In other words, the graphs show the electrical characteristics of the transistors that are different in the thicknesses of the oxide semiconductor films 208b and 208c. The results in FIGS. 79A to 79C, FIGS. 82A to 82C, FIGS. 83A to 83C, and FIGS. 84A to 84C reveal that the transistor with a channel length of 2 μm has a smaller variation in characteristics when the thickness of the oxide semiconductor film 208b is smaller.

It was found that the field-effect mobility was not considerably dependent on the thickness of the oxide semiconductor film 208b. However, the field-effect mobility was found to be higher when the thickness of the oxide semiconductor film 208c is smaller. Accordingly, the thickness of the oxide semiconductor film 208c is preferably smaller than or equal to 30 nm, further preferably smaller than or equal to 15 nm.

<Reliability Evaluation by Gate BT Test>

Next, the reliability of Samples H1 to H7 that were fabricated above to have a channel length of 6 μm and a channel width of 50 μm was evaluated by a gate bias temperature (BT) test where stress voltage was applied to the gate electrodes. Note that the following four test methods were employed as the gate BT test.

<<I. PBTS: Positive Bias Temperature Stress>>

The gate voltage (Vg) was +30 V, the drain voltage (Vd) and the source voltage (Vs) were 0 V (COMMON), the stress temperature was 60° C., the stress time was 1 hour, and the measurement environment was a dark environment. In other words, a source electrode and a drain electrode of the transistor were set at the same potential, and a potential different from that of the source and drain electrodes was applied to a gate electrode of the transistor for a certain time. The potential applied to the gate electrode was higher than the potential applied to the source electrode and the drain electrode (a potential applied to the gate electrode was more on the positive side than that applied to the source electrode and the drain electrode).

<<II. NBTS: Negative Bias Temperature Stress>>

The gate voltage (Vg) was −30 V, the drain voltage (Vd) and the source voltage (Vs) were 0 V (COMMON), the stress temperature was 60° C., the stress time was 1 hour, and the measurement environment was a dark environment. In other words, a source electrode and a drain electrode of the transistor were set at the same potential, and a potential different from that of the source and drain electrodes was applied to a gate electrode of the transistor for a certain time. The potential applied to the gate electrode was lower than the potential applied to the source electrode and the drain electrode (a potential applied to the gate electrode was more on the negative side than that applied to the source electrode and the drain electrode).

<<III. PBITS: Positive Bias Illuminations Temperature Stress>>

The gate voltage (Vg) was +30 V, the drain voltage (Vd) and the source voltage (Vs) were 0 V (COMMON), the stress temperature was 60° C., the stress time was 1 hour, and the measurement environment was a photo environment (approximately 10000 lx with a white LED). In other words, a source electrode and a drain electrode of the transistor were set at the same potential, and a potential different from that of the source and drain electrodes was applied to a gate electrode of the transistor for a certain time. The potential applied to the gate electrode was higher than the potential applied to the source electrode and the drain electrode (a potential applied to the gate electrode was more on the positive side than that applied to the source electrode and the drain electrode).

<<IV. NBITS: Negative Bias Illuminations Temperature Stress>>

The gate voltage (Vg) was −30 V, the drain voltage (Vd) and the source voltage (Vs) were 0 V (COMMON), the stress temperature was 60° C., the stress time was 1 hour, and the measurement environment was a photo environment (approximately 10000 lx with a white LED). In other words, a source electrode and a drain electrode of the transistor were set at the same potential, and a potential different from that of the source and drain electrodes was applied to a gate electrode of the transistor for a certain time. The potential applied to the gate electrode was lower than the potential applied to the source electrode and the drain electrode (a potential applied to the gate electrode was more on the negative side than that applied to the source electrode and the drain electrode).

Note that the gate BT test is one kind of accelerated test and can evaluate change in characteristics, caused by long-term usage, of transistors in a short time. In particular, the amount of change in threshold voltage ($\Delta$Vth) and the amount of change in shift value ($\Delta$Shift) of a transistor between before and after the gate BT test is an important indicator for examining the reliability. Between before and after the gate BT test, a smaller amount of change in threshold voltage ($\Delta$Vth) and a smaller amount of change in shift value ($\Delta$Shift) of a transistor means higher reliability of the transistor.

Note that the shift value of a transistor means, in the drain current-gate voltage (Id-Vg) characteristics of the transistor, the gate voltage (Vg) at a point of intersection of an axis of $1 \times 10^{-12}$ A and a tangent line of the logarithm of a drain current (Id) having the highest gradient. $\Delta$Vth represents the change in Vth and is obtained by subtraction of Vth before the stress application from Vth after the stress application. $\Delta$Shift represents the change in shift value and is obtained by subtraction of a shift value before the stress application from a shift value after the stress application.

Figure 85:
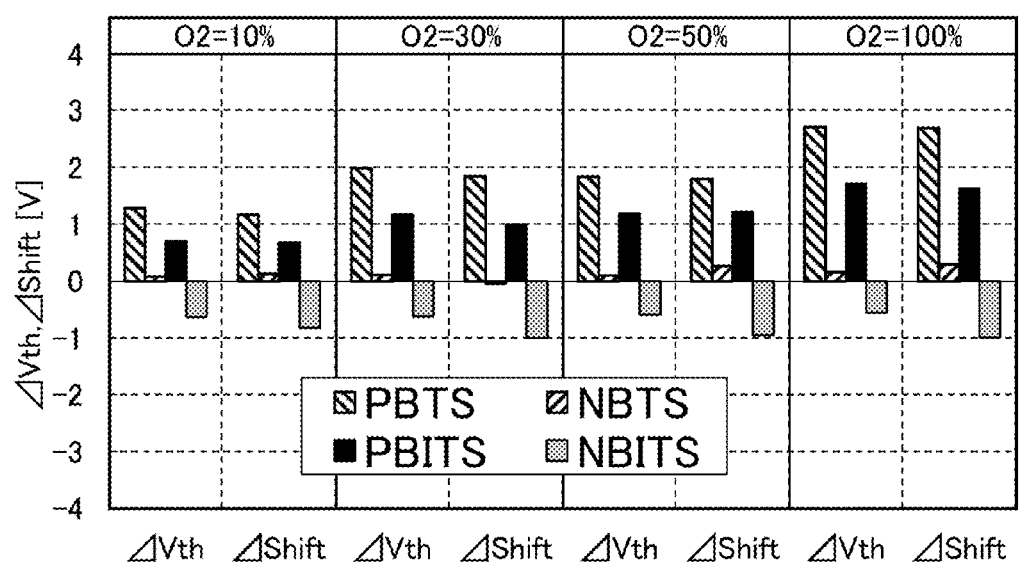
FIG. 85 shows results of reliability tests performed on transistors in Example.
Figure 86:
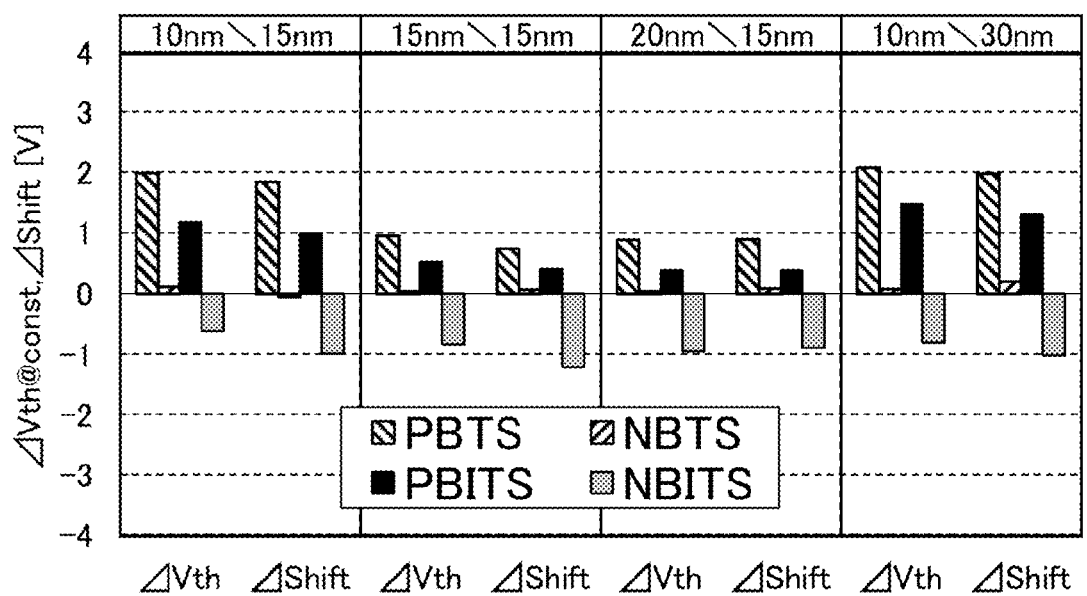
FIG. 86 shows results of reliability tests performed on transistors in Example.
Figure 87A:
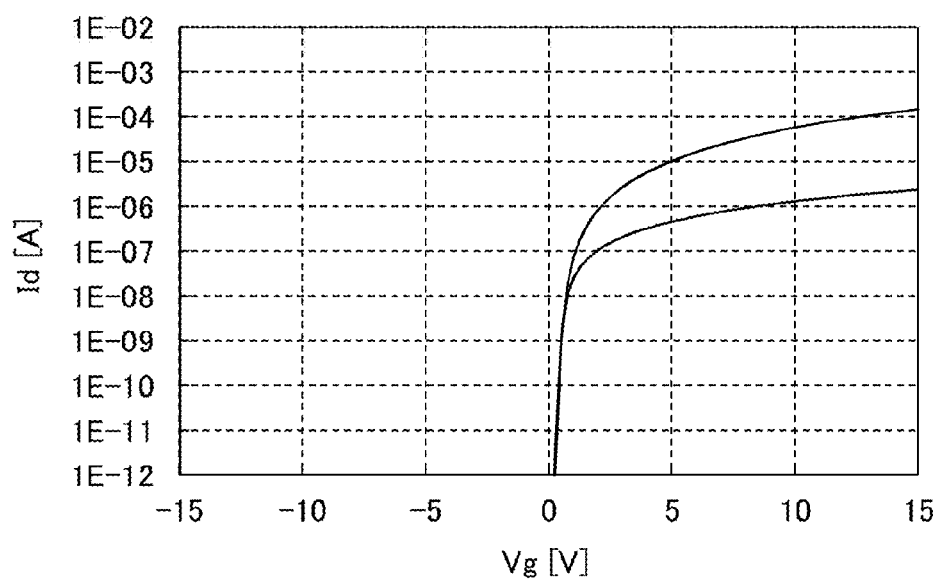
FIGS. 87A and 87B show Id-Vg characteristics of a transistor with and without light irradiation in Example.
Figure 87B:
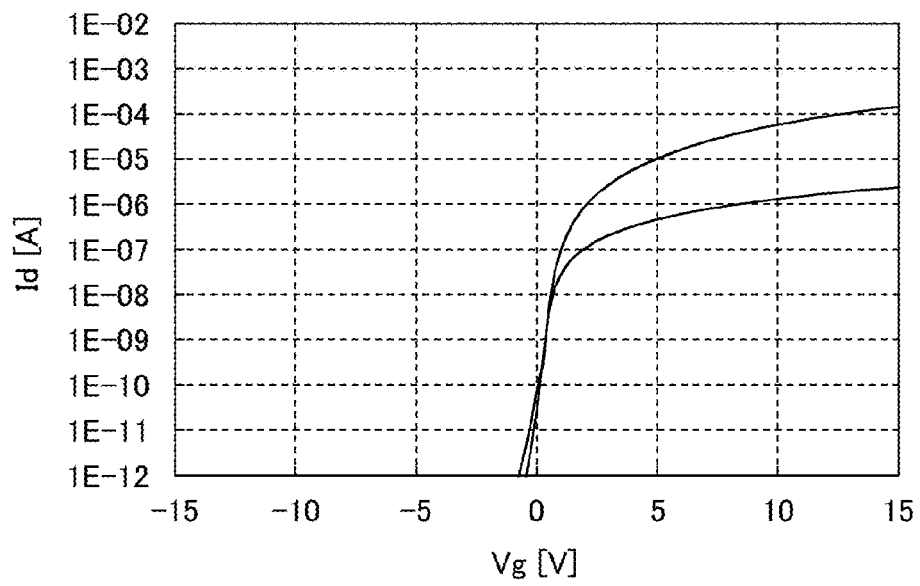
Figure 88A:
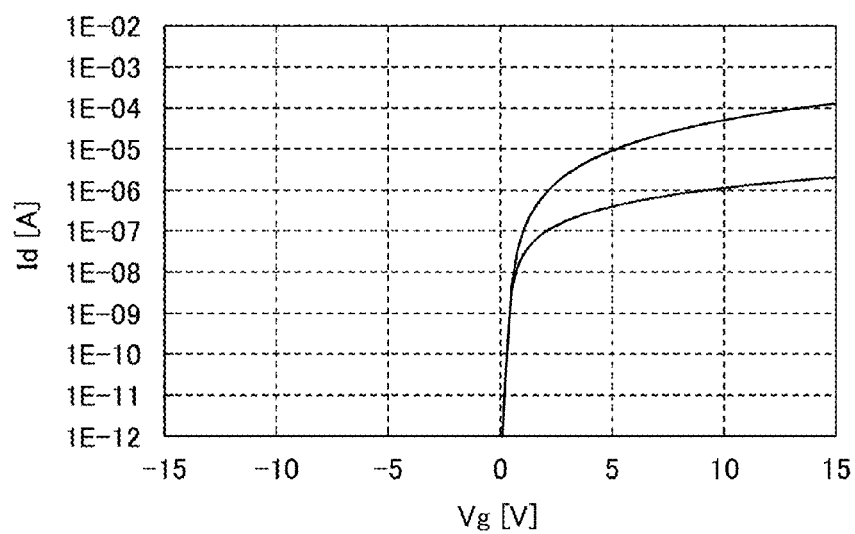
FIGS. 88A and 88B show Id-Vg characteristics of a transistor with and without light irradiation in Example.
Figure 88B:
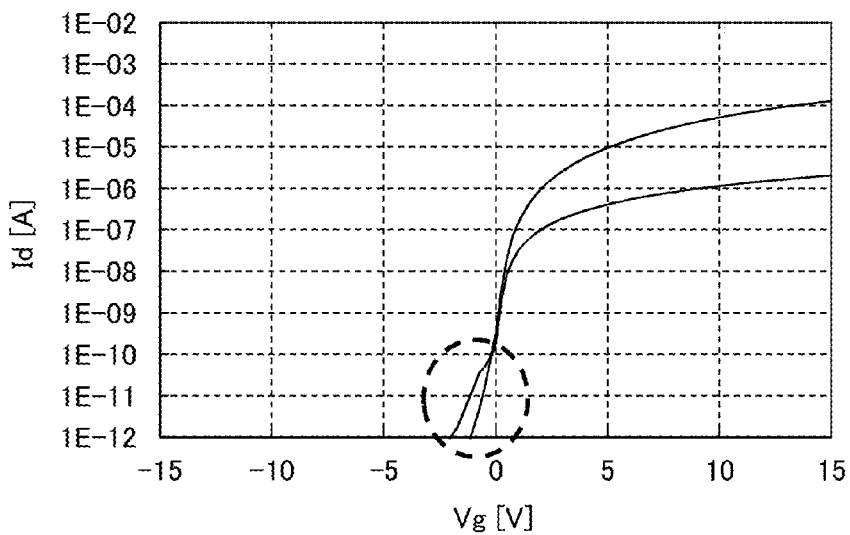
Figure 89A:
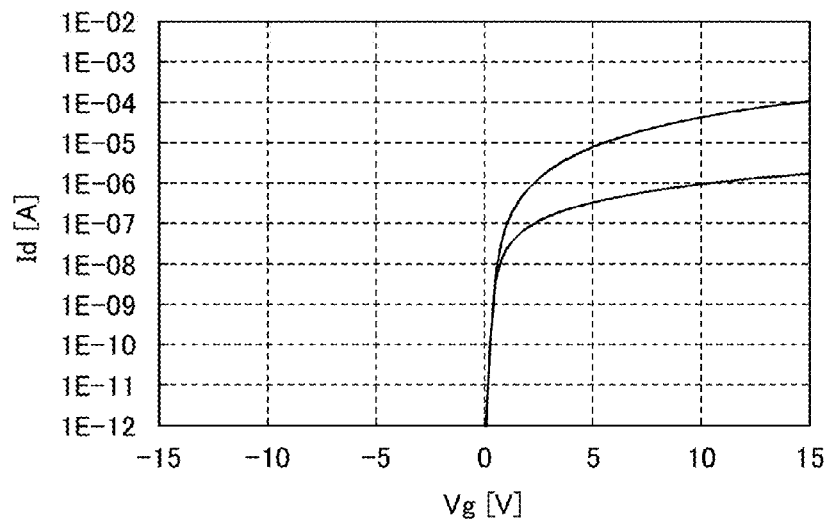
FIGS. 89A and 89B show Id-Vg characteristics of a transistor with and without light irradiation in Example.
Figure 89B:
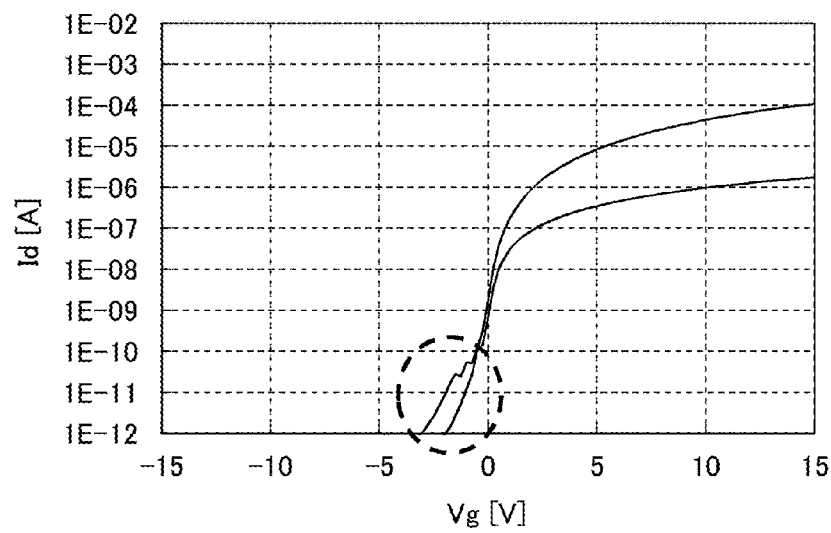
Figure 90A:
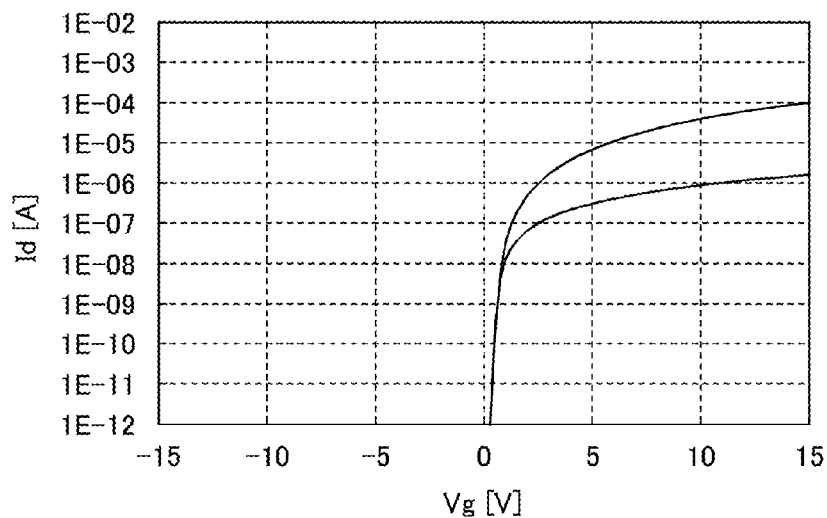
FIGS. 90A and 90B show Id-Vg characteristics of a transistor with and without light irradiation in Example.
Figure 90B:
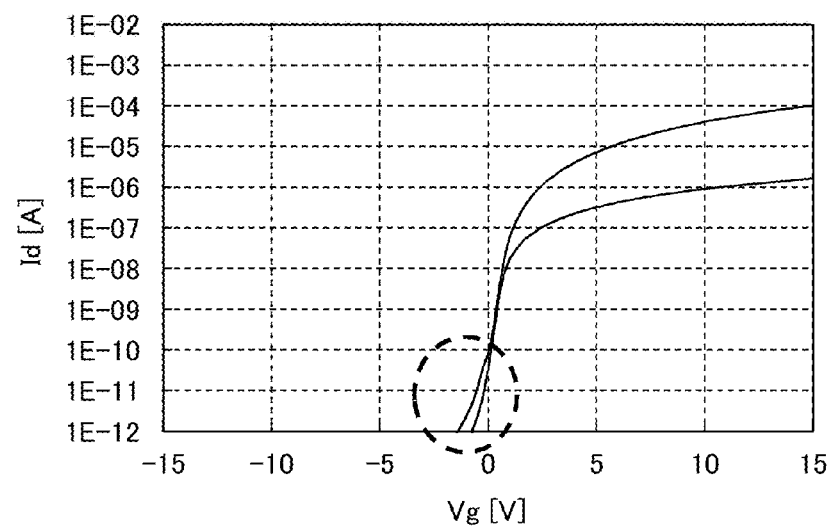

Gate BT test results of Samples H1 to H7 are shown in FIG. 85 and FIG. 86. In each of FIG. 85 and FIG. 86, the vertical axis shows the amount of shift in the threshold voltage ($\Delta$Vth, $\Delta$Shift) of a transistor.

FIG. 85 shows the gate BT test results of Samples H1 to H4. In other words, the graph shows the reliability test results of the transistors including the oxide semiconductor film 208b formed at a flow rate ratio of the oxygen gas of 10%, 30%, 50%, and 100%. The results in FIG. 85 show that when the flow rate ratio of the oxygen gas in formation of the oxide semiconductor film 208b is higher than or equal to 10% and lower than or equal to 50%, a variation in the gate BT test is as small as 2 V or less.

FIG. 86 shows the gate BT test results of Samples H2 and H5 to H7. In other words, the graph shows the reliability test results of the transistors different in the thicknesses of the oxide semiconductor films 208b and 208c. The results in FIG. 86 show that the shift in the positive direction due to the positive stress is smaller when the thickness of the oxide semiconductor film 208b is larger and the shift in the positive direction due to the positive stress is smaller when the thickness of the oxide semiconductor film 208c is smaller. It was suggested that when the oxide semiconductor film 208b is thin and the oxide semiconductor film 208c is thick, the oxide semiconductor film 208c as well as the oxide semiconductor film 208b are regions serving as the channel of the transistor and are more susceptible to defect states. Thus, the oxide semiconductor film 208c preferably has a thickness of 15 nm or less.

<Examination of Electrical Characteristics of Transistor Under Light Irradiation>

Next, the electrical characteristics of the transistors of Samples H2 and H5 to H7 that were fabricated above to have a channel length of 6 µm and a channel width of 50 µm were measured under light irradiation. As the electrical characteristics of the transistors, drain current-gate voltage (Id-Vg) characteristics were measured. The electrical characteristics under light irradiation were measured at a stress temperature of 60° C. and the light irradiation was performed at approximately 10000 lx with the use of a white LED. FIGS. 87A and 87B, FIGS. 88A and 88B, FIGS. 89A and 89B, and FIGS. 90A and 90B show the electrical characteristics of the transistors of Sample H2, Sample H5, Sample H6, and Sample H7, respectively. In FIGS. 87A and 87B, FIGS. 88A and 88B, FIGS. 89A and 89B, and FIGS. 90A and 90B, the voltage (Vd) between the source electrode and the drain electrode was set at 1 V and 10 V, and Vg was applied from −15 V to 20 V at intervals of 0.25 V. Furthermore, in FIGS. 87A and 87B, FIGS. 88A and 88B, FIGS. 89A and 89B, and FIGS. 90A and 90B, the vertical axis represents the drain current (Id) and the horizontal axis represents the gate voltage (Vg). FIG. 87A, FIG. 88A, FIG. 89A, and FIG. 90A show the electrical characteristics of the transistors without the light irradiation, and FIG. 87B, FIG. 88B, FIG. 89B, and FIG. 90B show the electrical characteristics of the transistors with the light irradiation.

The results in FIGS. 87A and 87B, FIGS. 88A and 88B, FIGS. 89A and 89B, and FIGS. 90A and 90B show that the transistors exhibit normally-on characteristics under the light irradiation. It was also found that Id when Vg is lower than or equal to 0 V is lower in the case where the oxide semiconductor film 208b has a smaller thickness. In other words, the thickness of the oxide semiconductor film 208b is preferably small or specifically, less than or equal to 10 nm.

The structure described in this example can be combined as appropriate with any of the embodiments and the other examples.

REFERENCE NUMERALS

10: region, 11: region, 12: region, 103: insulating film, 108: oxide semiconductor film, 112a: conductive film, 112b: conductive film, 116: insulating film, 120: conductive film, 200: transistor, 202: substrate, 204: conductive film, 206: insulating film, 207: insulating film, 208: oxide semiconductor film, 208a: oxide semiconductor film, 208b: oxide semiconductor film, 208c: oxide semiconductor film, 212: conductive film, 212a: conductive film, 212b: conductive film, 214: insulating film, 216: insulating film, 218: insulating film, 220a: conductive film, 220b: conductive film, 230: barrier film, 240: oxygen, 250: transistor, 251a: opening, 251b: opening, 252a: opening, 252b: opening, 252c: opening, 260: transistor, 270: transistor, 270A: transistor, 270B: transistor, 280: transistor, 300: target, 300a: target, 300b: target, 301: deposition chamber, 303b: magnet unit, 310: backing plate, 310a: backing plate, 310b: backing plate, 320: target holder, 320a: target holder, 320b: target holder, 322: target shield, 322a: target shield, 322b: target shield, 323: target shield, 330: magnet unit, 330a: magnet unit, 330b: magnet unit, 330N: magnet, 330N1: magnet, 330N2: magnet, 330S: magnet, 332: magnet holder, 340: plasma, 342: member, 360: substrate, 370: substrate holder, 380a: magnetic line of force, 380b: magnetic line of force, 390: power source, 391: power source, 450: display portion, 451: window, 452a: image, 452b: image, 453: button, 455: window, 456: document information, 457: scroll bar, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 600: transistor, 602: substrate, 604: conductive film, 606: insulating film, 607: insulating film, 608: oxide semiconductor film, 612a: conductive film, 612b: conductive film, 614: insulating film, 616: insulating film, 618: insulating film, 620: conductive film, 2000: touch panel, 2001: touch panel, 2501: display device, 2502t: transistor, 2503c: capacitor, 2503t: transistor, 2504: scan line driver circuit, 2505: pixel, 2509: FPC, 2510: substrate, 2510a: insulating layer, 2510b: flexible substrate, 2510c: adhesive layer, 2511: wiring, 2519: terminal, 2521: insulating layer, 2522: insulating layer, 2528: partition, 2529: liquid crystal layer, 2530a: spacer, 2530b: spacer, 2531: insulating layer, 2550: EL element, 2551: liquid crystal element, 2560: sealing layer, 2567: coloring layer, 2568: light-blocking layer, 2569: anti-reflective layer, 2570: substrate, 2570a: insulating layer, 2570b: flexible substrate, 2570c: adhesive layer, 2580: light-emitting module, 2590: substrate, 2591: electrode, 2592: electrode, 2593: insulating layer, 2594: wiring, 2595: touch sensor, 2597: adhesive layer, 2598: wiring, 2599: connection layer, 2601: pulse voltage output circuit, 2602: current sensing circuit, 2603: capacitor, 2611: transistor, 2612: transistor, 2613: transistor, 2621: electrode, 2622: electrode, 2700: deposition apparatus, 2701: atmosphere-side substrate supply chamber, 2702: atmosphere-side substrate transfer chamber, 2703a: load lock chamber, 2703b: unload lock chamber, 2704: transfer chamber, 2705: substrate heating chamber, 2706a: deposition chamber, 2706b: deposition chamber, 2706c: deposition chamber, 2751: cryotrap, 2752: stage, 2761: cassette port, 2762: alignment port, 2763: transfer robot, 2764: gate valve, 2765: heating stage, 2766a: target, 2766b: target, 2767a: target shield, 2767b: target shield, 2768: substrate holder, 2769: substrate, 2770: vacuum pump, 2771: cryopump, 2772: turbo molecular pump, 2780: mass flow controller, 2781: refiner, 2782: gas heating system, 2784: movable member, 2790a: magnet unit, 2790b: magnet unit, 2791: power source, 3000: deposition apparatus, 3010: process member, 3180: deposition chamber, 3181a: source material supply portion, 3181b: source material supply portion, 3182: control portion, 3182a: flow rate controller, 3182b: flow rate controller, 3182c: flow rate controller, 3182h: heating mechanism, 3183: inlet port, 3184: outlet port, 3185: evacuation unit, 3186: support portion, 3187: heating mechanism, 3188: door, 5100: pellet, 5120: substrate, 5161: region, 5200: pellet, 5201: ion, 5202: lateral growth portion, 5203: particle, 5220: substrate, 5230: target, 5240: plasma, 5260: heating mechanism, 8000: display module, 8001: upper cover, 8002: lower cover, 8003: FPC, 8004: touch sensor, 8005: FPC, 8006: display panel, 8007: backlight, 8008: light source, 8009: frame, 8010: printed circuit board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal, 9500: display device, 9501: display panel, 9502: display region, 9503: region, 9511: hinge, 9512: bearing.

This application is based on Japanese Patent Application serial no. 2015-040974 filed with Japan Patent Office on Mar. 3, 2015, the entire contents of which are hereby incorporated by reference.

The invention claimed is:

1. An oxide semiconductor film comprising:
In;
M;
Zn;
a first region overlapping with a first conductive film with a first insulating film positioned therebetween; and
a second region overlapping with a second conductive film with a second insulating film positioned therebetween,
wherein the first region comprises a region in which a peak value of a first density of shallow defect states at an interface between the oxide semiconductor film and the first insulating film is less than $1 \times 10^{13}$ cm$^{-2}$eV$^{-1}$,
wherein the second region comprises a region in which a peak value of a second density of shallow defect states at an interface between the oxide semiconductor film and the second insulating film is less than $1 \times 10^{13}$ cm$^{-2}$eV$^{-1}$,
wherein the first region comprises a region in which the peak value of the first density of the shallow defect states is substantially equal to the peak value of the second density of the shallow defect states, and
wherein M is Al, Ga, Y, or Sn.

2. The oxide semiconductor film according to claim 1, wherein the peak value of the first density of the shallow defect states and the peak value of the second density of the shallow defect states are measured by a high-frequency C-V method.

3. The oxide semiconductor film according to claim 2, wherein in the high-frequency C-V method, an alternating voltage at higher than or equal to 0.1 kHz and lower than or equal to 10 MHz and a direct-current voltage are applied to the first conductive film or the second conductive film.

4. The oxide semiconductor film according to claim 1, wherein the oxide semiconductor film comprises a region with c-axis alignment.

5. A semiconductor device comprising:
the oxide semiconductor film according to claim 1;
a source electrode electrically connected to the oxide semiconductor film; and
a drain electrode electrically connected to the oxide semiconductor film.

6. A semiconductor device comprising the oxide semiconductor film according to claim 1,
wherein an argon molecule at $1 \times 10^{14}$ cm$^{-2}$ or less is detected in the first insulating film by thermal desorption spectroscopy.

7. A semiconductor device comprising the oxide semiconductor film according to claim 1,
wherein an oxygen molecule at $1 \times 10^{15}$ cm$^{-2}$ or less is detected in the first insulating film by thermal desorption spectroscopy.

8. A display device comprising:
the semiconductor device according to claim 5; and
a display element.

9. A display module comprising:
the display device according to claim 8; and
a touch sensor.

10. An electronic device comprising:
the display module according to claim 9; and
one of an operation key and a battery.

* * * * *